US011977275B2

(12) United States Patent
Wang et al.

(10) Patent No.: US 11,977,275 B2
(45) Date of Patent: May 7, 2024

(54) GLASSES

(71) Applicant: SHENZHEN SHOKZ CO., LTD., Guangdong (CN)

(72) Inventors: Yueqiang Wang, Shenzhen (CN); Haofeng Zhang, Shenzhen (CN); Yongjian Li, Shenzhen (CN); Yunbin Chen, Shenzhen (CN); Fen You, Shenzhen (CN); Lei Zhang, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 608 days.

(21) Appl. No.: 17/172,034

(22) Filed: Feb. 9, 2021

(65) Prior Publication Data

US 2021/0165249 A1 Jun. 3, 2021

Related U.S. Application Data

(63) Continuation of application No. PCT/CN2019/102391, filed on Aug. 24, 2019.

(30) Foreign Application Priority Data

Aug. 24, 2018 (CN) .......................... 201810975515.1
Jan. 5, 2019 (CN) .......................... 201910009904.3
Jan. 5, 2019 (CN) .......................... 201920031804.6

(51) Int. Cl.
*G02C 11/00* (2006.01)
*G02C 5/14* (2006.01)
(Continued)

(52) U.S. Cl.
CPC ............... *G02C 11/10* (2013.01); *G02C 5/14* (2013.01); *G02C 5/143* (2013.01); *G02C 5/22* (2013.01);
(Continued)

(58) Field of Classification Search
None
See application file for complete search history.

(56) References Cited

U.S. PATENT DOCUMENTS 4,902,120 A 2/1990 Weyer
5,335,285 A * 8/1994 Gluz .................... H04R 1/1066
381/381

(Continued)

FOREIGN PATENT DOCUMENTS

CN 2639920 Y 9/2004
CN 102141688 A 8/2011
(Continued)

OTHER PUBLICATIONS

International Search Report in PCT/CN2019/102394 dated Nov. 28, 2019, 8 pages.
(Continued)

*Primary Examiner* — Darryl J Collins
(74) *Attorney, Agent, or Firm* — METIS IP LLC

(57) ABSTRACT

The present disclosure embodiment may disclose a glasses including a glasses frame and two speakers. The glasses frame may include a glasses rim and two glasses temples. The two glasses temples may be rotatably connected to the glasses rim, respectively. The two speakers may include an earphone core. The two speakers may be connected to the two glasses temples via hinge components of the two glasses temples, respectively. The hinge components may be rotatable to change a position of each of the speakers relative to connected one of the glasses temples. The glasses temple may include a circuit component or a battery to drive the earphone core to vibrate to generate a sound. In the present disclosure, the glasses rim and the glasses temple may be
(Continued)

connected through a rotating shaft, thereby protecting the connection wire in the glasses and extending the life of the connection wire.

18 Claims, 47 Drawing Sheets

(51) Int. Cl.
| | |
|---|---|
| G02C 5/22 | (2006.01) |
| G02C 11/06 | (2006.01) |
| H04R 1/02 | (2006.01) |
| H04R 1/04 | (2006.01) |
| H04R 1/06 | (2006.01) |
| H04R 1/10 | (2006.01) |
| H04R 1/28 | (2006.01) |
| H04R 9/02 | (2006.01) |
| H04R 9/06 | (2006.01) |
| H04R 25/00 | (2006.01) |
| H05K 1/02 | (2006.01) |
| H05K 1/18 | (2006.01) |

(52) U.S. Cl.
CPC ............ *G02C 5/2254* (2013.01); *G02C 11/06* (2013.01); *H04R 1/02* (2013.01); *H04R 1/028* (2013.01); *H04R 1/04* (2013.01); *H04R 1/06* (2013.01); *H04R 1/10* (2013.01); *H04R 1/1008* (2013.01); *H04R 1/1033* (2013.01); *H04R 1/1041* (2013.01); *H04R 1/1075* (2013.01); *H04R 1/1083* (2013.01); *H04R 1/28* (2013.01); *H04R 9/02* (2013.01); *H04R 9/025* (2013.01); *H04R 9/06* (2013.01); *H04R 25/65* (2013.01); *H05K 1/028* (2013.01); *H05K 1/189* (2013.01); *H04R 2460/13* (2013.01); *H05K 2201/05* (2013.01)

(56) References Cited

U.S. PATENT DOCUMENTS

| | | | | |
|---|---|---|---|---|
| 5,606,743 | A * | 2/1997 | Vogt | H04B 1/086 |
| | | | | 351/158 |
| 6,409,338 | B1 * | 6/2002 | Jewell | G02C 11/10 |
| | | | | 351/158 |
| 7,289,767 | B2 | 10/2007 | Lai | |
| 10,117,026 | B2 | 10/2018 | Qi et al. | |
| 10,670,888 | B1 * | 6/2020 | Yang | G02C 11/10 |
| 2005/0136977 | A1 * | 6/2005 | Levy | G02C 11/10 |
| | | | | 455/557 |
| 2006/0158608 | A1 * | 7/2006 | Lin | G02C 11/10 |
| | | | | 351/158 |
| 2008/0013041 | A1 * | 1/2008 | Chou | G02C 11/06 |
| | | | | 351/158 |
| 2008/0074609 | A1 | 3/2008 | Ifergan | |
| 2009/0290730 | A1 | 11/2009 | Fukuda et al. | |
| 2011/0170054 | A1 * | 7/2011 | Jackson | G02C 11/10 |
| | | | | 351/158 |
| 2011/0200204 | A1 | 8/2011 | Horigome et al. | |
| 2012/0105740 | A1 * | 5/2012 | Jannard | G06F 3/16 |
| | | | | 351/158 |
| 2012/0328134 | A1 * | 12/2012 | Lewis | G02C 11/10 |
| | | | | 381/386 |
| 2014/0253867 | A1 * | 9/2014 | Jiang | G02C 11/10 |
| | | | | 351/158 |
| 2015/0257662 | A1 | 9/2015 | Lee et al. | |
| 2016/0234613 | A1 | 8/2016 | Westerkull | |
| 2016/0246076 | A1 | 8/2016 | Wei | |
| 2016/0261956 | A1 * | 9/2016 | Collini | H04R 1/028 |
| 2017/0090201 | A1 | 3/2017 | Guo | |
| 2019/0113774 | A1 * | 4/2019 | Anderson | G02B 27/017 |
| 2020/0336824 | A1 | 10/2020 | Zheng et al. | |
| 2020/0344542 | A1 | 10/2020 | Liu et al. | |

FOREIGN PATENT DOCUMENTS

| | | |
|---|---|---|
| CN | 201984240 U | 9/2011 |
| CN | 102523546 A | 6/2012 |
| CN | 202306037 U | 7/2012 |
| CN | 202364340 U | 8/2012 |
| CN | 203786416 U | 8/2014 |
| CN | 204374548 U | 6/2015 |
| CN | 105007551 A | 10/2015 |
| CN | 204887455 U | 12/2015 |
| CN | 205103503 U | 3/2016 |
| CN | 205301727 U | 6/2016 |
| CN | 205720956 U | 11/2016 |
| CN | 205793159 U | 12/2016 |
| CN | 205793173 U | 12/2016 |
| CN | 205961389 U | 2/2017 |
| CN | 205987287 U | 2/2017 |
| CN | 206061075 U | 3/2017 |
| CN | 206292473 U | 6/2017 |
| CN | 106937221 A | 7/2017 |
| CN | 106954150 A | 7/2017 |
| CN | 106954151 A | 7/2017 |
| CN | 106954153 A | 7/2017 |
| CN | 106974645 A | 7/2017 |
| CN | 206365029 U | 7/2017 |
| CN | 106997107 A | 8/2017 |
| CN | 206387972 U | 8/2017 |
| CN | 206421112 U | 8/2017 |
| CN | 206563855 U | 10/2017 |
| CN | 206640748 U | 11/2017 |
| CN | 206920741 U | 1/2018 |
| CN | 107948881 A | 4/2018 |
| CN | 207266241 U | 4/2018 |
| CN | 207424414 U | 5/2018 |
| CN | 207443120 U | 6/2018 |
| CN | 108391188 A | 8/2018 |
| CN | 207718105 U | 8/2018 |
| CN | 207720370 U | 8/2018 |
| CN | 108600920 A | 9/2018 |
| CN | 108776393 A | 11/2018 |
| CN | 108845436 A | 11/2018 |
| CN | 108873372 A | 11/2018 |
| CN | 208079380 U | 11/2018 |
| CN | 109061902 A | 12/2018 |
| CN | 109495809 A | 3/2019 |
| CN | 208780924 U | 4/2019 |
| CN | 208780925 U | 4/2019 |
| CN | 208780926 U | 4/2019 |
| CN | 208780932 U | 4/2019 |
| CN | 208847977 U | 5/2019 |
| CN | 208847981 U | 5/2019 |
| CN | 110022516 A | 7/2019 |
| CN | 209184747 U | 7/2019 |
| CN | 209267805 U | 8/2019 |
| CN | 209358728 U | 9/2019 |
| JP | S59161928 A | 9/1984 |
| JP | 2006157318 A | 6/2006 |
| WO | 9623373 A1 | 8/1996 |
| WO | 2006023341 A2 | 3/2006 |
| WO | 2007070508 A2 | 6/2007 |
| WO | 2007133055 A1 | 11/2007 |
| WO | 2015115693 A1 | 8/2015 |

OTHER PUBLICATIONS

International Search Report in PCT/CN2019/102377 dated Dec. 3, 2019, 8 pages.
International Search Report in PCT/CN2019/102378 dated Nov. 6, 2019, 7 pages.
International Search Report in PCT/CN2019/102385 dated Nov. 18, 2019, 6 pages.
International Search Report in PCT/CN2019/102389 dated Nov. 28, 2019, 8 pages.
International Search Report in PCT/CN2019/102396 dated Nov. 27, 2019, 8 pages.
International Search Report in PCT/CN2019/102395 dated Nov. 27, 2019, 9 pages.

(56) References Cited

OTHER PUBLICATIONS

International Search Report in PCT/CN2019/102406 dated Nov. 26, 2019, 7 pages.
International Search Report in PCT/CN2019/102407 dated Nov. 8, 2019, 6 pages.
International Search Report in PCT/CN2019/102408 dated Nov. 6, 2019, 6 pages.
International Search Report in PCT/CN2019/102398 dated Oct. 31, 2019, 6 pages.
International Search Report in PCT/CN2019/102386 dated Nov. 25, 2019, 7 pages.
International Search Report in PCT/CN2019/102390 dated Nov. 22, 2019, 8 pages.
International Search Report in PCT/CN2019/102391 dated Nov. 22, 2019, 8 pages.
Written Opinion in PCT/CN2019/102391 dated Nov. 22, 2019, 12 pages.
Written Opinion in PCT/CN2019/102390 dated Nov. 22, 2019, 10 pages.
Written Opinion in PCT/CN2019/102396 dated Nov. 27, 2019, 10 pages.
Written Opinion in PCT/CN2019/102377 dated Dec. 3, 2019, 9 pages.
Written Opinion in PCT/CN2019/102378 dated Nov. 6, 2019, 13 pages.
Written Opinion in PCT/CN2019/102385 dated Nov. 18, 2019, 11 pages.
Written Opinion in PCT/CN2019/102389 dated Nov. 28, 2019, 9 pages.
Written Opinion in PCT/CN2019/102395 dated Nov. 27, 2019, 10 pages.
Written Opinion in PCT/CN2019/102394 dated Nov. 28, 2019, 9 pages.
Written Opinion in PCT/CN2019/102406 dated Nov. 26, 2019, 12 pages.
Written Opinion in PCT/CN2019/102407 dated Nov. 8, 2019, 10 pages.
Written Opinion in PCT/CN2019/102408 dated Nov. 6, 2019, 12 pages.
Written Opinion in PCT/CN2019/102398 dated Oct. 31, 2019, 9 pages.
Written Opinion in PCT/CN2019/102386 dated Nov. 25, 2019, 12 pages.
First Office Action in Chinese Application No. 201810975515.1 dated Apr. 13, 2023, 23 pages.

* cited by examiner

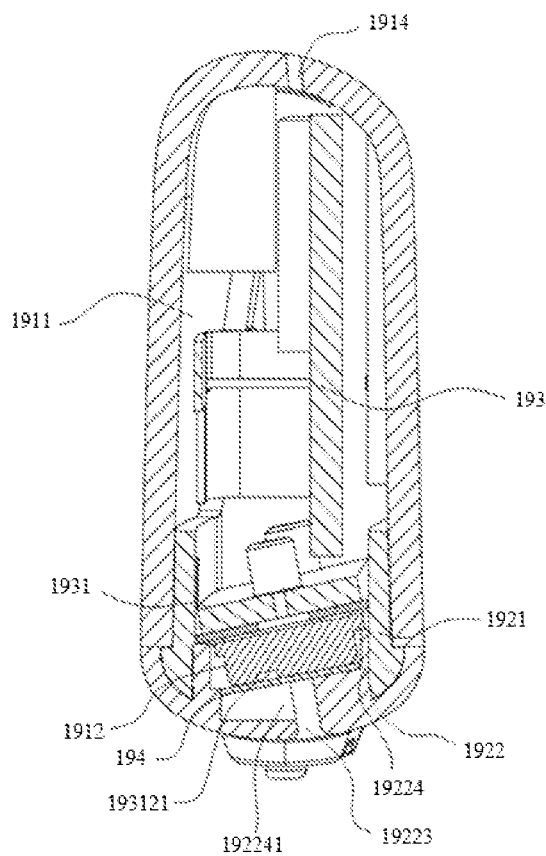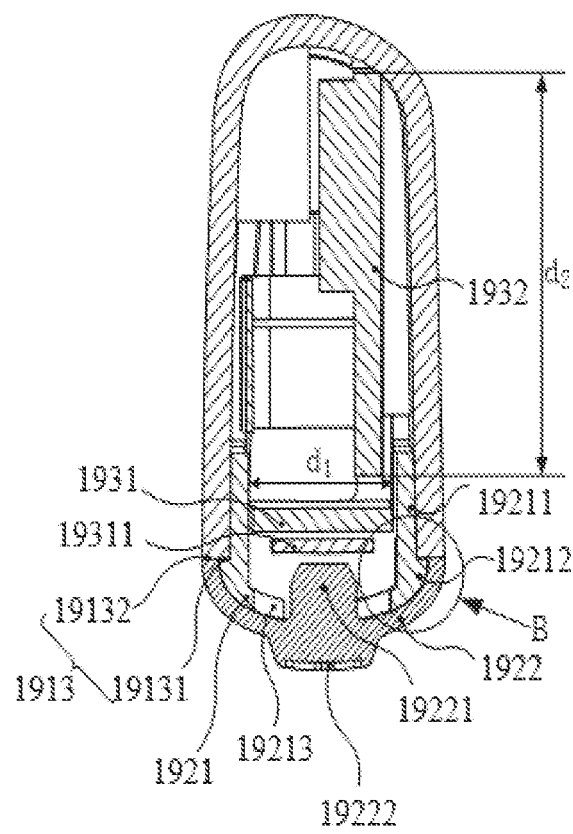
FIG. 67
FIG. 68

GLASSES

CROSS-REFERENCE TO RELATED APPLICATION

This application is a Continuation of International Application No. PCT/CN2019/102391, filed on Aug. 24, 2019, which claims priority of Chinese Patent Application No. 201810975515.1 filed on Aug. 24, 2018, Chinese Patent Application No. 201910009904.3 filed on Jan. 5, 2019, and Chinese Patent Application No. 201920031804.6 filed on Jan. 5, 2019, the contents of each of which are hereby incorporated by reference in its entirety.

TECHNICAL FIELD

The present disclosure relates to the field of glasses, and more specifically relates to glasses having a speaker.

BACKGROUND

With the development of speaker technology, electronic products (e.g., earphones, MP3, etc.) have been widely used. Speakers may have different product forms. For example, a speaker may be integrated on glasses (e.g., sunglasses, swimming glasses, etc.) or fixed inside or close to an ear of a user through a special structure (e.g., an ear hook). As the functions of the products become more diverse, there may be more and more modules and wires inside the speaker, and the wiring may be more and more complicated. The complicated wiring may occupy an internal space of the product greatly, and an unreasonable wiring distribution may cause wires to affect each other, which may lead to an abnormal sound and affect the sound quality of the speaker. Therefore, it may be necessary to provide a more efficient wiring technology, so as to simplify the wiring of the speaker and improve the sound quality of the speaker.

SUMMARY

An embodiment of the present disclosure may provide a glasses. The glasses may include a glasses frame and two speakers. The glasses frame may include a glasses rim and two glasses temples. The two glasses temples may be rotatably connected to the glasses rim, respectively. The two speakers may include an earphone core. The two speakers may be connected to the two glasses temples via hinge components of the two glasses temples, respectively. The hinge components may be rotatable to change a position of each of the speakers relative to one of the glasses temples. The glasses temple may include a circuit component or a battery to drive the earphone core to vibrate to generate a sound.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 67 is a sectional view illustrating an electronic component of a glasses along a C-C axis in FIG. 59 in a combined state according to some embodiments of the present disclosure;

FIG. 68 is a sectional view illustrating an electronic component of a glasses along an A-A axis in FIG. 59 in a combined state according to some embodiments of the present disclosure;

DETAILED DESCRIPTION

Figure 1:
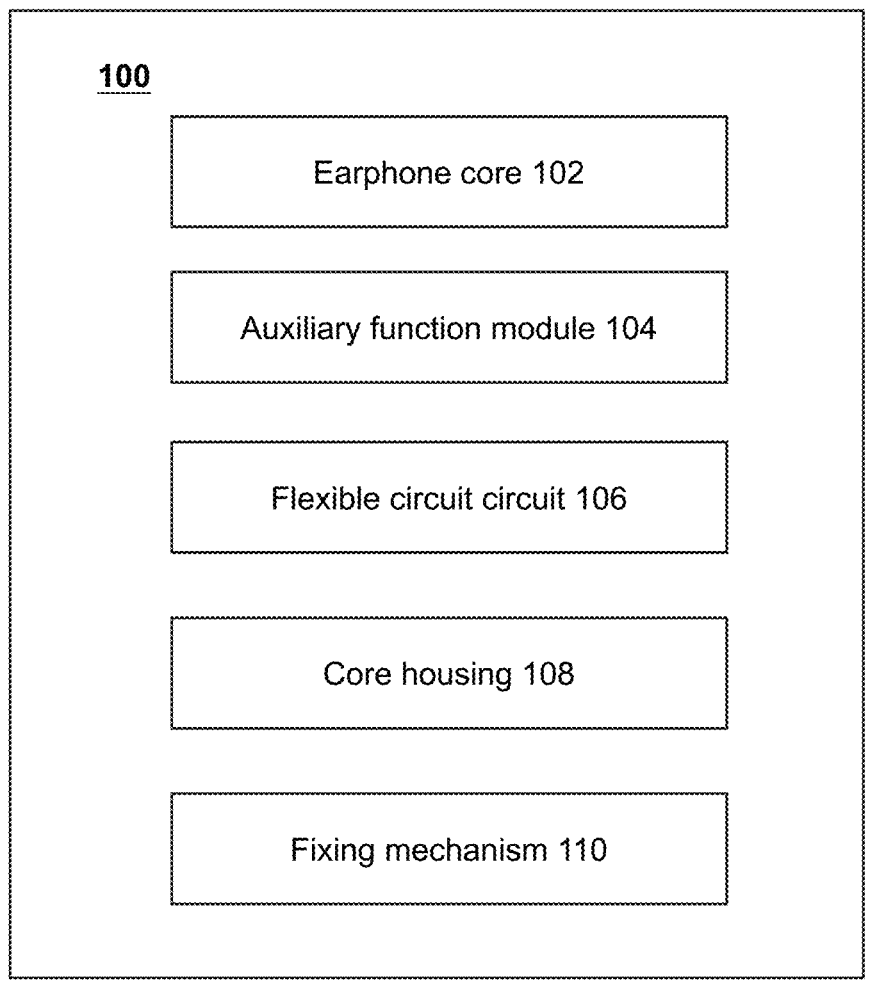
FIG. 1 is a block diagram illustrating a structure of a speaker according to some embodiments of the present disclosure.

In the following detailed description, numerous specific details are set forth by way of examples in order to provide a thorough understanding of the relevant disclosure. Obviously, drawings described below are only some examples or embodiments of the present disclosure. Those skilled in the art, without further creative efforts, may apply the present disclosure to other similar scenarios according to these drawings. It should be understood that the purposes of these illustrated embodiments are only provided to those skilled in the art to practice the application, and not intended to limit the scope of the present disclosure. Unless obviously obtained from the context or the context illustrates otherwise, the same numeral in the drawings refers to the same structure or operation.

As used in the disclosure and the appended claims, the singular forms "a," "an," and "the" may include plural referents unless the content clearly dictates otherwise. In general, the terms "comprise" and "include" merely prompt to include steps and elements that have been clearly identified, and these steps and elements do not constitute an exclusive listing. The methods or devices may also include other steps or elements. The term "based on" is "based at least in part on." The term "one embodiment" means "at least one embodiment;" the term "another embodiment" means "at least one other embodiment." Related definitions of other terms will be given in the description below. In the following, without loss of generality, the "glasses" or "sunglasses" described in the present disclosure means "glasses" or "sunglasses" with a speaker. For those skilled in the art, "glasses" or "sunglasses" may also be replaced with other similar words, such as "eye protection device," "eye wearable device," or the like. "Speaker" may also be replaced with other similar words, such as "hearing aid," "player," "playing device," or the like. For those skilled in the art, after understanding the basic principles of glasses, it may be possible to make various modifications and changes in the form and details of the specific methods and operations of implementing glasses without departing from the principles. In particular, an environmental sound collection and processing function may be added to the glasses to enable the glasses to implement the function of a hearing aid. For example, a microphone may collect environmental sounds of a user/wearer, process the sounds using an algorithm and transmit the processed sound (or generated electrical signal) to a speaker of glasses. That is, the glasses may be modified to include the function of collecting the environmental sounds, and after a signal processing, the sound may be transmitted to the user/wearer via the speaker, thereby implementing the function of the hearing aid. As an example, the algorithm mentioned herein may include noise cancellation, automatic gain control, acoustic feedback suppression, wide dynamic range compression, active environment recognition, active noise reduction, directional processing, tinnitus processing, multi-channel wide dynamic range compression, active howling suppression, volume control, or the like, or any combination thereof.

FIG. 1 is a block diagram illustrating a structure of a speaker according to some embodiments of the present disclosure.

A speaker 100 may at least include an earphone core 102, an auxiliary function module 104, and a flexible circuit board 106.

In some embodiments, the earphone core 102 may receive electrical audio signal(s) and convert the audio signal(s) into the sound signal(s). The flexible circuit board 106 may facilitate electrical connection(s) between different modules/components. For example, the flexible circuit board 106 may facilitate an electrical connection between the earphone core 102 and an external control circuit and an electrical connection between the earphone core 102 and the auxiliary function module 104.

In some embodiments, the earphone core 102 may at least include a magnetic circuit component, a vibration component, and a bracket that accommodates the magnetic circuit component and the vibration component. The magnetic circuit component may be used to provide a magnetic field. The vibration component may be used to convert an electrical signal input to the vibration component into a mechanical vibration signal so as to generate a sound. In some embodiments, the vibration component may include at least a coil and an inner lead. In some embodiments, the earphone core 102 may also include an external wire. The external wire may be capable of transmitting an audio current to the coil in the vibration component. One end of the external wire may be connected to the inner lead of the earphone core, and the other end may be connected to the flexible circuit board of the speaker. In some embodiments, the bracket may have a wiring groove. The external wire and/or the inner lead may be partially disposed of the wiring groove described in detail in other parts of the present disclosure.

In some embodiments, the auxiliary function module 104 may be used to receive auxiliary signal(s) and perform auxiliary function(s). The auxiliary function module 104 may be a module different from the earphone core and may be used for receiving the auxiliary signal(s) and performing the auxiliary function(s). In the present disclosure, the conversion of the audio signal into the sound signal may be considered as a main function of the speaker 100, and other functions different from the main function may be considered as the auxiliary function(s) of the speaker 100. For example, the auxiliary function(s) of the speaker 100 may include receiving a user sound and/or an ambient sound through a microphone, controlling a broadcasting process of the sound signal through a key, or the like, and a corresponding auxiliary function module may include a microphone, a key switch, etc., which may be set according to actual needs. The auxiliary signal(s) may be electric signal(s) related to the auxiliary function(s), optical signal(s) related to the auxiliary function(s), acoustic signal(s) related to the auxiliary function(s), vibration signal(s) related to the auxiliary function(s), or the like, or any combination thereof.

The speaker 100 may further include a core housing 108 for accommodating the earphone core 102, the auxiliary function module 104, and the flexible circuit board 106. When the speaker 100 is a bone conduction earphone, an inner wall of the core housing 108 may be directly or indirectly connected to the vibration component in the earphone core. When the user wears the bone conduction earphone, an outer wall of the core housing 108 may be in contact with the user and transmit the mechanical vibration of the vibration component to an auditory nerve through a bone, so that the human body may hear the sound. In some embodiments, the speaker may include the earphone core 102, the auxiliary function module 104, the flexible circuit board 106, and the core housing 108.

In some embodiments, the flexible circuit board 106 may be a flexible printed circuit board (FPC) accommodated in the inner space of the core housing 108. The flexible circuit board 106 may have high flexibility and be adapted to the inner space of the core housing 108. Specifically, in some embodiments, the flexible circuit board 106 may include a first board and a second board. The flexible circuit board 106 may be bent at the first board and the second board so as to adapt to a position of the flexible circuit board in the core housing 108, or the like. More details may refer to descriptions in other parts of the present disclosure.

In some embodiments, the speaker 100 may transmit the sound through a bone conduction approach. An outer surface of the core housing 108 may have a fitting surface. The fitting surface may be an outer surface of the speaker 100 in contact with the human body when the user wears the speaker 100. The speaker 100 may compress the fitting surface against a preset area (e.g., a front end of a tragus, a position of a skull, or a back surface of an auricle), thereby effectively transmitting the vibration signal(s) to the auditory nerve of the user through the bone and improving the sound quality of the speaker 100. In some embodiments, the fitting surface may be abutted on the back surface of the auricle. The mechanical vibration signal(s) may be transmitted from the earphone core to the core housing and transmitted to the back of the auricle through the fitting surface of the core housing. The vibration signal(s) may then be transmitted to the auditory nerve by the bone near the back of the auricle. In this case, the bone near the back of the auricle may be closer to the auditory nerve, which may have a better conduction effect and improve the efficiency of transmitting the sound to the auditory nerve by the speaker 100.

In some embodiments, the speaker 100 may further include a fixing mechanism 110. The fixing mechanism 110 may be externally connected to the core housing 108 and used to support and maintain the position of the core housing 108. In some embodiments, a battery assembly and a control circuit may be disposed in the fixing mechanism 110. The battery assembly may provide electric energy to any electronic component in the speaker 100. The control circuit may control any function component in the speaker 100. The function component may include, but be not limited to, the earphone core, the auxiliary function module, or the like. The control circuit may be connected to the battery and other functional components through the flexible circuit board or the wire.

In some embodiments, the fixing mechanism 110 may be a glasses rim, a hat, a headgear, other headwear accessories, or the like, or any combination thereof. For example, the fixing mechanism 110 may be a glasses rim. A cavity may be formed inside the glasses rim. The cavity may accommodate the battery assembly, the flexible circuit board, and the control circuit. In this case, the earphone core 102 may be located at the end of the glasses temple, which may be located near the ear and provide the sound signal(s) when the user wears the glasses.

Figure 2:
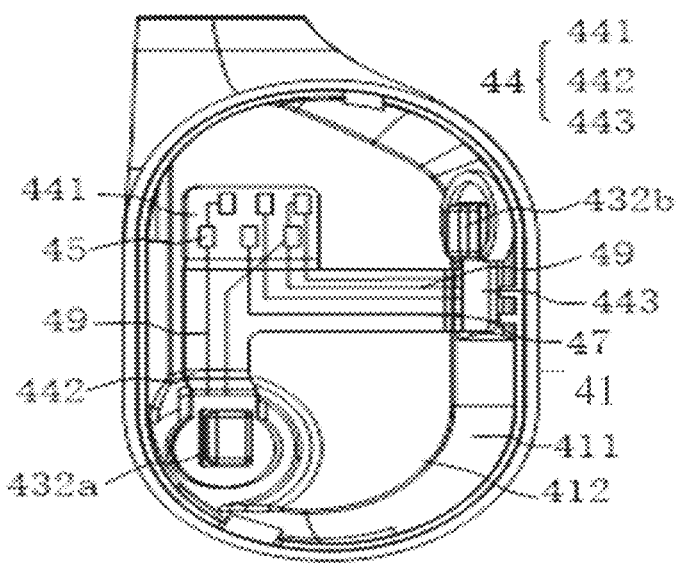
FIG. 2 is a schematic diagram illustrating a structure of a flexible printed circuit according to some embodiments of the present disclosure.

FIG. 2 is a schematic diagram illustrating a structure of a flexible circuit board located inside a core housing according to some embodiments of the present disclosure.

Figure 3:
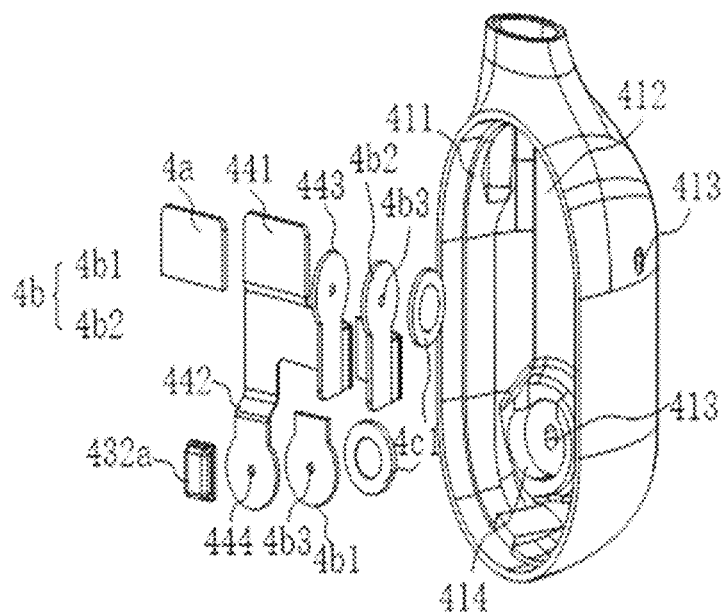
FIG. 3 is an exploded diagram illustrating a partial structure of a speaker according to some embodiments of the present disclosure.

In some embodiments, the flexible circuit board may be disposed with a number of pads. Different signal wires (e.g., audio signal wires, auxiliary signal wires) may be electrically connected to different pads through different flexible leads to avoid numerous and complicated internal wires issues, which may occur when both audio signal wires and auxiliary signal wires need to be connected to the earphone core or the auxiliary function module. As shown in FIGS. 2 and 3, a flexible circuit board 44 may at least include a number of first pads 45 and a number of second pads (not shown in the figures). In some embodiments, the flexible circuit board 44 in FIG. 2 may correspond to the flexible circuit board 106 in FIG. 1. At least one of the first pads 45 may be electrically connected to auxiliary function module(s). The at least one of the first pads 45 may be electrically connected to at least one of the second pads through a first flexible lead 47 on the flexible circuit board 44. The at least one of the second pads may be electrically connected to an earphone core (not shown in the figures) through external wire(s) (not shown in the figures). At least another one of the first pads 45 may be electrically connected to auxiliary signal wire(s). The at least another one of the first pads 45 and the auxiliary function module(s) may be electrically connected through a second flexible lead 49 on the flexible circuit board 44. In the embodiment, the at least one of the first pads 45 may be electrically connected to the auxiliary function module(s). The at least one of the second pads may be electrically connected to the earphone core through the external wire(s). The one of the at least one of the first pads 45 may be electrically connected to one of the at least one of the second pads through the first flexible lead 47, so that the external audio signal wire(s) and the auxiliary signal wire(s) may be electrically connected to the earphone core and the auxiliary function modules at the same time through the flexible circuit board, which may simplify a layout of the wiring.

In some embodiments, the audio signal wire(s) may be wire(s) electrically connected to the earphone core and transmitting audio signal(s) to the earphone core. The auxiliary signal wire(s) may be wire(s) electrically connected to the auxiliary function modules and performing signal transmission with the auxiliary function modules.

In some embodiments, referring to FIG. 2, specifically, the flexible circuit board 44 may be disposed with the number of pads 45 and two pads (not shown in the figure). The two pads and the number of pads 45 may be located on the same side of the flexible circuit board 44 and spaced apart. The two pads may be connected to two corresponding pads 45 of the number of pads 45 through the flexible lead(s)

47 on the flexible circuit board 44. Further, a core housing 41 may also accommodate two external wires. One end of each of the external wires may be welded to the corresponding pad, and the other end may be connected to the earphone core, so that the earphone core may be connected to the pads through the external wires. The auxiliary function modules may be mounted on the flexible circuit board 44 and connected to other pads of the number of pads 45 through the flexible lead(s) 49 on the flexible circuit board 44.

In some embodiments, wires may be disposed in the fixing mechanism 110 of the speaker 100. The wires may at least include the audio signal wire(s) and the auxiliary signal wire(s). In some embodiments, there may be multiple wires in the fixing mechanism 110. Such wires may include at least two audio signal wires and at least two auxiliary signal wires. For example, the fixing mechanism 110 may be a glasses rim. The glasses rim may be connected to the core housing 41, and the wires may be wires disposed in the glasses rim. One end of the plurality of the wires in the glasses rim may be welded to the flexible circuit board 44 or a control circuit board disposed in the core housing 108, and the other end of the plurality of the wire may enter the core housing 41 and be welded to the pad 45 on the flexible circuit board 44.

As used herein, one end of each of the two audio signal wires of the plurality of wires in the glasses rim, which may be located in the core housing 41, may be welded to the two pads 45 by two flexible leads 47, and the other end may be directly or indirectly connected to the control circuit board. The two pads 45 may be further connected to the earphone core through the welding of the flexible lead(s) 49 and the two pads 46 in FIG. 4 and the welding of the two external wires and the pads, thereby transmitting the audio signal(s) to the earphone core.

One end of each of at least two auxiliary signal wires in the core housing 41 may be welded to the pad 45 by the flexible lead(s) 49, and the other end may be directly or indirectly connected to the control circuit board so as to transmit the auxiliary signal(s) received and transformed by the auxiliary function module(s) to the control circuit (not shown in the figure).

In the approach described above, the flexible circuit board 44 may be disposed in the core housing 41, and the corresponding pads may be further disposed on the flexible circuit board 44. Therefore, the wires (not shown in the figure) may enter the core housing 41 and be welded to the corresponding pads, and further connected to the corresponding auxiliary function module(s) through the flexible leads 47 and the flexible leads 49 on the pads, thereby avoiding a number of wires directly connected to the auxiliary function module(s) to make the wiring in the core housing 41 complicated. Therefore, the arrangement of the wirings may be optimized, and the space occupied by the core housing 41 may be saved. In addition, when a number of the wires in the glasses rim are directly connected to the auxiliary function module(s), a middle portion of the wires in the glasses rim may be suspended in the core housing 41 to easily cause vibration, thereby resulting in abnormal sounds to affect the sound quality of the earphone core. According to the approach, the wires in the glasses rim may be welded to the flexible circuit board 44 and further connected to the corresponding auxiliary function module(s), which may reduce a situation that the wires are suspended from affecting the quality of the earphone core, thereby improving the sound quality of the earphone core to a certain extent.

In some embodiments, the flexible circuit board (also referred to as the flexible circuit board 44) may be further divided. The flexible circuit board may be divided into at least two regions. One auxiliary function module may be disposed on one of the at least two regions, so that at least two auxiliary function modules may be disposed on the flexible circuit board. Wiring between the audio signal wire(s) and the auxiliary signal wire(s) and the at least two auxiliary function modules may be implemented through the flexible circuit board. In some embodiments, the flexible circuit board may at least include a main circuit board and a first branch circuit board. The first branch circuit board may be connected to the main circuit board and extend away from the main circuit board along one end of the main circuit board. The auxiliary function module(s) may include at least a first auxiliary function module and a second auxiliary function module. The first auxiliary function module may be disposed on the main circuit board, and the second auxiliary function module may be disposed on the first branch circuit board. The number of first pads may be disposed on the main circuit board, and the second pads may be disposed on the first branch circuit board. In some embodiments, the first auxiliary function module may be a key switch. The key switch may be disposed on the main circuit board, and the first pads may be disposed corresponding to the key switch. The second auxiliary function module may be a microphone. The microphone may be disposed on the first branch circuit board, and the second pads corresponding to the microphone may be disposed on the first branch circuit board. The first pads corresponding to the key switch on the main circuit board may be connected to the second pads corresponding to the microphone on the first branch circuit board through the second flexible lead(s). The key switch may be electrically connected to the microphone, so that the key switch may control or operate the microphone.

In some embodiments, the flexible circuit board may further include a second branch circuit board. The second branch circuit board may be connected to the main circuit board. The second branch circuit board may extend away from the main circuit board along the other end of the main circuit board and be spaced from the first branch circuit board. The auxiliary function module(s) may further include a third auxiliary function module. The third auxiliary function module may be disposed on the second branch circuit board. The number of first pads may be disposed on the main circuit board. At least one of the second pads may be disposed on the first branch circuit board, and the other second pads may be disposed on the second branch circuit. In some embodiments, the third auxiliary function module may be a second microphone. The second branch circuit board may extend perpendicular to the main circuit board. The second microphone may be mounted on the end of the second branch circuit board away from the main circuit board. The number of pads may be disposed at the end of the main circuit board away from the second branch circuit board.

Specifically, as shown in FIG. 2 and FIG. 3, the second auxiliary function module may be the first microphone 432*a*. The third auxiliary function module may be the second microphone 432*b*. As used herein, the first microphone 432*a* and the second microphone 432*b* may both be MEMS (micro-electromechanical system) microphone, which may have a small working current, relatively stable performance, and high voice quality. The two microphones 432 may be disposed at different positions of the flexible circuit board 44 according to actual needs.

As used herein, the flexible circuit board 44 may include a main circuit board 441 (or referred to the main circuit board), and a branch circuit board 442 (or referred to the first branch circuit board) and a branch circuit board 443 (or referred to the second branch circuit board) connected to the main circuit board 441. The branch circuit board 442 may extend in the same direction as the main circuit board 441. The first microphone 432a may be mounted on one end of the branch circuit board 442 away from the main circuit board 441. The branch circuit board 443 may extend perpendicular to the main circuit board 441. The second microphone 432b may be mounted on one end of the branch circuit board 443 away from the main circuit board 441. A number of pads 45 may be disposed on the end of the main circuit board 441 away from the branch circuit board 442 and the branch circuit board 443.

In one embodiment, the core housing 41 may include a peripheral side wall 411 and a bottom end wall 412 connected to one end surface of the peripheral side wall 411, so as to form an accommodation space with an open end. As used herein, an earphone core may be disposed in the accommodation space through the open end. The first microphone 432a may be fixed on the bottom end wall 412. The second microphone 432b may be fixed on the peripheral side wall 411.

In the embodiment, the branch circuit board 442 and/or the branch circuit board 443 may be appropriately bent to suit a position of a sound inlet corresponding to the microphone 432 on the core housing 41. Specifically, the flexible circuit board 44 may be disposed in the core housing 41 in a manner that the main circuit board 441 is parallel to the bottom end wall 412. Therefore, the first microphone 432a may correspond to the bottom end wall 412 without bending the main circuit board 441. Since the second microphone 432b may be fixed on the peripheral side wall 411 of the core housing 41, it may be necessary to bend the second main circuit board 441. Specifically, the branch circuit board 443 may be bent at one end away from the main circuit board 441 so that a board surface of the branch circuit board 443 may be perpendicular to a board surface of the main circuit board 441 and the branch circuit board 442. Further, the second microphone 432b may be fixed at the peripheral side wall 411 of the core housing 41 in a direction facing away from the main circuit board 441 and the branch circuit board 442.

In one embodiment, the first pads 45, the second pads, the first microphone 432a, and the second microphone 432b may be disposed on the same side of the flexible circuit board 44. The second pads may be disposed adjacent to the second microphone 432b.

As used herein, the second pads may be specifically disposed at one end of the branch circuit board 443 away from the main circuit board 441 and have the same direction as the second microphone 432b and disposed at intervals. Therefore, the second pads may be perpendicular to the direction of the first pads 45 as the branch circuit board 443 is bent. It should be noted that the branch circuit board 443 may not be perpendicular to the board surface of the main circuit board 441 after being bent, which may be determined according to the arrangement between the peripheral side wall 411 and the bottom end wall 412.

Further, another side of the flexible circuit board 44 may be disposed with a rigid support plate 4a and a microphone rigid support plate 4b for supporting the first pads 45. The microphone rigid support plate 4b may include a rigid support plate 4b1 for supporting the first microphone 432a and a rigid support plate 4b2 for supporting the second pads and the second microphone 432b together.

As used herein, the rigid support plate 4a, the rigid support plate 4b1, and the rigid support plate 4b2 may be mainly used to support the corresponding pads and the microphone 432, and thus may need to have certain strengths. The materials of the three may be the same or different. The specific material may be polyimide film (PI film), or other materials that may provide the strengths, such as polycarbonate, polyvinyl chloride, etc. In addition, the thicknesses of the three rigid support plates may be set according to the strengths of the rigid support plates, and actual strengths required by the first pads 45, the second pads, the first microphone 432a, and the second microphone 432b, and be not specifically limited herein.

As used herein, the rigid support plate 4a, the rigid support plate 4b1, and the rigid support plate 4b2 may be three different regions of an entire rigid support plate, or three independent bodies spaced apart from each other, and be not specifically limited herein.

In one embodiment, the first microphone 432a and the second microphone 432b may correspond to two microphone components 4c, respectively (not shown in the figure). In one embodiment, the structures of the two microphone components may be the same. A sound inlet 413 may be disposed on the core housing 41. Further, the bond conduction loudspeaking device may be further disposed with an annular blocking wall 414 integrally formed on the inner surface of the core housing 41 at the core housing 41, and disposed at the periphery of the sound inlet 413, thereby defining an accommodation space (not shown in the figure) connected to the sound inlet 413.

In one embodiment, the flexible circuit board 44 may be disposed between a rigid support plate (e.g., the rigid support plate 4a, the rigid support plate 4b1, and the rigid support plate 4b2) and the microphone 432. A sound input 444 may be disposed at a position corresponding to a sound input 4b3 of the microphone rigid support plate 4b.

Further, the flexible circuit board 44 may further extend away from the microphone 432, so as to be connected to other functional components or wires to implement corresponding functions. Correspondingly, the microphone rigid support plate 4b may also extend out a distance with the flexible circuit board in a direction away from the microphone 432.

Correspondingly, the annular blocking wall 414 may be disposed with a gap matching the shape of the flexible circuit board to allow the flexible circuit board to extend out of the accommodation space 415. In addition, the gap may be further filled with a sealant to further improve the sealing.

Figure 4:
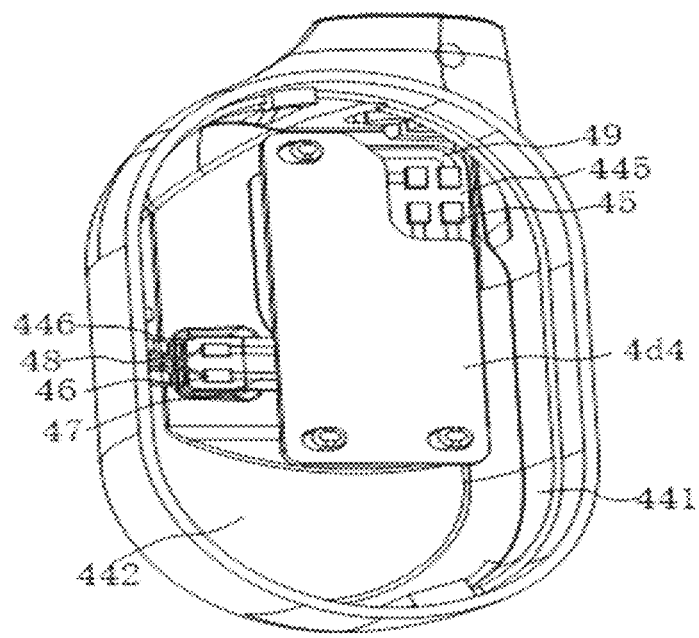
FIG. 4 is a partial sectional view illustrating a structure of a speaker according to some embodiments of the present disclosure.

FIG. 4 is a partial sectional view illustrating a structure of a speaker according to some embodiments of the present disclosure. In some embodiments, as shown in FIG. 4, the flexible circuit board 44 may include a main circuit board 445 and a branch circuit board 446. The branch circuit board 446 may extend along an extending direction perpendicular to the main circuit board 445. As used herein, the number of first pads 45 may be disposed at the end of the main circuit board 445 away from the branch circuit board 446. A key switch may be mounted on the main circuit board 445. The second pads 46 may be disposed at the end of the branch circuit boards 446 away from the main circuit board 445. The first auxiliary function module may be a key switch. The second auxiliary function module may be a microphone.

In the embodiment, a board surface of the flexible circuit board 44 and the bottom end wall 412 may be disposed in parallel and at intervals, so that the key switch may be disposed towards the bottom end wall 412 of the core housing 41.

As described above, an earphone core (or the earphone core 102) may include a magnetic circuit component, a vibration component, an external wire, and a bracket. As used herein, the vibration component may include a coil and an inner lead. The external wire may transmit an audio current to the coil in the vibration component. One end of the external wire may be connected to the inner lead of the earphone core, and the other end may be connected to the flexible circuit board of a speaker. The bracket may have a wiring groove. At least a portion of the external wire and/or the inner lead may be disposed in the wiring groove. In some embodiments, the inner lead and the outer wire may be welded to each other. A welding position may be located in the wiring groove.

Figure 5:
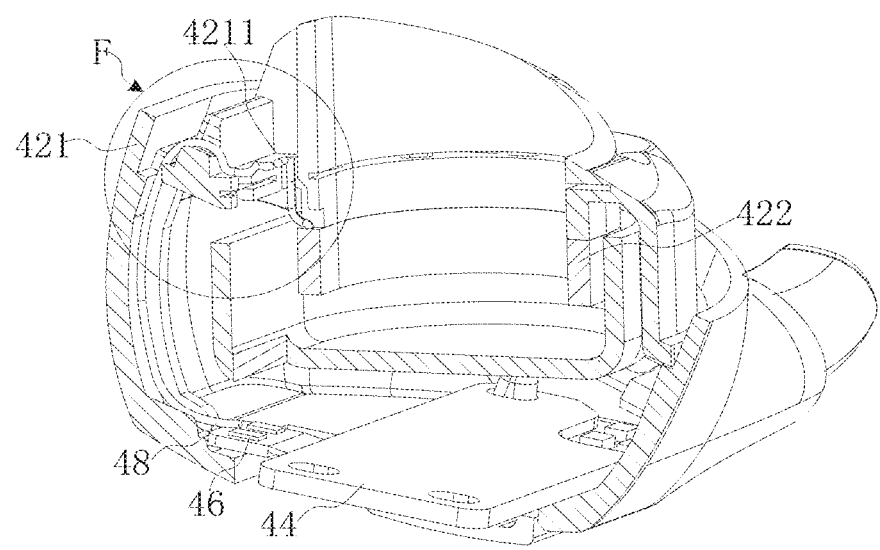
FIG. 5 is a partial sectional diagram illustrating a speaker according to some embodiments of the present disclosure.
Figure 6:
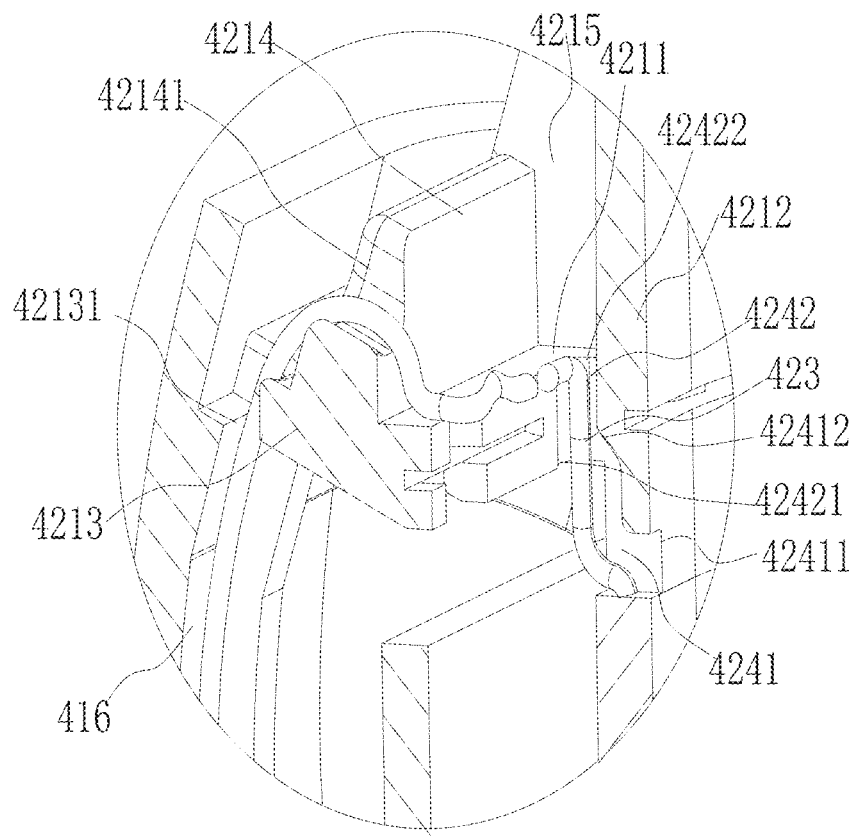
FIG. 6 is a partial enlarged diagram illustrating part F of a speaker in FIG. 5 according to some embodiments of the present disclosure.

FIG. 5 is a partial sectional diagram illustrating a speaker according to some embodiments of the present disclosure. FIG. 6 is a partial enlarged diagram illustrating part F of a speaker in FIG. 5 according to some embodiments of the present disclosure. Specifically, referring to FIG. 5 and FIG. 6, an earphone core may include a bracket 421, a coil 422, and an external wire 48. The bracket 421 may be used to support and protect the entire structure of the earphone core. In the embodiment, the bracket 421 may be disposed with a wiring groove 4211 used to accommodate a circuit of the earphone core.

The coil 422 may be disposed on the bracket 421 and have at least one inner lead(s) 423. One end of the inner lead(s) 423 may be connected to a main circuit in the coil 422 to lead out the main circuit and transmit an audio current to the coil 422 through the inner lead 423.

One end of the external wire 48 may be connected to the inner lead(s) 423. Further, the other end of the external wire 48 may be connected to a control circuit (not shown in the figure) to transmit the audio current through the control circuit to the coil 422 through the inner lead 423.

Specifically, during an assembly stage, the external wire 48 and the inner lead(s) 423 may need to be connected together by means of welding, or the like. Due to structural and other factors, after the welding is completed, a length of the wire may not be exactly the same as a length of a channel, and there may be an excess length part of the wire. And if the excess length part of the wire is not disposed reasonably, it may vibrate with the vibration of the coil 422, thereby making an abnormal sound and affecting the sound quality of the earphone core.

Further, at least one of the external wire 48 and the inner lead 423 may be wound and disposed in the wiring groove 4211. In an application scenario, the welding position between the inner lead 423 and the external wire 48 may be disposed in the wiring groove 4211, so that a portion of the external wire 48 and the inner lead 423 located near the welding position may be wound in the wiring groove 4211. In addition, in order to maintain stability, the wiring groove 4211 may be further filled with a sealant to further fix the wiring in the wiring groove 4211.

In the manner described above, the wiring groove 4211 may be disposed on the bracket 421, so that at least one of the external wire 48 and the inner lead 423 may be wound into the wiring groove 4211 to accommodate the excess length part of the wire, thereby reducing the vibration generated inside the channel, and reducing the influence of the abnormal sound caused by the vibration on the sound quality of the earphone core.

In one embodiment, the bracket 421 may include an annular main body 4212, a support flange 4213, and an outer blocking wall 4214. As used herein, the annular main body 4212, the support flange 4213, and the outer blocking wall 4214 may be integrally formed.

As used herein, the annular main body 4212 may be disposed inside the entire bracket 421 and used to support the coil 422. Specifically, a cross-section of the annular main body 4212 in a direction perpendicular to the radial direction of a ring of the annular main body 4212 may be consistent with the coil 422. The coil 422 may be disposed at an end of the annular main body 4212 facing the core housing. The inner side wall and the outer side wall of the annular main body 4212 may be flush with the inner side wall and the outer side wall of the coil 422, respectively, so that the inner side wall of the coil 422 and the inner side wall of the annular main body 4212 may be coplanar, and the outer side wall of the coil 422 and the outer side wall of the annular main body 4212 may be coplanar.

Further, the support flange 4213 may protrude on the outer side wall of the annular main body 4212 and extend along the outside of the annular main body 4212. Specifically, the support flange 4213 may extend outward in a direction perpendicular to the outer side wall of the annular main body 4212. As used herein, the support flange 4213 may be disposed at a position between two ends of the annular main body 4212. In the embodiment, the support flange 4213 may protrude around the outer side wall of the annular main body 4212 to form an annular support flange 4213. In other embodiments, the support flange 4213 may also be formed by protruding at a portion of the outer side wall of the annular main body 4212 according to needs.

The outer blocking wall 4214 may be connected to the support flange 4213 and spaced apart from the annular main body 4212 along the side of the annular main body 4212. As used herein, the outer blocking wall 4214 may be sleeved on the periphery of the annular main body 4212 and/or the coil 422 at intervals. Specifically, the outer blocking wall 4214 may be partially sleeved around the periphery of the annular main body 4212 and the coil 422 according to actual needs, or partially sleeved around the periphery of the annular main body 4212. It should be noted that, in the embodiment, a portion of the outer blocking wall 4214 close to the wiring groove 4211 may be sleeved on a portion of the periphery of the annular main body 4212. Specifically, the outer blocking wall 4214 may be disposed on a side of the support flange 4213 away from the core housing. As used herein, the outer side wall of the annular main body 4212, the side wall of the support flange 4213 away from the core housing, and the inner side wall of the outer blocking wall 4214 may together define the wiring groove 4211.

In one embodiment, a wiring channel 424 may be disposed on the annular main body 4212 and the support flange 4213. The inner lead(s) 423 may extend inside the wiring groove 4211 via the wiring channel 424.

As used herein, the wiring channel 424 may include a sub-wiring channel 4241 on the annular main body 4212 and a sub-wiring channel 4242 on the support flange 4213. The sub-wiring channel 4241 may be disposed through the inner side wall and the outer side wall of the annular main body 4212. A wiring port 42411 communicating with one end of the sub-wiring channel 4241 may be disposed on a side of the annular main body 4212 near the coil 422. A wiring port 42412 communicating with the other end of the sub-wiring channel 4241 may be disposed on a side of the core housing near the support flange 4213 facing the core housing. The sub-wiring channel 4242 may penetrate the support flange 4213 in a direction towards the outside of the core housing. The wiring port 42421 communicating with the end of the sub-wiring channel 4242 may be disposed on a side of the support flange 4213 facing the core housing. The wiring port 42422 communicating with the other end of the sub-wiring channel 4242 may be disposed on a side away from the core housing. As used herein, the wiring port 42412 and the wiring port 42421 may communicate through a space between the support flange 4213 and the annular main body 4212.

Further, the inner lead(s) 423 may enter the wiring port 42411, extend along the sub-wiring channel 4241, exit from the wiring port 42412 to enter a region between the annular main body 4212 and the support flange 4213, further enter the sub-wiring channel 4242 from the wiring port 42421, and extend into the wiring groove 4211 after passing through the wiring port 42422.

In one embodiment, the top of the outer blocking wall 4214 may be disposed with a slot 42141. The external wire 48 may extend inside the wiring groove 4211 through the slot 42141.

As used herein, one end of the external wire 48 may be disposed on the flexible circuit board 44. The flexible circuit board 44 may be specifically disposed on an inner side of the earphone core facing the core housing.

In the embodiment, the support flange 4213 may be further extended to a side of the outer blocking wall 4214 away from the annular main body 4212 to form an outer edge. Further, the outer edge may surround and abut on the inner side wall of the core housing. Specifically, the outer edge of the support flange 4213 may be disposed with a slot 42131, so that the external wire 48 on the inner side of the earphone core facing the core housing may be extended to the outer side of the support flange 4213 facing the core housing through the slot 42131, and then to the slot 42141, and enter the wiring groove 4211 through the slot 42141.

Further, the inner side wall of the core housing may be disposed with a guide groove 416. One end of the guide groove 416 may be located on one side of the flexible circuit board 44 and the other end may communicate with the slot 42131 and extend in a direction towards the outside of the core housing, so that the external wire 48 extends from the flexible circuit board to a second wiring groove 3331 by passing through the guide groove 416.

In one embodiment, the bracket 421 may further include two side blocking walls 4215 spaced along the circumferential direction of the annular main body 4212 and connected to the annular main body 4212, the supporting flange 4213, and the outer blocking wall 4214, thereby defining the wiring groove 4211 between the two side blocking walls 4215.

Specifically, the two side blocking walls 4215 may be oppositely disposed on the support flange 4213 and protrude towards the outer side of the core housing along the support flange 4213. As used herein, a side of the two side blocking walls 4215 facing the annular main body 4212 may be connected to the outer side wall of the annular main body 4212. A side away from the annular main body 4212 may terminate at the outer side wall of the outer blocking wall 4214. The wiring port 42422 and the slot 42141 may be defined between the two side blocking walls 4215. Therefore, the inner lead(s) 423 exiting from the wiring port 42422 and the external wire 48 entering through the slot 42141 may extend into the wiring groove 4211 defined by the two side blocking walls 4215.

Figure 7:
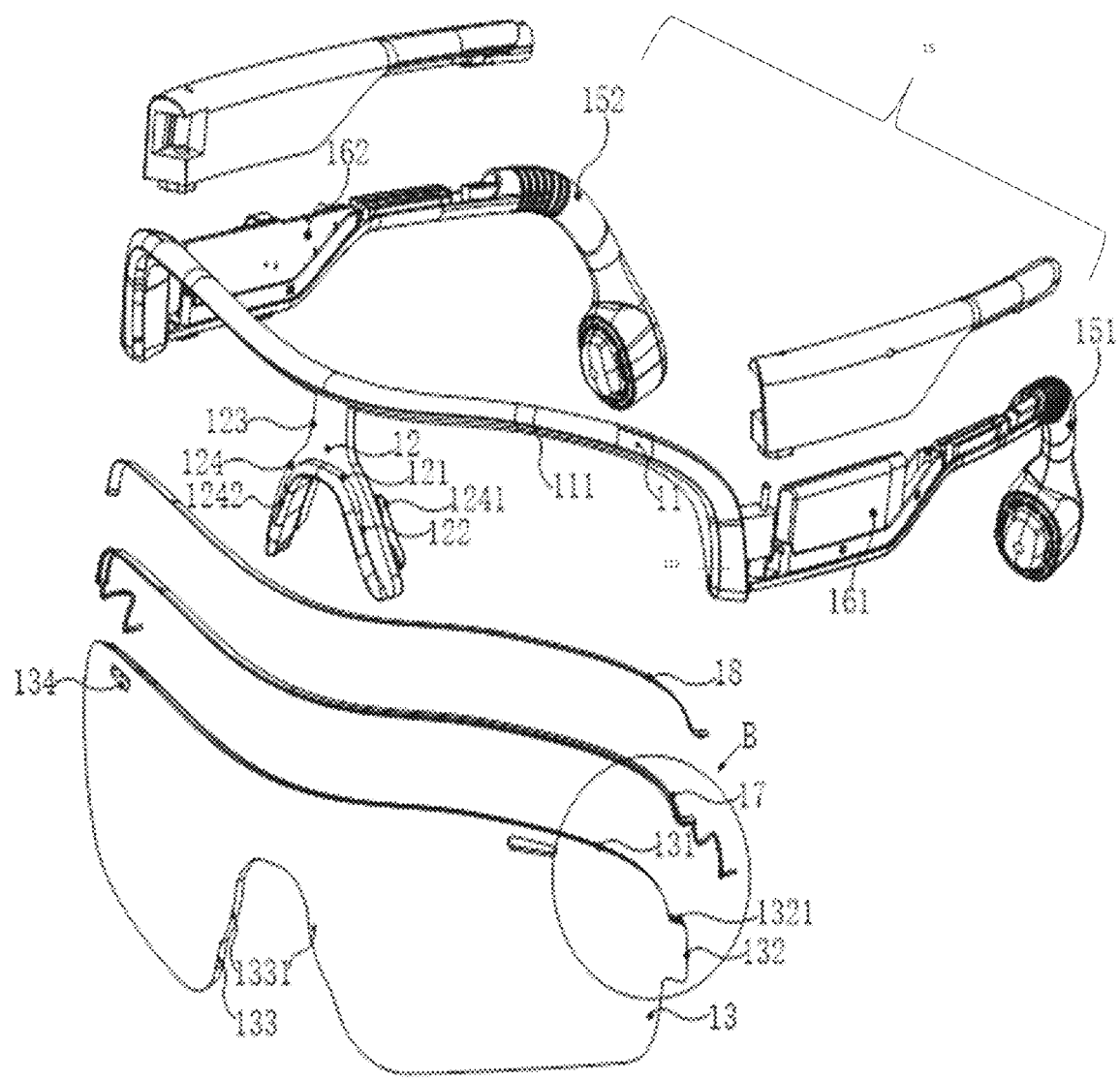
FIG. 7 is an exploded view illustrating a speaker according to some embodiments of the present disclosure.

FIG. 7 is a schematic diagram illustrating a structure of a speaker according to some embodiments of the present disclosure.

In some embodiments, the speaker may be glasses. In some embodiments, a fixing mechanism may be a glasses frame. The fixing mechanism may have at least one rotating shaft. The rotating shaft(s) may be used to connect a glasses rim and a glasses temple. The glasses rim and the glasses temple may rotate around the rotating shaft. The rotating shaft may have a rotating shaft wiring channel disposed along an axis. A connection wire may be disposed in the fixing mechanism. The connection wire may be an electrical connection wire. The connection wire may pass through the rotating shaft wiring channel. Two ends of the connection wire may extend into the glasses rim and the glasses temple, respectively. In some embodiments, the glasses temple at two sides may accommodate a control circuit and a battery component, respectively. The connection wire in the glasses rim may be electrically connect to the control circuit and the battery component. The connection wire may include an audio signal wire and an auxiliary signal wire. The connection wire may be electrically connected to a flexible circuit board (i.e., the flexible circuit board 106) in a core housing (i.e., the core housing 108), and electrically connected to an earphone core (i.e., the earphone core 102) and auxiliary function module(s) (i.e., an auxiliary function module 104) through the flexible circuit board.

In some embodiments, the glasses of the present disclosure may be glasses worn in people's daily life and at work to correct vision and protect eyes, or certain circuit structures and electronic components may be added into the glasses in order to further implement specific functions through the circuit structures and electronic components. Specifically, the glasses in the present disclosure may be smart glasses, virtual reality glasses, holographic glasses, augmented reality glasses, or glasses with other functional structures (e.g., glasses with a bone conduction earphone or an air conduction earphone).

In some embodiments, as shown in FIG. 7, the glasses frame may include a glasses rim 11, a nose pad 12, a glasses lens 13, and a glasses temple 15.

As used herein, the glasses rim 11 may be used to carry at least a portion of the glasses lens 13. The nose pad 12 may be used to support the glasses on the bridge of the nose of a user when the user wears the glasses.

The nose pad 12 may be disposed in the middle of the glasses rim 11 and integrally formed with the glasses rim 11. In the prior art, the glasses rim 11 and the nose pad 12 may be usually formed, respectively. The middle portion of the glasses rim 11 may be disposed with a structure connected to the nose pad 12. After molding, the nose pad 12 may be installed on the connection structure of the glasses rim 11. In the embodiment, the glasses rim 11 and the nose pad 12 may be integrally formed directly. Specifically, a corresponding mold may be used to implement the integral molding, for example, injection molding, or the like. In the embodiment, the glasses rim 11 and the nose pad 12 may not need to be further installed after the molding, thereby simplifying a manufacturing process of glasses.

In addition, the glasses lens 13 may also be integrally designed, and be fixed by the glasses rim 11 and the nose pad 12 in a clamping manner.

Further, the glasses rim 11 and the nose pad 12 may be respectively disposed with a structure for clamping the glasses lens 13. When the glasses are assembled, the integrally designed glasses lens 13 may be directly clamped to the integrally formed glasses rim 11 and nose pad 12 through the corresponding clamping structures.

In the embodiment, the glasses rim 11 and the nose pad 12 may be integrally formed, and the glasses lens 13 may also be integrally designed. Therefore, the entire structure of the glasses may be simple, and the manufacturing process of the glasses may be simplified.

Referring to FIG. 7, FIG. 7 is an exploded view illustrating the glasses according to an embodiment of the present disclosure. In the embodiment, the glasses lens 13 may include a top-side edge 131 and two outer edges 132 connected to both ends of the top-side edge 131 and disposed away from the nose pad 12. Each of the outer edges 132 may be respectively disposed with a first buckle 1321. The glasses rim 11 may be disposed with a first mounting groove 111 for receiving the top-side edge 131 and at least a portion of the outer edges 132, and a first buckle groove 112 for receiving the first buckle 1321 and communicating with the first mounting groove 111.

As used herein, when the glasses are in a wearing state, the top-side edge 131 may be located on the upper side of the glasses lens 13, the outer edge may be located on both sides of the glasses lens 13 near ears of the user, and the top-side edge 131 and the two outer edges 132 may be connected to each other. The first mounting groove 111 may be disposed on a side of the glasses rim 11 facing the glasses lens 13. A size of the first mounting groove 111 may match the top-side edge 131 and the two outer edges 132 of the corresponding glasses lens 13, so that the glasses lens 13 may be mounted on the glasses rim 11 by mounting the top-side edge 131 and at least the portion of the outer edge 132 in the first mounting groove 111.

Further, the first buckle 1321 may be formed by further extending at least a portion of the outer edge 131 of the glasses lens 13 toward two sides away from the nose pad 12. The first buckle groove 112 may be formed by recessing a position of the first mounting groove 111 corresponding to the first buckling 1321 in a direction away from the glasses lens 13. As used herein, the shape and size of the first buckle groove 112 may match the first buckle 1321, so that the glasses lens 13 may be further installed on the glasses rim 11 by clamping the first buckle 1321 into the first buckle groove 112.

It should be noted that at least a portion of the outer edge 132 may be located on the side of the first buckle 1321 away from the top-side edge 131, so that the first buckle 1321 and a portion of the glasses lens 13 near the two sides of the edge of the glasses lens 13 may be accommodated inside the first mounting groove 111. Therefore, the glasses lens 13 may be more firmly fixed on the glasses rim 11.

In one embodiment, the glasses lens 13 may further include an inner edge 133 abutting on the nose pad 12. The nose pad 12 may be disposed with a second mounting groove 121 for receiving the inner edge 133.

It should be noted that the glasses lens 13 may include a left glasses lens and a right glasses lens. The inner edge 133 of the glasses lens 13 may be disposed at a connection between the left glasses lens and the right glasses lens and a vicinity of the connection. Accordingly, the second mounting groove 121 and the first mounting groove 111 may be oppositely disposed so that the opposite sides of the glasses lens 13 may be respectively received and fixed in an accommodation space formed by the glasses rim 11 and the nose pad 12.

In one embodiment, two sides of the inner edge 133 may be respectively disposed with a second buckle 1331. The nose pad 12 may be further disposed with a second buckle groove 122 connected to the second mounting groove 121 and used to receive the second buckle 1331.

As used herein, the inner edge 133 may include two portions connected to each other, which may be respectively disposed on a side of the left glasses lens facing the right glasses lens and a side of the right glasses lens facing the left glasses lens. The nose pad 12 may also be divided into two portions, which may be respectively supported on the left and right nose bridges of the user when worn by the user. Accordingly, in the embodiment, the count of the second buckle groove 122 and the second buckle 1331 may also be two. The shape and size of the second buckle 1331 may match the corresponding second buckle groove 122 to install the second buckle 1331 in the corresponding second buckle groove 122.

In addition, the glasses lens 13 may be disposed with the inner edge 133 near both sides of the second buckle 1331, which may allow the vicinity of both sides of the second buckle 1331 to be installed in the second mounting groove 121. Therefore, the glasses lens 13 may be more firmly fixed on the nose pad 12.

By the approach, the glasses lens 13 may be respectively mounted on the glasses rim 11 and the nose pad 12 through the top-side edge 131, the outer edge 132, the inner edge 133, the first buckle 1321, and the second buckle 1331.

In an application scenario, the glasses lens 13 may be further disposed with vent holes 134. Specifically, the count of the vent holes may be two, and respectively disposed on the left and right sides of the glasses lenses 13 near the top-side edge 131. The arrangement of the vent holes 134 may facilitate air circulation of the inner and outer sides of the glasses lens 13 when the user wears the glasses, thereby reducing a phenomenon of fogging of the glasses lens 13 caused by local overheating due to reasons such as user movement, etc.

Figure 8:
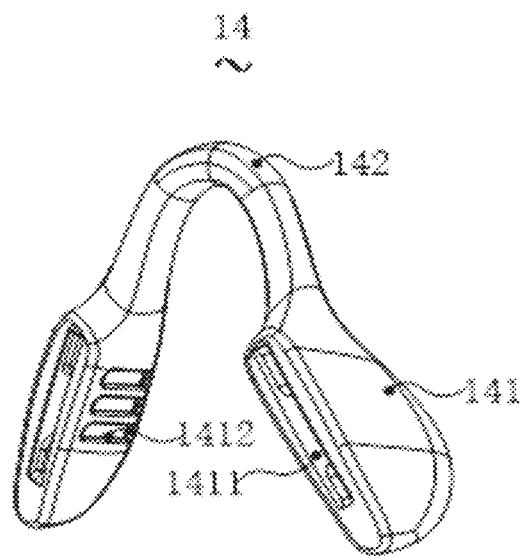
FIG. 8 is a schematic diagram illustrating a structure of a nose pad cover in a speaker according to some embodiments of the present disclosure.

Specifically, referring to FIG. 7 and FIG. 8 together, FIG. 7 is an exploded view illustrating a speaker according to some embodiments of the present disclosure, and FIG. 8 is a schematic diagram illustrating a structure of a nose pad cover of glasses according to some embodiments of the present disclosure. In one embodiment, the nose pad 12 may include a connection portion 123 connected to the glasses rim 11 on the side of the first mounting groove 111 near the user or away from the user in the wearing state, and two support portions 124 connected to the connection portion 123 in an inverted Y-shaped manner on a side of the connection portion 123 away from the glasses rim 11. The support portions 124 may be used to support the glasses on the nose of the user when wearing.

In an application scenario, the connecting portion 123 may be integrally connected to the glasses rim 11. When the user wears the glasses, the connecting portion 123 may be disposed on a side of the first mounting groove 111 close to the user.

A side of each of the support portions 124 protruding toward the nose bridge of the user may be disposed with I-shaped hook(s) 1241. The glasses may further include nose pad cover(s) 14 detachably sleeved on the hook(s) 1241.

As used herein, the nose pad cover 14 may be made of soft rubber. Specifically, the count of the I-shaped hook(s) 1241 may be two, corresponding to the left and right nose bridges of the user, respectively. The nose pad cover 14 may include two cover bodies 141 and a connecting portion 142 connecting to the two cover bodies 141. As used herein, the connecting portion 142 may be connected with the nose bridge of the user. The cover bodies 141 may be correspondingly disposed with I-shaped accommodation groove(s) 1411 matching the hook(s) 1241. Sides of the cover bodies 141 facing the nose bridge of the user may further be disposed with an anti-slippery portion 1412 including a number of grooves. In the embodiment, the nose pad cover 14 may be detachably disposed, thereby facilitating cleaning and replacement of the nose pad cover 14.

Further, in an embodiment, sides of the two support portions 124 back from the hook(s) 1241 may be protruded with strip shaped ribs 1242. The strip shaped ribs 1242 may cooperate with the two support portions 124 to form the second mounting groove 121 and the second buckle groove 122.

As used herein, the strip shaped ribs 1242 may be protruded along edges of the two support portions 124 away from the glasses lens 13, thereby forming the second mounting groove 121 for receiving the inner edge 133 of the glasses lens 13. At a position corresponding to the second buckle 1331 of the glasses lens 13, the strip shaped ribs 1242 may be further recessed to form the second buckle groove 122.

Referring to FIG. 7 together, in one embodiment, the glasses rim may further include the glasses temple 15, function component(s) 16, and a connection wire 17. As used herein, the glasses temple 15 may include a first glasses temple 151 and a second glasses temple 152. The function component(s) 16 may include a first function component 161 and a second function component 162.

Specifically, the first glasses temple 151 and the second glasses temple 152 may be respectively connected to the glasses rim 11. The first function component 161 and the second function component 162 may be respectively disposed on the first glasses temple 151 and the second glasses temple 152. At least one cavity may be disposed on the two glasses temples 15 to accommodate the corresponding function components 16.

The connection wire 17 may be disposed inside the first mounting groove 111 and between the bottom of the first mounting groove 111 and the top-side edge 131 of the glasses lens 13, and further extend to the first glasses temple 151 and the second glasses temple 152 to be electrically connected to the first function component 161 and the second function component 162.

In the embodiment, the function component(s) 16 respectively disposed in the two glasses temples 15 may need to be electrically connected through the connection wire 17 so that the glasses may implement a specific function. Specifically, in an application scenario, the first function component 161 may be a battery component, and the second function component 162 may be a control circuit component. The control circuit component may be connected to the battery component through the connection wire 17, so that the battery component may provide power to the control circuit component. Therefore, the control circuit component may implement the specific function.

In order to meet requirements of beauty and lightness of the glasses, the connection wire 17 may be disposed in the first mounting groove 111 along the top-side edge 131 of the glasses lens 13 and accommodated inside a space formed by the first mounting groove 111 and the top-side edge 131 of the glasses lens 13, so that the connection wire 17 may be neither exposed on the outer surface of the glasses nor occupy extra space. In an application scenario, the connection wire 17 may further extend along the outer edge 132 of the glasses lens 13 inside the first mounting groove 111.

Specifically, the glasses rim 11, the first glasses temple 151, and the second glasses temple 152 may be respectively disposed with a wiring channel communicated with each other, so that the connection wire 17 may enter the first glasses temple 151 and the second glasses temple 152 from the first mounting groove 111 of the glasses rim 11 through the corresponding wiring channels, thereby connecting the first function component 161 and the second function component 162.

In the embodiment, the connection wire 17 may have an electrical connection function. In other embodiments, the connection wire 17 may also have a mechanical connection function.

In the embodiment, the first function component 161 and the second function component 162 may be respectively disposed on the first glasses temple 151 and the second glasses temple 152. The connection wire 17 electrically connecting the first function component 161 and the second function component 162 may be disposed inside the first mounting groove 111 on the glasses rim 11 to receive the top-side edge 131 of the glasses lens 13, so that the connection wire 17 may be disposed between the bottom of the first mounting groove 111 and the top-side edge 131 of the glasses lens, and further extend to the first glasses temple 151 and the second glasses temple 152. Therefore, the connection wire 17 may not be exposed, and extra space may not need for the arrangement of the connection wire 17, so that the beauty and lightness of the glasses may be maintained.

Figure 9:
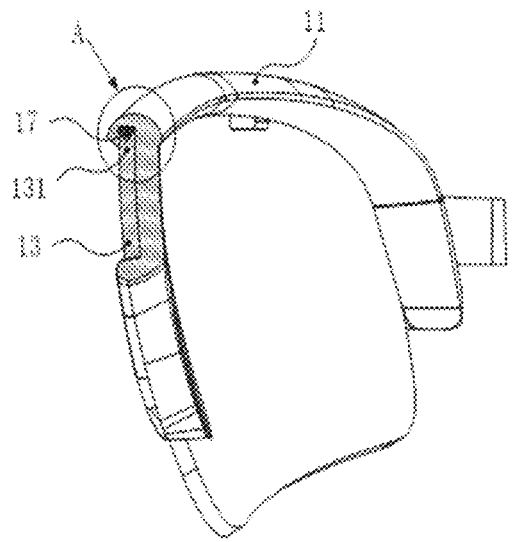
FIG. 9 is a partial sectional view illustrating a glasses rim and a glasses lens in a speaker according to some embodiments of the present disclosure.
Figure 10:
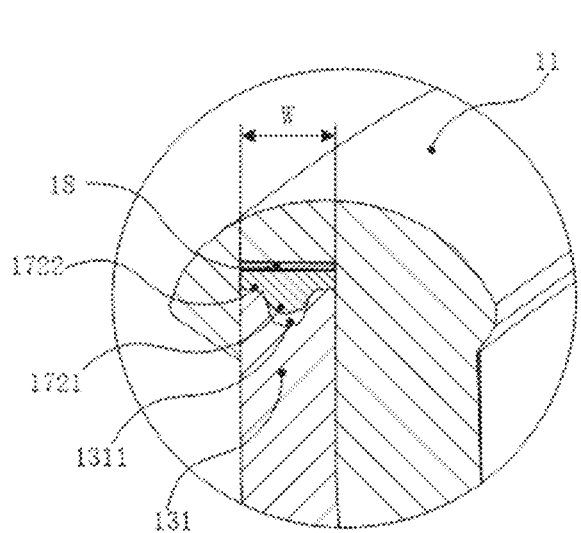
FIG. 10 is an enlarged view illustrating part A of a speaker in FIG. 9 according to some embodiments of the present disclosure.
Figure 11:
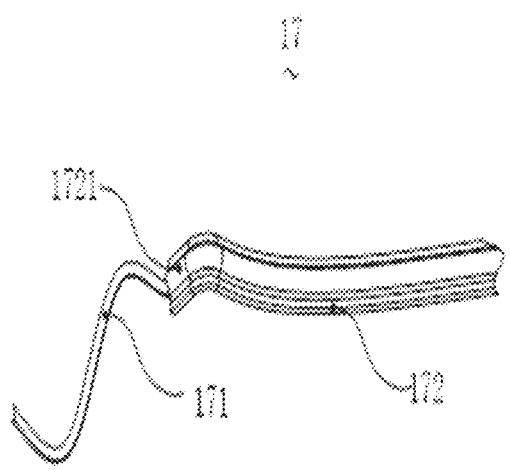
FIG. 11 is a partial structural diagram illustrating a connection wire in a speaker according to some embodiments of the present disclosure.

Referring to FIG. 9, FIG. 10, and FIG. 11 together, FIG. 9 is a partial sectional view illustrating a glasses rim and a glasses lens according to an embodiment of the present disclosure, FIG. 10 is an enlarged view illustrating part A in FIG. 9, and FIG. 11 is a partial structural diagram illustrating a connection wire according to an embodiment of the present disclosure. In the embodiment, the connection wire 17 may include a wire body 171 and a wire protection cover 172 wrapped around the periphery of the wire body 171. A sectional shape of the wire protection cover 172 may match a sectional shape of the first mounting groove 111, so that the wire protection cover 172 may be held in the first mounting groove 111 in a surface contact manner.

As used herein, the wire protection cover 172 may be made of soft rubber, so that the connection wire 17 may be bent to match the shape of the first mounting groove 111. It may be easy to understand that the wire body 171 may be thin. If the wire body 171 is directly installed in the first mounting groove 111, a contact area with the bottom of the first mounting groove 111 may be small, and it is difficult to be firmly fixed therein. In the embodiment, the wire protection cover 172 may be further wrapped around the periphery of the wire body 171, which, on the one hand, may play a role of protecting the wire body 171, and, on the other hand, increase the contact area between the connection wire 17 and the first mounting groove 111 by adjusting the surface area of the wire protection cover 172 to reliably fix the wire body 171 inside the first mounting groove 111.

Further, the sectional shape of the first mounting groove 111 may be a shape to allow the wire protection cover 172 to be held in the first mounting groove 111 with a large area of surface contact. For example, the shape may be U-shaped, rectangular, or wavy, and be not specifically limited herein. Correspondingly, the shape of a side of the wire protection cover 172 facing the bottom of the first mounting groove 111 may correspond to the shape, so that the wire protection cover 172 may be directly or indirectly fitted to the bottom of the first mounting groove 111.

In an application scenario, further referring to FIG. 7, an adhesive layer 18 may be disposed between the wire protection cover 172 and the glasses rim 11, so that the wire protection cover 172 may be fixed in the first mounting groove 111 through the adhesive layer 18.

As used herein, the adhesive layer 18 may be disposed on the bottom of the first mounting groove 111, or further extended to both sides and disposed on a side wall near the bottom of the first mounting groove 111, thereby making the adhesive layer 18 to wrap around the wire protection cover 172 to more firmly fix the connection wire 17 inside the first mounting groove 111.

Specifically, in the application scenario, a section of the first mounting groove 111 may be rectangular. The bottom of the first mounting groove 111 and a side of the wire protection cover 172 facing the bottom of the first mounting groove 111 may be both flat, and the adhesive layer 18 may be a double-sided adhesive layer disposed therebetween.

Further, in one embodiment, a side of the wire protection cover 172 facing the top-side edge 131 of the glasses lens 13 may be disposed with a protruding portion 1721 corresponding to the wire body 171. The top-side edge 131 of the glasses lens 13 may be disposed with a clearance slot 1311 for receiving the protruding portion 1721.

Specifically, the section of the wire body 171 may be circular. The wire protection cover 172 may be flush with the wire body 171 on the side of the wire body 171 facing the bottom of the first mounting groove 111. The side of the wire body 171 facing away from the bottom of the first mounting groove 111 may still present the shape of the wire body 171, thereby forming the corresponding protruding portion 1721.

Further, the top-side edge 131 of the glasses lens 13 may need to be further disposed inside the first mounting groove 111. In the embodiment, the top-side edge 131 may be further disposed with the clearance slot 1311 for receiving the protruding portion 1721, so that the connection wire 17 installed inside the first mounting groove 111 may be at least partially accommodated in the clearance slot 1311 corresponding to the top-side edge 131.

Further, the protruding portion 1721 may be located in a middle region of the wire protection cover 172 along a width direction of the wire protection cover 172 to form abutting portions 1722 on two sides of the protruding portion 1721. The two abutting portions 1722 may abut on the top-side edges 131 on two sides of the clearance slot 1311, respectively. As used herein, the width direction of the wire protection cover 172 may refer to a direction perpendicular to a direction of the wire protection cover 172 along the first mounting groove 111, specifically a direction indicated by W in FIG. 10.

It may be easy to understand that the depth of the first mounting groove 111 may be limited. If the top-side edge 131 of the glasses lens 13 is flush with the protruding portion 1721 of the connection wire 17, or a side of the wire protection cover 172 and the wire body 171 facing away from the bottom of the first mounting groove 111 is flush with the wire body 171, an insertion depth of the top-side edge 131 of the glasses lens 13 in the first mounting groove 111 may be reduced, which may disadvantage the stable installation of the glasses lens 13 in the glasses rim 11. In the embodiment, the top-side edge 131 of the glasses lens 13 may avoid a portion of the connection wire 17 through the clearance slot 1311, so that the top-side edge 131 may further extend towards the bottom of the first mounting groove 111 relative to the clearance slot 1311 and abut on the abutting portions 1722 on the two sides of the protruding portion 1721. Therefore, the space occupied by the connection wire 17 in the first mounting groove 111 may be reduced to a certain extent, so that the glasses lens 13 may be installed deeper inside the first mounting groove 111, thereby improving the stability of the glasses lens 13 in the glasses rim 11.

In an application scenario, the glasses rim 11 may be thin, and at least a portion of the protruding portion 1721 may be exposed outside the first mounting groove 111 to reduce the space of the glasses rim occupied by the connection wire 17, thereby reducing the depth of the first mounting groove 111 and improving the stability of the glasses rim 11.

Figure 12:
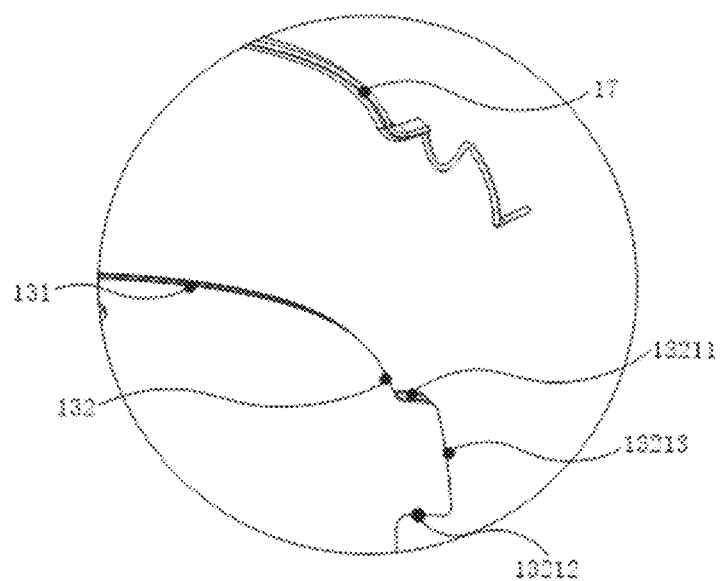
FIG. 12 is a partial structural schematic diagram illustrating part B of a speaker in FIG. 7 according to some embodiments of the present disclosure.

As used herein, further referring to FIG. 2 and FIG. 12, FIG. 12 is a partial structural diagram illustrating part B in FIG. 7 according to some embodiments of the present disclosure. In one embodiment, the first buckle 1321 may include a first sub-edge 13211, a second sub-edge 13212, and a third sub-edge 13213.

As used herein, the first sub-edge 13211 may be disposed adjacent to the top-side edge 131. The second sub-edge 13212 may be disposed away from the top-side edge 131 and opposite to the first sub-edge 13211. The third sub-edge 13213 may be connected to the first sub-edge 13211 and the second sub-edge 13212 on a side of the first sub-edge 13211 and the second sub-edge 13212 away from the glasses lens 13.

In the embodiment, the wire protection cover 172 may further extend to the first buckle groove 112 along the first sub-edge 13211.

In the way, the wire protection cover 172 may be held in the first mounting groove 111 and extend to the first buckle groove 112 to be hidden in the glasses rim 11. Therefore, when a user disassembles the glasses lens 13 during use, the wire protection cover 172 may not be exposed after the glasses lens 13 is disassembled to maintain the beauty of the glasses.

Further, when extending towards the first buckle groove 112, the wire protection cover 172 may end at a connection between the first sub-edge 13211 and the third sub-edge 13213. Certainly, the wire protection cover 172 may also not end and continue to extend along the wire body 171, as long as the wire protection cover 172 is not exposed when the glasses lens 13 is disassembled.

Figure 13:
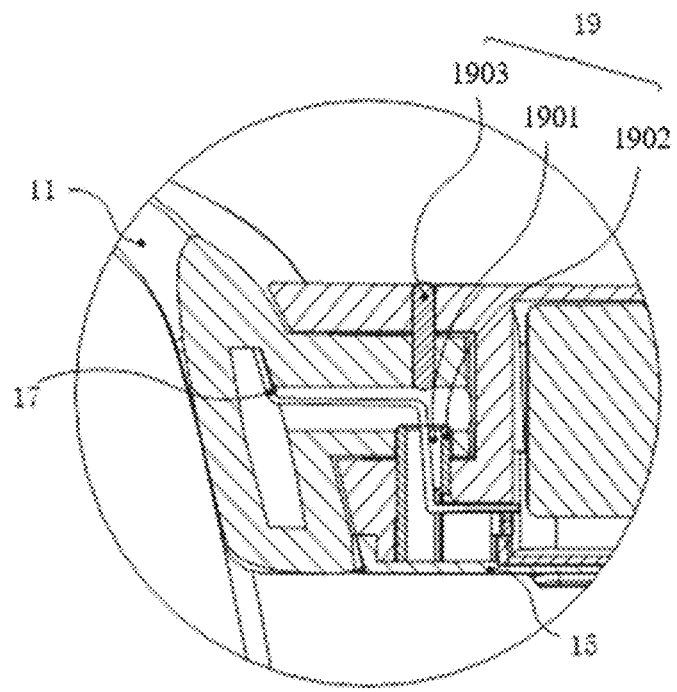
FIG. 13 is an enlarged sectional view illustrating a partial structure of glasses in a speaker according to some embodiments of the present disclosure.

Referring to FIG. 13 together, FIG. 13 is an enlarged sectional view illustrating a partial structure of glasses according to an embodiment of the present disclosure. In the embodiment, the glasses may further include rotating shaft(s) 19.

As used herein, the count of the rotating shaft(s) 19 may be two, and be respectively used to connect the glasses rim 11 and the two glasses temples 15 so that the glasses rim 11 and the glasses temples 15 may rotate relative to the rotating shaft 19. As used herein, the rotating shaft 19 may be disposed with a rotating shaft wiring channel 1901 in an axial direction. The connection wire 17 may be disposed inside the shaft wiring channel 1901 and extend to the glasses rim 11 and the glasses temples 15, respectively.

Specifically, in the embodiment, after the connection wire 17 passes through the rotating shaft wiring channel 1901, one end of the connection wire 17 may extend directly to one of the glasses temples 15, and the other end of the connection wire 17 may enter the glasses rim 11 and further extend to another one of the glasses temples 15 along the first mounting groove 111, thereby electrically connecting the two function components 16 located inside the two glasses temples 15, respectively.

In the embodiment, the connection wire 17 near the rotating shaft wiring channel may not include the wire protection cover 172. The rotating shaft wiring channel 1901 may pass through the rotating shaft 19.

It may be easy to understand that relative positions of structures near the rotating shaft 19 may change when the glasses rim 11 and the glasses temple 15 are folded. At this time, if the connection wire 17 located at the connection between the glasses rim 11 and the glasses temple 15 is directly disposed around the periphery of the rotating shaft 19, the connection wire 17 herein may be compressed or pulled, even deformed or broken with the folding of glasses rim 11 or glasses temples 15, which may affect the stability of the connection wire 17 and shorten the service life of the connection wire 17.

In the embodiment, the rotating shaft 19 may be disposed with the shaft wiring channel 1901 along the axial direction. The connection wire 17 located at the connection between the glasses rim 11 and the glasses temple 15 may pass through the shaft wiring channel 1901. Therefore, when the glasses rim 11 and the glasses temple 15 are folded, the connection wire 17 located inside the rotating shaft wiring channel 1901 may only generate a certain amount of rotation with the rotation of the rotating shaft 19 to reduce the folding, compressing or pulling of the connection wire 17, thereby protecting the connection wire 17 to a certain extent, improving the stability of the connection wire 17, and extending the service life of the connection wire 17.

As used herein, in the embodiment, an inner diameter of the rotation shaft wiring channel 1901 may be larger than an outer diameter of the connection wire 17. For example, the inner diameter of the shaft wiring channel 1901 may be twice the outer diameter of the connection wire 17. Accordingly, a binding effect of the inner side wall of the axis wiring channel 1901 on the connection wire 17 may be reduced, thereby reducing the rotation of the connection wire 17 when the glasses rim 11 and the glasses temple 15 are folded.

Figure 14:
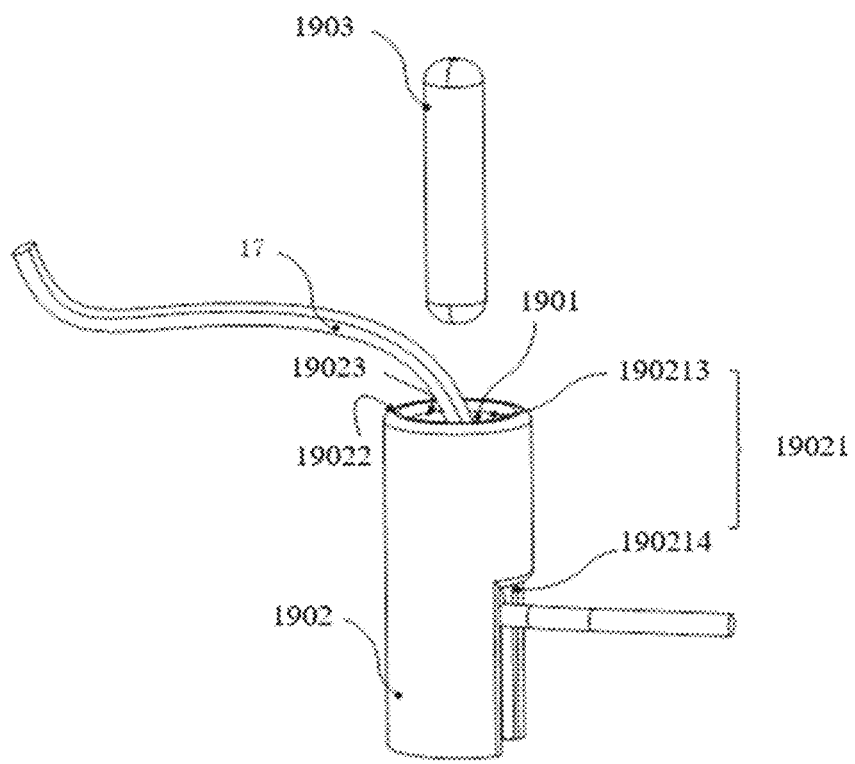
FIG. 14 is a schematic structural diagram illustrating a rotating shaft component and a connection wire in a speaker according to some embodiments of the present disclosure.

Referring to FIG. 13 and FIG. 14 together, FIG. 14 is a schematic structural diagram illustrating a rotating shaft and a connection wire of glasses according to an embodiment of the present disclosure. In the embodiment, the rotating shaft 19 may include a first rotating shaft 1902. Two ends of the first rotating shaft 1902 may be respectively connected to the glasses rim 11 and the glasses temple 15. The rotating shaft wiring channel 1901 may be disposed along an axial direction of the first rotating shaft 1902. The shaft wiring channel 1901 may communicate with the outside through a wiring port 19021 disposed on at least one end surface of the first rotating shaft 1902. The connection wire 17 may extend to the glasses rim 11 or the glasses temples 15 through the wiring port 19021.

It should be noted that, in the embodiment, the first rotating shaft 1902 may be rotatably connected to one of the glasses rim 11 and the glasses temples 15, and fixedly connected to another, so that the glasses rim 11 and the glasses temples 15 may be rotatably connected around the first rotating shaft 1902.

Specifically, in the embodiment, the rotating shaft wiring channel 1901 may be disposed inside the first rotating shaft 1902, and further communicate with the outside through the wiring port 19021.

Specifically, the rotating shaft wiring channel 1901 may penetrate at least one end surface of the first rotating shaft 1902 to form the wiring port 19021 of the rotating shaft wiring channel 1901. Therefore, the connection wire 17 may extend from the shaft wiring channel 1901 through the at least one end surface of the first rotating shaft 1902, and then extend to the glasses rim 11 or the glasses temples 15. It may be easy to understand that the periphery of the end surface of the first rotating shaft 1902 may have a relatively large movement space. The connection wire 17 extending from the end surface of the first rotating shaft 1902 may be accommodated inside the movement space. And if the first rotating shaft 1902 at the end face is rotatably connected to the corresponding glasses rim 11 or glasses temple 15, when the glasses rim 11 and the glasses temple 15 fold and rotate, the movement space may be appropriately buffered a twist of the connection wire 17 near the wiring port 19021 on the end surface with the rotation of the first rotating shaft 1902, thereby further reducing the twisting degree of the connection wire 17 and improving the stability of connection wire 17.

Figure 15:
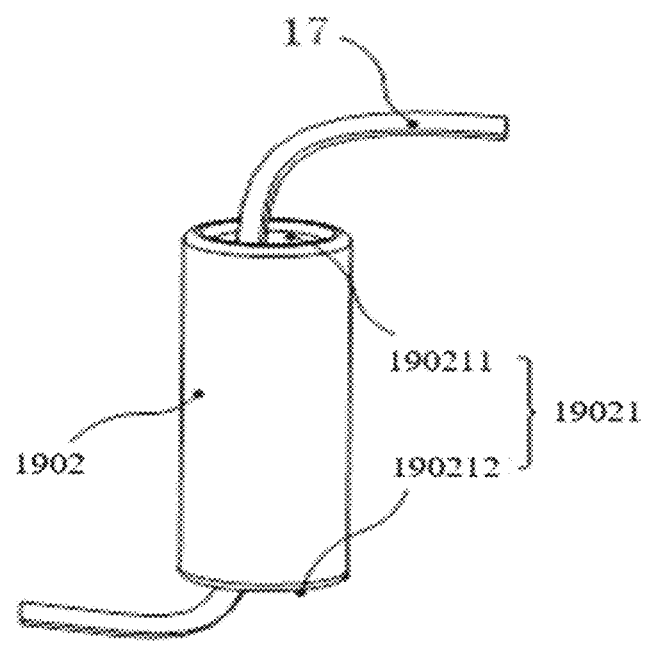
FIG. 15 is a schematic structural diagram illustrating a first rotating shaft in a speaker according to some embodiments of the present disclosure.

Referring to FIG. 15, FIG. 15 is a schematic structural diagram illustrating a first rotating shaft of glasses according to an embodiment of the present disclosure. In the embodiment, the wiring port 19021 may include a first wiring port 190211 and a second wiring port 190212 respectively disposed on two ends of the first rotating shaft 1902. The rotating shaft wiring channel 1901 may communicate with the outside through the two wiring ports 19021, so that the connection wire 17 may pass through the two ends of the first rotating shaft 1902 and extend to the glasses rim 11 and the glasses temple 15 through the first wiring port 190211 and the second wiring port 190212, respectively.

In other words, in the application scenario, the connection wire 17 at the connection between the glasses rim 11 and the glasses temple 15 may be disposed inside the rotating shaft wiring channel 1901 in the first rotating shaft 1902, and extend from the rotating shaft wiring channel 1901 through the two ends of the first rotating shaft 1902, respectively. At this time, since large movement spaces exist on the periphery of two end surfaces of the first rotating shaft 1902, the connection wire 17 extending from the two end surfaces of the first rotating shaft 1902 may only move or twist slightly without compressing or deforming when the relative rotation occurs between the glasses rim 11 and the glasses temple 15.

Referring to FIG. 14, in the embodiment, the wiring port 19021 may include a first wiring port 190213 and a second wiring port 190214. As used herein, the first wiring port 190213 may be disposed on an end surface of the first rotating shaft 1902, and the second wiring port 190214 may be disposed on a side wall of the first rotating shaft 1902. Therefore, one end of the shaft wiring channel 1901 may penetrate the end surface of the first rotating shaft 1902 in the axial direction through the first wiring port 190213, and the other end may penetrate the side wall of the first rotating shaft 1902 through the second wiring port 190214, and then communicate with the outside. The connection wire 17 may extend to the glasses rim 11 and the glasses temple 15 through the first wiring port 190213 and the second wiring port 190214, respectively.

Similarly, a large movement space may be disposed near the end face of the first rotating shaft 1902 of the first wiring port 190213. When a relative movement occurs between the glasses rim 11 and the glasses temple 15, the connection wire 17 near the first wiring port 190213 may only undergo a relative shift, or a small twist.

In an application scenario, the first rotating shaft 1902 may be fixedly connected to one of the glasses rim 11 and the glasses temple 15 disposed near the second wiring port 190214, and rotatably connected to another of the glasses rim 11 and the glasses temple 15 disposed near the first wiring port 190213. That is, the first rotating shaft 1902 may be rotatably connected to one of the glasses rim 11 or the glasses temple 15 at the wiring port 19021 disposed on the end surface. The first rotating shaft 1902 may be fixedly connected to another of the glasses rim 11 or the glasses temple 15 at the wiring port 19021 disposed on the side wall.

In an application scenario, the first rotating shaft 1902 may be closed to the glasses rim 11 at the first wiring port 190213, and rotatably connected to the glasses rim 11. The first rotating shaft 1902 may be closed to the glasses temple 15 at the second wiring port 190214, and fixedly connected to the glasses temple 15.

It should be noted that, in this application scenario, the first rotating shaft 1902 is rotatably connected to the glasses rim 11, and the relative rotation between the glasses rim 11 and the glasses temple 15 may cause the relative movement of the connection wire 17 at the first wiring port 190213. However, since the first wiring port 190213 is disposed on the end surface of the first rotating shaft 1902, similar to the embodiment described above, the end surface of the first rotating shaft 1902 may have a large movement space. When the glasses rim 11 and the glasses temple 15 are folded and rotated, and the connection wire 17 near the wiring port 19021 on the end surface is twisted to a certain extent with the rotation of the first rotating shaft 1902, the movement space may be appropriately buffered, and the twist may be turned into a shift or a small twist, without compressing or pulling the connection wire, thereby improving the stability of the connection wire and extending the service life of the connection wire.

In addition, the first rotating shaft 1902 may be fixedly connected to the glasses temple 15 at the second wiring port 190214. It may be easy to understand that the glasses temple 11 and the first rotating shaft 1902 may be synchronized when the relative rotation occurs between the glasses rim 11 and the glasses temple 15. Hence, the connection wire 17 in the shaft wiring channel 1901 may extend through the second wiring port 190214 into the connection wire 17 of the glasses temple 15 without twisting, compressing, or pulling. Therefore, at this time, the second wiring port 190214 may be disposed on the end surface of the first rotating shaft 1902 or on the side wall of the first rotating shaft 1902. The relative rotation between glasses rim 11 and glasses temple 15 may not cause the twisting, compressing, pulling, etc., of the connection wire 17 herein.

In other embodiments, if the first rotating shaft 1902 and the glasses temple 15 are rotatably connected at the second wiring port 190214, the relative rotation between thereof may allow the connection wire 17 to move, which may be constrained by the side wall of the first rotating shaft at the second wiring port 190214, so that the connection wire 17 may be compressed between the side wall of the first rotating shaft and the glasses temple 15.

If the first rotating shaft 1902 is near the glasses temple 15 at the first wiring port 190213 and rotatably connected to the glasses temple 15, the first rotating shaft 1902 may be near the glasses rim 11 at the second wiring port 190214 and fixedly connected to the glasses rim 11. For the same reason, when the glasses rim 11 and the glasses temple 15 are folded, the connection wire 17 inside the rotating shaft wiring channel 1901 and near the first wiring port 190213 and the second wiring port 190214 may be still only slightly twisted or moved.

Referring to FIG. 14, in one embodiment, the rotating shaft 19 may further include a second rotating shaft 1903 coaxial with and spaced from the first rotating shaft 1902.

In the embodiment, the second rotating shaft 1903 may be disposed on a side of the first rotating shaft 1902 near the first wiring port 190213. Certainly, in other embodiments, the second rotating shaft 1903 may also be disposed on a side of the first rotating shaft 1902 closed to the second wiring port 190214.

Figure 16:
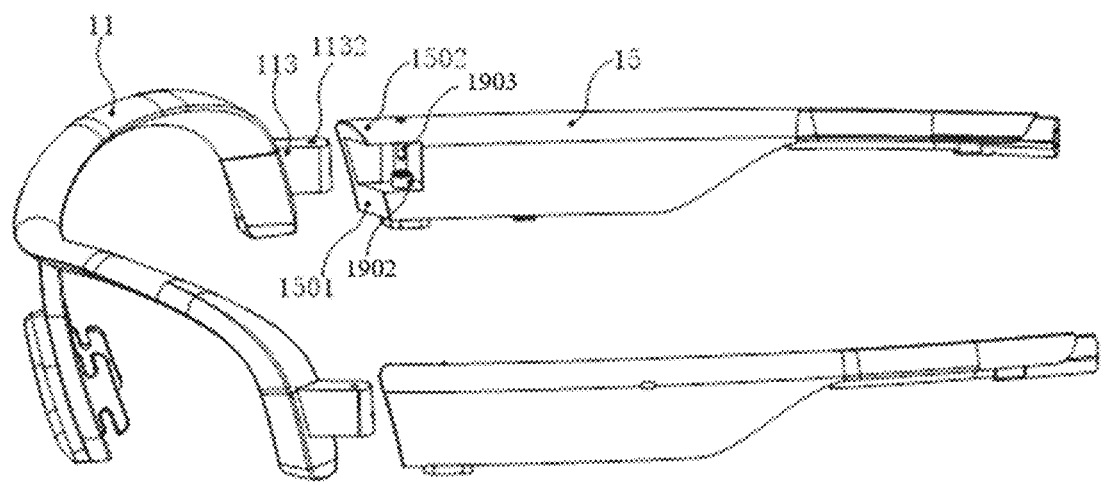
FIG. 16 is a partial exploded view illustrating a speaker according to some embodiments of the present disclosure.

Referring to FIG. 16, FIG. 16 is a partial exploded view illustrating glasses according to an embodiment of the present disclosure. In the embodiment, the glasses rim 11 may include first lug(s) 113. Specifically, the count of the first lug(s) 113 may be two, and be respectively disposed at two ends of the glasses rim 11 connecting to the two glasses temples 15 and protrude towards the corresponding glasses temples 15.

The glasses temple 15 may include a second lug 1501 and a third lug 1502 disposed at intervals. As used herein, the second lug 1501 and the third lug 1502 may face ends of the glasses rim 11 connected to the glasses temple 15 at which the lugs are located. In addition, when the user wears the glasses, the second lug 1501 and the third lug 1502 may be connected to a side away from the head of the user, thereby making the glasses more overall and more beautiful in appearance. In an application scenario, the second lug 1501 and the third lug 1502 disposed at intervals may be formed by disposing a groove in the middle of an end of the glasses temple 15 facing the glasses rim 11.

Further, ends of the first rotating shaft 1902 and the second rotating shaft 1903 closed to each other may be connected to the first lug 113. Ends of the first rotating shaft 1902 and the second rotating shaft 1903 away from each other may be connected to the second lug 1501 and the third lug 1502, respectively, so as to maintain the first lug 113 between the second lug 1501 and the third lug 1502.

As used herein, referring to FIG. 14 continuously, in one embodiment, the first wiring port 190213 may be disposed on an end surface of the first rotating shaft 1902 near the second rotating shaft 1903. The second wiring port 190214 may be disposed on a side wall of the first rotating shaft near the second lug 1501. The first rotating shaft may be rotatably connected to the first lug 113 and fixedly connected to the second lug 1501.

Specifically, in the embodiment, one end of the connection wire 17 inside the rotating shaft wiring channel 1901 may extend from the first wiring port 190213 and pass through an interval between the first rotating shaft 1902 and the second rotating shaft 1903. Further, in an application scenario, the first lug 113 may be disposed with a wiring channel connected to the first wiring port 190213, so that the connection wire 17 may further enter the glasses rim 11 from the first lug 113.

In addition, the other end of the connection wire 17 inside the rotating shaft wiring channel 1901 may extend from the second wiring port 190214. Further, in an application scenario, the third lug 1502 may be disposed with a wiring channel communicating with the second wiring port 190214, so that the connection wire 17 may further enter the glasses temple 15 through the wiring channel of the third lug 1502.

As used herein, the second wiring port 190214 may be a through-hole disposed on a side wall of the first rotating shaft 1902, and communicated with the rotating shaft wiring channel 1901 without penetrating an end of the first rotating shaft 1902. In the embodiment, the second wiring port 190214 may be further penetrated along the side wall of the first rotating shaft 1902 to an end of the first rotating shaft 1902 away from the first wiring port 190213. It may be easy to understand that, in the embodiment, the second wiring port 190214 may have a larger space. Therefore, when the connection wire 17 is moved for some reason, the restriction on the connection wire 17 may be further reduced, and the damage to the side wall of the first rotating shaft 1902 may be further reduced.

Figure 17:
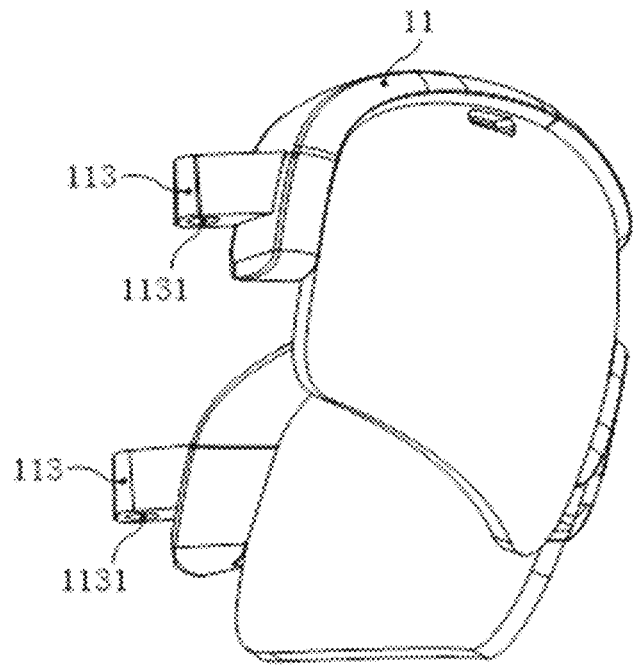
FIG. 17 is a schematic structural diagram illustrating a glasses rim and a glasses lens in a speaker according to some embodiments of the present disclosure.
Figure 18:
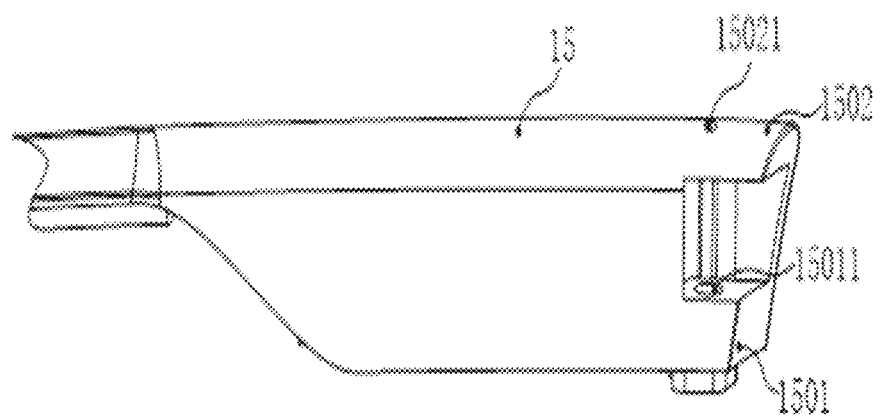
FIG. 18 is a schematic diagram illustrating a partial structure of a glasses temple in a speaker according to some embodiments of the present disclosure.

Referring to FIG. 16, FIG. 17, and FIG. 18 together, FIG. 17 is a schematic structural diagram illustrating a glasses rim and a glasses lens of glasses according to an embodiment of the present disclosure, and FIG. 18 is a partial structural schematic diagram illustrating a glasses temple of glasses according to an embodiment of the present disclosures. In the embodiment, the first lug 113 and the second lug 1501 may be coaxially disposed with a first accommodating hole 1131 and a second accommodating hole 15011, respectively. Sizes of the first accommodating hole 1131 and the second accommodating hole 15011 may be set to allow the first rotating shaft 1902 to be inserted into the first accommodating hole 1131 from the outside of the glasses temple 15 through the second accommodating hole 15011, such that the first rotating shaft 1902 may be in an interference fit with the second accommodating hole 15011 and in a clearance fit with the first accommodating hole 1131.

Specifically, the second accommodating hole 15011 may be a through-hole penetrating the second lug 1501. The first accommodating hole 1131 may correspond to the second accommodating hole 15011 and penetrate at least a portion of the first lug 113. As used herein, an inner diameter of the first accommodating hole 1131 may be larger than the second accommodating hole 15011. An outer diameter of the first rotating shaft 1902 may be between the first accommodating hole 1131 and the second accommodating hole 15011. Therefore, the first rotating shaft 1902 may be fixedly connected to the glasses temple 15 and rotatably connected to the glasses rim 11 so that the glasses rim 11 and the glasses temple 15 may be rotated around the first rotating shaft 1902 to be folded or unfolded.

Further, in an embodiment, the first lug 113 and the third lug 1502 may be coaxially disposed with a third accommodating hole 1132 and a fourth accommodating hole 15021, respectively. Sizes of the third accommodating hole 1132 and the fourth accommodating hole 15021 may be set to allow the second rotating shaft 1903 to be inserted into the third accommodating hole 1132 from the outside of the glasses temple 15 via the fourth accommodating hole 15021, such that the second rotating shaft 1903 may be in an interference fit with the third accommodating hole 1132 and in a clearance fit with the fourth accommodating hole 15021, or the second rotating shaft 1903 may be in a clearance fit with the third accommodating hole 1132 and in an interference fit with the fourth accommodating hole 15021.

In the embodiment, the third accommodating hole 1132 and the fourth accommodating hole 15021 may be coaxial with both the first accommodating hole 1131 and the second accommodating hole 15011. As used herein, the third accommodating hole 1132 may penetrate at least a portion of the first lug 113. In one application scenario, the first accommodating hole 1131 and the third accommodating hole 1132 may be coaxially penetrated. Specifically, as described in the above embodiment, the first lug 113 of the glasses rim 11 may be disposed with a wiring channel connected to the first wiring port 190213. The first accommodating hole 1131 and the third accommodating hole 1132 may be respectively disposed on both sides of the wiring channel located inside the first lug 113 and both pass through the wiring channel. The fourth accommodating hole 15021 may penetrate the third lug 1502. As used herein, the outer diameter of the second rotating shaft 1903 may be between the inner diameter of the third accommodating hole 1132 and the inner diameter of the fourth accommodating hole 15021. The inner diameter of the third accommodating hole 1132 may be larger than the fourth accommodating hole 15021. Alternatively, the inner diameter of the fourth accommodating hole 15021 may be larger than the third accommodating hole 1132. Therefore, the second rotating shaft 1903 may be fixedly connected to the glasses temple 15 and rotatably connected to the glasses rim 11, or the second rotating shaft 1903 may be fixedly connected to the glasses rim 11 and rotatably connected to the glasses temple 15, so that the glasses rim 11 and the glasses temple 15 may be rotated around the first rotating shaft 1902 to be folded or unfolded.

In one embodiment, the second rotating shaft 1903 may be a solid shaft, and the diameter may be less than that of the first rotating shaft 1902. In the wearing state, the second rotating shaft 1903 may be located on the upper side of glasses temple 15, and the first rotating shaft may be located on the lower side of glasses temple 15.

It should be noted that, since the rotating shaft wiring channel 1901 may be disposed inside the first rotating shaft 1902, the outer diameter of the first rotating shaft 1902 may be larger, which may adversely satisfy aesthetic needs of the user. Therefore, in the embodiment, the second rotating shaft 1903 having a smaller outer diameter may be further disposed. Hence, when the user wears the glasses, the second rotating shaft 1903 may be disposed on an upper portion that is easily found, and the first rotating shaft 1902 may be disposed on a lower portion that is not easily observed. Since the outer diameter of the second rotating shaft 1903 is smaller, the overall aesthetic effect of the glasses may be improved to a certain extent.

Certainly, in other embodiments, the first rotating shaft 1902 and the second rotating shaft 1903 may also be other cases. For example, the second rotating shaft 1903 may also be a hollow shaft, and the diameter of the second rotating shaft 1903 may be larger than the diameter of the first rotating shaft 1902. Alternatively, in the wearing state, the second rotating shaft 1903 may be disposed on a lower side of the glasses temple 15, and the first rotating shaft 1902 may be disposed on an upper side of the glasses temple 15, or the like, and be not limited herein.

In addition, referring to FIG. 14, a connection between an end surface 19022 of the first rotating shaft 1902 for disposing the first wiring port 190213 and an inner wall surface 19023 of the first rotating shaft 1902 for defining the rotating shaft wiring channel 1901 may be arc-shaped. It may be easy to understand that, when the rotation between the glasses rim 11 and the glasses temple 15 through the rotating shaft 19 occurs, since the first rotating shaft 1902 and the glasses rim 11 are rotatably connected, the connection wire 17 at the first wiring port 190213 may be moved. In the embodiment, the connection between the end surface 19022 of the first rotating shaft 1902 and the inner wall surface 19023 may be arc-shaped. Therefore, when the connection wire 17 at the first wiring port 190213 moves and contacts with the first rotating shaft 1902, the connection wire 17 may be avoided to be cut if the connection is too sharp, thereby further protecting the connection wire 17.

In an application scenario, a connection between the end surface of the first rotating shaft 1902 for disposing the second wiring port 190214 and the inner wall surface 19023 of the first rotating shaft 1902 for defining the rotating shaft wiring channel 1901 may also be arc-shaped. Similarly, in this way, the connection wire 17 may be further protected.

In some embodiments, referring to FIG. 1, the speaker of the glasses may include the earphone core 102 and the core housing 108. The speaker of the glasses may be a standalone earphone that can be used directly, or an earphone plugged into an electronic device for use. In an application scenario, the bone conduction earphone in this embodiment is one of the speakers in the above implementation of glasses.

For illustration purposes only, an audio earphone core may be further described below based on the bone conduction earphone. It should be noted that the content described below may also be applied to an air conduction speaker without departing from these principles.

Figure 19:
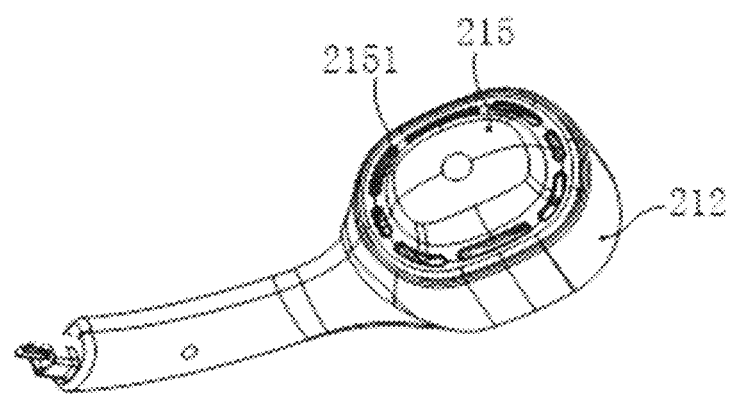
FIG. 19 is a schematic diagram illustrating a structure of an earphone according to some embodiments of the present disclosure.
Figure 20:
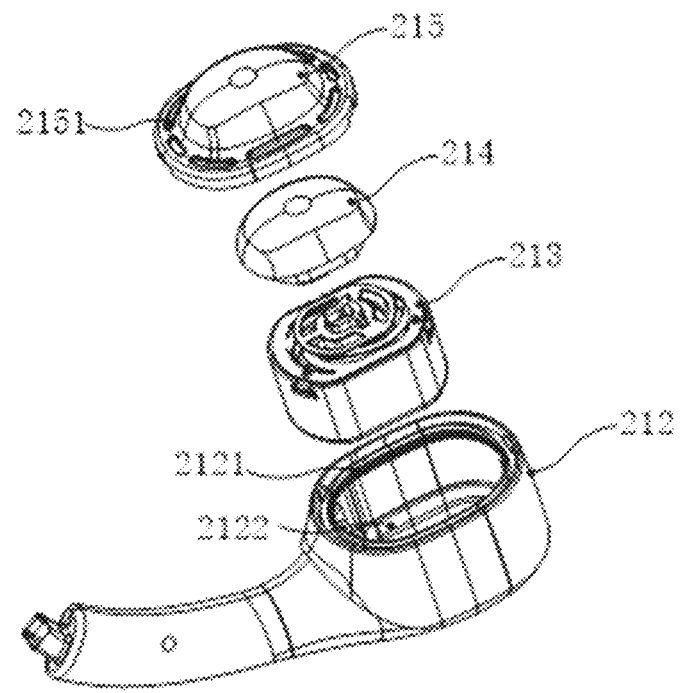
FIG. 20 is a exploded view illustrating a structure of an earphone according to some embodiments of the present disclosure.
Figure 30:
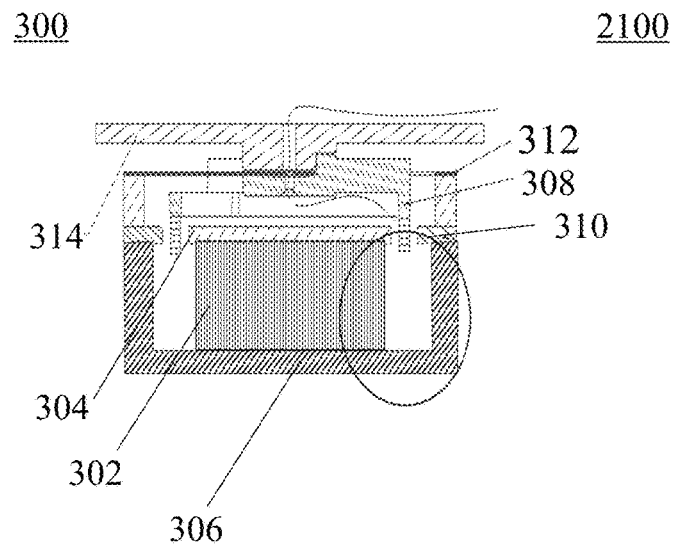
FIG. 30 is a schematic diagram illustrating a structure of a bone conduction speaker according to some embodiments of the present disclosure.

In some embodiments, FIG. 19 is a schematic structural diagram illustrating an earphone according to an embodiment of the disclosure. FIG. 20 is an exploded structural diagram illustrating an earphone according to an embodiment of the disclosure. FIG. 30 is a sectional view along a symmetry plane of the earphone in FIG. 19. In this embodiment, the speaker may include an earphone housing 212, a transducing device 213, a vibration transmission plate 214, and a vibration transmission layer 215. The earphone housing 212 and the vibration transmission layer 215 herein may be equivalent to the vibration transmission layer 2320 in FIG. 25 of this application. In some embodiments, the transducing device 213 may include a vibration component and a magnetic circuit component.

As used herein, the earphone housing 212 may be configured to define an earphone accommodating chamber 2122 with an opening 2121, which may be used to accommodate related functional structures of an earphone. For example, the transducing device 213 may be accommodated in the earphone accommodating chamber 2122.

Specifically, the transducing device 213 may be configured to generate vibrations according to audio signals. As used herein, the audio signal may be an audio signal directly stored in the transducing device 213, or an audio signal input to the transducing device 213 from a storage device or a communication circuit through a signal line or the like, which is not limited herein.

Further, the vibration transmission plate 214 may be connected to the transducing device 213, and exposed through the opening 2121 of the earphone accommodating chamber 2122 to transmit the vibration. Specifically, the transducing device 213 may convert the audio signal into a corresponding vibration signal, and further transmit the vibration signal through the vibration transmission plate 214 to transmit the vibration signal from the accommodating chamber 2122 of the earphone housing 212 to an outside of the earphone housing 212. The vibration signal may be further transmitted to users who directly or indirectly contact the vibration transmission plate 214.

In addition, the vibration transmission layer 215 may be coated on an outer surface of the vibration transmission plate 214, so that the vibration signal generated by the transducing device 213 may be transmitted to a transmission layer of the vibration transmission plate 214 through the vibration transmission plate 214, and then the vibration signal may be transmitted to the user by contacting a specific part of the user. In this embodiment, the vibration transmission layer 215 may be further connected to the earphone housing 212 to cover the opening 2121 of the earphone accommodating chamber 2122, thereby protecting elements in the accommodating chamber 2122 of the earphone housing 212. Specifically, the vibration transmission layer 215 may be connected to the earphone housing 212 by means of insertion, buckling, bonding, etc. For example, the vibration transmission layer 215 may be buckled on a periphery of the earphone housing 212 by buckling.

In an application scenario, the vibration transmission plate 214 may be made of a hard material, such as hard plastic, to better transmit the vibration signal. The vibration transmission layer 215 may be made of a soft material, such as soft silica gel, to coat the outer surface of the vibration transmission plate 214. Therefore, the bone conduction earphone may further transmit the vibration signal to the user through the vibration transmission layer 215, so that the user may have a better tactile feeling when using the bone conduction earphone.

It should be noted that the vibration transmission layer 215 in this embodiment is coated on the outer surface of the vibration transmission plate 214 by an integral injection molding manner. Therefore, the vibration transmission layer 215 and the vibration transmission plate 214 may be integrated. Further, when assembling the earphone, there is no need to further glue the vibration transmission layer 215 and the vibration transmission plate 214 together by means such as glue, thereby simplifying assembly operations of the earphone. At the same time, the vibration transmission plate 214 and the vibration transmission layer 215 may be integrated, which may avoid an adverse effect of an uneven thickness of a glue layer between the vibration transmission plate 214 and the vibration transmission layer 215 caused by glue dispensing on the vibration transmission effect. Therefore, the transmission effect of vibration may be improved, and the sound transmission quality of the bone conduction earphone may be improved.

As used herein, in one embodiment, the vibration transmission plate 214 may protrude from the opening 2121 to transmit the vibration signal generated by the transducing device 213 in the accommodation chamber 2122 of the earphone housing 212 to the outside of the accommodation chamber 2122. Then the vibration signal may be transmitted to the user through the vibration transmission layer 215.

The vibration transmission layer 215 and a portion of the outer surface of the vibration transmission plate 214 exposed through the opening 2121 may be fully fitted to each other and integrally molded. Specifically, in an application scenario, the portion of the outer surface of the vibration transmission plate 214 exposed through the opening 2121 may be a curved surface protruding away from the accommodating chamber 2122. Correspondingly, the vibration transmission layer 215 may be fully fitted to the vibration transmission plate 214 and integrated by the injection molding manner through the curved surface. It should be noted that, if the vibration transmission plate 214 and the vibration transmission layer 215 are fully fitted by dispensing glue, first of all, as mentioned above, it is difficult to control uniformity of the formed glue layer due to the influence of air and dispensing technology, thereby reducing the vibration transmission effect. Secondly, if the full fit is performed by dispensing, the dispensing glue is likely to overflow in order to achieve the full fit. On one hand, the uniformity of the glue layer may be further reduced, and on the other hand, it also brings inconvenience to the assembly of the earphone. In this embodiment, the vibration transmission plate 214 and the vibration transmission layer 215 may be fully fitted by the integral injection molding manner, so as to avoid the adverse effects of the full fitting achieved by the above-mentioned dispensing. In addition, on one hand, an area where the vibration transmission layer 215 and the vibration transmission plate 214 are fitted may be increased, thereby improving the vibration transmission effect. On the other hand, the curved surface may also increase the contact area between the vibration transmission layer 215 and user's skin, thereby further improving the transmission effect of the vibration. Specifically, the portion of the outer surface of the vibration transmission plate 214 exposed through the opening 2121 may be a flat surface in a middle part and a curved surface at the peripheral part.

As used herein, in one embodiment, the vibration transmission plate 214 may be spaced apart from the earphone housing 212 at the opening 2121 to form an annular spaced region around the vibration transmission plate 214. A through hole 2151 may be disposed on a corresponding region of the vibration transmission layer 215 in the annular spaced region.

In this embodiment, the vibration transmission plate 214 may not be connected to the earphone housing 212. Specifically, an inner side of the earphone housing 212 and an outer side of the vibration transmission plate 214 at the opening 2121 may be both circular or similar to circular. Therefore, the earphone housing 212 and the vibration transmission plate 214 may jointly form an annular spaced region.

The vibration transmission layer 215 may be coated and disposed on the outer surface of the vibration transmission plate 214, and connected to the earphone housing 212 to cover the opening 2121 of the accommodating chamber 2122. Therefore, a direction away from the accommodating chamber 2122 of the annular spaced region may be covered by the vibration transmission layer 215.

In this embodiment, the through hole 2151 may be further disposed in the region of the vibration transmission layer 215 corresponding to the annular spaced region. Specifically, a shape of the through hole 2151 may be a circle, an ellipse, etc. The count of the through hole 2151 may be one or more, which is not limited herein. When a plurality of through holes 2151 are disposed, the through holes 2151 may be disposed apart from each other around the vibration transmission plate 214.

It should be noted that, in this embodiment, the through hole 2151 may connect the accommodating chamber 2122 with the outside of the earphone housing 212, thereby further reducing sound leakage through vibration cancellation. Therefore, the sound transmission effect of the bone conduction earphone may be further improved.

In typical cases, the sound quality of the speaker may be affected by various factors such as the physical properties of components of the speaker, vibration transmission relationship(s) between the components, a vibration transmission relationship between the speaker and the outside, and the efficiency of a vibration transmission system when vibration is transmitted. Referring to FIG. 1, the components of the speaker may include a component that generates the vibration (e.g., but is not limited to a transducing device inside the earphone core 102), a component that fixes the speaker (e.g., but is not limited to a glasses rim), and a component that transmits the vibration (e.g., but is not limited to a panel inside the earphone core 102, a vibration transmission layer, etc.). The vibration transmission relationship(s) between the components and the vibration transmission relationship between the speaker and the outside may be determined by a contact mode (e.g., but is not limited to, a clamping force, a contact area, a contact shape, etc.) between the speaker and the user.

Figure 21:
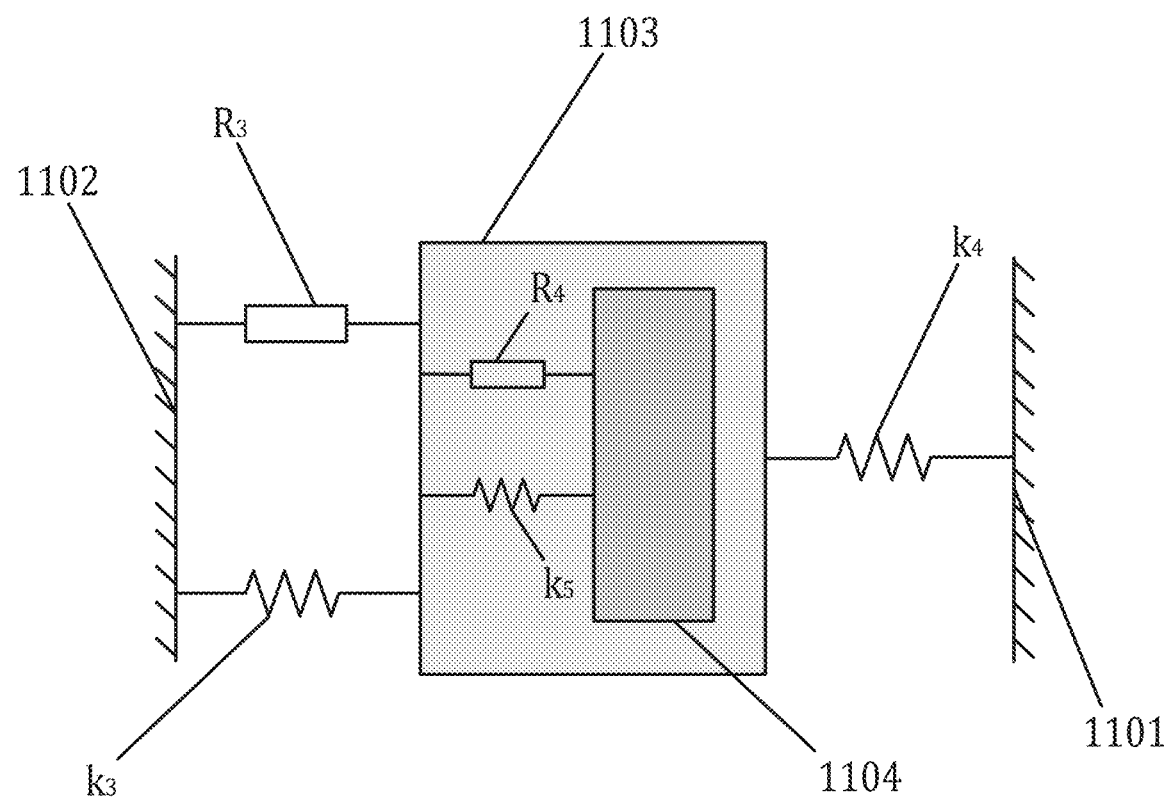
FIG. 21 is an equivalent model illustrating a vibration generation and transmission system of a speaker according to some embodiments of the present disclosure.

For the purpose of illustration only, relationship(s) between the sound quality and the components of the speaker may be further described below based on the speaker. It should be noted that the contents described below may also be applied to an air conduction speaker without violating the principle. FIG. 21 is an equivalent model illustrating a vibration generation and transmission system of a speaker according to some embodiments of the present disclosure. As shown in FIG. 21, the speaker in this embodiment may include a fixed end 1101, a sensing terminal 1102, a vibration unit 1103, and a transducing device 1104. As used herein, the fixed end 1101 may be connected to the vibration unit 1103 based on a transmission relationship K1 ($k_4$ in FIG. 21). The sensing terminal 1102 may be connected to the vibration unit 1103 based on a transmission relationship K2 ($R_3$, $k_3$ in FIG. 21). The vibration unit 1103 may be connected to the transducing device 1104 based on a transmission relationship K3 ($R_4$, $k_5$ in FIG. 21).

The vibration unit mentioned herein may be a vibrating body including a panel and a transducing device. The transmission relationships K1, K2, and K3 may be descriptions of functional relationships between corresponding portions of an equivalent system of the speaker (described in detail below). The vibration equation of the equivalent system may be expressed as:

$$m_3 x''_3 + R_3 x'_3 - R_4 x'_4 + (k_3+k_4)x_3 + k_5(x_3-x_4) = f_3 \quad (1)$$

$$m_3 x''_4 + R_4 x''_4 - k_5(x_3-x_4) = f_4 \quad (2)$$

where $m_3$ is an equivalent mass of the vibration unit 1103, $m_4$ is an equivalent mass of the transducing device 1104, $x_3$ is an equivalent displacement of the vibration unit 1103, $x_4$ is an equivalent displacement of the transducing device 1104, $k_3$ is an equivalent elastic coefficient between the sensing terminal 1102 and the vibration unit 1103, $k_4$ is an equivalent elastic coefficient between the fixed end 1101 and the vibration unit 1103, $k_5$ is an equivalent elastic coefficient between the transducing device 1104 and the vibration unit 1103, $R_3$ is an equivalent damping between sensing terminal 1102 and vibration unit 1103, $R_4$ is an equivalent damping between the transducing device 1104 and the vibration unit 1103, and $f_3$ and $f_4$ are interaction forces between the vibration unit 1103 and the transducing device 1104, respectively. An equivalent amplitude $A_3$ of the vibration unit in the system may be:

$$A_3 = -\frac{m_4 \omega^2}{(m_3 \omega^2 + j\omega R_3 - (k_3+k_4+k_5))(m_4 \omega^2 + j\omega R_4 - k_5) - k_5(k_5 - j\omega R_4)} \cdot f_0 \quad (3)$$

where $f_0$ denotes a driving force unit, and $\omega$ denotes a vibration frequency. It may be seen that factors affecting a frequency response of a bone conduction speaker may include a vibration generation portion (e.g., but is not limited to a vibration unit, a transducing device, a housing, and interconnection manners, such as $m_3$, $m_4$, $k_5$, $R_4$, etc., in equation (3)), a vibration transmission portion (e.g., but is not limited to, a contact manner with the skin, and properties of the glasses rim, such as $k_3$, $k_4$, $R_3$, etc., in the equation (3)). The change of structures of the components of the speaker and parameters of connections between the components may change the frequency response and sound quality of the bone conduction speaker. For example, the change of a clamping force may be equivalent to changing the size of $k_4$. The change of a bonding manner of glue may be equivalent to changing the size of $R_4$ and $k_5$. The change of the hardness, elasticity, damping, etc., of a relevant material may be equivalent to changing the size of $k_3$ and $R_3$.

In a specific embodiment, the fixed end 1101 may be points or regions (e.g., a top of an ear hook) relatively fixed in the bone conduction speaker during the vibration. These points or regions may be regarded as the fixed end of the bone conduction speaker during the vibration. The fixed end may constitute a specific component, or a position determined according to the overall structure of the bone conduction speaker. For example, the bone conduction speaker may be hung, bonded, or adsorbed near human ears by a specific device. The structure and shape of the bone conduction speaker may be designed so that a bone conduction part may be attached to the human skin.

The sensing terminal 1102 may be a hearing system for the human body to receive sound signal(s). The vibration unit 1103 may be portions of the bone conduction speaker for protecting, supporting, and connecting the transducing device, including portions that directly or indirectly contact the user, such as a vibration transmission layer or panel (a side of the core housing near the body) that transmits the vibration to the user, a housing that protects and supports other vibration-generating units, etc. The transducing device 1104 may be a sound vibration generating device, which may be one or more the transducing devices discussed above or any combination thereof.

The transmission relationship K1 may connect the fixed end 1101 and the vibration unit 1103, and represent a vibration transmission relationship between a vibration generating portion and the fixed end during the work of the bone conduction speaker. K1 may be determined according to the shape and structure of the bone conduction device. For example, the bone conduction speaker may be fixed to the human head in the form of a glasses frame, or installed on a helmet, fire mask or other special-purpose masks, glasses, etc. The shapes and structures of different bone conduction speakers may affect the vibration transmission relationship K1. Further, the structure of the speaker may also include physical properties such as composition materials, qualities, etc., of different portions of the bone conduction speaker. The transmission relationship K2 may connect the sensing terminal 402 and the vibration unit 1103.

K2 may be determined according to the composition of the transmission system. The transmission system may include but be not limited to transmitting sound vibration to the hearing system through tissues of the user. For example, when the sound is transmitted to the hearing system through the skin, subcutaneous tissues, bones, etc., the physical properties of different human tissues and their interconnections may affect K2. Further, the vibration unit 1103 may be in contact with the human tissue. In different embodiments, a contact surface on the vibration unit may be a side of a vibration transmission layer or panel. A surface shape, size of the contact surface, and an interaction force with the human tissue may affect the transmission relationship K2.

The transmission relationship K3 between the vibration unit 1103 and the transducing device 1104 may be determined by connection properties inside the vibration generating device of the bone conduction speaker. The transducing device and the vibration unit may be connected in a rigid or elastic manner. Alternatively, the change of a relative position of a connecting piece between the transducing device and the vibration unit may change the transmission device to transmit the vibration to the vibrating unit (in particular, the transmission efficiency of the panel), thereby affecting the transmission relationship K3.

During the use of the bone conduction speaker, the sound generation and transmission process may affect the final sound quality felt by the human body. For example, the above-mentioned fixed end, the human sensing terminal, the vibration unit, the transducing device, and the transmission relationships K1, K2, and K3, etc., may all affect the sound quality of the bone conduction speaker. It should be noted that K1, K2, and K3 are only a representation of the connection modes of different device portions or systems involved in the vibration transmission process, and may include, but be not limited to, a physical connection manner, a force transmission manner, the sound transmission efficiency, or the like.

It should be noted that the above description of the bone conduction speaker is only a specific example, and should not be regarded as the only feasible implementation solution. Obviously, for those skilled in the art, after understanding the basic principle of the bone conduction speaker, it may be possible to make various modifications and changes in the form and details of the specific method and operation of implementing the bone conduction speaker without departing from these principles, but these modifications and changes are still within the scope described above. For example, the above-mentioned K1, K2, and K3 may be simple vibrations or mechanical transmission manners. Or, the above-mentioned K1, K2, and K3 may include a complex nonlinear transmission system. The transmission relationship may be formed by a direct connection of each part or transmitted in a non-contact manner.

Figure 22:
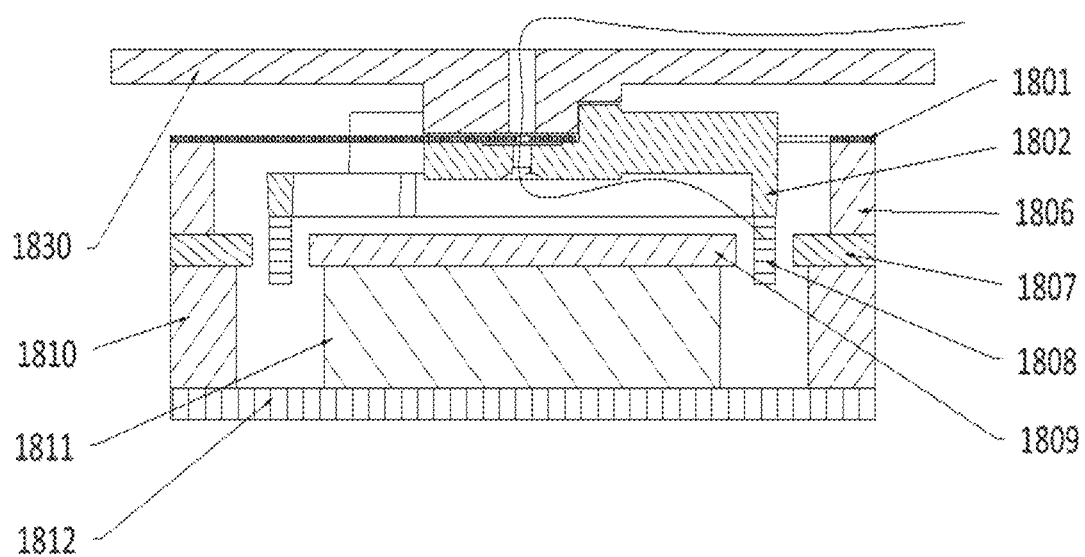
FIG. 22 is a structural diagram illustrating a compound vibration device of a speaker disposed according to an embodiment of the present disclosure.

FIG. 22 is a structural diagram illustrating a compound vibration device of a speaker according to some embodiments of the present disclosure.

Figure 23:
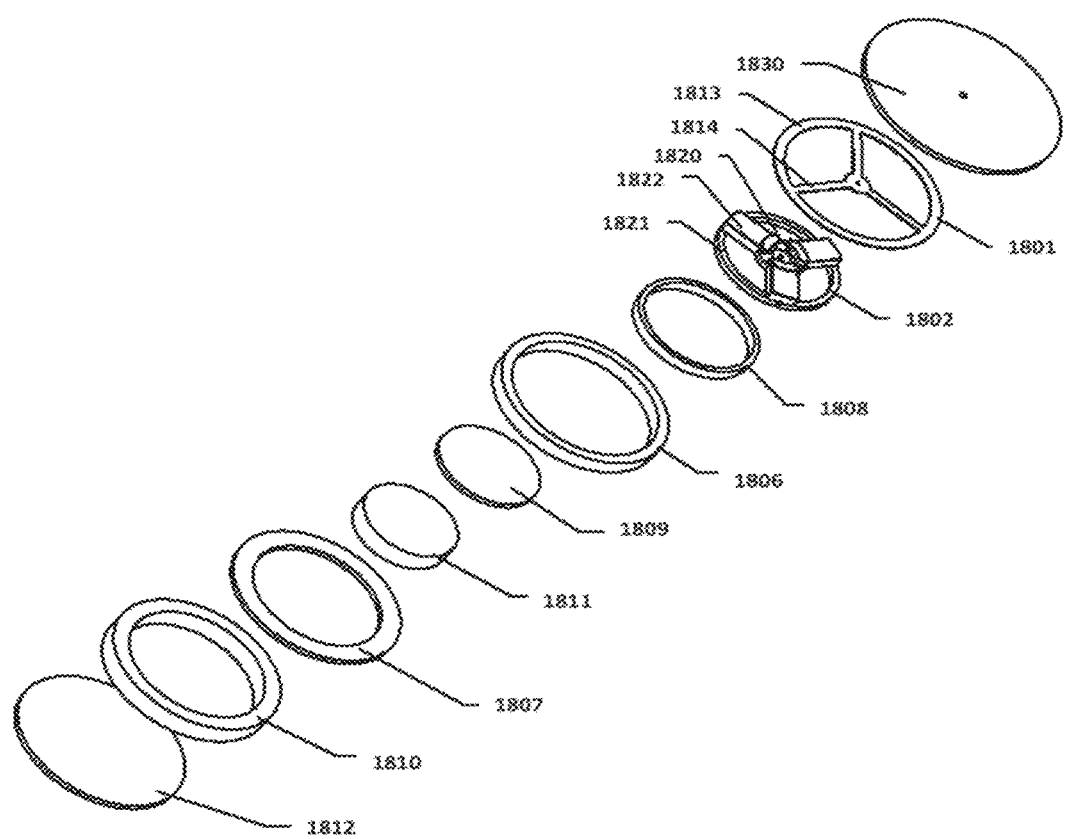
FIG. 23 is a structural diagram illustrating a compound vibration device of a speaker according to an embodiment of the present disclosure.
Figure 24:
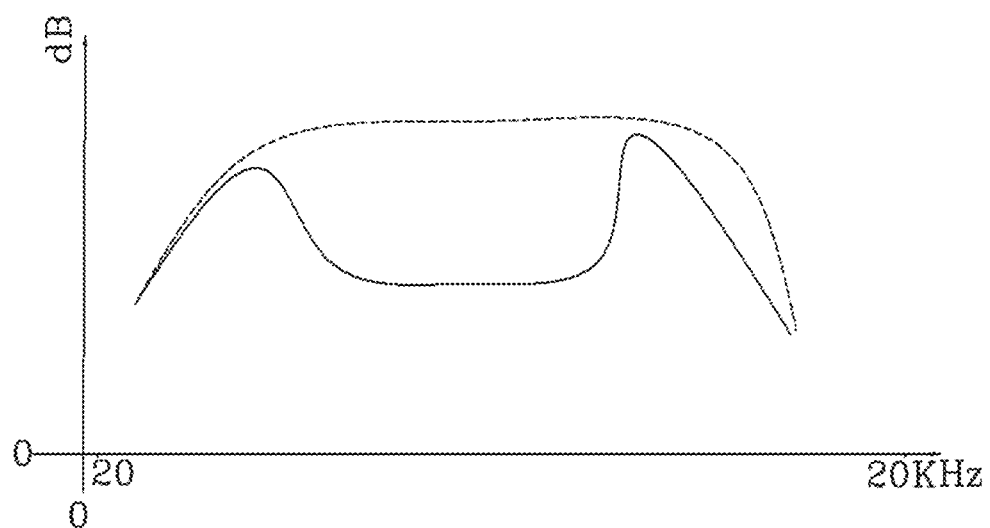
FIG. 24 is a frequency response curve illustrating a speaker according to an embodiment of the present disclosure.

In some embodiments, the compound vibration device may be disposed on glasses. In some embodiments, the compound vibration device in FIG. 22 may be a vibration portion that provides a sound inside an earphone core. Specifically, the compound vibration device in some embodiments of the present disclosure may be equivalent to a specific representation of the transmission relationship K3 of the vibration unit 1103 and the transducing device 1104 in FIG. 21. Embodiments of the compound vibration device of the speaker may be shown in FIG. 22 and FIG. 23. A vibration transmission plate 1801 and a vibration plate 1802 may form the compound vibration device. The vibration transmission plate 1801 may be disposed as a first annular body 1813. The first annular body may be disposed with three first supporting rods 1814 converged towards a center. A center position of the converged center may be fixed at the center of the vibration plate 1802. The center of the vibration plate 1802 may be a groove 1820 matching the converged center and the first support rods. The vibration plate 1802 may be disposed with a second annular body 1821 having a radius different from that of the vibration transmission plate 1801, and three second supporting rods 1822 having different thicknesses from that of the first supporting rod 1814. During assembly, the first supporting rods 1814 and the second supporting rods 1822 may be staggered and shown an angle being but be not limited to 60 degrees.

The first and second supporting rods may both be straight rods or other shapes that meet specific requirements. The count of supporting rods may be more than two, and symmetrical or asymmetrical arrangement may be adapted to meet requirements of economy and practical effects. The vibration transmission plate 1801 may have a thin thickness and be able to increase an elastic force. The vibration transmission plate 1801 may be clamped in the center of the groove 1820 of the vibration plate 1802. A voice coil 1808 (i.e., a coil 422 in FIG. 5) may be attached to a lower side of the second annular body 1821 of the vibration plate 1802. The compound vibration device may further include a bottom plate 1812. The bottom plate 1812 may be disposed with an annular magnet 1810. An inner magnet 1811 may be concentrically disposed in the annular magnet 1810. An inner magnetic conduction plate 1809 may be disposed on the top surface of the inner magnet 1811. An annular magnetic conduction plate 1807 may be disposed on the annular magnet 1810. A washer 1806 may be fixedly disposed above the annular magnetic conduction plate 1807. The first annular body 1813 of the vibration transmission plate 1801 may be fixedly connected to the washer 1806. The entire compound vibration device may be connected to the outside through a panel 1830. The panel 1830 may be fixedly connected to the converged center of the vibration transmission plate 1801, and fixed to the center of the vibration transmission plate 1801 and the vibration plate 1802. Using the compound vibration device constituting the vibrating plate and the vibration transmission plate, a frequency response shown in FIG. 23 may be obtained and two formants may be generated. By adjusting parameters such as sizes and materials of the two components, the formants may appear at different positions. For example, a low-frequency formant may appear at a position shifted at a lower frequency, and/or a high-frequency formant may appear at a position at a higher frequency. Preferably, a stiffness coefficient of the vibration plate may be greater than a stiffness coefficient of the vibration transmission plate. The vibration plate may generate the high-frequency formant in the two formants, and the vibration transmission plate may generate the low-frequency formant in the two formants. The range of the formants may be set within a frequency range of sounds audible to the human ear, and may also be not in the range. Preferably, neither of the formants may be within the frequency range of the sounds audible to the human ear. More preferably, one formant may be within the frequency range of the sounds audible to the human ear, and another formant may be out of the frequency range of the sounds audible to the human ear. More preferably, both formants may be within the frequency range of the sounds audible to the human ear. The descriptions of the compound vibration device constituting the vibration plate and the vibration transmission plate may be found in a patent application named "Bone conduction speaker and compound vibration device thereof" disclosed in Chinese Patent Application No. 201110438083.9, filed on Dec. 23, 2011, which are hereby incorporated by reference in its entirety.

Figure 25:
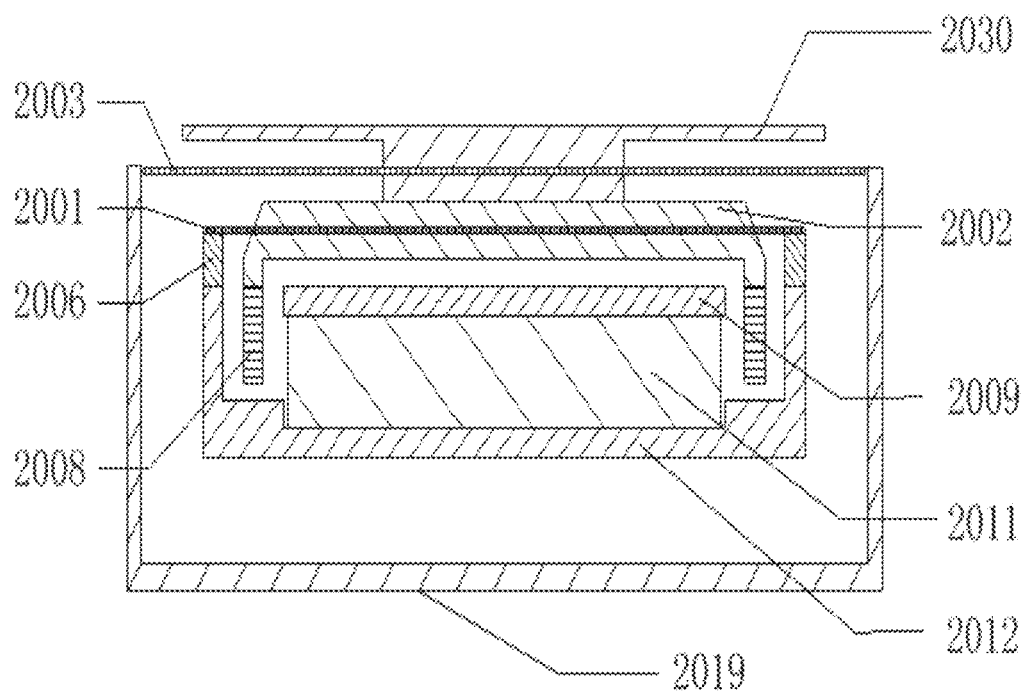
FIG. 25 is a structural diagram illustrating a compound vibration device of a speaker according to some embodiments in the present disclosure.

FIG. 25 is a structural diagram illustrating a compound vibration device of a speaker according to some embodiments of the present disclosure. In some embodiments, an earphone core may include the compound vibration device. In another embodiment, as shown in FIG. 25, the compound vibration device of the speaker may include a vibration plate 2002, a first vibration transmission plate 2003, and a second vibration transmission plate 2001. The first vibration transmission plate 2003 may fix the vibration plate 2002 and the second vibration transmission plate 2001 on a core housing 2219. The compound vibration device constituted by the vibration plate 2002, the first vibration transmission plate 2003, and the second vibration transmission plate 2001 may generate not less than two formants. A flatter frequency response curve may be generated within an audible range of a hearing system, thereby improving the sound quality of the speaker.

Figure 26:
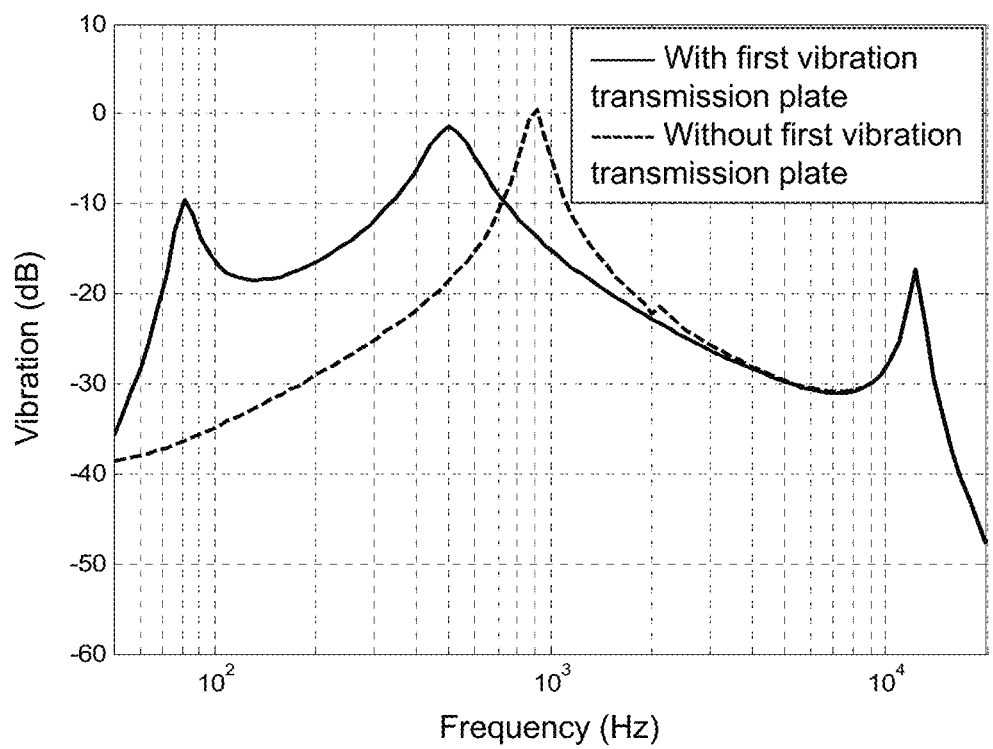
FIG. 26 is a vibration response curve illustrating a speaker according to some embodiments of the present disclosure.

The count of formants generated in a triple composite vibration system of the first vibration transmission plate may be greater than that of a composite vibration system without the first vibration transmission plate. Preferably, the triple composite vibration system may generate at least three formants. More preferably, at least one formant may not be within the range audible to the human ear. More preferably, the formants may be all within the range audible to the human ear. In one embodiment, by using the triple composite vibration system constituted by the vibration plate, the first vibration transmission plate, and the second vibration transmission plate, the frequency response shown in FIG. 26 may be obtained, resulting in three distinct formants, so that the sensitivity of the frequency response of the speaker in the low frequency range (about 600 Hz) may be greatly improved, and the sound quality may be improved.

By changing parameters such as the size and material of the first vibration transmission plate, the formant(s) may be shifted to obtain an ideal frequency response. Preferably, the first vibration transmission plate may be an elastic plate. The elasticity may be determined by various aspects such as the material, thickness, and structure of the first vibration transmission plate. The material of the first vibration transmission plate may be, but be not limited to, steel (such as, but is not limited to, stainless steel, carbon steel, etc.), a light alloy (such as, but is not limited to, an aluminum alloy, a beryllium copper, a magnesium alloy, a titanium alloy, etc.), plastics (such as, but being is limited to, high-molecular polyethylene, blown nylon, engineering plastics, etc.), other single or composite materials capable of implementing the same performance. The composite materials may be but be not limited to a reinforcing material, for example, glass fiber, carbon fiber, boron fiber, graphite fiber, graphene fiber, silicon carbide fiber, aramid fiber, etc. The composite materials may also be a composite of other organic and/or inorganic materials, such as various types of glass steels constituted by glass fiber reinforcing unsaturated polyester, epoxy resin, or phenolic resin. The thickness of the first vibration transmission plate may not be less than 0.005 mm. Preferably, the thickness may be 0.005 mm to 3 mm. More preferably, the thickness may be 0.01 mm to 2 mm. Still more preferably, the thickness may be 0.01 mm to 1 mm. Further preferably, the thickness may be 0.02 mm to 0.5 mm. The structure of the first vibration transmission plate may be disposed in a ring shape, and preferably include at least one ring. Preferably, the structure may include at least two rings, which may be concentric rings or non-concentric rings. The rings may be connected by at least two supporting rods that centrally radiate from the outer ring to the inner ring. Further preferably, the structure may include at least one elliptical ring. Further preferably, the structure may include at least two elliptical rings. Different elliptical rings may have a different radius of curvature. The rings may be connected by the supporting rods. Still further preferably, the first vibration transmission plate may include at least one square ring. The structure of the first vibration transmission plate may also be disposed in a plate shape. Preferably, a hollow pattern may be disposed on the first vibration transmission plate, and the area of the hollow pattern may not be less than the area without a hollow pattern. The material, thickness, and structure described above may be combined to form different vibration transmission plates. For example, the ring-shaped vibration transmission plate may have different thickness distributions. Preferably, the thickness of the supporting rod may be equal to the thickness of the ring. Further preferably, the thickness of the supporting rod may be greater than the thickness of the ring. More preferably, the thickness of the inner ring may be greater than the thickness of the outer ring.

Figure 27:
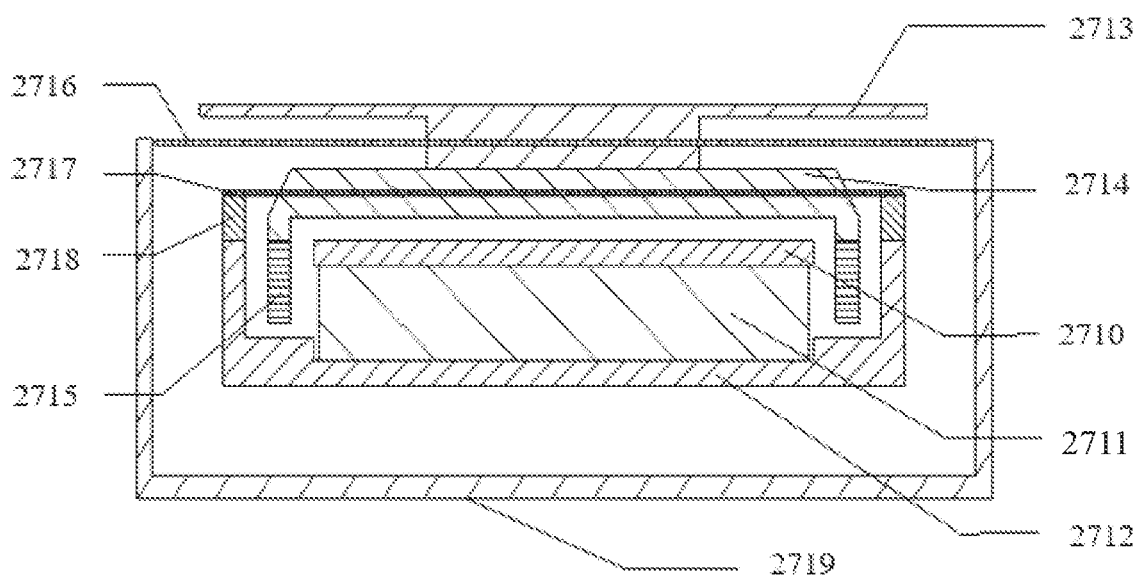
FIG. 27 is a structural diagram illustrating a structure of a vibration generating portion of a speaker according to some embodiments of the present disclosure.

The content disclosed in the present disclosure may also disclose specific embodiments of the vibration plate, the first vibration transmitting piece, and the second vibration transmitting piece described above. FIG. 27 is a structural diagram illustrating a vibration generating portion of a speaker according to some embodiments of the present disclosure. As shown in FIG. 27, a transducing device may include a magnetic circuit system constituted by a magnetic conduction plate 2710, a magnetic system constituted by a magnet 2711 and a magnetizer 2712, a vibration plate 2714, a coil 2715, a first vibration transmission plate 2716, and a second vibration transmission plate 2717. A panel 2713 may protrude from a core housing 2719, and be bonded to the vibration plate 2714 by glue. The first vibration transmission plate 2716 may connect and fix the transducing device on the core housing 2719 to form a suspension structure.

Figure 28:
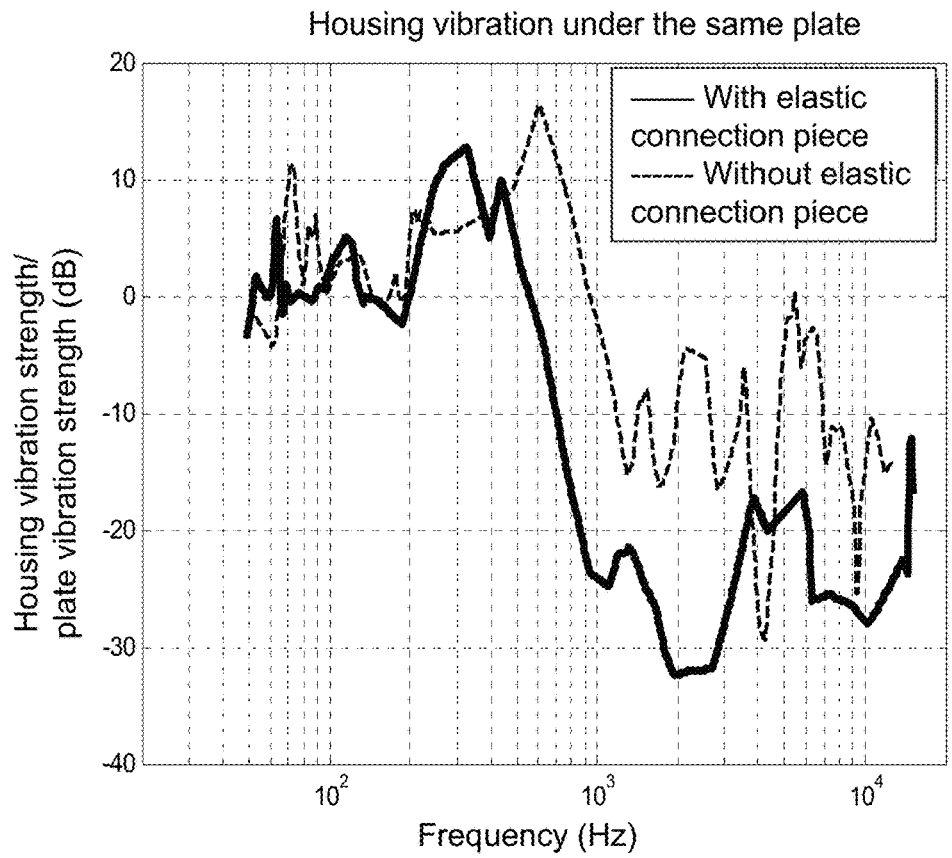
FIG. 28 is a vibration response curve illustrating a vibration generating portion of a speaker according to some embodiments of the present disclosure.
Figure 29:
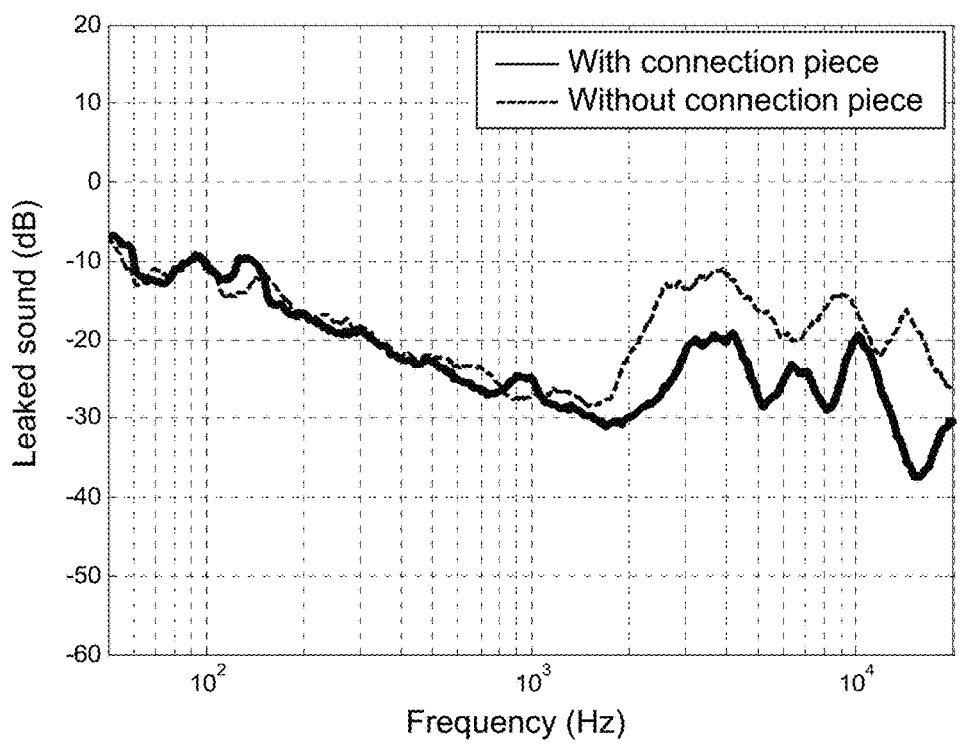
FIG. 29 is a vibration response curve illustrating a generating portion a speaker according to some embodiments of the present disclosure.

During the working of the speaker, a triple vibration system constituted by the vibration plate 2714, the first vibration transmission plate 2716, and the second vibration transmission plate 2717 may generate a flatter frequency response curve, thereby improving the sound quality of the speaker. The first vibration transmission plate 2716 may elastically connect the transducing device to the core housing 2219, which may reduce the vibration transmitted by the transducing device to the housing, thereby effectively reducing a leaked sound caused by the vibration of the housing, and also reducing the influence of the vibration of the housing on the sound quality of the speaker. FIG. 28 is a vibration response curve illustrating a vibration component of a speaker according to some embodiments of the present disclosure. As used herein, the thick line may show the frequency response of the vibration generating portion when the first vibration transmission plate 2716 is used, and the thin line may show the frequency response of the vibration generating portion when the first vibration transmission plate 2716 is not used. It may be seen that the vibration of the housing of the speaker without the first vibration transmission plate 2716 may be significantly greater than the vibration of the housing of the speaker with the first vibration transmission plate 2716 in a frequency range above 500 Hz. FIG. 29 is a comparison of a leaked sound in a case of including the first vibration transmission plate 2716 and a case of excluding the first vibration transmission plate 2716. As used herein, the leaked sound of the device with the first vibration transmission plate 2716 in an intermediate frequency (e.g., about 1000 Hz) may be less than the leaked sound of the device without the first vibration transmission plate 2716 in the corresponding frequency range. It may be seen that the vibration of the housing may be effectively reduced after using the first vibration transmission plate between the panel and the housing, thereby reducing the leaked sound. In some embodiments, the first vibration transmission plate may include, but be not limited to, stainless steel, beryllium copper, plastics, a polycarbonate material, or the like. The thickness may be in a range of 0.01 to 1 millimeters.

FIG. 30 is a longitudinal sectional view illustrating a speaker according to some embodiments of the present disclosure. As shown in FIG. 30, the speaker 300 may include a first magnetic unit 302, a first magnetically conductive unit 304, a second magnetically conductive unit 306, a first vibration plate 308, a voice coil 310, a second vibration plate 312, and a vibration panel 314. As used herein, the speaker 300 may correspond to the magnetic circuit component in FIG. 19. In some embodiments, the magnetic circuit component may include the first magnetic unit 302, the first magnetically conductive unit 304, and the second magnetically conductive unit 306. The magnetic circuit component may generate a first full magnetic field (also referred to "total magnetic field of the magnetic circuit component" or "first magnetic field").

The magnetic unit described in the present disclosure may refer to an unit that may generate a magnetic field, such as a magnet. The magnetic unit may have a magnetization direction. The magnetization direction may refer to a direction of a magnetic field inside the magnetic unit. In some embodiments, the first magnetic unit 302 may include one or more magnets. The first magnetic unit may generate a second magnetic field. In some embodiments, the magnet may include a metal alloy magnet, ferrite, or the like. The metal alloy magnet may include neodymium iron boron, samarium cobalt, aluminum nickel cobalt, iron chromium cobalt, aluminum iron boron, iron carbon aluminum, or the like, or any combination thereof. Ferrite may include barium ferrite, steel ferrite, manganese ferrite, lithium manganese ferrite, or the like, or any combination thereof.

In some embodiments, a lower surface of the first magnetically conductive unit 304 may be connected to an upper surface of the first magnetic unit 302. The second magnetically conductive unit 306 may be connected to the first magnetic unit 302. It should be noted that the magnetically conductive unit herein may also refer to a magnetic field concentrator or an iron core. The magnetically conductive unit may adjust a distribution of a magnetic field (e.g., a second magnetic field generated by the first magnetic unit 302). The magnetically conductive unit may include a unit made of a soft magnetic material. A connection manner between the first magnetically conductive unit 304, the second magnetically conductive unit 306, and the first magnetic unit 302 may include bonding, snapping, welding, riveting, bolting, or the like, or any combination thereof. In some embodiments, the first magnetic unit 302, the first magnetically conductive unit 304, and the second magnetically conductive unit 306 may be disposed as an axisymmetric structure. The axisymmetric structure may be a ring structure, a columnar structure, or other axisymmetric structures.

In some embodiments, a magnetic gap may form between the first magnetic unit 302 and the second magnetically conductive unit 306. The voice coil 310 may be disposed in the magnetic gap. The voice coil 310 may be connected to the first vibration plate 308. The first vibration plate 308 may be connected to the second vibration plate 312. The second vibration plate 312 may be connected to the vibration panel 314. When a current is passed into the voice coil 310, the voice coil 310 may be located in a magnetic field formed by the first magnetic unit 302, the first magnetically conductive unit 304, and the second magnetically conductive unit 306, and applied to an ampere force. The ampere force may drive the voice coil 310 to vibrate, and the vibration of the voice coil 310 may drive the vibration of the first vibration plate 308, the second vibration plate 312, and the vibration panel 314. The vibration panel 314 may transmit the vibration to auditory nerves through tissues and bones, so that a person may hear a sound. The vibration panel 314 may be in direct contact with human skins, or in contact with the skins through a vibration transmission layer made of a specific material.

In some embodiments, for a speaker with a single magnetic unit, magnetic induction line(s) passing through the voice coil may not be uniform and divergent. At the same time, magnetic leakage may form in the magnetic circuit. That is, more magnetic induction lines may leak outside the magnetic gap and fail to pass through the voice coil. As a result, a magnetic induction strength (or magnetic field strength) at the position of the voice coil may decrease, which may affect the sensitivity of the speaker. Therefore, the speaker 300 may further include at least one second magnetic unit and/or at least one third magnetically conductive unit (not shown in figures). The at least one second magnetic unit and/or at least one third magnetically conductive unit may suppress the leakage of the magnetic induction lines and restrict the shape of the magnetic induction lines passing through the voice coil. Therefore, more magnetic induction lines may pass through the voice coil as horizontally and densely as possible to increase the magnetic induction strength (or magnetic field strength) at the position of the voice coil, thereby increasing the sensitivity of the speaker 300, and further improving the mechanical conversion efficiency of the speaker 300 (i.e., the efficiency of converting the input power of the speaker 300 into the mechanical energy of the vibration of the voice coil).

Figure 31:
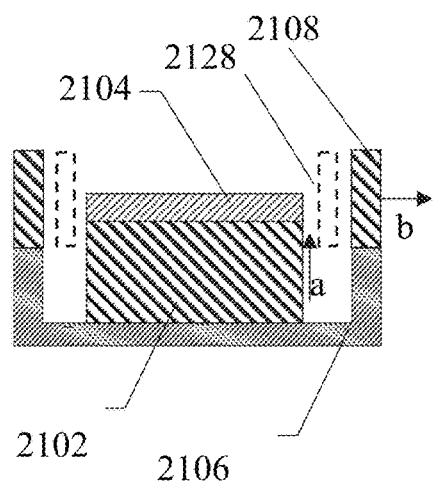
FIG. 31 is a longitudinal sectional view illustrating a magnetic circuit component 2100 according to some embodiments of the present disclosure.

FIG. 31 is a longitudinal sectional view illustrating a magnetic circuit component 2100 according to some embodiments of the present disclosure. As shown in FIG. 31, the magnetic circuit component 2100 may include a first magnetic unit 2102, a first magnetically conductive unit 2104, a second magnetically conductive unit 2106, and a second magnetic unit 2108. In some embodiments, the first magnetic unit 2102 and/or the second magnetic unit 2108 may include any one or more magnets described in the present disclosure. In some embodiments, the first magnetic unit 2102 may include a first magnet, and the second magnetic unit 2108 may include a second magnet. The first magnet may be the same as or different from the second magnet. The first magnetically conductive unit 2104 and/or the second magnetically conductive unit 2106 may include any one or more magnetically conductive materials described in the present disclosure. The processing manner of the first magnetically conductive unit 2104 and/or the second magnetically conductive unit 2106 may include any one or more processing manners described in the present disclosure. In some embodiments, the first magnetic unit 2102 and/or the first magnetically conductive unit 2104 may be disposed as an axisymmetric structure. For example, the first magnetic unit 2102 and/or the first magnetically conductive unit 2104 may be a cylinder, a cuboid, or a hollow ring (e.g., the cross-section is a shape of the runway). In some embodiments, the first magnetic unit 2102 and the first magnetically conductive unit 2104 may be coaxial cylinders with the same or different diameters. In some embodiments, the second magnetically conductive unit 2106 may be a groove-type structure. The groove-type structure may include a U-shaped section (as shown in FIG. 30). The groove-type second magnetically conductive unit 2106 may include a bottom plate and a side wall. In some embodiments, the bottom plate and the side wall may be integrally formed as a whole. For example, the side wall may be formed by extending the bottom plate in a direction perpendicular to the bottom plate. In some embodiments, the bottom plate may be connected to the side wall through any one or more connection manners described in the present disclosure. The second magnetic unit 2108 may be disposed as a ring shape or a sheet shape. In some embodiments, the second magnetic unit 2108 may be the ring shape. The second magnetic unit 2108 may include an inner ring and an outer ring. In some embodiments, the shape of the inner ring and/or the outer ring may be a ring, an ellipse, a triangle, a quadrangle, or any other polygons. In some embodiments, the second magnetic unit 2108 may be formed by arranging a number of magnets. Both ends of any one of the number of magnets may be connected to or have a certain distance from both ends of an adjacent magnet. The spacing between the magnets may be the same or different. In some embodiments, the second magnetic unit 2108 may be formed by arranging two or three sheet-shaped magnets equidistantly. The shape of the sheet-shaped magnet may be fan-shaped, a quadrangular shape, or the like. In some embodiments, the second magnetic unit 2108 may be coaxial with the first magnetic unit 2102 and/or the first magnetically conductive unit 2104.

In some embodiments, the upper surface of the first magnetic unit 2102 may be connected to the lower surface of the first magnetically conductive unit 2104. The lower surface of the first magnetic unit 2102 may be connected to the bottom plate of the second magnetically conductive unit 306. The lower surface of the second magnetic unit 2108 may be connected to the side wall of the second magnetically conductive unit 2106. The connection manners between the first magnetic unit 2102, the first magnetically conductive unit 2104, the second magnetically conductive unit 2106, and/or the second magnetic unit 2108 may include bonding, snapping, welding, riveting, bolting, or the like, or any combination thereof.

In some embodiments, a magnetic gap may be formed between the first magnetic unit 2102 and/or the first magnetically conductive unit 2104 and the inner ring of the second magnetic unit 2108. A voice coil 2128 may be disposed in the magnetic gap. In some embodiments, heights of the second magnetic unit 2108 and the voice coil 2128 relative to the bottom plate of the second magnetically conductive unit 2106 may be equal. In some embodiments, the first magnetic unit 2102, the first magnetically conductive unit 2104, the second magnetically conductive unit 2106, and the second magnetic unit 2108 may form a magnetic circuit. In some embodiments, the magnetic circuit component 2100 may generate a first full magnetic field (also referred to "total magnetic field of magnetic circuit component" or "first magnetic field"). The first magnetic unit 2102 may generate a second magnetic field. The first full magnetic field may be formed by magnetic fields generated by all components (e.g., the first magnetic unit 2102, the first magnetically conductive unit 2104, the second magnetically conductive unit 2106, and the second magnetic unit 2108) in the magnetic circuit component 2100. The magnetic field strength of the first full magnetic field in the magnetic gap (also referred to as magnetic induction strength or magnetic flux density) may be greater than the magnetic field strength of the second magnetic field in the magnetic gap. In some embodiments, the second magnetic unit 2108 may generate a third magnetic field. The third magnetic field may increase the magnetic field strength of the first full magnetic field in the magnetic gap. The third magnetic field increasing the magnetic field strength of the first full magnetic field herein may mean that the magnetic strength of the first full magnetic field in the magnetic gap when the third magnetic field exists (i.e., the second magnetic unit 2108 exists) may be greater than that of the first full magnetic field when the third magnetic field does not exist (i.e., the second magnetic unit 2108 does not exist). In other embodiments of the specification, unless otherwise specified, the magnetic circuit component may mean a structure including all magnetic units and magnetically conductive units. The first full magnetic field may represent the magnetic field generated by the magnetic circuit component as a whole. The second magnetic field, the third magnetic field, . . . , and the N-th magnetic field may respectively represent the magnetic fields generated by the corresponding magnetic units. In different embodiments, the magnetic unit that generates the second magnetic field (the third magnetic field, . . . , or the N-th magnetic field) may be the same or different.

In some embodiments, an included angle between a magnetization direction of the first magnetic unit 2102 and a magnetization direction of the second magnetic unit 2108 may be between 0 degrees and 180 degrees. In some embodiments, the included angle between the magnetization direction of the first magnetic unit 2102 and the magnetization direction of the second magnetic unit 2108 may be between 45 degrees and 135 degrees. In some embodiments, the induced angle between the magnetization direction of the first magnetic unit 2102 and the magnetization direction of the second magnetic unit 2108 may be equal to or greater than 90 degrees. In some embodiments, the magnetization direction of the first magnetic unit 2102 may be perpendicular to the lower surface or the upper surface of the first magnetic unit 302 and be vertically upward (as shown by the direction a in the figure). The magnetization direction of the second magnetic unit 2108 may be directed from the inner ring of the second magnetic unit 2108 to the outer ring (as shown by the direction b on the right side of the first magnetic unit 2102 in the figure, the magnetization direction of the first magnetic unit 2102 may deflect 90 degrees in a clockwise direction).

In some embodiments, at the position of the second magnetic unit 2108, an included angle between the direction of the first full magnetic field and the magnetization direction of the second magnetic unit 2108 may not be greater than 90 degrees. In some embodiments, at the position of the second magnetic unit 2108, the included angle between the direction of the magnetic field generated by the first magnetic unit 2102 and the direction of the magnetization of the second magnetic unit 2108 may be less than or equal to 90 degrees, such as 0 degrees, 10 degrees, 20 degrees, or the like.

Compared with a magnetic circuit component with a single magnetic unit, the second magnetic unit 2108 may increase the total magnetic flux in the magnetic gap of the magnetic circuit component 2100, thereby increasing the magnetic induction intensity in the magnetic gap. And, under the action of the second magnetic unit 2108, originally scattered magnetic induction lines may converge to the position of the magnetic gap, further increasing the magnetic induction intensity in the magnetic gap.

Figure 32:
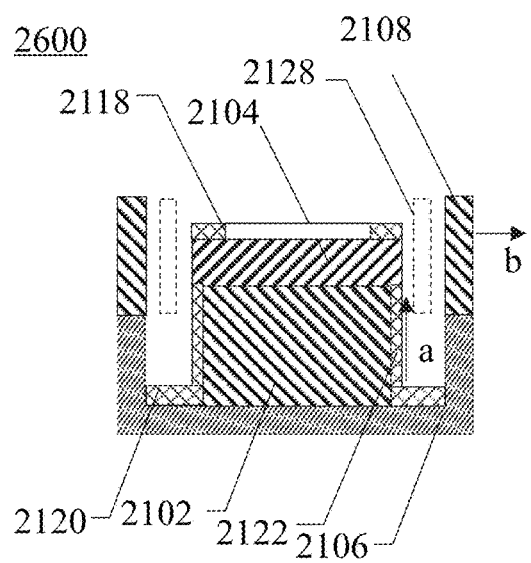
FIG. 32 is a longitudinal sectional view illustrating a magnetic circuit component 2600 according to some embodiments of the present disclosure.

FIG. 32 is a longitudinal sectional view illustrating a magnetic circuit component 2600 according to some embodiments of the present disclosure. As shown in FIG. 32, different from the magnetic circuit component 2100, the magnetic circuit component 2600 may further include at least one electrically conductive unit (e.g., a first electrically conductive unit 2118, a second electrically conductive unit 2120, and a third electrically conductive unit 2122).

The electrically conductive unit may include a metal material, a metal alloy material, an inorganic non-metal material, or other conductive materials. The metal material may include gold, silver, copper, aluminum, etc. The metal alloy material may include an iron-based alloy, an aluminum-based alloy material, a copper-based alloys, a zinc-based alloys, etc. The inorganic non-metal material may include graphite, etc. The electrically conductive unit may be a sheet shape, a ring shape, a mesh shape, or the like. The first electrically conductive unit 2118 may be disposed on an upper surface of the first magnetically conductive unit 2104. The second electrically conductive unit 2120 may be connected to the first magnetic unit 2102 and the second magnetically conductive unit 2106. The third electrically conductive unit 2122 may be connected to a side wall of the first magnetic unit 2102. In some embodiments, the first magnetically conductive unit 2104 may protrude from the first magnetic unit 2102 to form a first concave portion. The third electrically conductive unit 2122 may be disposed on the first concave portion. In some embodiments, the first electrically conductive unit 2118, the second electrically conductive unit 2120, and the third electrically conductive unit 2122 may include the same or different conductive materials. The first electrically conductive unit 2118, the second electrically conductive unit 2120, and the third electrically conductive unit 2122 may be respectively connected to the first magnetically conductive unit 2104, the second magnetically conductive unit 2106 and/or the first magnetic unit 2102 through any one or more connection manners described in the present disclosure.

A magnetic gap may be formed between the first magnetic unit 2102, the first magnetically conductive unit 2104, and the inner ring of the second magnetic unit 2108. A voice coil 2128 may be disposed in the magnetic gap. The first magnetic unit 2102, the first magnetically conductive unit 2104, the second magnetically conductive unit 2106, and the second magnetic unit 2108 may form a magnetic circuit. In some embodiments, the electrically conductive unit may reduce an inductive reactance of the voice coil 2128. For example, if a first alternating current flows through the voice coil 2128, a first alternating induced magnetic field may be generated near the voice coil 2128. Under the action of the magnetic field in the magnetic circuit, the first alternating induced magnetic field may cause the inductive reactance of the voice coil 2128 and hinder the movement of the voice coil 2128. When an electrically conductive unit (e.g., the first electrically conductive unit 2118, the second electrically conductive unit 2120, and the third electrically conductive unit 2122) is disposed near the voice coil 2128, the electrically conductive unit may induce a second alternating current under the action of the first alternating induced magnetic field. A third alternating current in the electrically conductive unit may generate a second alternating induced magnetic field near the third alternating current. The second alternating induction magnetic field may be opposite to the first alternating induction magnetic field, and weaken the first alternating induction magnetic field, thereby reducing the inductive reactance of the voice coil 2128, increasing the current in the voice coil, and improving the sensitivity of the speaker.

Figure 33:
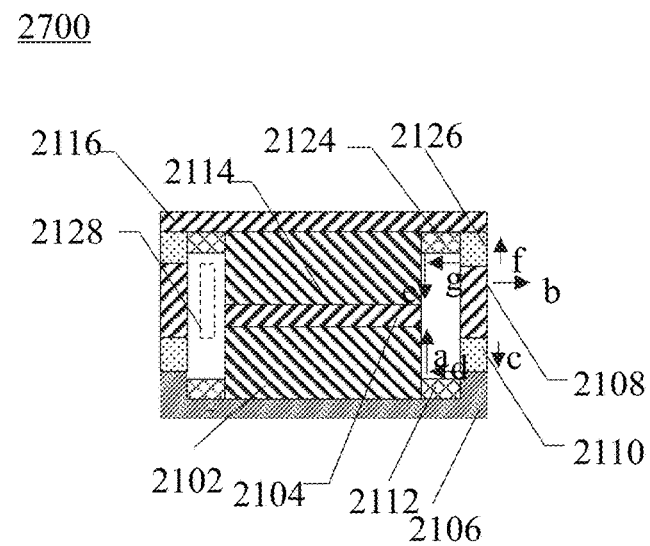
FIG. 33 is a longitudinal sectional view illustrating a magnetic circuit component 2700 according to some embodiments of the present disclosure.

FIG. 33 is a longitudinal sectional view illustrating a magnetic circuit component 2700 according to some embodiments of the present disclosure. As shown in FIG. 33, different from the magnetic circuit component 2500, the magnetic circuit component 2700 may further include a third magnetic unit 2110, a fourth magnetic unit 2112, a fifth magnetic unit 2114, a third magnetically conductive unit 2116, a sixth magnetic unit 2124, and a seventh magnetic unit 2126. The third magnetic unit 2110, the fourth magnetic unit 2112, the fifth magnetic unit 2114, the third magnetically conductive unit 2116 and/or the sixth magnetic unit 2124, and the seventh magnetic unit 2126 may be disposed as coaxial ring cylinders.

In some embodiments, an upper surface of the second magnetic unit 2108 may be connected to the seventh magnetic unit 2126. A lower surface of the second magnetic unit 2108 may be connected to the third magnetic unit 2110. The third magnetic unit 2110 may be connected to the second magnetically conductive unit 2106. An upper surface of the seventh magnetic unit 2126 may be connected to the third magnetically conductive unit 2116. The fourth magnetic unit 2112 may be connected to the second magnetically conductive unit 2106 and the first magnetic unit 2102. The sixth magnetic unit 2124 may be connected to the fifth magnetic unit 2114, the third magnetically conductive unit 2116, and the seventh magnetic unit 2126. In some embodiments, the first magnetic unit 2102, the first magnetically conductive unit 2104, the sixth magnetic unit 2124, the second magnetically conductive unit 2106, the second magnetic unit 2108, the third magnetic unit 2110, the fourth magnetic unit 2112, the fifth magnetic unit 2114, the third magnetically conductive unit 2116, and the seventh magnetic unit 2126 may form a magnetic circuit and a magnetic gap.

In some embodiments, an included angle between a magnetization direction of the first magnetic unit 2102 and a magnetization direction of the sixth magnetic unit 2124 may be between 0 degrees and 180 degrees. In some embodiments, the included angle between the magnetization direction of the first magnetic unit 2102 and the magnetization direction of the sixth magnetic unit 2124 may be between 45 degrees and 135 degrees. In some embodiments, the included angle between the magnetization direction of the first magnetic unit 2102 and the magnetization direction of the sixth magnetic unit 2124 may not be higher than 90 degrees. In some embodiments, the magnetization direction of the first magnetic unit 2102 may be perpendicular to a lower surface or an upper surface of the first magnetic unit 2102 and be vertically upward (as shown by the direction a in the figure). The magnetization direction of the sixth magnetic unit 2124 may be directed from an outer ring of the sixth magnetic unit 2124 to an inner ring (as shown by the direction g on the right side of the first magnetic unit 2102 in the figure, the magnetization direction of the first magnetic unit 2102 may deflect 270 degrees in a clockwise direction). In some embodiments, the magnetization direction of the sixth magnetic unit 2124 may be the same as that of the fourth magnetic unit 2112 in the same vertical direction.

In some embodiments, at the position of the sixth magnetic unit 2124, an included angle between the direction of the magnetic field generated by the magnetic circuit component 2700 and the magnetization direction of the sixth magnetic unit 2124 may not be higher than 90 degrees. In some embodiments, at the position of the sixth magnetic unit 2124, the included angle between the direction of the magnetic field generated by the first magnetic unit 2102 and the magnetized direction of the sixth magnetic unit 2124 may be less than or equal to 90 degrees, such as 0 degrees, 10 degrees, or 20 degrees.

In some embodiments, the included angle between the magnetization direction of the first magnetic unit 2102 and the magnetization direction of the seventh magnetic unit 2126 may be between 0 degrees and 180 degrees. In some embodiments, the included angle between the magnetization direction of the first magnetic unit 2102 and the magnetization direction of the seventh magnetic unit 2126 may be between 45 degrees and 135 degrees. In some embodiments, the included angle between the magnetization direction of the first magnetic unit 2102 and the magnetization direction of the seventh magnetic unit 2126 may not be higher than 90 degrees. In some embodiments, the magnetization direction of the first magnetic unit 2102 may be perpendicular to a lower surface or an upper surface of the first magnetic unit 2102 and be vertically upward (as shown by the direction a in the figure). The magnetization direction of the seventh magnetic unit 2126 may be directed from the lower surface of the seventh magnetic unit 2126 to the upper surface (as shown in the direction off on the right side of the first magnetic unit 2102 in the figure, the magnetization direction of the first magnetic unit 2102 may deflect 360 degrees in a clockwise direction). In some embodiments, the magnetization direction of the seventh magnetic unit 2126 may be opposite to that of the third magnetic unit 2110.

In some embodiments, at the position of the seventh magnetic unit 2126, the included angle between the direction of the magnetic field generated by magnetic circuit component 2700 and the direction of magnetization of the seventh magnetic unit 2126 may not be higher than 90 degrees. In some embodiments, at the position of the seventh magnetic unit 2126, the included angle between the direction of the magnetic field generated by the first magnetic unit 2102 and the magnetized direction of the seventh magnetic unit 2126 may be less than or equal to 90 degrees, such as 0 degrees, 10 degrees, or 20 degrees.

In the magnetic circuit component 2700, the third magnetically conductive unit 2116 may close the magnetic circuit generated by the magnetic circuit component 2700, so that more magnetic induction lines may be concentrated in the magnetic gap, thereby implementing the effect of suppressing the magnetic leakage, increasing the magnetic induction strength in the magnetic gap, and improving the sensitivity of the speaker.

Figure 34:
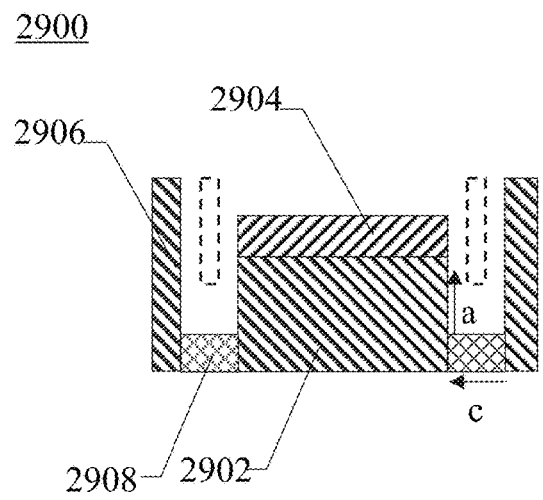
FIG. 34 is a longitudinal sectional view illustrating a magnetic circuit component 2900 according to some embodiments of the present disclosure.

FIG. 34 is a longitudinal sectional view illustrating a magnetic circuit component 2900 according to some embodiments of the present disclosure. As shown in FIG. 34, the magnetic circuit component 2900 may include a first magnetic unit 2902, a first magnetically conductive unit 2904, a first full magnetic field changing unit 2906, and a second magnetic unit 2908.

An upper surface of the first magnetic unit 2902 may be connected to a lower surface of the first magnetically conductive unit 2904. The second magnetic unit 2908 may be connected to the first magnetic unit 2902 and the first full magnetic field changing unit 2906. The connection manners between the first magnetic unit 2902, the first magnetically conductive unit 2904, the first full magnetic field changing unit 2906, and/or the second magnetic unit 2908 may be based on any one or more connection manners described in the present disclosure. In some embodiments, the first magnetic unit 2902, the first magnetically conductive unit 2904, the first full magnetic field changing unit 2906, and/or the second magnetic unit 2908 may form a magnetic circuit and a magnetic gap.

In some embodiments, the magnetic circuit component 2900 may generate a first full magnetic field. The first magnetic unit 2902 may generate a second magnetic field. A magnetic field intensity of the first full magnetic field in the magnetic gap may be greater than the magnetic field intensity of the second magnetic field in the magnetic gap. In some embodiments, the second magnetic unit 2908 may generate a third magnetic field. The third magnetic field may increase a magnetic field strength of the second magnetic field in the magnetic gap.

In some embodiments, the included angle between the magnetization direction of the first magnetic unit 2902 and the magnetization direction of the second magnetic unit 2908 may be between 0 degrees and 180 degrees. In some embodiments, the included angle between the magnetization direction of the first magnetic unit 2902 and the magnetization direction of the second magnetic unit 2908 may be between 45 degrees and 135 degrees. In some embodiments, the included angle between the magnetization direction of the first magnetic unit 2902 and the magnetization direction of the second magnetic unit 2908 may not be higher than 90 degrees.

In some embodiments, at the position of the second magnetic unit 2908, the included angle between a direction of the first full magnetic field and the magnetization direction of the second magnetic unit 2908 may not be higher than 90 degrees. In some embodiments, at the position of the second magnetic unit 2908, the included angle between the direction of the magnetic field generated by the first magnetic unit 2902 and the direction of magnetization of the second magnetic unit 2908 may be a less than or equal to 90 degrees, such as 0 degrees, 10 degrees, or 20 degrees. As another example, the magnetization direction of the first magnetic unit 2902 may be perpendicular to the lower surface or the upper surface of the first magnetic unit 2902 and be vertically upward (as shown by the direction a in the figure). The magnetization direction of the second magnetic unit 2908 may be directed from the outer ring of the second magnetic unit 2908 to the inner ring (as shown by the direction c on the right side of the first magnetic unit 2902 in the figure, the magnetization direction of the first magnetic unit 2902 may deflect 270 degrees in a clockwise direction).

Compared with a magnetic circuit component with a single magnetic unit, the first full magnetic field changing unit 2906 in the magnetic circuit component 2900 may increase the total magnetic flux in the magnetic gap, thereby increasing the magnetic induction intensity in the magnetic gap. And, under the action of the first full magnetic field changing unit 2906, originally scattered magnetic induction lines may converge to the position of the magnetic gap, further increasing the magnetic induction intensity in the magnetic gap.

Figure 35:
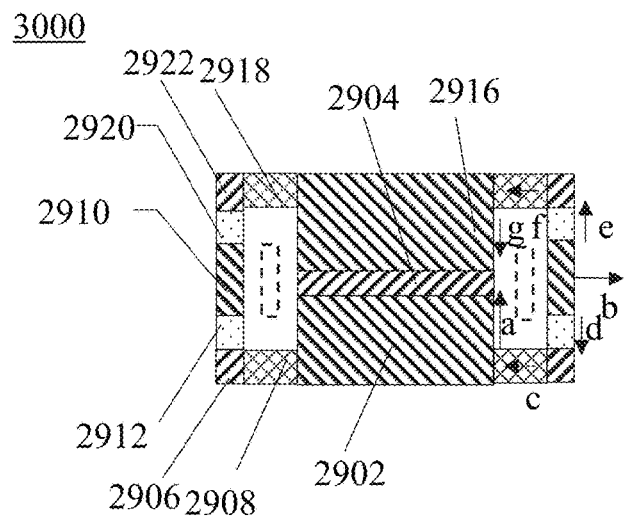
FIG. 35 is a longitudinal sectional view illustrating a magnetic circuit component 3000 according to some embodiments of the present disclosure.

FIG. 35 is a longitudinal sectional view illustrating a magnetic circuit component 3000 according to some embodiments of the present disclosure. As shown in FIG. 35, in some embodiments, the magnetic circuit component 3000 may include the first magnetic unit 2902, a first magnetically conductive unit 2904, a first full magnetic field changing unit 2906, a second magnetic unit 2908, a third magnetic unit 2910, a fourth magnetic unit 2912, a fifth magnetic unit 2916, a sixth magnetic unit 2918, a seventh magnetic unit 2920, and a second ring unit 2922. In some embodiments, the first full magnetic field changing unit 2906 and/or the second ring unit 2922 may include a ring-shaped magnetic unit or a ring-shaped magnetically conductive unit. The ring-shaped magnetic unit may include any one or more magnetic materials described in the present disclosure. The ring-shaped magnetically conductive unit may include any one or more magnetically conductive materials described in the present disclosure.

In some embodiments, the sixth magnetic unit 2918 may be connected to the fifth magnetic unit 2916 and the second ring unit 2922. The seventh magnetic unit 2920 may be connected to the third magnetic unit 2910 and the second ring unit 2922. In some embodiments, the first magnetic unit 2902, the fifth magnetic unit 2916, the second magnetic unit 2908, the third magnetic unit 2910, the fourth magnetic unit 2912, the sixth magnetic unit 2918, and/or the seventh magnetic unit 2920, the first magnetically conductive unit 2904, the first full magnetic field changing unit 2906, and the second ring unit 2922 may form a magnetic circuit.

In some embodiments, an included angle between the magnetization direction of the first magnetic unit 2902 and a magnetization direction of the sixth magnetic unit 2918 may be between 0 degrees and 180 degrees. In some embodiments, the angle between the magnetization direction of the first magnetic unit 2902 and the magnetization direction of the sixth magnetic unit 2918 may be between 45 degrees and 135 degrees. In some embodiments, the included angle between the magnetization direction of the first magnetic unit 2902 and the magnetization direction of the sixth magnetic unit 2918 may not be higher than 90 degrees. In some embodiments, the magnetization direction of the first magnetic unit 2902 may be perpendicular to the lower surface or the upper surface of the first magnetic unit 2902 and be vertically upward (as shown by the direction a in the figure). The magnetization direction of the sixth magnetic unit 2918 may be directed from an outer ring of the sixth magnetic unit 2918 to an inner ring (as shown by the direction f on a right side of the first magnetic unit 2902 in the figure, the magnetization direction of the first magnetic unit 2902 may deflect 270 degrees in a clockwise direction). In some embodiments, in the same vertical direction, the magnetization direction of the sixth magnetic unit 2918 may be the same as that of the second magnetic unit 2908. In some embodiments, the magnetization direction of the first magnetic unit 2902 may be perpendicular to the lower surface or the upper surface of the first magnetic unit 2902 and be vertically upward (as shown by the direction a in the figure). The magnetization direction of the seventh magnetic unit 2920 may be directed from the lower surface of the seventh magnetic unit 2920 to the upper surface (as shown by the direction e on the right side of the first magnetic unit 2902 in the figure, the magnetization direction of the first magnetic unit 2902 may deflect 360 degrees in the clockwise direction). In some embodiments, a magnetization direction of the seventh magnetic unit 2920 may be the same as that of the fourth magnetic unit 2912.

In some embodiments, at a position of the sixth magnetic unit 2918, an included angle between a direction of a magnetic field generated by the magnetic circuit component 2900 and the magnetization direction of the sixth magnetic unit 2918 may not be higher than 90 degrees. In some embodiments, at the position of the sixth magnetic unit 2918, the included angle between the direction of the magnetic field generated by the first magnetic unit 2902 and the direction of magnetization of the sixth magnetic unit 2918 may be less than or equal to 90 degrees, such as 0 degrees, 10 degrees, or 20 degrees.

In some embodiments, an included angle between the magnetization direction of the first magnetic unit 2902 and the magnetization direction of the seventh magnetic unit 2920 may be between 0 degrees and 180 degrees. In some embodiments, the included angle between the magnetization direction of the first magnetic unit 2902 and the magnetization direction of the seventh magnetic unit 2920 may be between 45 degrees and 135 degrees. In some embodiments, the included angle between the magnetization direction of the first magnetic unit 2902 and the magnetization direction of the seventh magnetic unit 2920 may not be higher than 90 degrees.

In some embodiments, at a position of the seventh magnetic unit 2920, an included angle between a direction of a magnetic field generated by the magnetic circuit component 3000 and the magnetization direction of the seventh magnetic unit 2920 may not be higher than 90 degrees. In some embodiments, at the position of the seventh magnetic unit 2920, the included angle between the direction of the magnetic field generated by the first magnetic unit 2902 and the direction of magnetization of the seventh magnetic unit 2920 may be less than or equal to 90 degrees, such as 0 degrees, 10 degrees, or 20 degrees.

In some embodiments, the first full magnetic field changing unit 2906 may be a ring-shaped magnetic unit. In the case, a magnetization direction of the first full magnetic field changing unit 2906 may be the same as that of the second magnetic unit 2908 or the fourth magnetic unit 2912. For example, on the right side of the first magnetic unit 2902, the magnetization direction of the first full magnetic field changing unit 2906 may be directed from an outer ring to an inner ring of the first full magnetic field changing unit 2906. In some embodiments, the second ring unit 2922 may be a ring-shaped magnetic unit. In the case, a magnetization direction of the second ring unit 2922 may be the same as that of the sixth magnetic unit 2918 or the seventh magnetic unit 2920. For example, on the right side of the first magnetic unit 2902, the magnetization direction of the second ring unit 2922 may be directed from an outer ring to an inner ring of the second ring unit 2922.

In the magnetic circuit component 3000, a number of magnetic units may increase the total magnetic flux. Different magnetic units may interact with each other, thereby suppressing the leakage of the magnetic induction lines, increasing the magnetic induction strength in the magnetic gap, and improving the sensitivity of the speaker.

Figure 36:
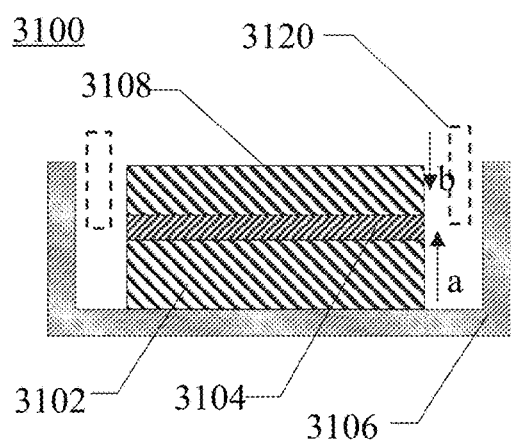
FIG. 36 is a longitudinal sectional schematic diagram illustrating a magnetic circuit component 3100 according to some embodiments of the present disclosure.

FIG. 36 is a longitudinal sectional view illustrating a magnetic circuit component 3100 according to some embodiments of the present disclosure. As shown in FIG. 36, the magnetic circuit component 3100 may include a first magnetic unit 3102, a first magnetically conductive unit 3104, a second magnetically conductive unit 3106, and a second magnetic unit 3108.

In some embodiments, the first magnetic unit 3102 and/or the second magnetic unit 3108 may include any one or more of the magnets described in the present disclosure. In some embodiments, the first magnetic unit 3102 may include a first magnet. The second magnetic unit 3108 may include a second magnet. The first magnet may be the same as or different from the second magnet. The first magnetically conductive unit 3104 and/or the second magnetically conductive unit 3106 may include any one or more magnetically conductive materials described in the present disclosure. The processing manner of the first magnetically conductive unit 3104 and/or the second magnetically conductive unit 3106 may include any one or more processing manners described in the present disclosure. In some embodiments, the first magnetic unit 3102, the first magnetically conductive unit 3104, and/or the second magnetic unit 3108 may be disposed as an axisymmetric structure. For example, the first magnetic unit 3102, the first magnetically conductive unit 3104, and/or the second magnetic unit 3108 may be cylinders. In some embodiments, the first magnetic unit 3102, the first magnetically conductive unit 3104, and/or the second magnetic unit 3108 may be coaxial cylinders with the same diameter or different diameters. The thickness of the first magnetic unit 3102 may be greater than or equal to the thickness of the second magnetic unit 3108. In some embodiments, the second magnetically conductive unit 3106 may be a groove-type structure. The groove-type structure may include a U-shaped section. The groove-type second magnetically conductive unit 3106 may include a bottom plate and a side wall. In some embodiments, the bottom plate and the side wall may be integrally formed as a whole. For example, the side wall may be formed by extending the bottom plate in a direction perpendicular to the bottom plate. In some embodiments, the bottom plate may be connected to the side wall through any one or more connection manners described in the present disclosure. The second magnetic unit 3108 may be disposed as a ring shape or a sheet shape. The shape of the second magnetic unit 3108 may refer to descriptions elsewhere in the specification. In some embodiments, the second magnetic unit 3108 may be coaxial with the first magnetic unit 3102 and/or the first magnetically conductive unit 3104.

An upper surface of the first magnetic unit 3102 may be connected to a lower surface of the first magnetically conductive unit 3104. A lower surface of the first magnetic unit 3102 may be connected to the bottom plate of the second magnetically conductive unit 3106. A lower surface of the second magnetic unit 3108 may be connected to an upper surface of the first magnetically conductive unit 3104. A connection manner between the first magnetic unit 3102, the first magnetically conductive unit 3104, the second magnetically conductive unit 3106 and/or the second magnetic unit 3108 may include one or more manners such as bonding, snapping, welding, riveting, bolting, or the like, or any combination thereof.

A magnetic gap may be formed between the first magnetic unit 3102, the first magnetically conductive unit 3104, and/or the second magnetic unit 3108 and the side wall of the second magnetically conductive unit 3106. A voice coil may be disposed in the magnetic gap. In some embodiments, the first magnetic unit 3102, the first magnetically conductive unit 3104, the second magnetically conductive unit 3106, and the second magnetic unit 3108 may form a magnetic circuit. In some embodiments, the magnetic circuit component 3100 may generate a first full magnetic field. The first magnetic unit 3102 may generate a second magnetic field. The first full magnetic field may be formed by magnetic fields generated by all components (e.g., the first magnetic unit 3102, the first magnetically conductive unit 3104, the second magnetically conductive unit 3106, and the second magnetic unit 3108) in the magnetic circuit component 3100. A magnetic field strength of the first full magnetic field in the magnetic gap (also referred to magnetic induction strength or magnetic flux density) may be greater than a magnetic field strength of the second magnetic field in the magnetic gap. In some embodiments, the second magnetic unit 3108 may generate a third magnetic field. The third magnetic field may increase the magnetic field strength of the second magnetic field in the magnetic gap.

In some embodiments, an included angle between a magnetization direction of the second magnetic unit 3108 and a magnetization direction of the first magnetic unit 3102 may be between 90 degrees and 180 degrees. In some embodiments, the included angle between the magnetization direction of the second magnetic unit 3108 and the magnetization direction of the first magnetic unit 3102 may be between 150 degrees and 180 degrees. In some embodiments, the magnetization direction of the second magnetic unit 3108 may be opposite to that of the first magnetic unit 3102 (the direction a and the direction b shown in the figure).

Compared with a magnetic circuit component with a single magnetic unit, the magnetic circuit component 3100 may add the second magnetic unit 3108. The magnetization direction of the second magnetic unit 3108 may be opposite to the magnetization direction of the first magnetic unit 3102, which may suppress a magnetic leakage of the first magnetic unit 3102 in the magnetization direction. Therefore, the magnetic field generated by the first magnetic unit 3102 may be more compressed into the magnetic gap, thereby increasing the magnetic induction strength within the magnetic gap.

Figure 37:
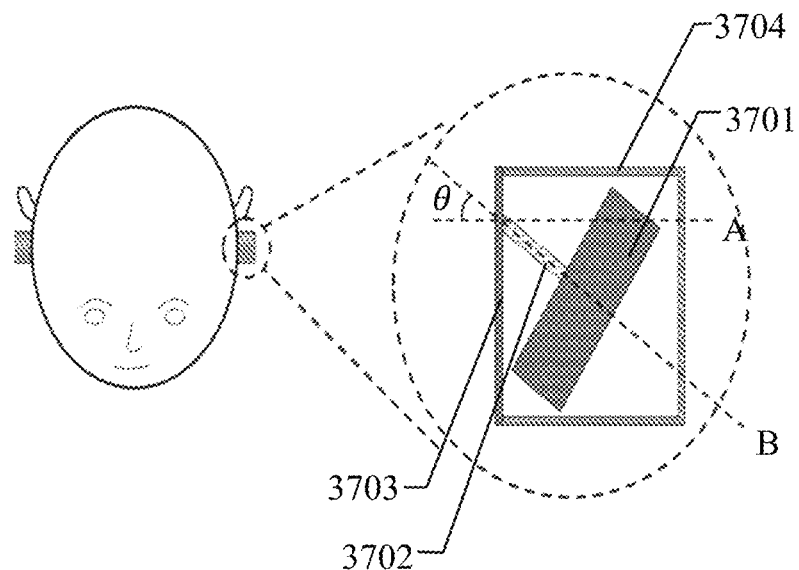
FIG. 37 is a schematic diagram of an application scenario and structure of a glasses according to some embodiments of the present disclosure.

FIG. 37 is a schematic diagram of an application scenario and structure of a bone conduction speaker according to some embodiments of the disclosure. Referring to FIG. 37 and FIG. 1, a mechanism diagram shown in FIG. 37 is equivalent to the speaker. The speaker may include the earphone core 102 and the core housing 108 in FIG. 1. The following only uses a bone conduction speaker as an example to illustrate the application scenario and structure of the speaker. In some embodiments, as shown in FIG. 37, the bone conduction speaker may include a driving component 3701, a transmission assembly 3702, a panel 3703 (the panel 103 may also be called a housing panel, which is a panel of a core housing facing a human body side), a housing 3704, etc. Referring to FIG. 1, the panel 3703 and the housing 3704 may be similar to the core housing 108 in FIG. 1. The driving component 3701 and the transmission assembly 3702 may be similar to the earphone core 102 in FIG. 1. In some embodiments, the housing 3704 may include a housing back and a housing side. The housing 3704 may be connected to the panel 3703 through the housing back and the housing side. The driving component 3701 may transmit vibration signals to the panel 3703 and/or the housing 3704 through the transmission assembly 3702, so as to contact with human skin through the panel 3703 or the housing 3704, thereby transmitting sound to the human body. In some embodiments, the panel 3703 and/or the housing 3704 of the bone conduction speaker may be in contact with the human skin at a tragus, so as to transmit sound to the human body. In some embodiments, the panel 3703 and/or the housing 3704 may also be in contact with human skin on a back side of an auricle.

In some embodiments, a straight line B (or a vibration direction of a driving device) where a driving force generated by the e driving component 3701 is located may have an included angle θ with a normal A of the panel 3703. In other words, the straight line B and the straight line A may not be parallel.

The panel has an area that is in contact with or abutting on the user's body, such as, human skin. It should be understood that when the panel is covered with other materials (e.g., soft materials such as silicone, etc.) to enhance wearing comfort of the user, a relationship between the panel and the user's body may not direct contact, but be abutting on each other. In some embodiments, after the bone conduction speaker is worn on the user's body, all regions of the panel may be in contact with or abutting on the user's body. In some embodiments, after the bone conduction speaker is worn on the user's body, part region of the panel may be in contact with or abutting on the user's body. In some embodiments, the region of the panel used to contact with or abut on the user's body may occupy more than 50% of the entire panel area. More preferably, the region may occupy more than 60% of the panel area. Generally speaking, the region of the panel that is in contact with or abutting on the user's body may be a flat surface or a curved surface.

In some embodiments, when the region of the panel used to contact with or abut on the user's body is a plane, the normal may be satisfied with a general definition of a normal. That is, it is a dashed line perpendicular to the plane. In some embodiments, when the region of the panel used to contact with or abut on the user's body is a curved surface, the normal may be an average normal of the region. As used herein, the average normal may be defined as follows:

$$\hat{r}_0 = \frac{\oiint_S \hat{r} ds}{|\oiint_S \hat{r} ds|} \quad (4)$$

As used herein, $\hat{r}_0$ is the average normal; $\hat{r}$ is a normal of any point on the surface, and ds is a surface element.

Further, the curved surface may be a quasi-plane close to a plane, that is, a surface where an included angle between the normal of any point in at least 50% of the region of the curved surface and the average normal is less than a set threshold. In some embodiments, the set threshold may be less than 10 degrees. In some embodiments, the set threshold may be further less than 5 degrees.

In some embodiments, the straight line B where the driving force is located and a normal A' of the region on the panel 3703 used to contact with or abut on the user's body may have the included angle θ. A value range of the included angle θ may be from 0 to 180 degrees. Further, the value range of the included angle θ may be from 0 to 180 degrees and not equal to 90 degrees. In some embodiments, setting the straight line B to have a positive direction pointing to outside of the bone conduction speaker and setting the normal A of the panel 3703 (or the normal A' of a contact surface of the panel 3703 and the human skin) to have a positive direction pointing to outside of the bone conduction speaker, an included angle θ formed by the normal A or A' and the straight line B in the positive direction may be an acute angle, that is, from 0 to 90 degree. More descriptions regarding the normal A and the normal A' may be found in FIG. 39 and related descriptions, which may not be repeated herein.

Figure 38:
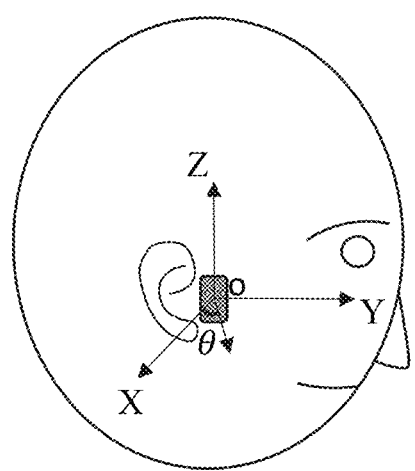
FIG. 38 is a schematic diagram illustrating an angle direction according to some embodiments of the present disclosure.

FIG. 38 is a schematic diagram illustrating an angle direction according to some embodiments of the present disclosure. As shown in FIG. 38, in some embodiments, a driving force generated by a driving device may have components in a first quadrant and/or a third quadrant of a plane coordinate system XOY. As used herein, the plane coordinate system XOY is a reference coordinate system, and the origin O of the plane coordinate system XOY is located on a contact surface between a panel and/or a housing and a human body after a bone conduction speaker is worn a human body. An X-axis may be parallel to a coronal axis of the human body and a Y-axis may be parallel to a sagittal axis of the human body. A positive direction of the X-axis may be facing toward outside of the human body, and a positive direction of the Y-axis may be facing toward front of the human body. The quadrant should be understood as four regions divided by a horizontal axis (e.g., the X axis) and a vertical axis (e.g., the Y axis) in a plane rectangular coordinate system, and each region is called a quadrant. The quadrant is centered at the origin, and the X and Y axes are the dividing lines. The upper right region (a region enclosed by a positive half axis of the X axis and a positive half axis of the Y axis) is called the first quadrant, the upper left region (a region enclosed by a negative half axis of the X axis and the positive half axis of the Y axis) is called a second quadrant, the lower left region (a region enclosed by the negative half axis of the X axis and a negative half axis of the Y axis) is called the third quadrant, and the lower right region (a region enclosed by the positive half axis of the X axis and the negative half axis of the Y axis) is called a fourth quadrant. As used herein, a point on the coordinate axis may not belong to any quadrant. It should be understood that the driving force in this embodiment may be directly located in the first quadrant and/or third quadrant of the plane coordinate system XOY. Alternatively, the driving force may be directed in other directions, but a projection or component in the first quadrant and/or the third quadrant of the plane coordinate system XOY is not zero, and the projection or component in a Z-axis direction may be zero or not zero. As used herein, the Z axis is perpendicular to the plane XOY and passes through the origin O. In some specific embodiments, a minimum included angle θ between the straight line where the driving force is located and the normal of the region on the panel that is in contact with or abutting on the user's body may be any acute angle. For example, a range of the included angle θ may be preferably 5-80 degrees. More preferably, the range may be 15-70 degrees. More preferably, the range may be 25-60 degrees. More preferably, the range may be 25-50 degrees. More preferably, the range may be 28-50 degrees. More preferably, the range may be 30-39 degrees. More preferably, the range may be 31-38 degrees. Further preferably, the range may be 32-37 degrees. Further preferably, the range may be 33-36 degrees. Further preferably, the range may be 33-35.8 degrees. Further preferably, the range may be 33.5-35 degrees. Specifically, the included angle θ may be 26 degrees, 27 degrees, 28 degrees, 29 degrees, 30 degrees, 31 degrees, 32 degrees, 33 degrees, 34 degrees, 34.2 degrees, 35 degrees, 35.8 degrees, 36 degrees, 37 degrees, 38 degrees, etc., and an error may be controlled within 0.2 degree. It should be noted that the above description of the direction of the driving force should not be interpreted as a limitation of the driving force in the present disclosure. In other embodiments, the driving force may also have components in the second and fourth quadrants of the plane coordinate system XOY. Even the driving force may be located on the Y axis, etc.

Figure 39:
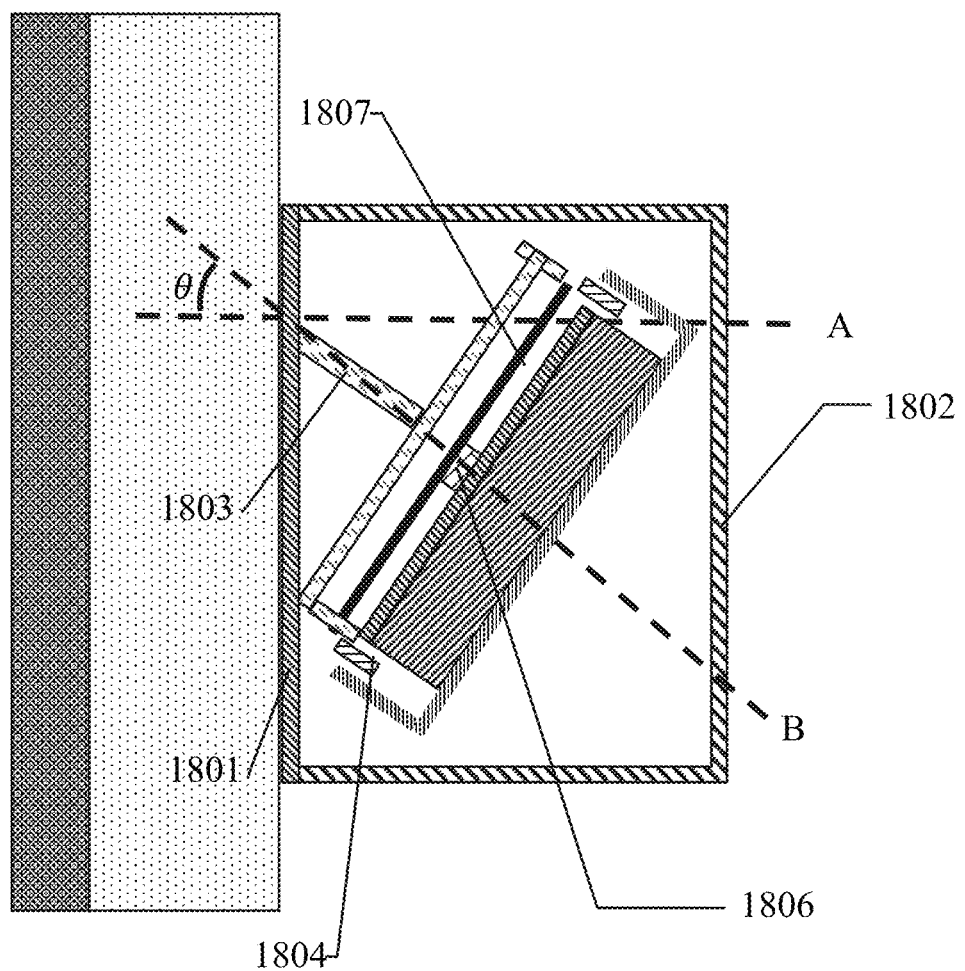
FIG. 39 is a structural schematic diagram illustrating a bone conduction speaker acting on human skin and bones according to some embodiments of the present disclosure.

FIG. 39 is a structural schematic diagram illustrating a bone conduction speaker acting on human skin and bones according to some embodiments of the present disclosure.

In some embodiments, a straight line where a driving force is located may be collinear or parallel to a straight line where a drive device vibrates. For example, in a driving device based on a moving coil principle, a direction of the driving force may be the same as or opposite to a vibration direction of a coil and/or a magnetic circuit assembly. A panel may be flat or curved. Alternatively, the panel may have a number of protrusions or grooves. In some embodiments, after a bone conduction speaker is worn on a user's body, a normal of a region on the panel that is in contact with or abuts against the user's body is not parallel to the straight line where the driving force is located. Generally speaking, the region on the panel that is in contact with or abuts against the user's body may be relatively flat. Specifically, the region may be a plane or a quasi-plane with little curvature. When the region on the panel used to contact with or abut on the user's body is a plane, a normal of any point on the region may be used as a normal of the region. At this time, the normal A of the panel 3703 and a normal A' of a contact surface where the panel 3703 is in contact with human skin may be parallel or coincident. When the panel on the panel used to contact with the user's body is not a plane, the normal of the area may be an average normal of the region. The detailed definition of the average normal may be referred to the related description in FIG. 37, which will not be repeated herein. In some other embodiments, when the panel on the panel used to contact with the user's body is not a plane, the normal of the region may also be determined as follows: selecting a certain point in a region when the panel is in contact with the human skin, determining a tangent plane of the panel at this point, determining a straight line that passes through the point and is perpendicular to the tangent plane, and designating the straight line as the normal of the panel. When the panel on the panel used to contact the human skin is not a plane, the selected point may be different, the tangent plane of the panel at the point may be different, and the determined normal may be different. At this time, the normal A' and the normal A of the panel may not be parallel. According to a specific embodiment of the present disclosure, the straight line where the driving force is located (or the straight line where the driving device vibrates) may have an included angle θ with the normal of the region, and a range of the included angle may be from 0 to 180 degrees. In some embodiments, when setting the straight line where the driving force is located to have a positive direction through the panel (or a contact surface of the panel and/or the housing and the human skin) pointing out of the bone conduction speaker and setting the normal of the panel (or the contact surface of the panel and/or the housing and the human body) to have a positive direction pointing out of the bone conduction speaker, the included angle formed by the two straight lines in the positive direction may be an acute angle.

As shown in FIG. 39, the bone conduction speaker may include a driving device (also referred to as a transducing device in other embodiments), a transmission assembly 1803, a panel 1801, and a housing 1802. In some embodiments, a coil 1804 and a magnetic circuit assembly 1807 may be both ring-shaped structures. In some embodiments, the driving device may be a moving coil driving manner, and include the coil 1804 and the magnetic circuit assembly 1807.

In some embodiments, the coil 1804 and the magnetic circuit assembly 1807 may have axes parallel to each other. The axis of the coil 1804 or the magnetic circuit assembly 1807 may be perpendicular to a radial plane of the coil 1804 and/or a radial plane of the magnetic circuit assembly 1807. In some embodiments, the coil 1804 and the magnetic circuit assembly 1807 may have a same central axis. The central axis of the coil 1804 may be perpendicular to the radial plane of the coil 1804 and passes through a geometric center of the coil 1804. The central axis of the magnetic circuit component 1807 may be perpendicular to the radial plane of the magnetic circuit component 1807 and passes through a geometric center of the magnetic circuit component 1807. The axis of the coil 1804 or the magnetic circuit assembly 1807 and the normal of the panel 1801 may have the aforementioned angle θ.

Only for an example, referring to FIG. 39, a relationship between the driving force F and a skin deformation S may be explained below. When the straight line where the driving force generated by the driving device is located may be parallel to the normal of the panel 1801 (i.e., the included angle is zero), the relationship between the driving force and a total skin deformation may be:

$$F_\perp = S_\perp \times E \times A/h \quad (5)$$

As used herein, $F_\perp$ is the driving force, $S_\perp$ is the total deformation of the skin in a direction perpendicular to the skin, E is an elastic modulus of the skin, A is a contact area between the panel and the skin, and h is a total thickness of the skin (i.e., a distance between the panel and the bone).

When the straight line where the driving force of the driving device is located is perpendicular to the normal of the region on the panel that is in contact with or abuts against the user's body (i.e., the angle θ is 90 degrees), a relationship between the driving force in a vertical direction and the total skin deformation may be as Equation (6) shown:

$$F_{//} = S_{//} \times G \times A/h \quad (6)$$

As used herein, $F_{//}$ is a magnitude of the driving force, $S_{//}$ is a total deformation of the skin in a direction parallel to the skin, G is a shear modulus of the skin, A is the contact area between the panel and the skin, and h is the total thickness of the skin (i.e., the distance between the panel and the bone).

The relationship between the shear modulus and the elastic modulus may be:

$$G = E/2(1+\gamma) \quad (7)$$

As used herein, γ is the Poisson's ratio of the skin and 0<γ<0.5, so the shear modulus may be smaller than the elastic modulus, the corresponding total deformation of the skin may be $S_{//} > S_\perp$ under a same driving force. Generally, the Poisson's ratio of the skin may be close to 0.4.

When the straight line where the driving force is generated by the driving device is not parallel to the normal of the region where the panel is in contact with the user's body, a horizontal driving force and a vertical driving force may be expressed as the following Equation (8) and Equation (9), respectively:

$$F_\perp = F \times \cos(\theta) \quad (8)$$

$$F_{//} = F \times \sin(\theta) \quad (9)$$

As used herein, a relationship between driving force and skin deformation may be expressed by the following equation:

$$S = \sqrt[2]{S_\perp^2 + S_{//}^2} = \frac{h}{A} \times F \times \sqrt[2]{(\cos(\theta)/E)^2 + (\sin(\theta)/G)^2} \quad (10)$$

When the Poisson's ratio of the skin is 0.4, the detailed description of the relationship between the included angle and the total skin deformation may be referred to the specific content elsewhere in the present disclosure.

Figure 40:
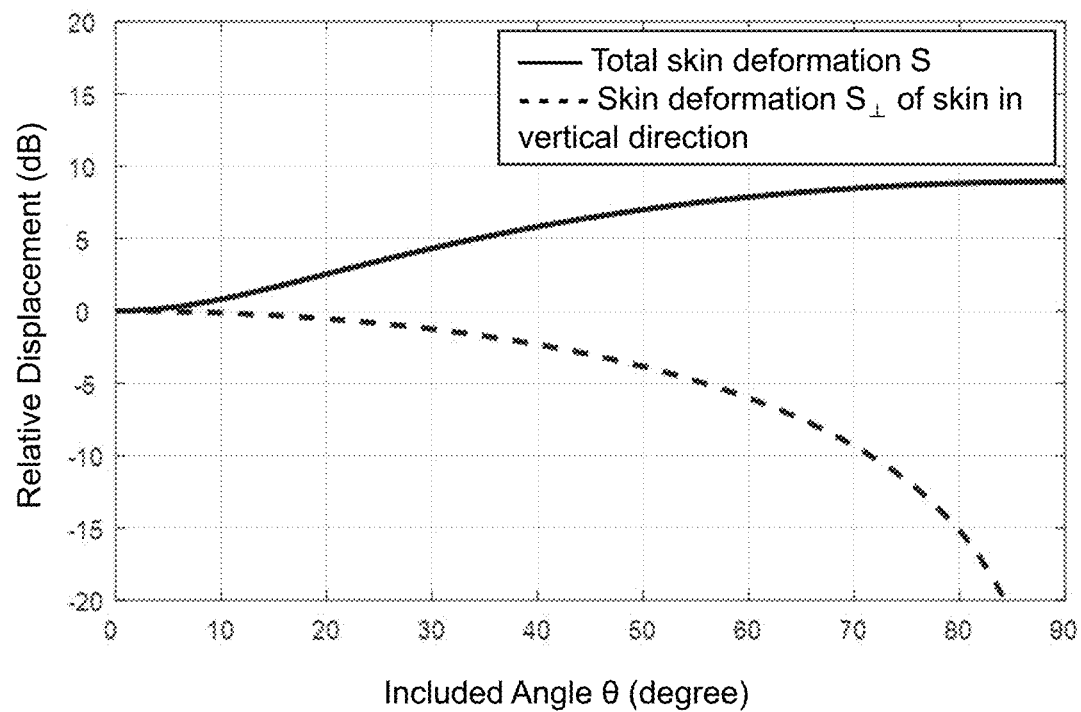
FIG. 40 is a diagram illustrating a relationship of an included angle and a relative displacement of a bone conduction speaker according to some embodiments of the present disclosure.

FIG. 40 is a diagram illustrating a relationship of an included angle and a relative displacement of a bone conduction speaker according to some embodiments of the present disclosure. As shown in FIG. 40, the relationship between the included angle and a total skin deformation is that the larger the included angle and the greater the relative displacement, the greater the total skin deformation S. The skin deformation $S_\perp$ of the skin in a vertical direction may increase as the included angle increases. If the relative displacement decreases, the skin deformation $S_\perp$ of the skin in the vertical direction may decrease. When the included angle is close to 90 degrees, the skin deformation $S_\perp$ of the skin in the vertical direction may gradually tend to zero.

A volume of the bone conduction speaker in a low frequency part may be positively correlated with the total skin deformation S. The greater the S, the greater the volume of the bone conduction in the low frequency. The volume of the bone conduction speaker in a high frequency part may be positively correlated with the skin deformation $S_\perp$ in the vertical direction. The bigger the skin deformation $S_\perp$ in the vertical direction, the greater the volume of the bone conduction in the low frequency.

When the Poisson's ratio of the skin is 0.4, the detailed description of the relationship between the included angle θ and the total skin deformation S and the relationship between the included angle θ and the skin deformation $S_\perp$ in the vertical direction may be found in FIG. 40. As shown in FIG. 40, the relationship between the included angle θ and the total skin deformation S may be that the greater the included angle θ, the greater the total skin deformation S, the greater the corresponding volume of the bone conduction speaker in the low frequency. As shown in FIG. 40, the relationship between the included angle θ and the skin deformation $S_\perp$ in the vertical direction may be that the greater the included angle θ, the smaller the skin deformation $S_\perp$ in the vertical direction, the smaller the corresponding volume of the bone conduction speaker in the high frequency.

Through Equation (10) and the curve in FIG. 40, it should be noted that, with the increase of the included angle θ, a speed of the increase of the total deformation of skin S and a speed of the decrease of the skin deformation $S_\perp$ in the vertical direction may be different. The speed of the increase of the total deformation of skin S may increase faster at first and then slower, and the speed of the decrease of the skin deformation $S_\perp$ in the vertical direction may decrease at a faster and faster rate. To balance the volume of the low frequency and high frequency components of the bone conduction speaker, the included angle θ should be in a suitable size. For example, a range of θ may be 5-80 degrees, 15-70 degrees, 25-50 degrees, or 25-35 degrees, 25-30 degrees, etc.

Figure 41:
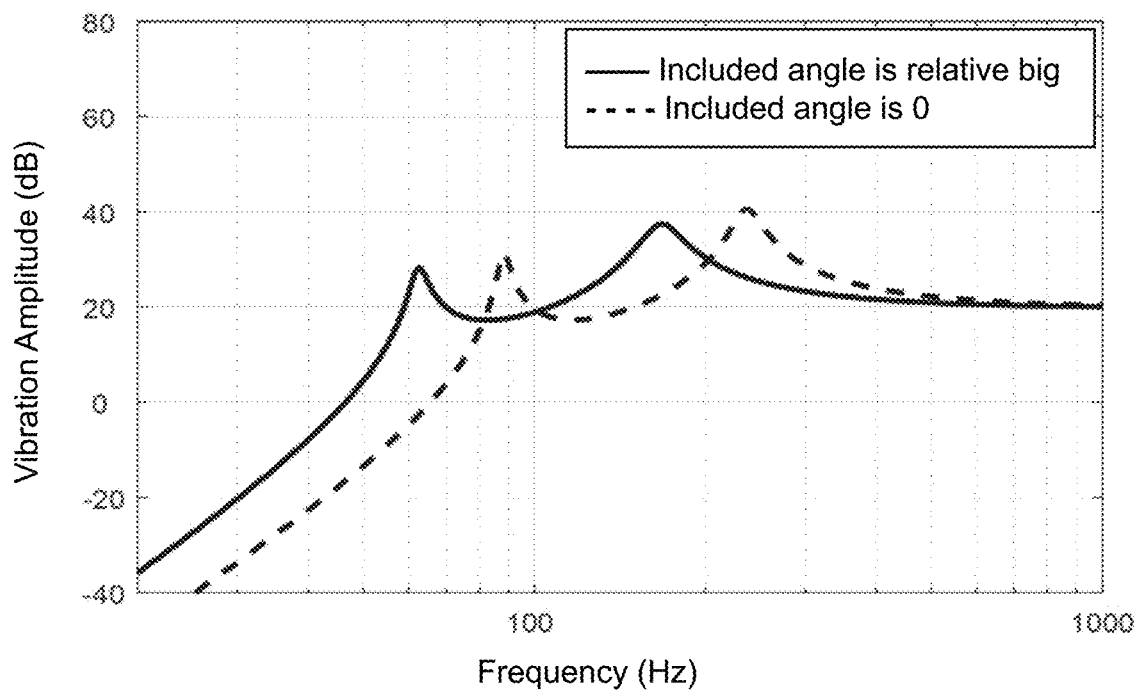
FIG. 41 is a schematic diagram illustrating a low-frequency part of a frequency response curve of a bone conduction speaker with different included angles θ according to some embodiments of the present disclosure.

FIG. 41 is a schematic diagram illustrating a low-frequency part of a frequency response curve of a bone conduction speaker with different included angles according to some embodiments of the present disclosure. As shown in FIG. 41, a panel may be in contact with skin and transmit vibrations to the skin. In this process, the skin may also affect the vibration of the bone conduction speaker, thereby affecting the frequency response curve of the bone conduction speaker. From the above analysis, it should be found that the greater an included angle, the greater a total deformation of the skin under a same driving force. For the bone conduction speaker, it may be equivalent to a reduction in the elasticity of the skin relative to the panel. It may be further understood that when a straight line where the driving force of the driving device is located and a normal of a region on the panel that is in contact with or abutting with a user's body are formed a certain angle θ, especially when the angle θ increases, a formant of the low frequency area in the frequency response curve may be adjusted to a lower frequency region, so that the low frequency may dive deeper and the low frequency may increase. Compared with other technical means to improve the low-frequency components of the sound, such as adding a vibration plate to the bone conduction speaker, setting the included angle may effectively suppress the increase of the sense of vibration while increasing the low-frequency energy, thereby reducing the sense of vibration. Therefore, low-frequency sensitivity of the bone conduction speaker may be significantly improved, thereby improving sound quality and human experience. It should be noted that, in some embodiments, increased low frequency and less sense of vibration may be expressed that when the included angle θ increases in a range of 0 to 90 degrees, energy in the low frequency range of the vibration or sound signal increases, and the sense of vibration has also increased simultaneously, but the energy in the low-frequency range has increased to a greater degree than the sense of vibration. Therefore, in terms of relative effects, the sense of vibration may have been relatively decreased. It should be seen from FIG. 41 that, when the included angle is large, the formant in the low frequency region appears in a lower frequency range, which may extend a flat part of a frequency curvature in a disguised manner, thereby improving the sound quality of the speaker.

Figure 42:
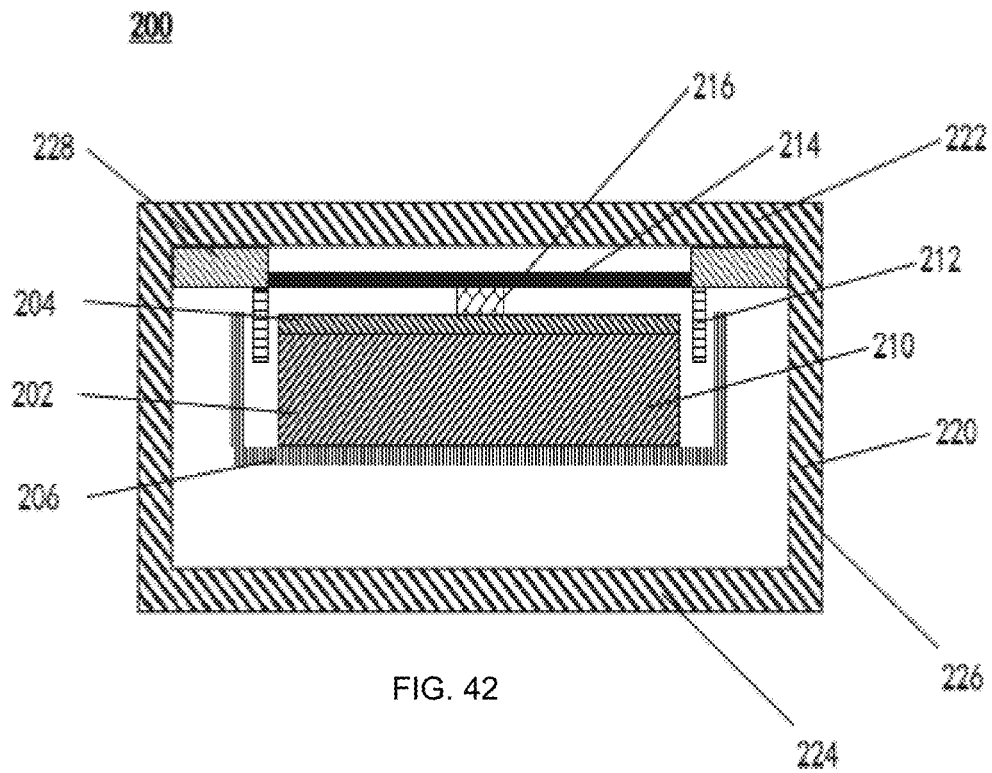
FIG. 42 is a longitudinal sectional view illustration a bone conduction speaker according to some embodiments of the present disclosure.

FIG. 42 is a longitudinal sectional view illustration a bone conduction speaker according to some embodiments of the present disclosure. It should be noted that the bone conduction speaker 200 in FIG. 42 may correspond to the earphone core 102 and the core housing 108 in FIG. 1. An earphone housing 220 may correspond to the core housing 108. As shown in FIG. 42, in some embodiments, the bone conduction speaker 200 may include the magnetic circuit assembly 210, the coil 212, the transmission vibration plate 214, the connection piece 216, and the earphone housing 220. The magnetic circuit assembly 210 may include a first magnetic element 202, a first magnetic guide element 204, and a second magnetic guide element 206.

In some embodiments, the earphone housing 220 may include a housing panel 222, a housing back 224, and a housing side 226. The housing back 224 may be located on a side opposite to the housing panel 222, and respectively disposed on two ends of the housing side 226. The housing panel 222, the housing back 224, and the housing side 226 may form an integral structure with a certain accommodation space. In some embodiments, the magnetic circuit assembly 210, the coil 212, and the transmission vibration plate 214 may be fixed inside the earphone housing 220. In some embodiments, the bone conduction speaker 200 may further include a housing bracket 228. The vibration transmission piece 214 may be connected to the earphone housing 220 through the housing bracket 228. The coil 212 may be fixed on the housing bracket 228. The housing 220 may be driven to vibrate by the housing bracket 228. In some embodiments, the housing bracket 228 may be a part of the earphone housing 220. Alternatively, the housing bracket 228 may be a separate component, directly or indirectly connected to the inside of the earphone housing 220. In some embodiments, the housing bracket 228 may be fixed on an inner surface of the housing side 226. In some embodiments, the housing bracket 228 may be pasted on the earphone housing 220 by glue, or be fixed on the earphone housing 220 by stamping, injection molding, clamping, riveting, screw connection, or welding.

In some embodiments, it may be possible to design a connection mode of the housing panel 222, the housing back 224, and the housing side 226 to ensure that the earphone housing 220 has a greater rigidity. For example, the housing panel 222, the housing back 224, and the housing side 226 may be integrally formed. As another example, the housing back 224 and the housing side 226 may be an integral structure. The housing panel 222 and the housing side 226 may be directly pasted and fixed by glue, or fixed by means of clamping, welding, or threaded connection. The glue may be glue with strong viscosity and high hardness. Still another example, the housing panel 222 and the housing side 226 may be an integral structure, and the housing back 224 and the housing side 226 may be directly pasted and fixed by glue, or fixed by the clamping, welding, or threaded connection. In some embodiments, the housing panel 222, the housing back 224, and the housing side 226 may be all independent components, and the three components may be connected and fixed by one or a combination of the glue, clamping, welding, or threaded connection. For example, the housing panel 222 and the housing side 226 may be connected by the glue, and the housing back 224 and the housing side 226 may be connected by the clamping, welding, or threaded connection. Alternatively, the housing back 224 and the housing side 226 may be connected by the glue, and the housing panel 222 and the housing side 226 may be connected by the clamping, welding, or threaded connection.

In different application scenarios, the housing described in the present disclosure may be made by different assembly manners. For example, as described elsewhere in the present disclosure, the housing may be integrally formed, a separate combination, or a combination of the two manners. In the manner of the separate combination, different separate components may be pasted and fixed by glue, or fixed by the clamping, welding or threaded connection. Specifically, in order to better understand the assembly manner of the earphone housing of the bone conduction earphone in the present disclosure, FIGS. 43-45 may describe several examples of the assembly manner of the housing.

Figure 43:
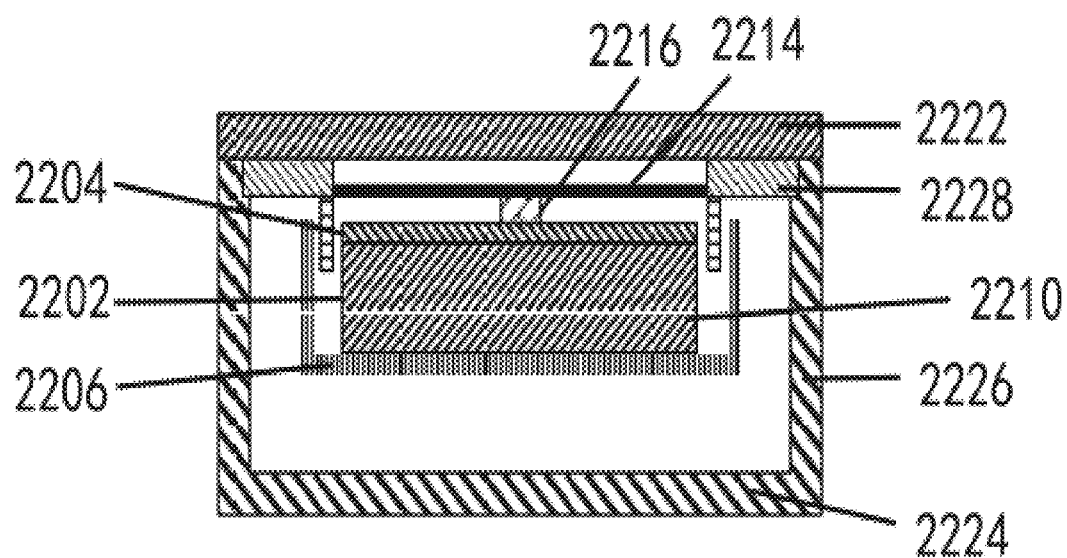
FIG. 43 is a schematic diagram illustrating a structure of a bone conduction speaker according to some embodiments of the present disclosure.

As shown in FIG. 43, the bone conduction speaker may mainly include a magnetic circuit assembly 2210 and a housing. In some embodiments, the magnetic circuit assembly 2210 may include a first magnetic element 2202, a first magnetic guide element 2204, and a second magnetic guide element 2206. The housing may include a housing panel 2222, a housing back 2224, and a housing side 2226. The housing side surface 2226 and the housing back surface 2224 may be made in an integral manner, and the housing panel 2222 may be connected to one end of the housing side 2226 through a separate combination. The separate combination may include pasted and fixed with glue, or fixed the housing panel 2222 to one end of the housing side 2226 by means of clamping, welding or threaded connection. The housing panel 2222 and the housing side 2226 (or the housing back 2224) may be made of different materials, a same material, or partly same materials. In some embodiments, the housing panel 2222 and the housing side 2226 may be made of the same material, and a Young's modulus of the same material may be greater than 2000 MPa. More preferably, the Young's modulus of the same material may be greater than 4000 MPa. More preferably, the Young's modulus of the same material may be greater than 6000 MPa. More preferably, the Young's modulus of the earphone housing 220 material may be greater than 8000 MPa. More preferably, the Young's modulus of the same material may be greater than 12000 MPa. More preferably, the Young's modulus of the same material may be greater than 15000 MPa. Further preferably, the Young's modulus of the same material may be greater than 18000 MPa. In some embodiments, the housing panel 2222 and the housing side 2226 may be made of different materials, and Young's moduli of the different materials may be greater than 4000 MPa. More preferably, the Young's moduli of the different materials may be all greater than 6000 MPa. More preferably, the Young's moduli of the different materials may be greater than 8000 MPa. More preferably, the Young's moduli of the different materials are all greater than 12000 MPa. More preferably, the Young's moduli of the different materials may be greater than 15000 MPa. Further preferably, the Young's moduli of the different materials may be greater than 18000 MPa. In some embodiments, the material of the housing panel 2222 and/or the housing side 2226 may include but not be limited to AcrYlonitrile butadiene styrene (ABS), PolYstYrene (PS), high High impact polYstYrene (HIPS), PolYpropYlene (PP), PolYethYlene terephthalate (PET), PolYester (PES), PolYcarbonate (PC), PolYam ides (PA), PolYvinYl chloride (PVC), PolYurethanes (PU), PolYvinYlidene chloride, PolYethYlene (PE), PolYmethYl methacrylate (PMMA), PolYetheretherketone (PEEK), Phenolics (PF), Urea-formaldehYde (UF), melamine formaldehyde (MF), some metals, alloy (e.g., aluminum alloy, chromium-molybdenum steel, scandium alloy, magnesium alloy, titanium alloy, magnesium-lithium alloy, nickel alloy, etc.), glass fiber, carbon fiber, or any combination of thereof. In some embodiments, the material of the housing panel 2222 may be any combination of glass fiber, carbon fiber, polycarbonate (PC), PolYamides (PA), and other materials. In some embodiments, the material of the housing panel 2222 and/or the housing side 2226 may be made by mixing carbon fiber and polycarbonate (PC) in a certain ratio. In some embodiments, the material of the housing panel 2222 and/or the housing side 2226 may be made by mixing carbon fiber, glass fiber, and polycarbonate (PolYcarbonate, PC) in a certain proportion. In some embodiments, the material of the housing panel 2222 and/or the housing side 2226 may be made by mixing glass fiber and PolYcarbonate (PC) in a certain proportion, or made of glass fiber and PolYam ides (PA) in a certain proportion.

In some embodiments, the housing panel 2222, the housing back 2224, and the housing side 2226 may form an integral structure with a certain accommodation space. In the overall structure, the vibration transmission plate 2214 may be connected to the magnetic circuit assembly 2210 through the connection member 2216. Two sides of the magnetic circuit assembly 2210 may be respectively connected to the first magnetic guide element 2204 and the second magnetic guide element 2206. The vibration transmission plate 2214 may be fixed inside the overall structure through the housing bracket 2228. In some embodiments, the housing side 2226 may have a step structure for supporting the housing bracket 2228. After the housing support 2228 is fixed to the housing side 2226, the housing panel 2222 may be fixed on the housing support 2228 and the housing side 2226 at the same time, or separately fixed on the housing support 2228 or the housing side 2226. In this case, optionally, the housing side 2226 and the housing bracket 2228 may be integrally formed. In some embodiments, the housing bracket 2228 may be directly fixed on the housing panel 2222 (e.g., by means of glue, clamping, welding, or threaded connection). The fixed housing panel 2222 and housing bracket 2228 may be then fixed to the housing side (e.g., by means of glue, clamping, welding, or threaded connection). In this case, optionally, the housing bracket 2228 and the housing panel 2222 may be integrally formed.

Figure 44:
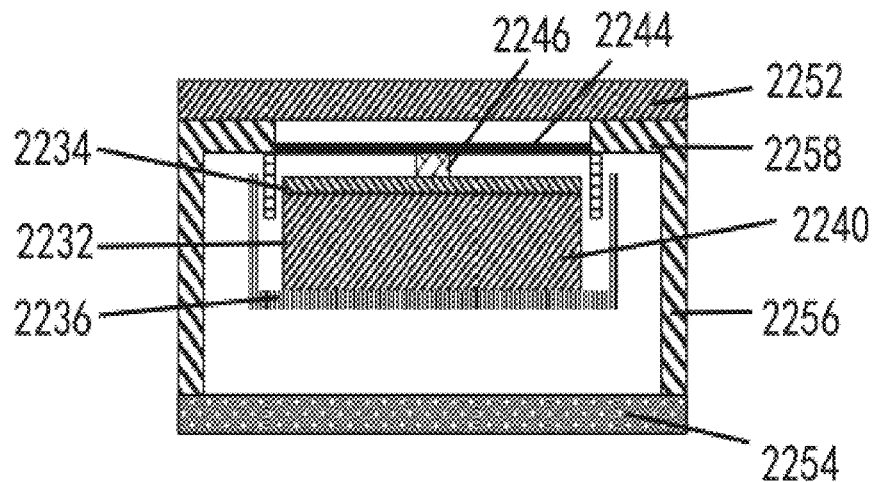
FIG. 44 is a schematic diagram illustrating a structure of another bone conduction speaker according to some embodiments of the present disclosure.

In another specific embodiment, as shown in FIG. 44, the bone conduction speaker may mainly include a magnetic circuit assembly 2240 and a housing. As used herein, the magnetic circuit assembly 2240 may include a first magnetic element 2232, a first magnetic guide element 2234, and a second magnetic guide element 2236. In the overall structure, a vibration transmission plate 2244 may be connected to the magnetic circuit assembly 2240 through a connection member 2246. A difference between the embodiment and the embodiment provided in FIG. 43 may be that a housing bracket 2258 and the housing side 2256 are integrally formed. The housing panel 2252 may be fixed to one side of the housing side 2256 connected to the housing bracket 2258 (e.g., by means of glue, clip, welding, or threaded connection), and the housing back 2254 may be fixed to the other side of the housing side 2256 (e.g., by means of glue, clamping, welding, or threaded connection, etc.). In this case, optionally, the housing support 2258 and the housing side 2256 may be a separate combined structure, and the housing panel 2252, the housing back 2254, the housing support 2258, and the housing side 2256 may be all pasted and fixed by glue, clamping, welding, or threaded connection for fixed connection.

Figure 45:
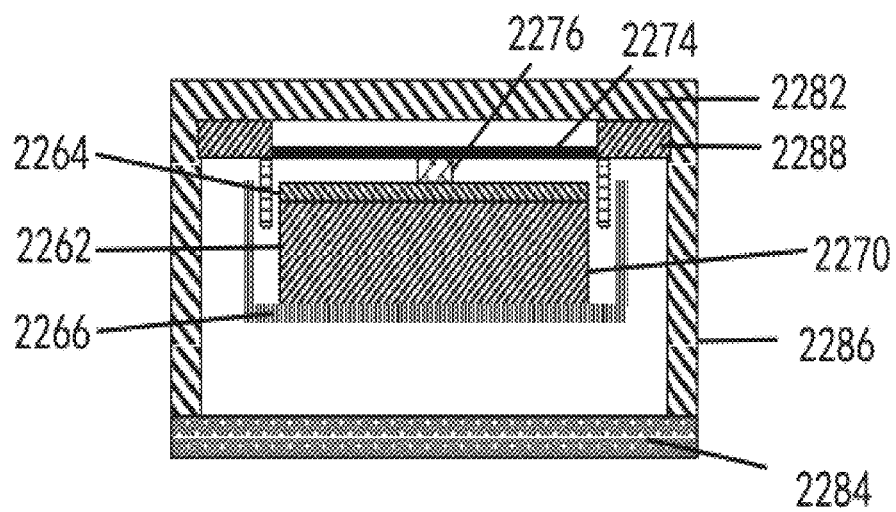
FIG. 45 is a schematic diagram illustrating a structure of still another bone conduction speaker according to some embodiments of the present disclosure.

In another specific embodiment, as shown in FIG. 45, the bone conduction speaker in the embodiment may mainly include a magnetic circuit assembly 2270 and a housing. As used herein, the magnetic circuit assembly 2270 may include a first magnetic element 2262, a first magnetic guide element 2264, and a second magnetic guide element 2266. In the overall structure, a vibration transmission plate 2274 may be connected to the magnetic circuit assembly 2270 through a connection member 2276. A difference between the embodiment and the embodiment provided in FIG. 44 may be that the housing panel 2282 and the housing side surface 2286 are integrally formed. The housing back 2284 may be fixed on the housing side 2286 opposite to one side of the housing panel 2282 (e.g., by means of glue, clamping, welding or screw connection). The housing bracket 2288 may be fixed on the housing panel 2282 and/or the housing side 2286 by means of glue, clamping, welding or threaded connection. In this case, optionally, the housing bracket 2288, the housing panel 2282, and the housing side 2286 may be integrally formed.

Figure 46:
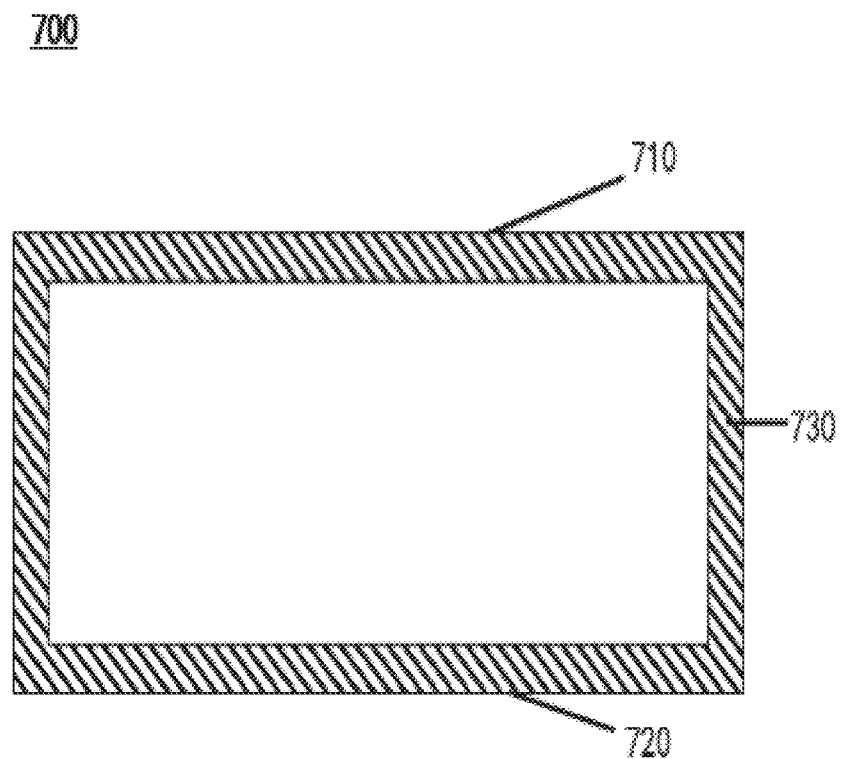
FIG. 46 is a schematic diagram illustrating a housing structure of a bone conduction speaker according to some embodiments of the present disclosure.

FIG. 46 is a schematic diagram illustrating a housing structure of a bone conduction speaker according to some embodiments of the present disclosure. As shown in FIG. 46, the housing 700 may include a housing panel 710, a housing back 720, and a housing side 730. The housing panel 710 may be in contact with a human body, and transmit a vibration of the bone conduction speaker to auditory nerve of the human body. In some embodiments, when an overall rigidity of the housing 700 is relatively large, vibration amplitudes and phases of the housing panel 710 and the housing back 720 may remain the same or substantially same (the housing side 730 does not compress air and therefore does not generate sound leakage) within a certain frequency range, so that a first sound leakage signal generated by the housing panel 710 and a second sound leakage signal generated by the housing back 720 may be superimposed on each other. The superposition may reduce the amplitude of a first leakage sound wave or a second leakage sound wave, thereby achieving a purpose of reducing the sound leakage of the housing 700. In some embodiments, the certain frequency range may include at least a part of frequencies greater than 500 Hz. Preferably, the certain frequency range may include at least a part of frequencies greater than 600 Hz. Preferably, the certain frequency range may include at least a part of frequencies greater than 800 Hz. Preferably, the certain frequency range may include at least a part of frequencies greater than 1000 Hz. Preferably, the certain frequency range may include at least a part of frequencies greater than 2000 Hz. More preferably, the certain frequency range may include at least a part of frequencies greater than 5000 Hz. More preferably, the certain frequency range may include at least a part of frequencies greater than 8000 Hz. Further preferably, the certain frequency range may include at least a part of frequencies greater than 10000 Hz.

In some embodiments, the rigidity of the housing of the bone conduction speaker may affect the vibration amplitude and phase of different parts of the housing (e.g., the housing panel, the housing back, and/or the housing side), thereby affecting the sound leakage of the bone conduction speaker. In some embodiments, when the housing of the bone conduction speaker has relatively large rigidity, the housing panel and the housing back may maintain a same or substantially same vibration amplitude and phase at a higher frequency, thereby significantly reducing the sound leakage of the speaker.

In some embodiments, the higher frequency may include a frequency not less than 1000 Hz, for example, a frequency between 1000 Hz and 2000 Hz, a frequency between 1100 Hz and 2000 Hz, a frequency between 1300 Hz and 2000 Hz, a frequency between 1500 Hz and 2000 Hz, a frequency between 1700 Hz and 2000 Hz, and a frequency between 1900 Hz and 2000 Hz. Preferably, the higher frequency mentioned herein may include a frequency not less than 2000 Hz, for example, a frequency between 2000 Hz and 3000 Hz, a frequency between 2100 Hz and 3000 Hz, a frequency between 2300 Hz and 3000 Hz, a frequency between 2500 Hz and 3000 Hz, a frequency between 2700 Hz and 3000 Hz, or a frequency between 2900 Hz and 3000 Hz. Preferably, the higher frequency may include a frequency not less than 4000 Hz, for example, a frequency between 4000 Hz and 5000 Hz, a frequency between 4100 Hz and 5000 Hz, a frequency between 4300 Hz and 5000 Hz, a frequency between 4500 Hz and 5000 Hz, a frequency between 4700 Hz and 5000 Hz, or a frequency between 4900 Hz and 5000 Hz. More preferably, the higher frequency may include a frequency not less than 6000 Hz, for example, a frequency between 6000 Hz and 8000 Hz, a frequency between 6100 Hz and 8000 Hz, a frequency between 6300 Hz and 8000 Hz, a frequency between 6500 Hz and 8000 Hz, a frequency between 7000 Hz and 8000 Hz, a frequency between 7500 Hz and 8000 Hz, or a frequency between 7900 Hz and 8000 Hz. Further preferably, the higher frequency may include a frequency not less than 8000 Hz, for example, a frequency between 8000 Hz and 12000 Hz, a frequency between 8100 Hz and 12000 Hz, a frequency between 8300 Hz and 12000 Hz, a frequency between 8500 Hz and 12000 Hz, a frequency between 9000 Hz and 12000 Hz, a frequency between 10000 Hz and 12000 Hz, or a frequency between 11000 Hz and 12000 Hz.

Maintaining the same or substantially same vibration amplitude of the housing panel and the housing back means that a ratio of the vibration amplitudes of the housing panel and the housing back is within a certain range. For example, the ratio of the vibration amplitudes of the housing panel and the housing back may be between 0.3 and 3. Preferably, the ratio of the vibration amplitudes of the housing panel and the housing back may be between 0.4 and 2.5. Preferably, the ration of the vibration amplitudes of the housing panel and the housing back may be between 0.5 and 1.5. More preferably, the ratio of the vibration amplitudes of the housing panel and the housing back may be between 0.6 and 1.4. More preferably, the ratio of the vibration amplitudes of the housing panel and the housing back may be between 0.7 and 1.2. More preferably, the ratio of the vibration amplitude of the housing panel and the housing back may be between 0.75 and 1.15. More preferably, the ratio of the vibration amplitudes of the housing panel and the housing back may be between 0.8 and 1.1. More preferably, the ratio of the vibration amplitudes of the housing panel and the housing back may be between 0.8 and 1.1. More preferably, the ratio of the vibration amplitudes of the housing panel and the housing back may be between 0.85 and 1.1. Further preferably, the ratio of the vibration amplitudes of the housing panel and the housing back may be between 0.9 and 1.05. In some embodiments, the vibrations of the housing panel and the housing back may be represented by other physical quantities that can characterize the vibration amplitude. For example, sound pressures generated by the housing panel and the housing back at a point in the space may be used to represent the vibration amplitudes of the housing panel and the housing back.

Maintaining the same or substantially same vibration phase of the housing panel and the housing back means that a difference between the vibration phases of the housing panel and the housing back is within a certain range. For example, the difference between the vibration phases of the housing panel and the housing back is between −90 degrees and 90 degrees. Preferably, the difference between the vibration phases of the housing panel and the housing back may be between −80 degrees and 80 degrees. Preferably, the difference between the vibration phases of the housing panel and the housing back may be between −60 degrees and 60 degrees. Preferably, the difference between the vibration phases of the housing panel and the housing back may be between −45 degrees and 45 degrees. More preferably, the difference between the vibration phases of the housing panel and the housing back may be between −30 degrees and 30 degrees. More preferably, the difference between the vibration phases of the housing panel and the housing back may be between −20 degrees and 20 degrees. More preferably, the difference between the vibration phases of the housing panel and the housing back may be between −15 degrees and 15 degrees. More preferably, the difference between the vibration phases of the housing panel and the housing back may be between −12 degrees and 12 degrees. More preferably, the difference between the vibration phases of the housing panel and the housing back may be between −10 degrees and 10 degrees. More preferably, the difference between the vibration phases of the housing panel and the housing back may be between −8 degrees and 8 degrees. More preferably, the difference between the vibration phases of the housing panel and the housing back may be between −6 degrees and 6 degrees. More preferably, the difference between the vibration phases of the housing panel and the housing back may be between −5 degrees and 5 degrees. More preferably, the difference between the vibration phases of the housing panel and the housing back may be between −4 degrees and 4 degrees. More preferably, the difference between the vibration phases of the housing panel and the housing back may be between −3 degrees and 3 degrees. More preferably, the difference between the vibration phases of the housing panel and the housing back may be between −2 degrees and 2 degrees. More preferably, the difference between the vibration phases of the housing panel and the housing back may be between −1 degrees and 1 degrees. Further preferably, the difference between the vibration phases of the housing panel and the housing back may be 0 degree.

Figure 47A:
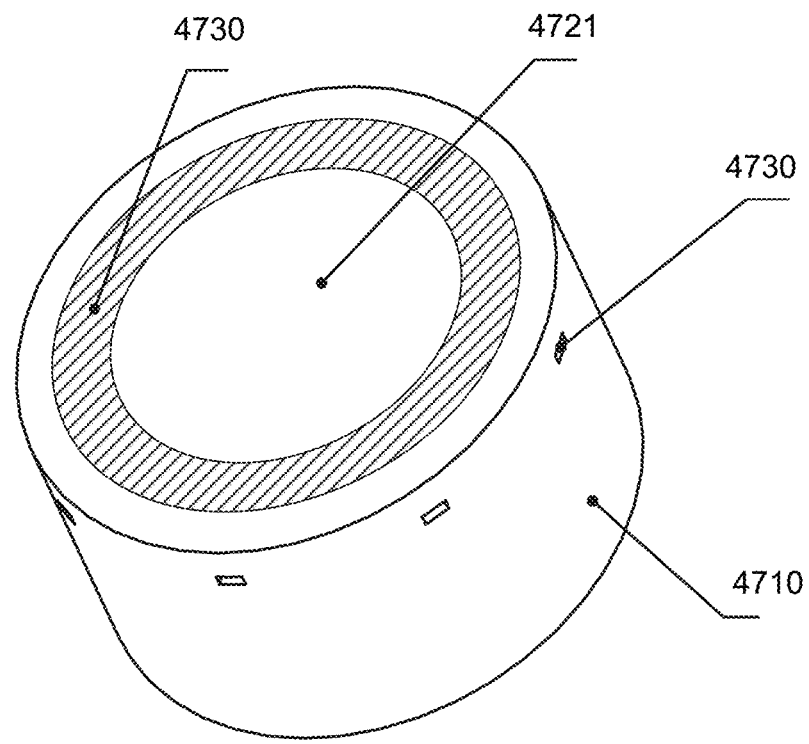
FIG. 47A is a schematic diagram illustrating a structure of a speaker according to some embodiments of the present disclosure.
Figure 47B:
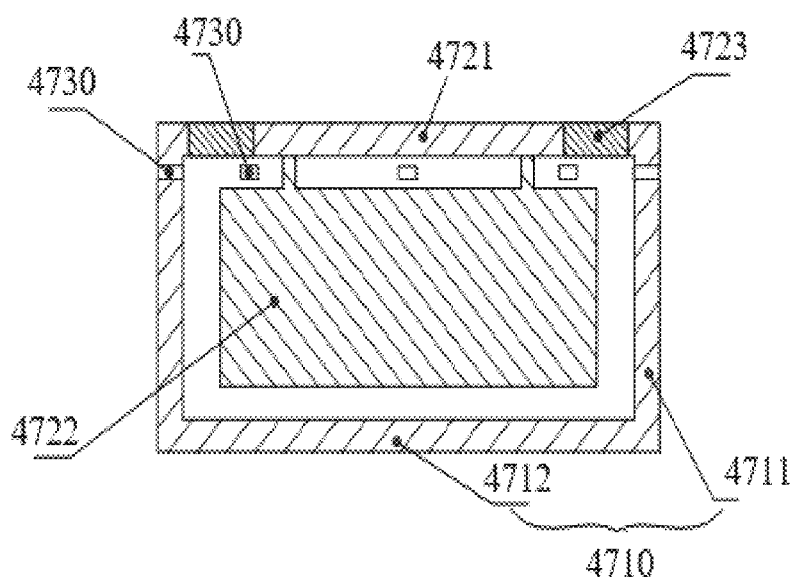
FIG. 47B is a schematic diagram illustrating a structure of a speaker according to some embodiments of the present disclosure.

FIGS. 47A and 47B are schematic diagrams of a speaker according to some embodiments of the present disclosure. In the embodiment, the speaker may include a core housing 4710, a vibration panel 4721, and a transducing device 4722. Referring to FIG. 25, the core housing 4710 may be consistent with the core housing 4710 (FIG. 25). In some embodiments, the transducing device 4722 may be accommodated inside the core housing 4710 and generate a vibration. The vibration of the transducing device 4722 may cause the core housing 4710 to vibrate, thereby pushing the air outside the housing to vibrate and generate a leaked sound. At least one sound guiding hole 4730 may be disposed in at least a portion of the core housing 4710. The sound guiding hole(s) 4730 may be used to lead sound waves in the housing formed by the air vibration inside the core housing 4710 to the outside of the core housing 4710, and interfere with leaked sound waves formed by the air outside the housing pushed by the vibration of the core housing 4710. In some embodiments, the interference may reduce the amplitude of the leaked sound waves.

The vibration panel 4721 may be fixedly connected to the transducing device 4722, and synchronously vibrated by the transducing device 4722. The vibration panel 4721 may protrude from the core housing 4710 through an opening of the core housing 4710, and at least partially fit human skins. The vibration may be transmitted to auditory nerves through human tissues and bones, so that a person may hear a sound. The transducing device 4722 and the core housing 4710 may be connected through a connection piece 4723. The connection piece 4723 may position the transducing device 4722 inside the core housing 4710.

The connection piece 4723 may be one or more independent components, or disposed with the transducing device 4722 or the core housing 4710 as a whole. In some embodiments, in order to reduce a constraint on the vibration, the connection piece 4723 may be made of an elastic material.

In some embodiments, the sound guiding hole(s) 4730 may be disposed in an upper portion of the height of a side wall, for example, a portion of the side wall from the top (the vibration panel) to ⅓ height along the height direction.

Taking a cylindrical housing as an example, for the disposing position, the sound guiding hole(s) 4730 may be opened in a side wall 4711 and/or a bottom wall 4712 of the housing according to different requirements. Preferably, the sound guiding hole(s) 4730 may be opened in an upper portion and/or a lower portion of the side wall 4711 of the housing. The count of sound guiding holes in the side wall 4711 of the housing may be at least two, and preferably uniformly distributed in a circularly circumferential direction. The count of sound guiding holes in the bottom wall 4712 of the housing may be at least two. With a center of the bottom wall as the center of the ring, the holes may be uniformly distributed in a ring shape. The sound guiding holes distributed in the ring may be disposed as at least one ring. The count of sound guiding holes disposed in the bottom wall 4712 of the housing may be only one. The sound guiding holes may be disposed at the center of the bottom wall 4712.

As for the count, the sound guiding hole(s) may be one or more, preferably multiple, and evenly arranged. For ring-shaped distributed sound guiding holes, the count of sound guiding holes of each ring may be, for example, 6-8.

The shape of the sound guiding hole may be a ring shape, an oval shape, a rectangular shape, or a long strip shape. The long strip shape may generally refer to a long strip along a straight line, a curve, an arc, or the like. Various shapes of the sound guiding holes on the speaker may be the same or different.

In some embodiments, the penetrating sound guiding hole(s) 4730 may be disposed in the lower portion of the side wall of the core housing 4710 (a portion of the side wall from ⅔ height to the bottom along the height direction). The count of the sound guiding hole(s) 4730 may be, for example, eight, and the shape may be, for example, a rectangle. Each sound guiding hole 4730 may be uniformly distributed in a ring shape on the side wall of the core housing 4710.

In some embodiments, the core housing 4710 may be cylindrical. The penetrating sound guiding hole(s) 4730 may be disposed in a middle portion of the side wall of the core housing 4710 (a portion of the side wall from ⅓ to ⅔ height along the height direction). The count of the sound guiding hole(s) 4730 may be, for example, eight, and the shape may be, for example, a rectangle. Each sound guiding hole 4730 may be uniformly distributed in a ring shape on the side wall of the core housing 4710.

In some embodiments, the penetrating sound guiding hole(s) 4730 may be disposed in a circumferential direction of the bottom wall of the core housing 4710. The count of the sound guiding hole(s) 4730 may be, for example, eight, and the shape may be, for example, a rectangle. Each sound guiding hole 4730 may be uniformly distributed in a ring shape on the side wall of the core housing 4710.

In some embodiments, the penetrating sound guiding hole(s) 4730 may be respectively formed in the upper and lower portions of the side wall of the core housing 4710. The sound guiding hole(s) 4730 may be uniformly distributed in the upper portion and the lower portion of the side wall of the core housing 4710 in a ring shape. The count of the sound guiding hole(s) 4730 of each ring may be eight. In addition, the sound guiding hole(s) 4730 disposed at the upper and lower portions may be symmetrically disposed relative to a middle portion of the core housing 4710. The shape of each sound guiding hole 4730 may be a ring.

In some embodiments, the penetrating sound guiding hole(s) 4730 may be disposed in the upper portion and the lower portion of the side wall of the core housing 4710, and the bottom wall of the core housing 4710, respectively. The sound guiding hole(s) 4730 opened on the side wall may be evenly distributed in the upper portion and the lower portion of the side wall of the core housing 4710. The count of the hole(s) of each ring may be eight. The sound guiding hole(s) 4730 disposed at the upper portion and the lower portion may be symmetrically arranged relative to a middle portion of the core housing 4710. Each sound guiding hole 4730 opened on the side wall may be rectangular. The shape of the sound guiding hole(s) 4730 opened on the bottom wall may be a long strip shape arranged along an arc. The count of the hole(s) may be four. The hole(s) may be uniformly distributed in a ring shape with the center of the bottom wall as the ring center. The sound guiding hole(s) 4730 opened on the bottom wall may also include a ring through-hole opened at the center.

In some embodiments, the penetrating sound guiding hole(s) 4730 may be opened in the upper portion of the side wall of the core housing 4710. The hole(s) may be evenly distributed in the upper portion of the side wall of the core housing 4710. The count may be, for example, eight, and the shape of the sound guiding hole(s) 4730 may be a ring.

In some embodiments, in order to show a better effect of suppressing leaked sound, the sound guiding holes 4730 may be uniformly distributed in the upper portion, the middle portion, and the lower portion of the side wall 4711, respectively, and a ring of the sound guiding hole(s) 4730 may also be disposed in the bottom wall 4712 of the core housing 4710 in the circumferential direction. The aperture of each sound guiding hole 4730 and the count of the hole(s) may be the same.

In some embodiments, the sound guiding hole 4730 may be an unobstructed through-hole.

In order to control the effect of the sound wave propagating from the sound guiding hole(s) 4730 in the housing, a damping layer (not shown in the specification drawing) may be disposed at the opening of the sound guiding hole(s) 4730 to adjust the phase and amplitude of the sound wave, thereby correcting and guiding the effect of the sound wave in the housing. The material and position of the damping layer may be set in many manners. For example, the damping layer may be made of tuning paper, tuning cotton, non-woven fabric, silk, cotton, sponge, rubber, or other materials with a certain damping for sound quality conduction. The damping layer may be attached to an inner wall of the sound guiding hole(s) 4730, or placed on the outside of the sound guiding hole(s) 4730.

In some embodiments, corresponding to different sound guiding holes, the disposed damping layer may be disposed to have the same phase difference between the different sound guiding holes 4730 to suppress the leaked sound of the same wavelength, or different phase differences between the different sound guiding holes 4730 to suppress the leaked sound of different wavelengths (i.e., a specific band of leaked sound).

In some embodiments, different portions of the same sound guiding hole(s) 4730 may be disposed to have the same phase (e.g., using a pre-designed step or step-shaped damping layer) to suppress leaked sound waves of the same wavelength. Alternatively, different portions of the same sound guiding hole 4730 may be disposed to have different phases to suppress leaked sound waves of different wavelengths.

The transducing device 4722 may not only drive the vibration panel 4721 to vibrate, but also be a vibration source, which is accommodated inside the core housing 4710. The vibration of the surface of the transducing device 4722 may cause the air in the housing to vibrate with the surface. Sound waves may be formed inside the core housing 4710, which may be referred to as in-housing sound waves. The vibration panel 4721 and the transducing device 4722 may be located at the core housing 4710 through the connection piece 4723. It may be inevitable that the vibration may be applied to the core housing 4710 to drive the core housing 4710 to vibrate synchronously. Therefore, the core housing 4710 may push the air outside the housing to vibrate to form the leaked sound wave. The leaked sound wave may propagate outward, forming the leaked sound.

According to the following equation to determine a position of the sound guiding hole to suppress the leaked sound, the reduction of the leaked sound may be proportional to:

$$(\iint_{S_{opening}} Pds - \iint_{S_{housing}} P_d ds) \tag{11}$$

Wherein $S_{opening}$ may be an opening area of the sound guiding hole, and $S_{housing}$ may be a housing area that is not in contact with the face.

An in-housing pressure:

$$P = P_a + P_b + P_c + P_e, \tag{12}$$

$P_a$, $P_b$, $P_c$, and $P_e$ may be sound pressures generated at any point of a-plane, b-plane, c-plane, and e-plane in the housing space, respectively.

$$P_a(x, y, z) = -j\omega\rho_0 \iint_{S_a} W_a(x_a', y_a') \cdot \frac{e^{jkR(x_a', y_a')}}{4\pi R(x_a', y_a')} dx_a' dy_a' - P_{aR} \tag{13}$$

$$P_b(x, y, z) = -j\omega\rho_0 \iint_{S_b} W_b(x', y') \cdot \frac{e^{jkR(x', y')}}{4\pi R(x', y')} dx' dy' - P_{bR} \tag{14}$$

$$P_c(x, y, z) = -j\omega\rho_0 \iint_{S_c} W_c(x_c', y_c') \cdot \frac{e^{jkR(x_c', y_c')}}{4\pi R(x_c', y_c')} dx_c' dy_c' - P_{cR} \tag{15}$$

$$P_e(x, y, z) = -j\omega\rho_0 \iint_{S_e} W_e(x_e', y_e') \cdot \frac{e^{jkR(x_e', y_e')}}{4\pi R(x_e', y_e')} dx_e' dy_e' - P_{eR} \tag{16}$$

Wherein $R(x', y') = \sqrt{(x-x')^2 + (y-y')^2 + z^2}$ may be the distance from an observation point $(x, y, z)$ to a point $(x', y', 0)$ on a b-plane sound source, $S_a$, $S_b$, $S_c$, and $S_e$ may be the area of a-plane, b-plane, c-plane, and e-plane, respectively, $R(x'_a, y'_a) = \sqrt{(x-x_a')^2 + (y-y_a')^2 + (z-z_a)^2}$ may be the distance from the observation point $(x, y, z)$ to a point $(x'_a, y'_a, z_a)$ on a a-plane sound source, $R(x'_c, y'_c) = \sqrt{(x-x_c')^2 + (y-y_c')^2 + (z-z_c)^2}$ may be the distance from the observation point $(x, y, z)$ to a point $(x'_c, y'_c, z_c)$ on a c-plane sound source, $R(x'_e, y'_e) = \sqrt{(x-x_e')^2 + (y-y_e')^2 + (z-z_e)^2}$ may be the distance from the observation point $(x, y, z)$ to a point $(x'_e, y'_e, z_e)$ on an e-plane sound source, $k = \omega/u$ may be a wave count (u may be the speed of sound), $\rho_0$ may be a density of air. $\omega$ may be an angular frequency of vibration, and $P_{aR}$, $P_{bR}$, $P_{cR}$, and $P_{eR}$ may be sound resistances of air itself, which respectively may be:

$$P_{aR} = A \cdot \frac{z_a \cdot r + j\omega \cdot z_a r'}{\varphi} + \delta \tag{17}$$

$$P_{bR} = A \cdot \frac{z_b \cdot r + j\omega \cdot z_b r'}{\varphi} + \delta \tag{18}$$

$$P_{cR} = A \cdot \frac{z_c \cdot r + j\omega \cdot z_c r'}{\varphi} + \delta \tag{19}$$

$$P_{eR} = A \cdot \frac{z_e \cdot r + j\omega \cdot z_e r'}{\varphi} + \delta \tag{20}$$

Wherein r may be a sound damping of each unit length, r' may be a sound mass of each unit length, $z_a$ may be the distance from the observation point to the a-plane sound source, $z_b$ may be the distance from the observation point to the b-plane sound source, $z_c$ may be the distance from the observation point to the c-plane sound source, $z_e$ may be the distance from the observation point to the e-plane sound source.

$W_a(x, y)$, $W_b(x, y)$, $W_c(x, y)$, $W_e(x, y)$, and $W_d(x, y)$ may be sound source intensities of each unit area of the a-plane, b-plane, c-plane, e-plane, and d-plane, and may be derived from the following equation group (21):

$$F_e = F_a = F - k_1 \cos \omega t - \iint_{S_a} W_a(x,y)dxdy - \iint_{S_e} W_e(x,y)dxdy - f$$

$$F_b = -F + k_1 \cos \omega t + \iint_{S_b} W_b(x,y)dxdy - \iint_{S_e} W_e(x,y)dxdy - L$$

$$F_c = F_d = F_b - k_2 \cos \omega t - \iint_{S_c} W_c(x,y)dxdy - f - \gamma$$

$$F_d = F_b - k_2 \cos \omega t - \iint_{S_d} W_d(x,y)dxdy \tag{21}$$

Wherein F may be a driving force converted by the transducing device, $F_a$, $F_b$, $F_c$, $F_d$, $F_e$ may be driving forces of a, b, c, d, and e, respectively, $S_d$ may be the housing (d-plane) area, f may be a viscous resistance formed by a small gap of the side wall, $f = \eta \Delta s(dv/dy)$, L may be an equivalent load of the face when the vibration plate acts on the face, $\gamma$ may be energy dissipated on an elastic element 2, $k_1$, $k_2$ may be elastic coefficients of an elastic element 1 and the elastic element 2, respectively, $\eta$ may be a fluid viscosity coefficient, $dv/dy$ may be a fluid velocity gradient, $\Delta s$ may be a sectional area of an object (plate), A may be the amplitude, $\varphi$ may be an area of a sound field, $\Delta$ may be a high-order quantity (derived from an incomplete symmetry of the shape of the housing). At any point outside the housing, a sound pressure generated by the vibration of the housing may be:

$$P_d = -j\omega\rho_0 \iint W_d(x_d', y_d') \cdot \frac{e^{jkR(x_d', y_d')}}{4\pi R(x_d', y_d')} dx_d' dy_d' \tag{22}$$

Wherein $R(x'_d, y'_d) = \sqrt{(x-x_d')^2 + (y-y_d')^2 + (z-z_d)^2}$ may be the distance from the observation point $(x, y, z)$ to a point $(x'_d, y'_d, z_d)$ on the d-plane sound source.

$P_a$, $P_b$, $P_c$, $P_e$ may be all functions of position. When a hole is opened at any position of the housing, and the area of the hole is S, the total effect of sound pressure at the hole may be $\iint_{S_{opening}} Pds$.

Since the vibration panel 4721 on the core housing 4710 is closely attached to the human tissue, and its output energy may be absorbed by the human tissue, only the d-plane may push the air outside the housing to vibrate to form the leaked sound. The total effect of vibration of the air outside the housing pushed by the housing may be $\iint_{S_{housing}} P_d ds$.

In some application scenarios, our goal may be to make $\iint_{S_{opening}} Pds$ and $\iint_{S_{housing}} P_d ds$ equal in magnitude and opposite in direction, so as to achieve the effect of reducing the leaked sound. Once the basic structure of the device is determined, $\iint_{S_{housing}} P_d ds$ may be an amount that we can not adjust, $\iint_{S_{opening}} Pds$ may be adjusted to offset $\iint_{S_{housing}} P_d ds$. $\iint_{S_{opening}} Pds$ may include complete phase and amplitude information. The phase and amplitude may be closely related to the housing size of the speaker, the vibration frequency of the transducing device, the opening position, shape, count, size of the sound guiding hole(s), and whether there is a damping on the hole, which may allow us to implement the purpose of suppressing the leaked sound by adjusting the opening position, shape and count of sound guiding hole(s), and/or increasing damping and/or adjusting damping material.

The in-housing sound wave(s) and leaked sound wave(s) may be equivalent to two sound sources shown in the figure. The penetrating sound guiding hole(s) 4730 may be opened on the wall surface of the housing in some embodiments of the present disclosure, which may guide the in-housing sound wave(s) to propagate to the outside of the housing, propagate in the air with the leaked sound waves(s), and interfere therewith, thereby reducing the amplitude of the leaked sound wave(s), that is, reducing the leaked sound. Therefore, the technical solution of the present disclosure, through the convenient improvement of opening sound guiding hole(s) in the housing, may solve the problem of the leaked sound to a certain extent without increasing the volume and weight of the speaker.

According to the equation derived by the inventor, those skilled in the art may easily understand that the elimination effect of leaked sound wave(s) may be closely related to the housing size of the speaker, the vibration frequency of the transducing device, the opening position, shape, count, and size of the sound guiding hole(s), and whether there is a damping on the hole, such that the opening position, shape, count, and the damping material of the sound guiding hole(s) may have a variety of different solutions according to needs.

In a target region near the speaker (e.g., the speaker shown in FIGS. 47A and 47B), a difference between a phase of a leaked sound wave transmitted to the target region and a phase of an in-housing sound wave propagating to the target region through sound guiding hole(s) may be close to 180 degrees. By doing this, the leaked sound wave generated by the housing may be significantly reduced or even eliminated in the target region.

Figure 48:
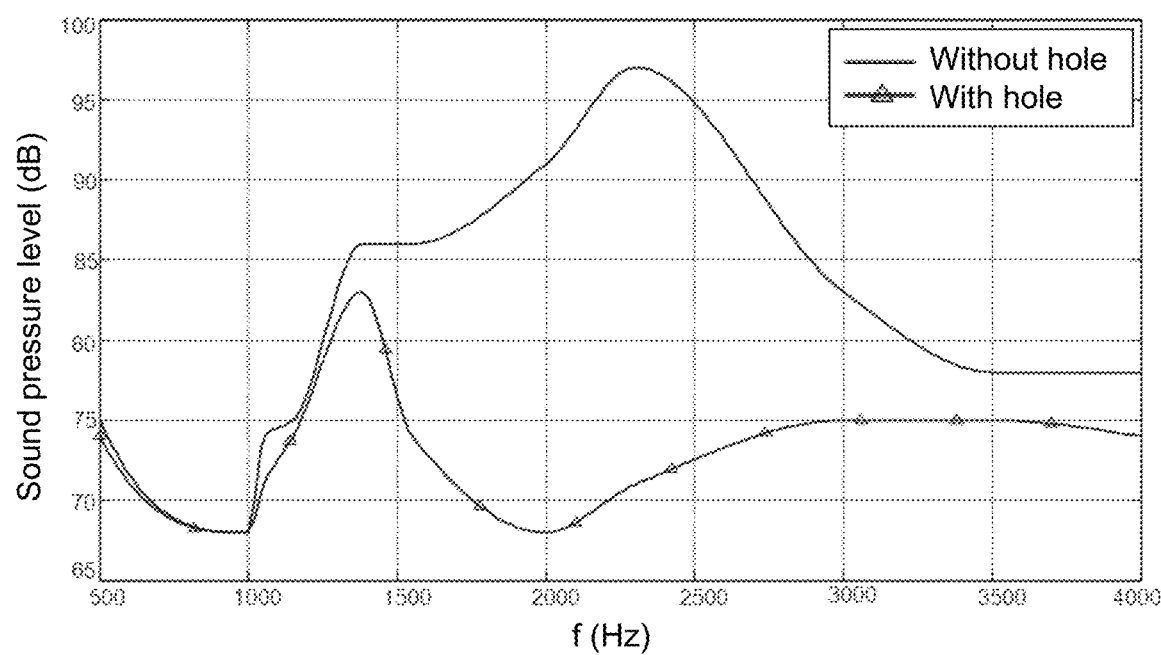
FIG. 48 is a diagram illustrating an effect of suppressing leaked sound of a speaker in FIGS. 47A and 47B according to some embodiments of the present disclosure.

As shown in FIG. 48, the leaked sound wave may be significantly suppressed in a frequency band from 1500 Hz to 4000 Hz. As used therein, within a frequency band from 1500 Hz to 3000 Hz, the suppressed leaked sound may basically exceed 10 dB. Especially within a frequency band from 2000 Hz to 2500 Hz, the leaked sound may be reduced by more than 20 dB after the sound guiding hole(s) is opened in an upper side of the housing compared with a case without opening the sound guiding hole(s).

In a specific embodiment, referring to FIG. 7, FIG. 47A, and FIG. 47B, the glasses frame may include the glasses rim 11, the nose pad 12, the glasses lens 13, and the glasses temple 15. The speaker may be connected to the glasses temple 15 through a connection component. In some embodiments, the structure of the speaker may be shown in FIGS. 47A and 47B. The speaker may include a vibration unit and the transducing device 4722. The vibration unit may include the core housing 4710 and the vibration panel 4721. The transducing device 4722 may be located inside and connected to the vibration unit. Preferably, the vibration unit may include the panel and the vibration transmission layer described above. The vibration panel 4721 may be a surface of the vibration unit 1202 in contact with the user, preferably, an outer surface of the vibration transmission layer.

During a usage, the connection component may fix the speaker to a specific portion of the user (e.g., the head), and provide a clamping force between the vibration unit and the user. The vibration panel 4721 may be connected to the transducing device 4722 and keep contact with the user to transmit a sound to the user through vibration. In order to obtain an earphone holder/earphone strap that meets a specific clamping force condition, those skilled in the art may choose connection components with different shapes and structures according to actual situations. It should be noted that the clamping force of the glasses temple 15 may not only affect the efficiency of sound transmission, but also affect the feeling of the user in the bass frequency range. The clamping force mentioned herein may be a pressure between the vibration panel 4721 and the user. Preferably, the clamping force may be between 0.1 N to 5 N. More preferably, the clamping force may be between 0.1 N to 4 N. Even more preferably, the clamping force may be between 0.2 N to 3 N. Even more preferably, the clamping force may be between 0.2 N to 1.5 N. Even more preferably, the clamping force may be between 0.3 N to 1.5 N.

Figure 49:
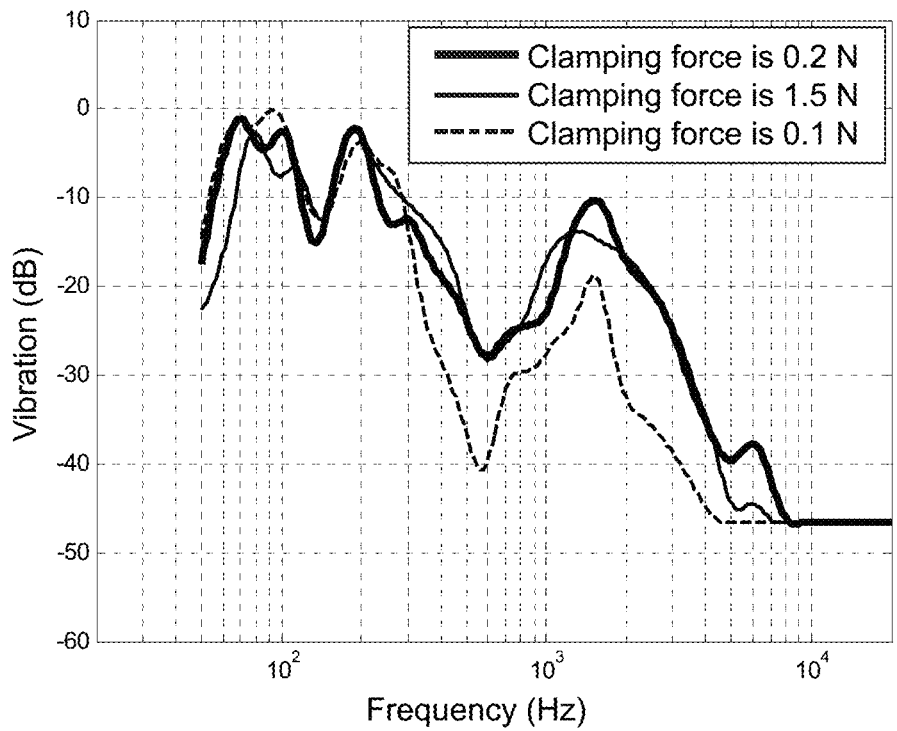
FIG. 49 is a vibration response curve illustrating a bone conduction speaker under different pressures between a contact surface and a user according to some embodiments of the present disclosure.
Figure 50:
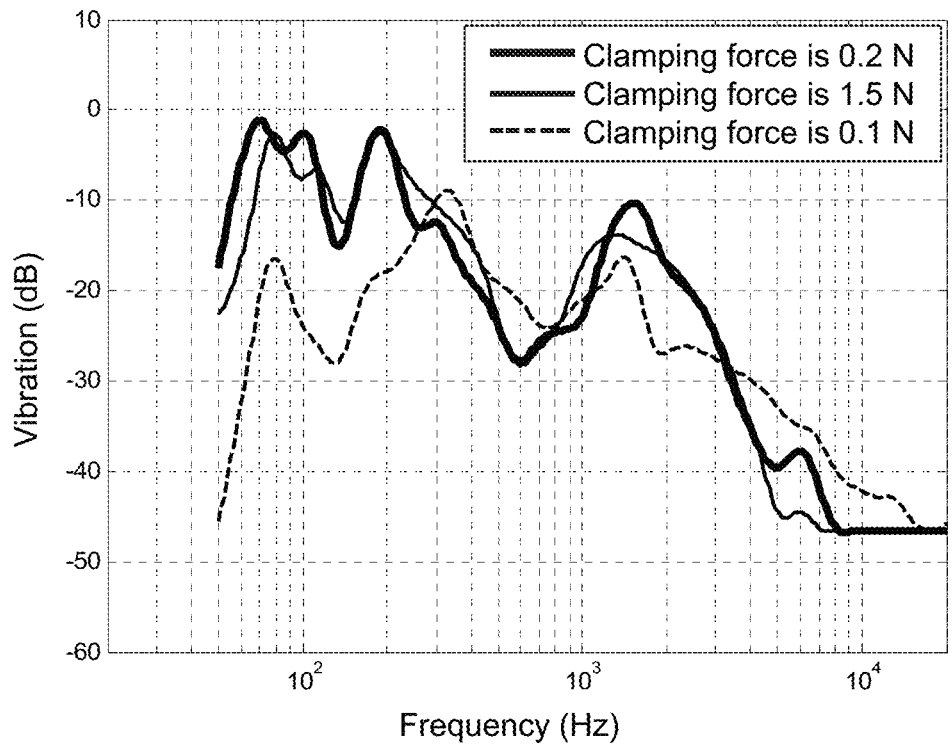
FIG. 50 is a vibration response curve illustrating a bone conduction speaker under different pressures between a contact surface and a user according to some embodiments of the present disclosure.

FIG. 49 is a vibration response curve illustrating a bone conduction speaker under different pressures between a contact surface and a user according to some embodiments of the present disclosure. FIG. 50 is a vibration response curve illustrating a bone conduction speaker under different pressures between a contact surface and a user according to some embodiments of the present disclosure. In a process of vibration transmission, if a clamping force is lower than a certain threshold, it may not facilitate the transmission of high frequency vibration. As shown in (a), for the same vibration source (sound source), midrange-frequency and high-frequency portions of a vibration (sound) received by a wearer when the clamping force is 0.1 N may be significantly less than those of a received vibration (sound) when the clamping force is 0.2 N and 1.5 N. That is, with respect to sound quality, the performance of the midrange-frequency and high-frequency portions when the clamping force is 0.1 N may be weaker than the performance of those when the clamping force is between 0.2 N to 1.5 N. Similarly, in the process of vibration transmission, if the clamping force is greater than a certain threshold, it may not facilitate the transmission of low-frequency vibration. As shown in (b), for the same vibration source (sound source), midrange-frequency and low-frequency portions of a vibration (sound) received by the wearer when the clamping force is 5.0 N may be significantly less than those of a received vibration (sound) when the clamping force is 0.2 N and 1.5 N. That is, with respect to sound quality, the performance of the low-frequency portion when the clamping force is 5.0 N may be weaker than the performance of that when the clamping force is between 0.2 N to 1.5 N.

In a specific embodiment, by selecting a suitable connection component, the pressure between the contact surface and the user may be kept in a proper range. The pressure between the contact surface and the user may be greater than a certain threshold. Preferably, the threshold may be 0.1 N. More preferably, the threshold may be 0.2 N. More preferably, the threshold may be 0.3 N. Even more preferably, the threshold may be 0.5 N. The pressure between the contact surface and the user may be less than another threshold. Preferably, the threshold may be 5.0 N. More preferably, the threshold may be 4 N. Even more preferably, the threshold may be 3 N. Even more preferably, the threshold may be 1.5 N.

Referring to FIG. 1, in some embodiments, the speaker (e.g., a bone conduction speaker, an air conduction speaker, etc.) on the glasses may include the earphone core 102 and the core housing 108. As used herein, bone conduction is a kind of sound conduction manner, which converts the sound into mechanical vibrations with different frequencies and transmits sound waves through human skull, bone labyrinth, inner ear lymphatic transmission, organum spirale, auditory nerve, auditory center, etc.

Referring to FIG. 21, the transmission relationship K2 between the sensing terminal 1102 and the vibration unit 1103 (i.e., the core housing) may also affect the frequency response of the bone conduction system. The sound heard by the human ear depends on energy received by a cochlea. The energy may be affected by different physical quantities during transmission, which may be expressed as the follow equation:

$$P = \iint_S \alpha \cdot f(a,R) \cdot L \cdot ds \qquad (23)$$

where P is proportional to the energy received by the cochlea. S is an area that a contact surface 502a contacts with a human face. α is a dimension conversion coefficient. f(a, R) denotes influence of an acceleration a of a point on the contact surface and a degree of tightness R between the contact surface and the skin on an energy transmission. L is an impedance of the transmission of the mechanical wave on any contact point, i.e., a transmission impedance per unit area.

Based on Equation (23), the transmission of sound is affected by the transmission impedance L. Vibration transmission efficiency of the bone conduction system is related to L. A frequency response curve of the bone conduction system may be a superposition of frequency response curves of all points on the contact surface. Factors affecting the impedance may include a size, a shape, a roughness, a force, or a force distribution of the energy transmission area. For example, the sound transmission effect may be changed by changing a structure and a shape of the vibration unit, and then the sound quality of the bone conduction speaker may be changed. For example, the sound transmission effect may be changed by changing corresponding physical properties of the contact surface of the vibration unit.

Figure 51:
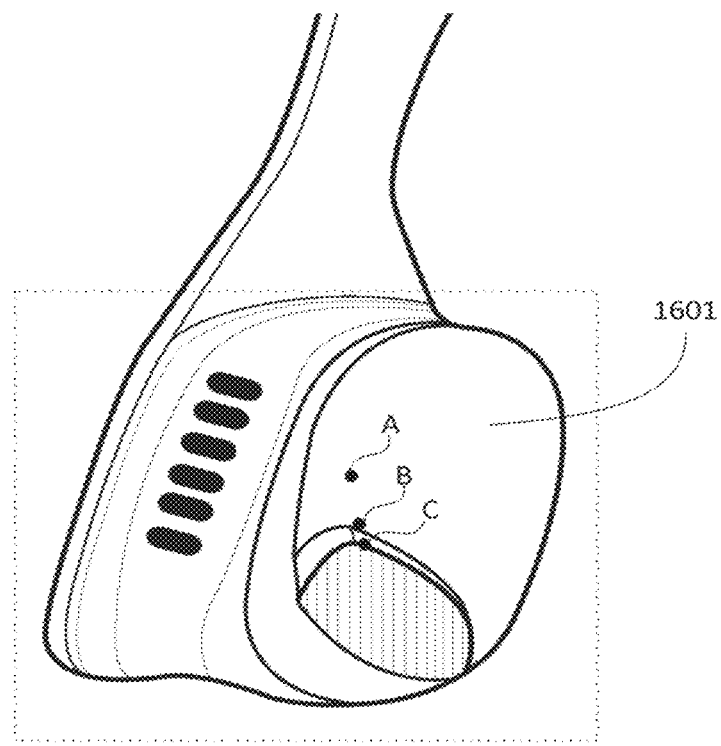
FIG. 51 is a schematic diagram illustrating a contact surface of a vibration unit of a speaker according to an embodiment of the present disclosure.

FIG. 51 is a schematic diagram illustrating a contact surface of a vibration unit of a speaker according to some embodiments of the present disclosure. In some embodiments, the contact surface of the vibration unit of the speaker in FIG. 51 corresponds to the outer wall of the functional module in FIG. 1 in contact with the human body. As used herein, the embodiment is a specific embodiment of the transmission relationship K2 between the sensing terminal 1102 and the vibration unit 1103. As shown in FIG. 51, a surface of a well-designed contact surface may be provided with a gradient structure. The gradient structure refers to a region where the surface of the contact surface has a height change. The contact surface mentioned herein is a side close to a user on the core housing. The gradient structure may be a raised/sunken or stepped structure existing on an outside of the contact surface (a side fitted to the user), or a raised/sunken or stepped structure existing on an inside of the contact surface (a side facing away from the user). It should be known that the contact surface of the vibration unit may be fitted to any position of the head of the user, for example, the top of the head, a forehead, a cheek, a temple, an auricle, the back of an auricle, etc. As shown in FIG. 51, the contact surface 1601 (the outside of the contact surface) may include a convex portion or a concave portion (not shown in FIG. 51). In a working process of the bone conduction speaker, the convex portion or the concave portion may contact with the user and change a pressure at different positions on the contact surface 1601 contacted with the face. The convex portion may be in closer contact with the face. Therefore, skin and subcutaneous tissue in contact with the convex portion may be under more pressure than other parts of the face. Accordingly, the skin and subcutaneous tissue in contact with the concave portion may be subjected to less pressure than other parts. For example, there are three points A, B and C on the contact surface 1601 in FIG. 51, which are located on a non-convex portion, an edge of the convex portion, and the convex portion of the contact surface 1601, respectively. When the contact surface 1601 is in contact with the skin, clamping forces on the skin at the three points A, B, and C may be FC>FA>FB. In some embodiments, the clamping force at point B is 0, i.e., point B does not contact with the skin. Facial skin and subcutaneous tissue may show different resistance and response to sound under different pressures. An impedance of a part with high pressure may be small, which may have a biased high-pass filtering characteristic for a sound wave. An impedance of a part with low pressure may be large, which may have a biased low-pass filtering characteristic for a sound wave. Impedance characteristics L of different parts of the contact surface 1601 may be different. According to Equation (23), frequency responses of different parts may be different when the sound is transmitted. Effect of the sound transmission through the whole contact surface may be equivalent to a sum of effects of the sound transmission through each part. Finally, when the sound is transmitted to the brain, a smooth frequency response curve may be formed to avoid that a resonance peak in low frequency or high frequency is too high. Therefore, an ideal frequency response in a whole audio bandwidth may be obtained. Similarly, a material and thickness of the contact surface 1601 may also affect the sound transmission, thereby affecting the effect of the sound quality. For example, when the material of the contact surface is soft, the transmission effect of the sound wave in the low-frequency range may be better than that in the high-frequency range. When the material of the contact surface is hard, the transmission effect of the sound wave in the high-frequency range may be better than that in the low-frequency range.

Figure 52:
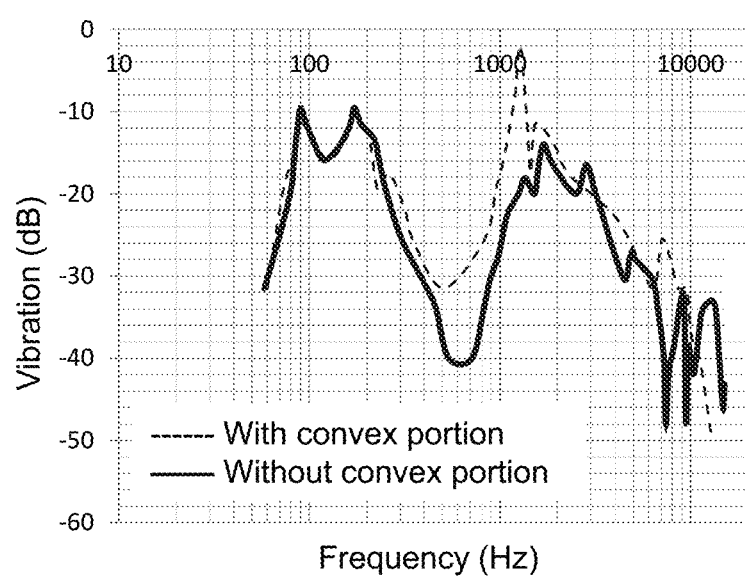
FIG. 52 is schematic diagram illustrating a vibration response curve of a speaker according to some embodiments of the present disclosure.

FIG. 52 shows frequency responses of a speaker with different contact surfaces. The dashed line corresponds to a frequency response of the speaker with a convex portion on the contact surface, while the solid line corresponds to a frequency response of the speaker without a convex portion on the contact surface. In a middle and low frequency range (e.g., in a range of 300 Hz to 1000 Hz), a vibration of the speaker without a convex portion may be significantly weakened compared with a vibration of the speaker with the convex portion. Therefore, a "pit" may be formed on the frequency response curve, which is not the ideal frequency response, thereby affecting the sound quality of the speaker.

The descriptions of FIG. 52 may be only an explanation for a specific example. For those skilled in the art, after understanding the basic principles of the influence on the frequency response of the speaker, it may be possible to perform various modifications and variations on the structure and component of the speaker to obtain different frequency response effect.

It should be noted that, for those skilled in the art, the shape and structure of the contact surface 1601 are not limited to the descriptions and may be satisfied other specific requirements. For example, the convex portion or concave portion of the contact surface may be distributed on the edge of the contact surface or in the middle of the contact surface. The contact surface may include one or more convex portions or concave portions, both of which may be distributed on the contact surface. The material of the convex portion or concave portion of the contact surface may be other materials different from the material of the contact surface. The material may be flexible, rigid, or more suitable for production of a specific pressure gradient. The material may be a memorized or non-memorized material. The material may be a single material or a composite material. A structural graphic of the convex portion or concave portion of the contact surface may include but not limited to an axisymmetric graphic, a central symmetric graphic, a rotational symmetric graphic, an asymmetric graphic, etc. The structural graphic of the convex portion or concave portion of the contact surface may be one type of graphic, or two or more combinations of graphics. The surface of the contact surface may include but not be limited to a certain degree of smoothness, roughness, waviness, etc. A position distribution of the convex portion or concave portion of the contact surface may include but not be limited to axial symmetry, central symmetry, rotational symmetry, asymmetric distribution, etc. The convex portion or concave portion of the contact surface may be at the edge of the contact surface or distributed in the contact surface.

Figure 53:
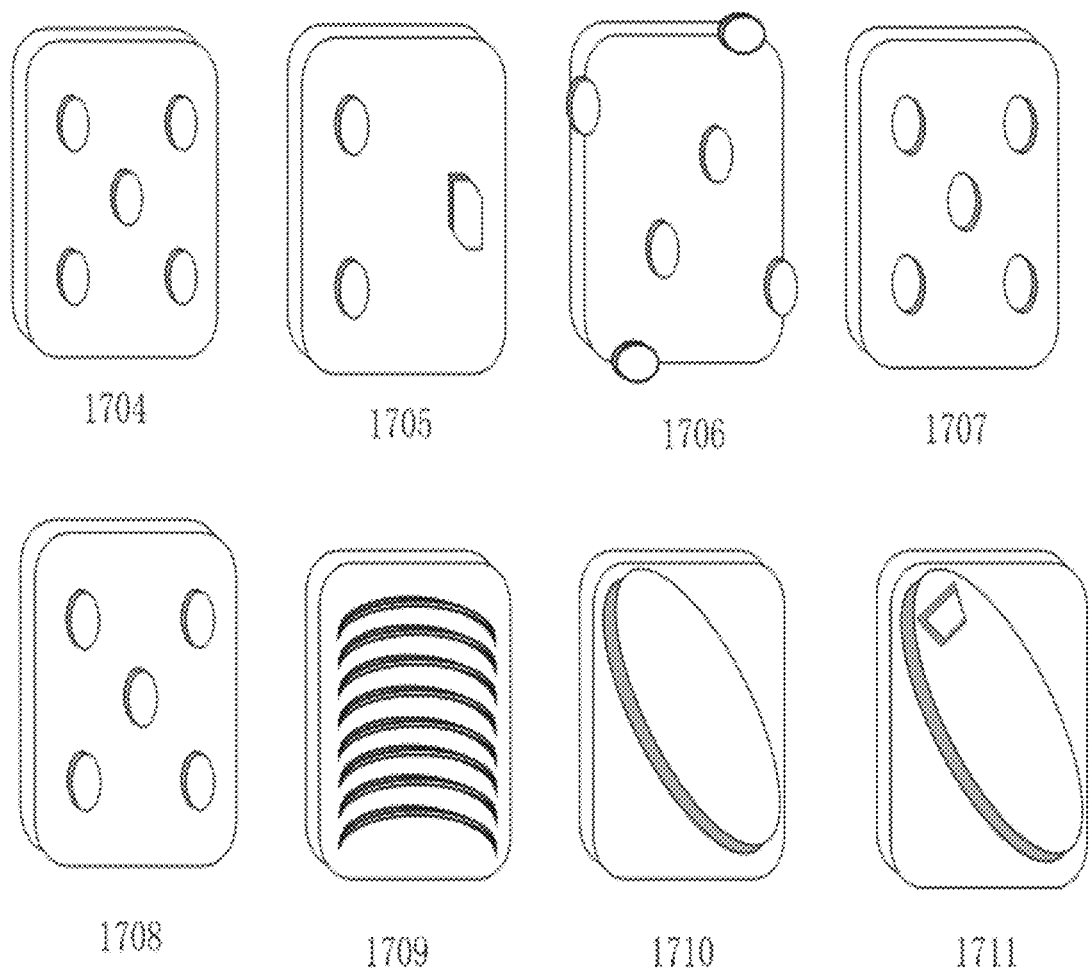
FIG. 53 is a schematic diagram illustrating a contact surface of a vibration unit of a speaker according to an embodiment of the present disclosure.

FIG. 53 is a schematic diagram illustrating a contact surface of a vibration unit of a speaker according to some embodiments of the present disclosure. As shown in FIG. 53, FIG. 53 shows a plurality of exemplary structures of a contact surface. As used herein, 1704 is an example of a contact surface including a plurality of convex portions with a similar shape or a similar structure. The convex portion may be made of a material same as or similar to a material of other portions of a panel. Alternatively, the convex portion may be made of a material different from the material of other portions of the panel. Specifically, the convex portion may consist of a combination of a memory material and a material of a vibration-transfer layer. As used herein, a proportion of the memory material may be larger than or equal to 10%. Preferably, the proportion of the memory material in the convex portion may be larger than or equal to 50%. An area of a single convex portion may be 1% to 80% of a total area. Preferably, the area of the single convex portion may be 5% to 70% of the total area. More preferably, the area of the single convex portion may be 8% to 40% of the total area. A total area of all the convex portions may be 5% to 80% of the total area. Preferably, the total area of all the convex portions may be 10% to 60% of the total area. There may be at least one convex portion. Preferably, there may be one convex portion. More preferably, there may be two convex portions. Further preferably, there may be at least five convex portions. A shape of the convex portion may be circle, oval, triangle, rectangle, trapezoid, irregular polygon, or other similar shapes. As used herein, a structure of the convex portion may be symmetric or asymmetric. A location distribution of the convex portions may also be symmetric or asymmetric. The count of the convex portions may be one or multiple. Heights of the convex portions may be the same or different. The heights and distribution of the convex portions may be designed to form a certain gradient.

1705 is a structure of the convex portion of the contact surface, which is an example of a combination of more than two graphics. As used herein, the count of convex portions of different graphics may be one or more. The shapes of the two or more convex portions may be any two or a combination of a circle, an ellipse, a triangle, a rectangle, a trapezoid, an irregular polygon, or other similar shapes. The material, count, area, symmetry, etc. of the convex portions may be similar to those of 1704.

1706 is an example in which the convex portions of the contact surface are distributed on the edge of and inside the contact surface. As used herein, the count of the convex portions may not be limited to that shown in the figure. A ratio of the count of convex portions located on the edge of the contact surface to the count of all the convex portions may be 1%-80%. Preferably, the ratio may be 5%-70%. More preferably, the ratio may be 10%-50%. Further preferably, the ratio may be 30%-40%. The material, count, area, shape, symmetry, etc. of the convex portion may be similar to those of 1704.

1707 is a structural graphic of the concave portion of the contact surface. The structure of the concave portion may be symmetric or asymmetric. The position distribution of the concave portion may also be symmetric or asymmetric. The count of the concave portions may be one or more. The shapes of the concave portions may be the same or different. The concave portion may be hollow. A ratio of an area of one single concave to the total area of the contact surface may be 1%-80%. Preferably, the ratio may be 5%-70%. More preferably, the ratio may be 8%-40%. A ratio of a total area of all concave portions to the total area of the contact surface may be 5%-80%. Preferably, the ratio may be 10%-60%. There may be at least one concave portion. Preferably, there may be one concave portion. More preferably, there may be two concave portions. Further preferably, there may be at least five concave portions. The shape of the concave portion may be a circle, an ellipse, a triangle, a rectangle, a trapezoid, an irregular polygon, or other similar shapes.

1708 is an example in which there are both convex portions and concave portions on the contact surface. The count of the convex portions and concave portions is not limited to one or more. A ratio of the count of concave portion to the count of convex portions may be 0.1-100. Preferably, the ratio may be 1-80. More preferably, the ratio may be 5-60. Further preferably, the ratio may be 10-20. The material, area, shape, symmetry, etc. of a single convex portion/concave portion may be similar to those of 5104.

1709 is an example of a contact surface with a certain waviness. The waviness may be composed of two or more convex portions/concave portions or a combination of the convex portion and the concave portion. Preferably, distances between adjacent convex portions/concave portions may be equal. More preferably, the distances between the convex portions/concave portions may be equidistant arrangement.

1710 is an example in which there is a convex portion with a large area on the contact surface. A ratio of the area of the convex portion to the total area of the contact surface may be 30%-80%. Preferably, a part of the edge of the convex portion and a part of the edge of the contact surface may be substantially in contact with each other.

1711 is a first convex portion with a large area on the contact surface, and a second convex portion with a small area on the first convex portion. A ratio of the large area to the total area of the contact surface may be 30%-80%, and a ratio of the small area to the total area of the contact surface may be 1%-30%, preferably, the ratio of the small area to the total area of the contact surface may be 5%-20%. A ratio of the small area to the large area may be 5%-80%. Preferably, the ratio of the small area to the total area of the contact surface may be 10%-30%.

The above description of the structure of the contact surface of the speaker is only a specific example, and should not be regarded as the only feasible implementation solution.

Figure 54:
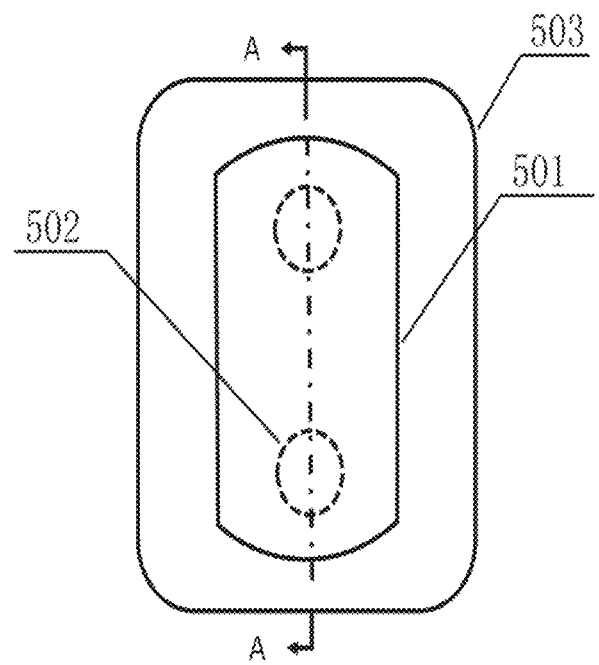
FIG. 54 is schematic diagram illustrating a vertical view of a bonding manner of a panel of a speaker according to some embodiments in the present disclosure.

In some embodiments, the side of the core housing fitted to the user may be composed of a panel and a vibration transmission layer. FIG. 54 is a front view and a side view of the panel and the vibration transmission layer connected to each other.

In some embodiments, the vibration transmission layer may be provided on an outer surface of a side wall of the core housing in contact with the human body. As used herein, the vibration transmission layer in this embodiment may be a specific embodiment to change physical characteristics of the contact surface of the vibration unit to change the sound transmission effect. Different regions on the vibration transmission layer may have different vibration transmission effects. For example, there may be a first contact surface region and a second contact surface region on the vibration transmission layer. Preferably, the first contact surface region may not be attached to the panel, and the second contact surface region may be attached to the panel. More preferably, when the vibration transmission layer is in direct or indirect contact with a user, a clamping force on the first contact surface region may be less than a clamping force on the second contact surface region (the clamping force herein refers to a pressure between the contact surface of the vibration unit and a user). Further preferably, the first contact surface region may not directly contact the user, and the second contact surface region may directly contact the user and transmit vibrations. An area of the first contact surface region may be different from an area of the second contact surface region. Preferably, the area of the first contact surface region may be smaller than the area of the second contact surface region. More preferably, there may be holes on the first contact surface region to further reduce the area of the first contact surface region. The outer surface (i.e., the surface facing the user) of the vibration transmission layer may be flat or uneven. Preferably, the first contact surface region may be on a plane different from the second contact surface region. More preferably, the second contact surface region may be higher than the first contact surface region. Further preferably, the second contact surface region and the first contact surface region may form a step structure. More preferably, the first contact surface region may be in contact with the user, and the second contact surface region may not be in contact with the user. Materials of the first contact surface region and the second contact surface region may be the same or different. The material may be one or more combinations of the vibration transmission layer materials described above. The above description of the clamping force on the contact surface is only a manifestation of the present disclosure. Those skilled in the art may modify the structure and manner described above according to actual requirements, and these modifications are still within the protection scope of the present disclosure. For example, the vibration transmission layer may be unnecessary. The panel may directly contact the user. Different contact surface regions may be provided on the panel. The different contact surface regions may have a same property as the first contact surface region and second contact surface region described above. As another example, a third contact surface region may be provided on the contact surface. The third contact surface region may have structure different from the first contact surface region and the second contact surface region, and these structures may obtain certain effects on reducing housing vibrations, suppressing sound leakage, improving the frequency response curve of the vibration unit, etc.

Figure 55:
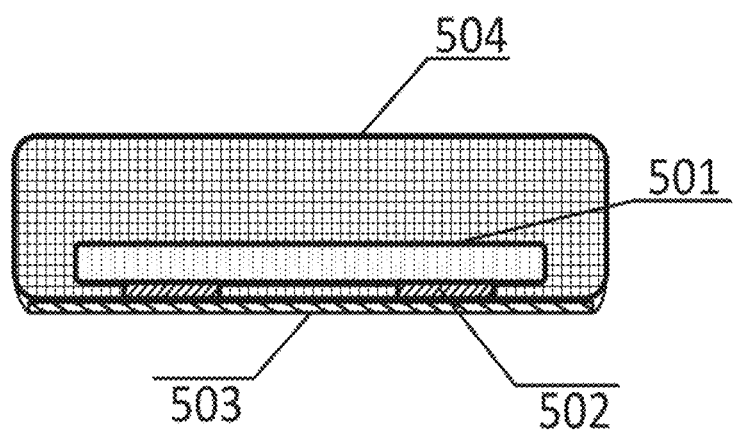
FIG. 55 is schematic diagram illustrating a vertical view of a bonding manner of a panel of a speaker according to some embodiments in the present disclosure.

As shown in FIG. 54 and FIG. 55, in some embodiments, a panel 501 and a vibration transmission layer 503 may be bonded by glue 502. Bonded portions may be located at both ends of the panel 501. The panel 501 may be located in a housing formed by the vibration transmission layer 503 and the housing 504. Preferably, a projection of the panel 501 on the vibration transmission layer 503 may be the first contact surface region, and a region around the first contact surface region may be the second contact surface region.

Figure 56:
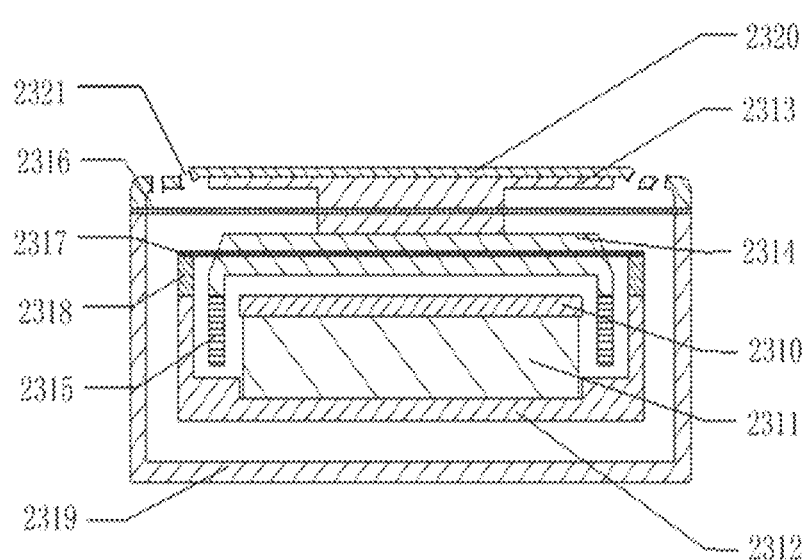
FIG. 56 is a structural diagram illustrating a vibration generating portion of a speaker according to some embodiments of the present disclosure.

In a specific embodiment, as shown in FIG. 56, a transducing device may include a magnetic circuit system including a magnetic conduction plate 2310, a magnet 2311, and a magnetizer 2312, a vibration plate 2314, a coil 2315, a first vibration transmission plate 2316, a second vibration transmission plate 2317, and a gasket 2318. A panel 2313 may protrude from a housing 2319, and be bonded to the vibration plate 2314 by glue. The first vibration transmission plate 2316 may connect and fix the transducing device on the housing 2319 to form a suspension structure. A vibration transmission layer 2320 (such as but not limited to silica gel) may be added on the panel 2313. The vibration transmission layer 2320 may produce a certain deformation to adapt to the shape of the skin. Referring to FIG. 20, the vibration transmission layer 2320 in this embodiment may correspond to the vibration transmission plate 214 and a vibration transmission layer 215. A portion of the vibration transmission layer 2320 that is in contact with the panel 2313 may be higher than a portion of the vibration transmission layer 2320 that is not in contact with the panel 2313, thereby forming a step structure. One or more small holes 2321 may be disposed in the portion of the vibration transmission layer 2320 that is not in contact with the panel 2313 (the part where the vibration transmission layer 2320 does not protrude in FIG. 56). The small holes in the vibration transmission layer may reduce sound leakage. That is, a connection between the panel 2313 and the housing 2319 through the vibration transmission layer 2320 may be weakened, and the vibration of the panel 2313 transmitted to the housing 2319 through the vibration transmission layer 2320 may be reduced, thereby reducing the sound leakage caused by the vibration of the housing 2319. An area of the non-protruding portion of the vibration transmission layer 2320 may be reduced after the small hole 2321 is provided, air that can be driven may be reduced, and the sound leakage caused by air vibration may be reduced. After the small holes 2321 are provided in the non-protruding portion of the vibration transmission layer 2320, the air vibration in the housing may be guided out of the housing, and the air vibration in the housing and the air vibration caused by the housing 2319 may be mutually offset to reduce the sound leakage. It should be noted that because the small holes 2321 may guide sound waves in the housing of the compound vibration device out to superimpose the leakage sound wave and further reduce the sound leakage, the small hole may also be called a sound guiding hole.

It should be noted herein that, in this embodiment, since the panel protrudes from the housing of the speaker, and the panel and the housing of the speaker is connected using the first vibration plate, a degree of coupling between the panel and the housing may be greatly reduced, and the first vibration transmission plate may provide a certain deformation, so that the panel may have a higher degree of freedom when the panel is fitted to the user, which may better adapt to a complex bonding surface. The first vibration transmission plate may make the panel produce a certain angle of inclination relative to the housing. Preferably, the inclination angle may be less than or equal to 5 degrees.

Figure 57:
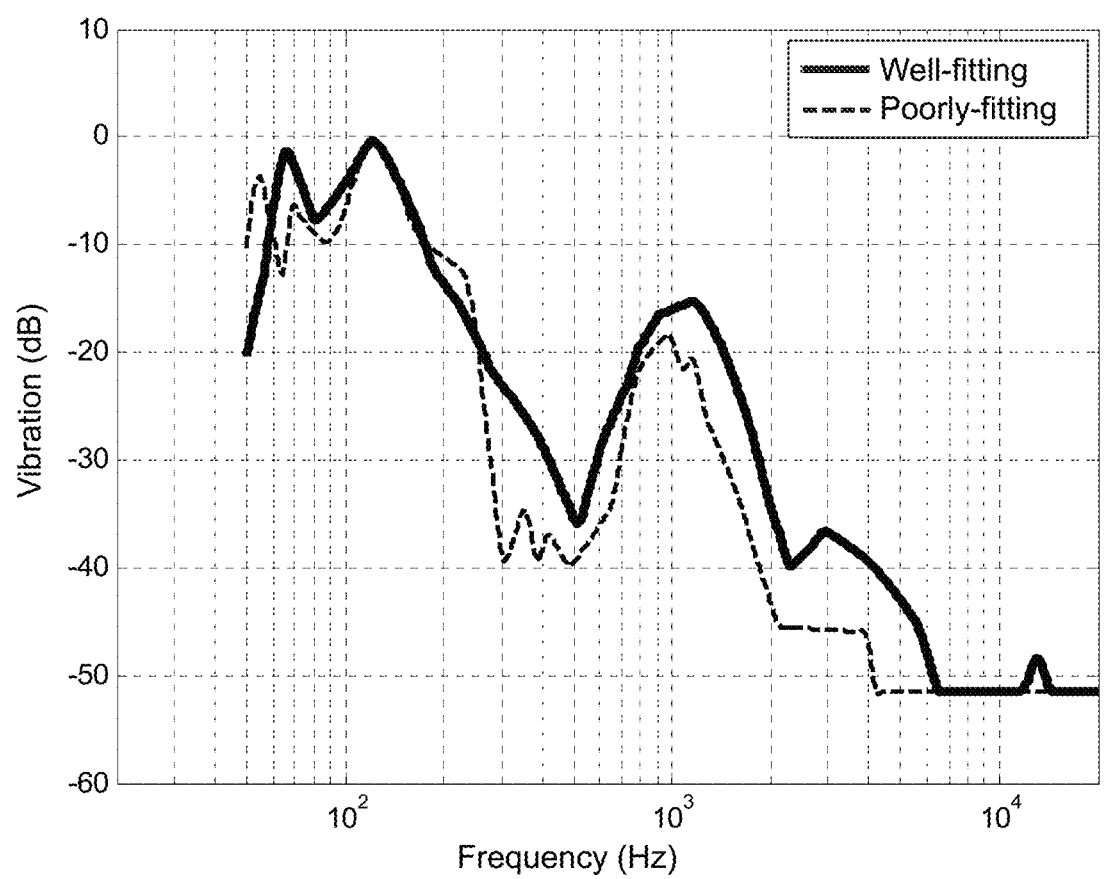
FIG. 57 is a schematic diagram illustrating a vibration response curve of a vibration generating portion of a speaker according to some embodiments of the present disclosure.

Further, a vibration efficiency of the speaker may vary with a fitting state. A speaker with a better fitting state may have a higher vibration transmission efficiency. As shown in FIG. 57, the thick line shows a vibration transmission efficiency in a better fitting state, and the thin line shows a vibration transmission efficiency in a poorly-fitting state. It may be seen that the vibration transmission efficiency in a well-fitting state is higher.

Figure 58:
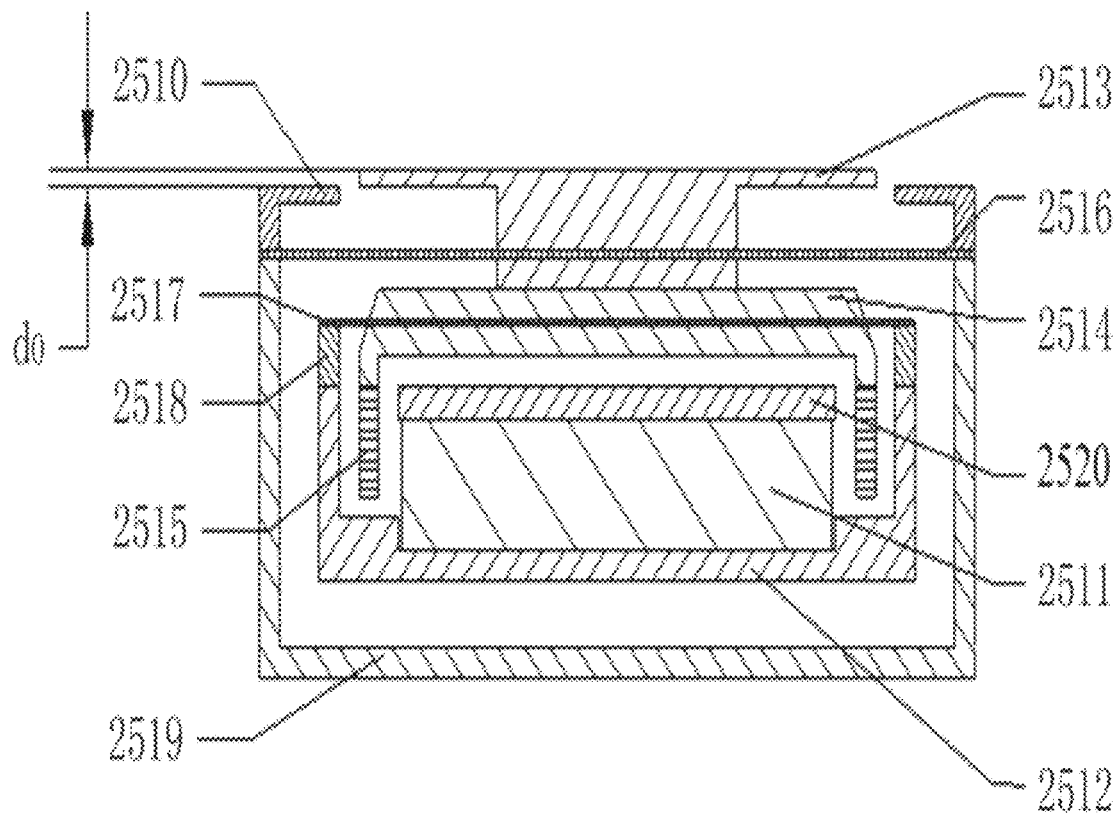
FIG. 58 is a structural diagram illustrating a vibration generating portion of a speaker according to some embodiments of the present disclosure.

FIG. 58 is a structural diagram illustrating a vibration generating portion of a speaker according to some embodiments of the present disclosure. As shown in FIG. 58, as a specific embodiment, in this embodiment, a transducing device may include a magnetic circuit system constituted by a magnetic conduction plate 2520, a magnet 2511, and a magnetizer 2512, a vibration plate 2514, a coil 2515, a first vibration transmission plate 2516, a second vibration transmission plate 2517, and a gasket 2518. A panel 2513 may protrude from a housing 2519, and be bonded to the vibration plate 2514 by glue. The first vibration transmission plate 2516 may connect and fix the transducing device on the housing 2519 to form a suspension structure.

A difference between this embodiment and the above-mentioned embodiment in FIG. 56 is that a border is added to the edge of the housing. In a contact between the housing and the skin, the border may make the force distribution more even and increase wearing comfort of the speaker. There may be a height difference do between the border 2510 and the panel 2513. The force of the skin acting on the panel 2513 may reduce a distance d between the panel 2513 and the border 2510. When a pressure between the speaker and a user is greater than a force experienced when the first vibration transmission plate 2516 is deformed into d0, the excess clamping force may be transmitted to the skin through the border 2510 without affecting the clamping force of the vibrating portion, thereby making the clamping force more consistent and ensuring sound quality.

Figure 59:
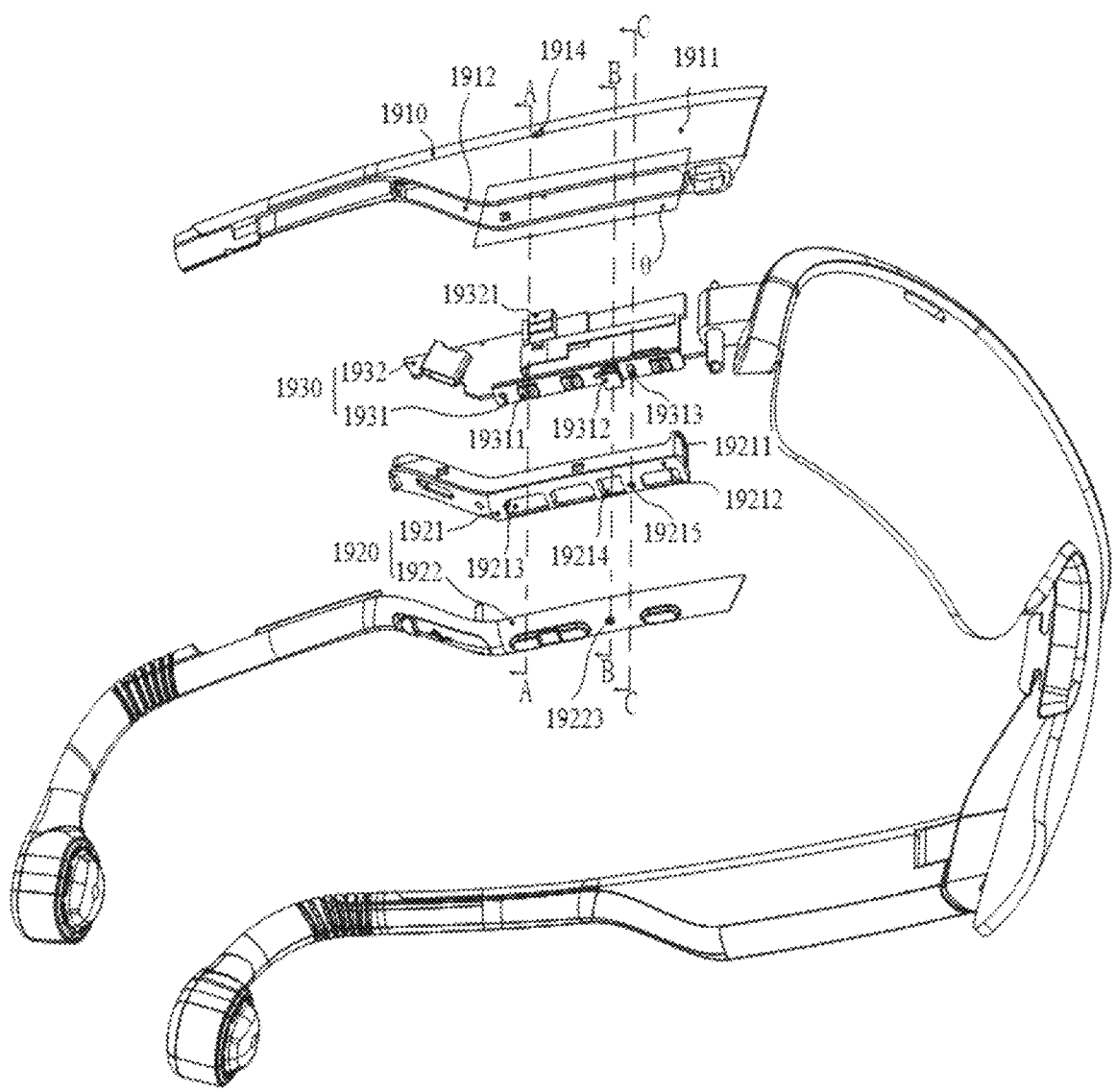
FIG. 59 is an exploded structural diagram illustrating a speaker according to some embodiments of the present disclosure.
Figure 60:
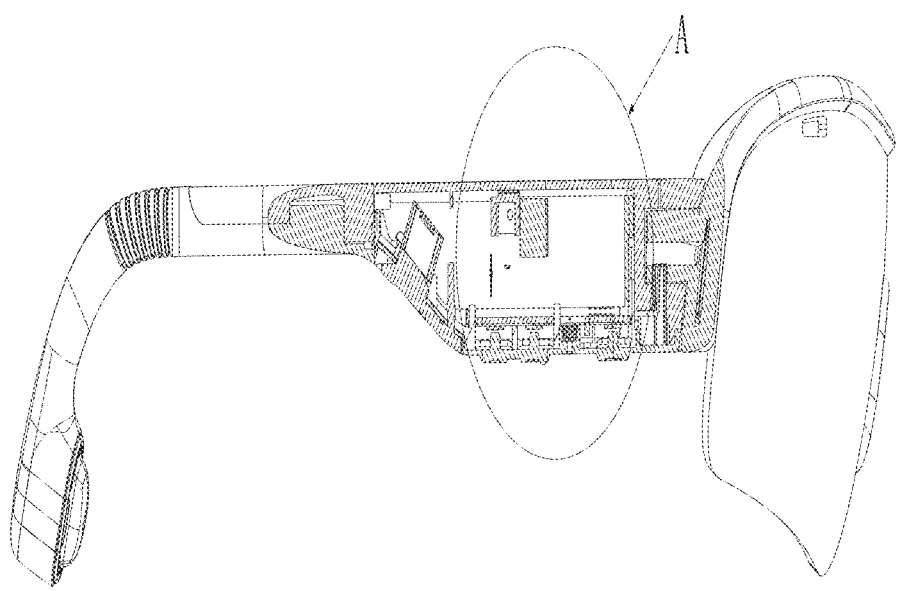
FIG. 60 is a partial sectional view illustrating a glasses according to some embodiments of the present disclosure.
Figure 61:
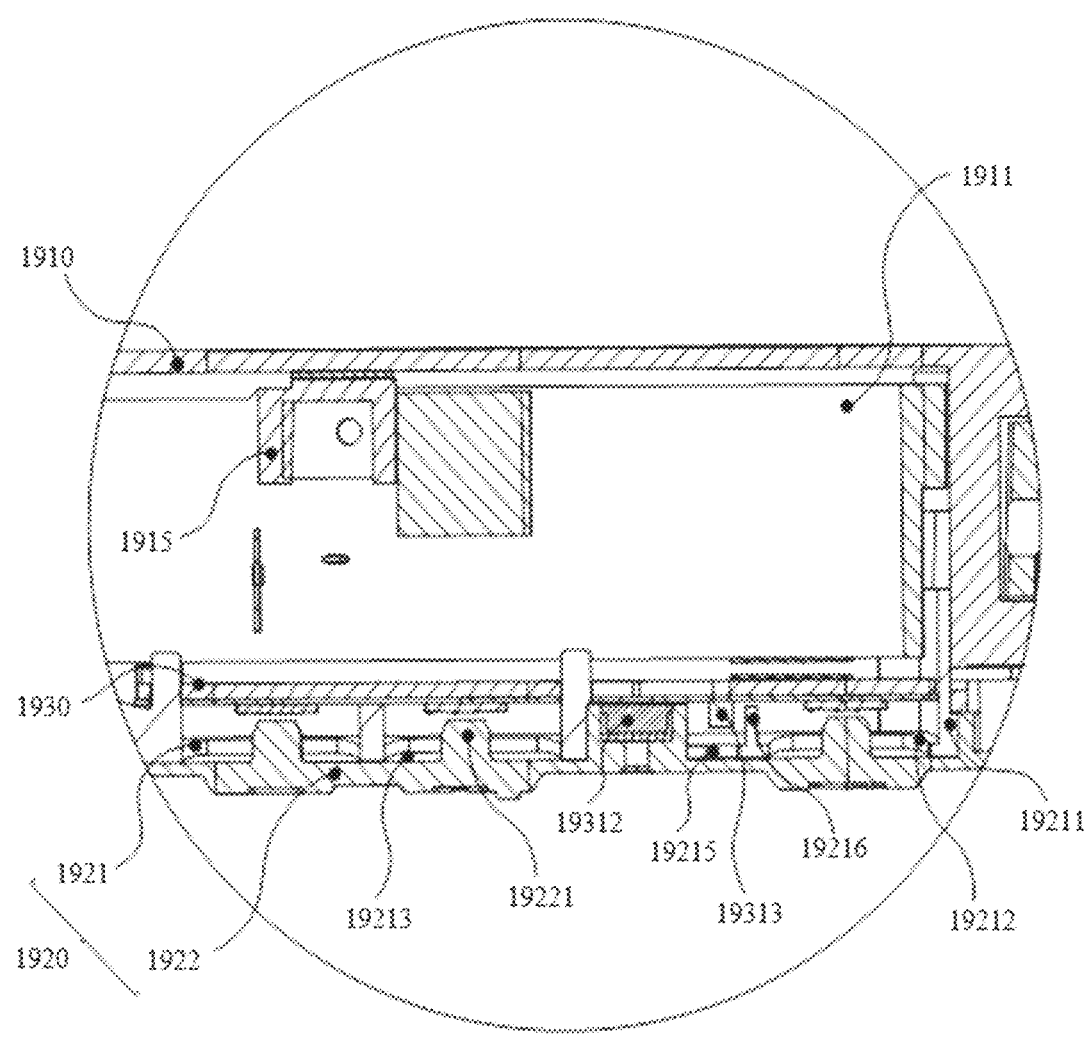
FIG. 61 is an enlarged view illustrating part A in FIG. 20 according to some embodiments of the present disclosure.

FIG. 59 is an exploded structural diagram illustrating a speaker according to some embodiments of the present disclosure. FIG. 60 is a partial sectional view illustrating a speaker according to some embodiments of the present disclosure. FIG. 61 is an enlarged view illustrating part A in FIG. 60 according to some embodiments of the present disclosure. As shown in FIGS. 59-61, in some embodiments, the speaker may include a component body. A chamber 1911 may be formed inside the component body. It should be noted that the component body may be located in the glasses temple 15 (in FIG. 7) in the above embodiment. In some embodiments, at least two dual microphones may also be disposed in the glasses temple 15.

It should be noted that the auxiliary function module 104 may be located in the core housing 108 or in the fixing mechanism 110, e.g., in the glasses temple 15 (FIG. 7).

The component body may be a structure including at least two portions. The component body may also be a structure formed by integrally molding, e.g., a structure integrally formed by injection molding. A spatial shape of the component body may include, but not be limited to, a rectangular parallelepiped, a cube, an ellipsoid, a sphere, a cone, and other irregular spatial shapes. A material of the component body may include, but not be limited to, a plastic, a silica gel, a rubber, a glass, a ceramic, an alloy, a stainless steel, or the like, or any combination thereof.

In some embodiments, the component body may include an accommodation body 1910 and a cover 1920. The accommodation body 1920 may be hollow to form the chamber 1911. The accommodation body 1910 may include an opening 1912 communicated with the chamber 1911. The cover 1920 may be disposed on the opening 1912 to seal the chamber 1911. The chamber 1911 may be an internal chamber formed by two or more components when assembled. Alternatively, the chamber 1911 may also be an internal chamber formed according to a shape of a forming mold during the integral molding process of the component. The chamber 1911 may be used to accommodate multiple electronic elements and circuit structures of the speaker. The component body may be used to seal the chamber 1911. The chamber 1911 may be completely sealed by the component body, or be jointly sealed by the component body and other accessories on the component body.

As used herein, the accommodation body 1910 may be at least a portion of the speaker. Specifically, the accommodation body 1910 in this embodiment may be a structure for holding, e.g., a circuit board, a battery 52, or an electronic component in the speaker. For example, the accommodation body 1910 may be a whole or a portion of the housing of the speaker.

In addition, the accommodation body 1910 may be disposed with a chamber 1911 having an opening 1912 for accommodating the circuit board, the battery, the electronic component, etc. The opening 1912 may communicate with the chamber 1911 and used as a channel for loading and/or unloading the circuit board, the battery, the electronic component, etc. For example, a count of the opening 112 may be one, or multiple, which is not limited herein.

Further, the shape of the cover 1920 may at least partially match the opening 1912. Therefore, the cover 1920 may be placed on the opening 1912 to seal the chamber 1911. As used herein, the material of the cover 1920 may be different from or partially the same as the accommodation body 1910.

In some embodiments, the cover 1920 may include a rigid bracket 1921 and a soft cover layer 1922. As used herein, the rigid bracket 1921 may be used to mechanically connect to the accommodation body 1910. The soft cover layer 1922 may integrally form on the surface of the rigid bracket 1921 by injection molding to provide a seal for the chamber 1911 after the rigid bracket 1921 is connected to the accommodation body 1910.

In some embodiments, the material of the rigid bracket 1921 may include hard plastic. The material of the soft cover layer 1922 may include soft silicone or rubber. As used herein, the shape of one side of the rigid bracket 1921 towards the accommodation body 1910 may match the opening 1912. The rigid bracket 1921 may be fixed to the opening 1912 of the chamber 1911 by means of plugging, buckling, etc., to be mechanically connected to the accommodation body 1910. A gap may easily form at a connection of the rigid bracket 1921 and the accommodation body 1910 and reduce the sealing of the chamber 1911. Further, the soft cover layer 1922 may integrally form on an outer surface of the bracket 1921 away from the accommodation body 1910 by injection molding. Further the connection between the bracket 1921 and the accommodation body 1910 may be covered, thereby implementing the sealing of the chamber 1911.

In the embodiment, the cover 1920 may include the rigid bracket 1921 and the soft cover layer 1922 integrally forming on the surface of the rigid bracket 1921 by injection molding. The rigid bracket 1921 may be mechanically connected to the accommodation body 1910. The soft cover layer 1922 may further provide sealing for the chamber 1911 after the rigid bracket 1921 is connected to the accommodation body 1911. The soft cover layer 1922 may facilitate to fit the gap between the rigid bracket 1921 and the accommodation body 1910, thereby further improving the sealing performance of the electronic component, and improving the waterproof effect of the electronic component. At the same time, the rigid bracket 1921 and the soft cover layer 1922 may integrally form by injection molding, which may simplify the assembly process of the electronic component.

In an embodiment, the rigid bracket 1921 may include an inserting portion 19211 and a covering portion 19212. The covering portion 19212 may be covered in the opening 1912. The inserting portion 19211 may be disposed on one side of the covering portion 19212, and extend into the chamber 1911 along an inner wall of the chamber 1911 to fix the covering portion 19212 on the opening 1912.

In an application scenario, the inserting portion 19211 may be inserted without through the inner wall of the chamber 1911. For example, an insertion portion matching the shape of the inserting portion 19211 of the rigid bracket 1921 may be further disposed inside the chamber 1911 so that the inserting portion 19211 may be inserted with the insertion portion to fix the insertion portion inside the chamber 1911. For example, the shape of the inserting portion 19211 may be a cylinder. The insertion portion may be a cylindrical ring surrounding the insertion portion of the cylinder. As used herein, an inner diameter of the insertion portion of the cylindrical ring may be appropriately less than the outer diameter of the insertion portion of the cylindrical body. Therefore, when the inserting portion 19211 is inserted into the insertion portion, the inserting portion 19211 and the insertion portion may be in the interference fit to allow the bracket 1921 to be stably connected to the chamber 1911. Of course, other insertion manners may also be used as long as the inserting portion 19211 is inserted into the chamber 1911 and fixed to the chamber 1911.

The covering portion 19212 may be disposed on one side of the inserting portion 19211 facing away from the chamber 1911, and cover the opening 1912 after the inserting portion 19211 is inserted into the chamber 1911. As used herein, the covering portion 19212 may be an integral structure, or may be further disposed with some holes according to requirements to implement a function.

Figure 62:
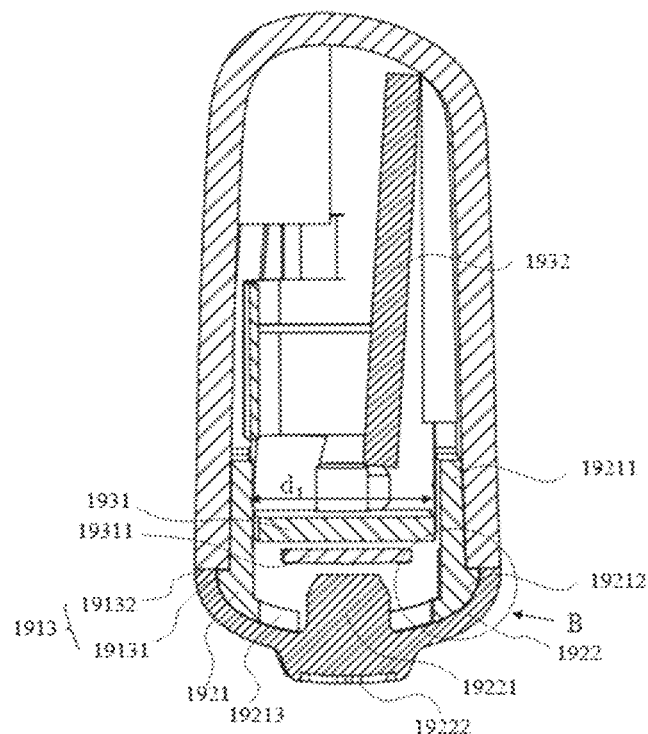
FIG. 62 is a sectional view illustrating an electronic component of a glasses along an A-A axis in FIG. 59 in a combined state according to some embodiments of the present disclosure.

Referring to FIG. 62, FIG. 62 is a sectional view illustrating a speaker along an A-A axis in FIG. 59 in a combined state according to some embodiments of the present disclosure. In an embodiment, the accommodation body 1910 may include an opening edge 1913 for defining the opening 1912. The covering portion 19212 may be pressed on an inner region 19131 of the opening edge 1913 near the opening 1912. The soft cover layer 1922 may cover an outer surface of the covering portion 19212 away from the accommodation body 1910 and be pressed on an outer region 19132 at the outer side of the inner region 19131 of the opening edge 1913 to seal with the opening edge 1913.

As used herein, the inner region 19131 and the outer region 19132 of the opening edge 1913 may both belong to the opening edge 1913, and may not be other regions external to the opening edge 1913. As used herein, the inner region 19131 of the opening edge 1913 may be a region of the opening edge 1913 near the opening 1912. The outer region 19132 of the opening edge 1913 may be a region of the opening edge 1913 away from the opening 1912.

In the embodiment, the covering portion 19212 of the rigid bracket 1921 may be pressed on the inner region 19131 of the opening edge 1913 near the opening 1912. Therefore, the covering portion 19212 may initially seal the opening edge 1913 at first. However, since the accommodation body 1910 and the rigid bracket 1921 are hard materials, the connection between the two and the further coverage of the covering portion 19212 may not have a good sealing effect. A gap may easily form between an end where the covering portion 19212 is pressed on the opening edge 1913 and far from the opening 1912 and the opening edge 1913. The chamber 1911 may further be penetrated via the gap, thereby reducing the sealing performance.

Therefore, in the embodiment of the present disclosure, the soft cover layer 1922 may cover the outer surface of the covering portion 19212 away from the accommodation body 1910, and be further pressed on the outer region 19132 of the periphery of the inner region 19131 of the opening edge 1913. Therefore, the gap forming between the covering portion 19212 and the opening edge 1913 of the rigid bracket 1921 may be further covered. Since the soft cover layer 1922 may be a soft material, the sealing effect of the electronic component may be further improved and the electronic component may have better water resistance.

Figure 63:
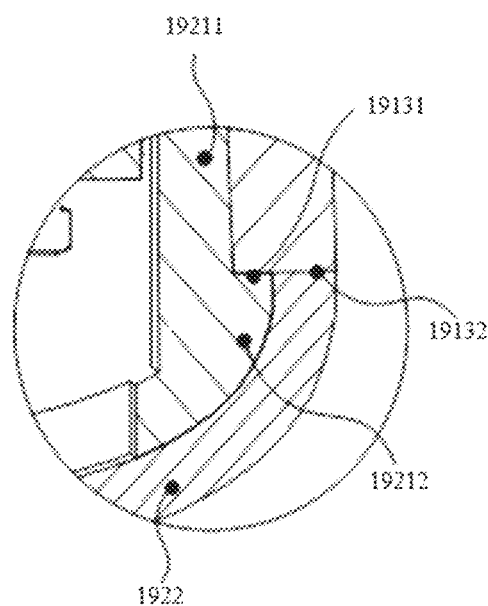
FIG. 63 is an enlarged view illustrating part B in FIG. 62 according to some embodiments of the present disclosure.

Referring to FIG. 63, FIG. 63 is an enlarged view illustrating part B in FIG. 62. In an application scenario, in a covered state of the cover 1920, the periphery of the covering portion 19212 may cover the inner region 19131 of the opening edge 1913 and touch the inner region 19131 of the opening edge 1913. The soft cover layer 1922 may be disposed on the side of the covering portion 19212 away from the accommodation body 1910. Therefore, the covering portion 19212 located at the inner region 19131 of the opening edge 1913 may be sandwiched between the inner region 19131 of the opening edge 1913 and the soft cover layer 1922. The soft cover layer 1922 may further extend in a direction away from the opening 1912 of the covering portion 19212 and a direction towards the opening edge 1913 until it contacts the outer region 19132 of the opening edge 1913. Therefore, a contact end surface of the covering portion 19212 and the opening edge 1913 and a contact end surface of the cover layer 1922 and the opening edge 1913 may be arranged flush with each other. A structure of "opening edge 1913—covering portion 19212—covering layer 1922" may form on the inner region 19131 of the opening edge 1913.

Figure 64:
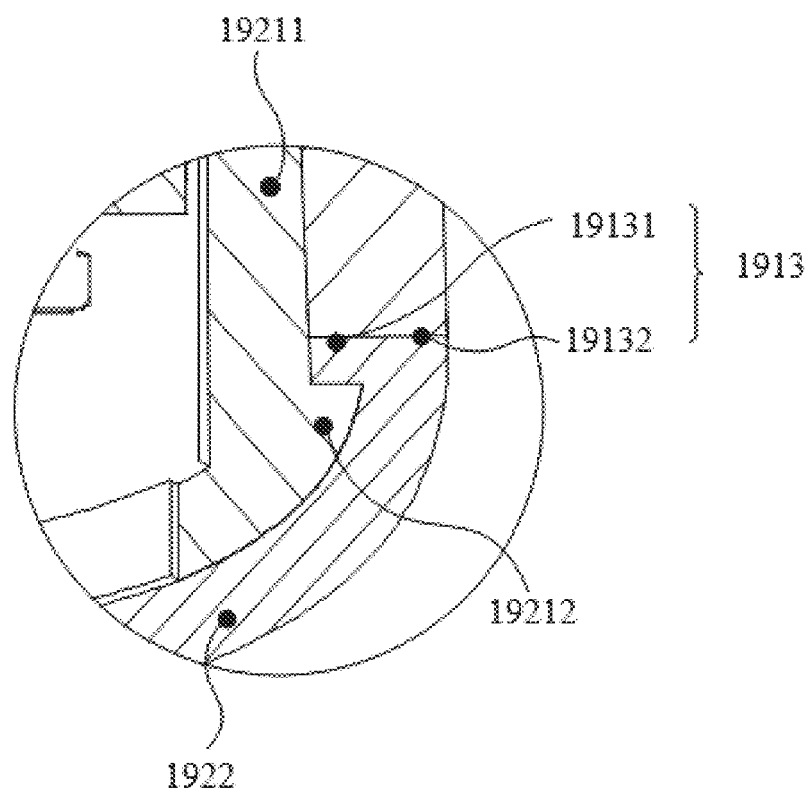
FIG. 64 is a partial sectional view according to some embodiments of the present disclosure.

In another application scenario, referring to FIG. 64, FIG. 64 is a partial sectional view illustrating a speaker according to some embodiments of the present disclosure. In the application scenario, after extending to contact the outer region 19132 of the opening edge 1913, the soft cover layer 1922 may further extend along the region between the covering portion 19212 and the opening edge 1913 to the inner region 19131 of the opening edge 1913. It may be further assumed, between the inner region 19131 of the opening edge 1913 and the covering portion 19212, the covering portion 19212 may be pressed onto the inner region 19131 of the opening edge 1913 to form the structure of "opening edge 1913—soft covering layer 1922—covering portion 19212—soft covering layer 1922". In the application scenario, the soft cover layer 1922 may be further extended between the rigid bracket 1921 and the opening edge 1913 on the basis of the covering portion 19212 covering the rigid bracket 1921, thereby further improving the sealing between the chamber 1911 and cover 1920, and further improving the waterproof effect of the electronic component.

In an embodiment, referring to FIG. 59 to FIG. 64, the speaker may further include a circuit component 1930 disposed inside the chamber 1911. The circuit component 1930 may be disposed with a switch 19311.

In some embodiments, the circuit component 1930 may include a first circuit board 1931. The switch 19311 may be disposed on an outer side of the first circuit board 1931 towards the opening 1912 of the chamber 1911. A count of the switch 19311 may be one or multiple. If the count of the switch 19311 is multiple, the switch 19311 may be disposed on the first circuit board 1931 at intervals. It should be noted that, the first circuit board 1931 may correspond to the first branch circuit board in the above embodiments.

Correspondingly, the rigid bracket 1921 may be disposed with a switch hole 19213 corresponding to the switch 19311. The soft cover layer 1922 may further cover the switch hole 19213. A pressing portion 19221 may be disposed at a position corresponding to the switch hole 19213. The pressing portion 19221 may extend towards the inside of the chamber 1911 through the switch hole 19213. When the corresponding position of the soft cover layer 1922 is pressed, the pressing portion 19221 may press the switch 19311 of the circuit component 1930, thereby triggering the circuit component 1930 to perform a preset function.

As used herein, the pressing portion 19221 disposed on the cover layer 1922 may form when the side of the soft cover layer 1922 towards the rigid bracket 1921 protrudes in a direction facing the switch hole 19213 and the switch 19311. The shape of the pressing portion 19221 may match the switch hole 19213. Therefore, when the corresponding position of the soft cover layer 1922 is pressed, the pressing portion 19221 may pass through the switch hole 19213 and reach the corresponding switch 19311 of the first circuit board 1931. At the same time, the length of the pressing portion 19221 in the direction towards the switch 19311 may be set so that the switch 19311 may not be pressed when the position corresponding to the soft cover layer 1922 is not pressed, and the corresponding switch 19311 may be pressed when the position corresponding to the soft cover layer 1922 is pressed.

In an application scenario, a position of the soft cover layer 1922 corresponding to the pressing portion 19221 may further protrude towards a side facing away from the rigid bracket 1921 to form a convex pressing portion 19222. Therefore, the user may clarify the position of the switch 19311 and trigger the circuit component 1930 to perform a corresponding function by pressing the corresponding pressing portion 19222.

In some embodiments, the auxiliary function module 204 may be used to receive auxiliary signal(s) and perform auxiliary function(s). The auxiliary function module 204 may be a module different from the earphone core and may be used for receiving the auxiliary signal(s) and performing the auxiliary function(s). Further, the auxiliary function module 204 may be configured to implement one or more functions of an image function, a voice function, an auxiliary control function, and a switch control function. In the present disclosure, the conversion of the audio signal into the sound signal may be considered as a main function of the speaker, and other functions different from the main function may be considered as the auxiliary function(s) of the speaker. For example, the auxiliary function(s) of the speaker 100 may include receiving a user sound and/or an ambient sound through a microphone, controlling a broadcasting process of the sound signal through a key, or the like.

Further, the auxiliary function module(s) may at least include a first auxiliary function module and a second auxiliary function module. The first auxiliary function module may be disposed on the main circuit board 445, and the second auxiliary function module may be disposed on the first branch circuit board 442.

Further, the auxiliary function module(s) may also include a third auxiliary function module. The third auxiliary function module may be disposed on the second branch circuit board.

Specifically, the second auxiliary function module may be a first microphone element 19312. The third auxiliary function module may be a second microphone element 19321. As used herein, the first microphone element 19312 and the second microphone element 19321 may both be MEMS (micro-electromechanical system) microphones, which may have a small working current, relatively stable performance, and high voice quality.

It should be noted that, the first microphone element 19312 and the second microphone element 19321 may correspond to the microphone 432 in the above embodiments.

In some embodiments, the first microphone and the second microphone may be distributed in the speaker in a specific manner, so that a main sound source (e.g., a human mouth) may be located at a direction that the second microphone element 19321 points to the first microphone element 19312.

Specifically, the first microphone element 19312 may be disposed on one side of the first circuit board 1931 facing the cover 1920, and the second microphone element 19321 may be disposed on one side of a second circuit board 1932 facing the accommodation body 1910.

When the user wears the speaker, distances from the mouth (the main sound source) to the first microphone element 19312 and the second microphone element 19321 may be less than distances from other sound sources (e.g., a noise source) in the environment to the first microphone element 19312 and the second microphone element 19321. The mouth may be considered as a near-field sound source of the first microphone element 19312 and the second microphone element 19321. For near-field sound sources, magnitudes of the sound received by the two sets of microphone elements may be related to the distance between the sound source and the two sets of microphone elements. Since the first microphone element 19312 is closer to the main sound source, the first microphone element 19312 may receive a larger audio signal $V_{J1}$. Since, the second microphone element 19321 is far from the main sound source, the second microphone element 19321 may receive a smaller audio signal $V_{J2}$. That is, $V_{J1}$ may be larger than $V_{J2}$.

Since the noise source in the environment is far away from the first microphone element 19312 and the second microphone element 19321, the noise source in the environment may be considered as a far-field sound source of the first microphone element 19312 and the second microphone element 19321. For far-field sound sources, magnitudes of the noise signals received by the two sets of microphone elements may be similar. That is, $V_{Y1}$ may be equal to $V_{Y2}$.

Therefore, a total sound signal received by the first microphone element 19312 may be:

$$V_1 = V_{J1} + V_{Y1} \tag{24}$$

A total sound signal received by the second microphone element 19321 may be:

$$V_2 = V_{J2} + V_{Y2} \tag{25}$$

In order to eliminate the noise in the received sound signal, a differential operation may be performed on the total sound signal of the first microphone element 19312 and the total sound signal of the second microphone element 19321. The differential operation may be as follows:

$$V = V_1 - V_2 = (V_{J1} - V_{J2}) + (V_{Y1} - V_{Y2}) \approx V_{J1} - V_{J2} \tag{26}$$

Further, according to a differential result of the signals obtained according to formula (26), combining with the distances of the first microphone element 19312 and the second microphone element 19321 relative to the main sound source, actual audio signals obtained by the first microphone element 19312 and/or the second microphone element 19321 from the main sound source may be further obtained. The actual audio signal may be $V_{J1}$ or $V_{J2}$.

Therefore, in order to improve the quality of the finally obtained audio signals, the differential result of the signals obtained according to formula (26) may be as large as possible. That is, $V_{J1}$ may be much larger than $V_{J2}$. In some embodiments of the present disclosure, the effect may be achieved according to the following manners: an installation position of the first microphone element 19312 being as close as possible to the main sound source (e.g., the human mouth); an installation position of the second microphone element 19321 being as far away as possible from the main sound source (e.g., the human mouth); isolating the two microphone elements; disposing a sound barrier between the two microphone elements. It should be noted that all the above manners may achieve the effect of improving the quality of the audio signal, and these manners may be used alone or in combination.

In some embodiments, to make the installation position of the first microphone element 19312 as close as possible to the main sound source (e.g., the human mouth), the first circuit board 1931 and the first microphone element 19312 installed thereon may be disposed to be inclined. In some embodiments, in order to make the installation position of the second microphone element 19321 as far away as possible from the main sound source (e.g., the human mouth), the second circuit board 1932 and the second microphone element 19321 installed thereon may be disposed to be inclined to flexibly adjust an installation distance. At the same time, a corresponding sound guide channel and a sound barrier may be disposed in each installation region of the microphone elements. The specific installation manners may refer to FIG. 65-69 and the descriptions thereof.

It should be noted that the second circuit board 1932 may be equivalent to the second branch circuit board in the above embodiments.

The first circuit board 1931 may include the first microphone element 19312. Specifically, the first circuit board 1931 may be disposed facing the cover 1920. The first microphone element 19312 may be disposed on one side of the first circuit board 1931 facing the cover 1920. For example, the first microphone element 19312 may be disposed on the first circuit board 1931 spaced from the switch 19311 in the above embodiment. The first microphone element 19312 may be used to receive a sound signal from the outside of the electronic component, and convert the sound signal into an electrical signal for analysis and processing.

Correspondingly, the bracket 1921 may be disposed with a first microphone hole 19214 corresponding to the first microphone element 19312. The soft cover layer 1922 may be disposed with a first sound guiding hole 19223 corresponding to the first microphone hole 19214. The first sound guiding hole 19223 may be disposed corresponding to the first microphone element 19312.

Specifically, the first sound guiding hole 19223 may be disposed on the cover 1920. One end of the first sound guiding hole 19223 may be connected to the first microphone hole 19214 on the cover 1920, and the other end of the first sound guiding hole 19223 may face to the first microphone element 19312, which may shorten a sound guiding distance and improve a sound guiding effect.

Specifically, the first circuit board 1931 may face the cover 1920 in a manner parallel to or inclined to the cover 1920. The first sound guiding hole 19223 may be perpendicular or inclined to a surface of the cover 1920.

In some embodiments, a depth direction of the opening 1912 may be vertical or inclined relative to a bottom of the accommodation body 1910. When the opening 1912 is vertical, the cover 1920 may be horizontal relative to the accommodation body 1910 after being covered. When the opening 1912 is inclined, the cover 1920 may be inclined relative to the accommodation body 1910. The inclination may be inclined toward a side of the mouth of the human body. In this way, the first sound guiding hole 19223 may face the mouth or face of the human more directly, and improve effect of the sound from the main sound source acquired by the microphone element.

Further, when the opening 1912 is inclined, an included angle between a plane of the opening 1912 and a plane of a width direction of the accommodation body may be in a range of 10 to 30 degrees, so that the first sound guiding hole 19223 may further face an area of the human mouth. Specifically, when the opening 1912 is inclined, the included angle between the plane of the opening 1912 and the plane of the width direction of the accommodation body may be any angle within the above range, such as, 10 degrees, 15 degrees, 20 degrees, 23 degrees, 27 degrees, 30 degrees, etc., which may not be specific limitation herein.

Specifically, the first sound guiding hole 19223 may be disposed through the soft cover layer 1922. When the opening 1912 is vertical and the first circuit board 1931 is parallel to the cover 1920, the first sound guiding hole 19223 may be disposed perpendicular to the cover 1920. That is, the first sound guiding hole 19223 may be vertical. When the opening 1912 is vertical and the first circuit board 1931 is inclined to the cover 1920, the first sound guiding hole 19223 may be disposed inclined to the cover 1920. When the opening 1912 is inclined and the first circuit board 1931 is parallel to the cover 1920, the first sound guiding hole 19223 may be disposed perpendicular to the cover 1920. That is, the first sound guiding hole 19223 may be inclined. When the opening 1912 is inclined and the first circuit board 1931 is inclined to the cover 1920, the first sound guiding hole 19223 may also be disposed inclined to the cover 1920. That is, the first sound guiding hole 19223 may be vertical or inclined.

Further, when the first circuit board 131 faces the cover 1920 in a manner inclined to the cover 1920, the included angle between a plane of the first circuit board 1931 and a plane of the cover 1920 may be in a range of 5 to 20 degrees. Specifically, when the first circuit board 1931 faces the cover 1920 in a manner inclined to the cover 1920, the included angle between the plane of the first circuit board 1931 and the plane of the cover 1920 may be any angel within the included angle range, such as, 5 degrees, 8 degrees, 10 degrees, 15 degrees, 20 degrees, etc., which may not be specifically limited herein.

Specifically, the first sound guiding hole 19223 may correspond to the first microphone hole 19214 on the bracket 1921. The first microphone element 19312 may be further communicated with the outside of the speaker. Therefore, the sound outside the speaker may pass through the first sound guiding hole 19223 and the first microphone hole 19214. The sound may be received by the first microphone element 19312.

In order to further improve the effect of the sound guiding, a central axis of the first sound guiding hole 19223 may coincide with a main axis of a sound receiving region 193121 of the first microphone element 19312. The sound receiving region 193121 of the first microphone element 19312 refers to a region (e.g., a diaphragm) on the first microphone element 19312 that receives sound waves. When the central axis of the first sound guiding hole 19223 coincides with the main axis of the sound-receiving area 193121 of the first microphone element 19312, the sound of the main sound source may be acquired by the first microphone hole 19214. The sound may be directly guided to the sound receiving region 193121 of the first microphone element 19312 through the first sound guiding hole 19223. The sound propagation path may be further reduced, which may prevent the main sound source from repeatedly propagating in the chamber to cause loss and echo, and also prevent the main sound source from being transmitted to a region of the second microphone element 1321 through a channel in the chamber. Therefore, the sound effect may be improved.

As used herein, in one embodiment, the cover 1920 may be arranged in a stripe shape. As used herein, a main axis of the first sound guiding hole 19223 and a main axis of the sound receiving region 193121 of the first microphone element 19312 may be coincided with each other in the width direction of the cover 1920. As used herein, the main axis of the sound receiving region 193121 of the first microphone element 19312 refers to a main axis of the sound receiving region 193121 of the first microphone element 19312 in the width direction of the cover 1920, such as an axis n in FIG. 65. The main axis of the first sound guiding hole 19223 may be an axis m in FIG. 65. The axis n may be coincided with the axis m.

Further, the shape of the first sound guiding hole 19223 may be any shape as long as the sound from the outside of the speaker is able to be received by the speaker. In some embodiments, the first sound guiding hole 19223 may be a circular hole having a relatively small size, and disposed in a region of the cover layer 1922 corresponding to the microphone hole 19214. The first sound guiding hole 19223 with the small size may reduce the communication between the first microphone element 19312 or the like in the speaker and the outside, thereby improving the sealing of the speaker.

Further, in order to guide the sound signal entered from the first sound guiding hole 19223 to the first microphone element 19312, the sound guiding channel 192241 may be disposed with a curved shape.

Specifically, in an application scenario, the main axis of the first sound guiding hole 19223 may be disposed in the middle of the cover 1920 in the width direction of the cover 1920.

At the same time, the soft cover 1922 of the cover 1920 may also be disposed with a first sound blocking member 1224 corresponding to first sound guiding hole 19223. The first sound blocking member 1224 may extend towards the inside of the chamber 1911 via the microphone hole 1214 to restrict the sound to be transmitted along a transmission direction to the first microphone element 19312. A sound guiding channel 12241 may be defined. One end of the sound guiding channel 192241 may be in communication with the first sound guiding hole 19223 of the soft cover layer 1922. The first microphone element 19312 may be inserted into the sound guiding channel 192241 from another end of the sound guiding channel 192241.

As used herein, when the speaker further includes the switch 19311 in the above embodiment, the switch hole 19213 and the first microphone hole 19214 may be arranged on the rigid bracket 1921 at intervals.

Further, an interval distance between the switch hole 19213 and the first microphone hole 19214 may be in a range of 10 to 20 millimeters, and specifically may also be 10 millimeters, 15 millimeters, 20 millimeters, etc.

Correspondingly, the first sound blocking member 19224 may extend to the periphery of the first microphone element 19312 from the soft cover layer 1922, through the periphery of the first sound guiding hole 19223, the microphone hole 19214, and the inside of the chamber 1911 to form the sound guiding channel 192241 from the first sound guiding hole 19223 to the first microphone element 19312. Therefore, the sound signal of the electronic component entering the sound guiding hole may directly reach the first microphone element 19312 through the sound guiding channel 192241.

Specifically, a shape of the sound guiding channel 192241 in a section perpendicular to the length direction may be the same as or different from the shape of the microphone hole 19214 or the first microphone element 19312. In an application scenario, the sectional shapes of the microphone hole 19214 and the first microphone element 19312 in a direction perpendicular to the bracket 1921 towards the chamber 1911 may be square. The size of the microphone hole 19214 may be slightly larger than the outer size of the sound guiding channel 192241. The inner size of the sound guiding channel 192241 may not be less than the outer size of the first microphone element 19312. Therefore, the sound guiding channel 192241 may pass through the first sound guiding hole 19223 to reach the first microphone element 19312 and be wrapped around the periphery of the first microphone element 19312.

Through the way described above, the soft cover layer 1922 of the speaker may be disposed with the first sound guiding hole 19223 and the sound guiding channel 192241 passing from the periphery of the first sound guiding hole 19223 through the microphone hole 19214 to reach the first microphone element 19312 and wrapped around the periphery of the first microphone element 19312. The sound guiding channel 192241 may be disposed so that the sound signal entering through the first sound guiding hole 19223 may reach the first microphone element 19312 via the first sound guiding hole 19223 and be received by the first microphone element 19312. Therefore, the leakage of the sound signal in the transmission process may be reduced, thereby improving the efficiency of receiving the electronic signal by the speaker.

In an application scenario, the speaker may also include a waterproof mesh cloth 194 disposed inside the sound guiding channel 192241. The waterproof mesh cloth 194 may be held against the side of the soft cover layer 1922 towards the microphone element by the first microphone element 19312 and cover the first sound guiding hole 19223.

Specifically, the bracket 1921 may protrude at a position of the bracket 1921 close to the first microphone element 19312 in the sound guiding channel 192241 to form a convex surface opposite to the first microphone element 19312. Therefore, the waterproof mesh 194 may be sandwiched between the first microphone element 19312 and the convex surface, or directly adhered to the periphery of the first microphone element 19312, and the specific setting manner may not be limited herein.

In addition to the waterproof function for the first microphone element 19312, the waterproof mesh cloth 194 in the embodiment may also have a function of sound transmission, etc., to avoid adversely affecting the sound receiving effect of a sound receiving region 193121 of the first microphone element 19312.

It should be noted that, due to the setting requirements of the circuit component 1930, the first microphone element 19312 may be disposed at a first position of the first circuit board 1931. When the first sound guiding hole 19223 is disposed, the first sound guiding hole 19223 may be disposed at a second position of the cover 1920 due to the aesthetic and convenient requirements. In the embodiment, the first position and the second position may not correspond in the width direction of the cover 1920. Therefore, the main axis of the first sound guiding hole 19223 and the main axis of the sound receiving region 193121 of the first microphone element 19312 may be spaced from each other in the width direction of the cover 1920. Therefore, the sound input via the first sound guiding hole 19223 may not reach the sound receiving region 193121 of the first microphone element 19312 along a straight line.

In some embodiments, the cover 1920 may be a portion of the outer housing of the speaker. In order to meet the overall aesthetic requirements of the speaker, the first sound guiding hole 19223 may be disposed in the middle in the width direction of the cover 1920. Therefore, the first sound guiding hole 19223 may look more symmetrical and meet the visual requirements of people.

In some scenarios, the corresponding sound guiding channel 192241 may be disposed with a stepped shape in a section along the B-B axis in FIG. 59. Therefore, the sound signal introduced by the first sound guiding hole 19223 may be transmitted to the first microphone element 19312 through the stepped sound guiding channel 192241 and received by the first microphone element 19312.

Further, referring to FIG. 67, FIG. 67 is a sectional view illustrating an electronic component in a combined state along a C-C axis in FIG. 59 according to the present disclosure. In some embodiments, the speaker may further include a light emitting element 19313. Specifically, the light emitting element 19313 may be disposed on the first circuit board 1931 of the circuit component 1930 to be accommodated inside the chamber 1911. For example, the light emitting element 19313 may be disposed on the first circuit board 1931 in an arrangement together with the switch 19311 and the first microphone element 19312 in the embodiment. It should be noted that the circuit component 1930 may be equivalent to the control circuit in the above embodiments.

Correspondingly, the rigid bracket 1921 may be disposed with a light emitting hole 19215 corresponding to the light emitting element 19313. The soft cover layer 1922 may cover the light emitting hole 19215. The thickness of a region of the soft cover layer 1922 corresponding to the light emitting hole 19215 may be set to allow a light emitted by the light emitting element 19313 to be transmitted through the soft cover layer 1922.

As used herein, the light emitting element 19313 may include a light emitting diode, etc. A count of the light emitting element 19313 may be one or multiple. A count of the light emitting holes 19215 on the rigid bracket 1921 may be the same as that of the light emitting elements 19313. When the count of the light emitting elements 19313 is multiple, the light emitting elements 19313 may correspond to different light emitting holes 19215. Therefore, different signals may be transmitted through the different light emitting elements 19313.

In the embodiment, the soft cover layer 1922 may still transmit the light emitted from the light emitting element 19313 to the outside of the speaker in a manner under a condition that the cover layer 1922 covers the light emitting hole 19215.

Specifically, in an application scenario, the thickness of the soft cover layer 1922 corresponding to the entire region or a portion of the region of the light emitting hole 19215 may be set to be less than the thickness of the soft cover layer 1922 corresponding to a region of the periphery of the light emitting hole 19215. Therefore, the light emitted by the light-emitting element 19313 may pass through the light emitting hole 19215 and be transmitted through the soft cover layer 1922. Of course, other manners may be also adopted to make a region where the soft cover layer 1922 covers the light emitting hole 19215 may transmit the light through the soft cover layer 1922, and be not specifically limited herein. For example, a window may be disposed on the soft cover layer 1922 corresponding to the entire region or a portion of the region of the light emitting hole 19215. The window may be covered with a layer of transparent or light transmitting material (e.g., thin film, quartz, etc.), so that light emitted by the light emitting element 19313 may pass through the light emitting hole 19215 and be further transmitted through the window.

In some embodiments, on the basis of covering the light emitting hole 19215 corresponding to the light emitting element 19313, the soft cover layer 1922 may be further disposed to enable to transmit the light emitted by the light emitting element 19313 through the cover layer 1922 to the outside of the electronic component. Therefore, the light emitting element 19313 may be sealed by the soft cover layer 1922 without affecting the light emitting function of the electronic component, so as to improve the sealing and waterproof performance of the electronic component.

Specifically, in an embodiment, the rigid bracket 1921 may further include a light blocking member 19216 extending toward the inside of the chamber 1911 and disposed on the periphery of the light emitting hole 19215. The light blocking member 19216 may limit the transmission direction of the light generated by the light emitting element 19313.

As used herein, a shape of the light emitting hole 19215 may be any shape that may transmit the light emitted by the light emitting element 19313, such as, a circle, a square, a triangle, etc. In this embodiment, the shape of the light emitting hole 19215 may be a circle.

Since there is still a certain distance between the light emitting element 19313 and the light emitting hole 19215, a portion of the light emitted by the light emitting element 19313 may leak out before the light reaches the light emitting hole 19215 if without a restriction. Therefore, the light may not be transmitted to the light emitting hole 19215 effectively, which may reduce a brightness of the light that may be seen from the outside of the speaker, thereby making it inconvenient for the user to receive signals. The arrangement of the light blocking member 19216 in this embodiment may limit the transmission direction of the light generated by the light emitting element 19313 so as to reduce light leakage, thereby increasing the brightness of the light transmitted through the light emitting hole 19215.

Specifically, the light blocking member 19216 in this embodiment may be partially or entirely formed by the rigid bracket 1921. For example, the rigid bracket 1921 may extend along the periphery of the light emitting hole 19215 toward the inside of the chamber 1911 and surround the light emitting element 19313. In such cases, a light channel for light propagation may be formed. Through the light channel, the light generated by the light emitting element 19313 may propagate directly to the light emitting hole 19215 along a direction of the light channel. Alternatively, the rigid bracket 1921 may not include the light channel. The propagation of light may be limited from one direction or several directions by the rigid bracket 1921. For example, the rigid bracket 1921 may extend into the chamber 1911 from one side of the light emitting hole 19215 to form the light blocking member 19216 that blocks the light emitting element 19313 on one side. In some embodiments, the rigid bracket 1921 may further cooperate with other components to limit the propagation of light. For example, the rigid bracket 1921 extends into the chamber 1911 from one side of the light emitting hole 19215 to form the light blocking member 19216 that blocks the light emitting element 19313 on one side, and the light blocking member 19216 may further cooperate with the inner wall of the chamber 1911 or other structures of the rigid bracket 1921 to limit the transmission direction of the light generated by the light emitting element 19313 from multiple directions.

In an application scenario, the light emitting element 19313 and the first microphone element 19312 may be adjacently disposed on the first circuit board 1931, and the corresponding light emitting holes 19215 and the first microphone holes 19214 may be disposed on the rigid bracket 1921 at intervals. As described in the above embodiments, the first sound blocking member 19224 formed by the soft cover layer 1922 that defines the sound guide channel 192241 may be disposed on the periphery of the first microphone element 19312. The first sound blocking member 19224 may be disposed through the first microphone hole 19214. Then the first microphone element 19312 and the light emitting element 19313 may be arranged at intervals, and the first microphone hole 19214 and the light emitting hole 19215 may be arranged at intervals.

Specifically, in this application scenario, the light blocking member 19216 formed by the rigid bracket 1921 may cooperate with one side wall of the first sound blocking member 19224 close to the light emitting element 19313, which may jointly limit the transmission direction of the light generated by the light emitting element 19313.

In another application scenario, the chamber 1911 may be arranged in a stripe shape on a cross section in a direction perpendicular to the opening 1912. Correspondingly, the rigid bracket 1921 may also be arranged in a stripe shape and inserted into the chamber 1911 through the opening 1912 via the inserting portion 19211, thereby forming a mechanical connection with the chamber 1911. The inserting portions 19211 may be disposed on both sides of the length direction of the rigid bracket 1921, so that the light emitting element 19313 may include the corresponding inserting portions 19211 of the rigid bracket 1921 on both sides of the length direction of the rigid bracket 1921. In such cases, the light on both sides of the light emitting element 19313 may be limited. Further, in this application scenario, the light blocking member 19216 may be further disposed on one side of the light emitting element 19313 perpendicular to the length direction of the rigid bracket 1921, and a side wall of the first sound blocking member 19224 may be disposed on another side of the light emitting element 19313 perpendicular to the length direction of the rigid bracket 1921. The light blocking member 19216 and the first sound blocking member 19224 may be plates parallel to each other, and further cooperate with the inserting portions 19211 on both sides of the light emitting element 19313 to limit the transmission direction of the light generated by the light emitting element 19313.

In an embodiment, the circuit component 1930 in the speaker may include the first circuit board 1931 of the speaker in the above embodiments. The circuit component 1930 may further include the second circuit board 1932. The details may be referred to FIG. 59, FIG. 62, FIG. 65, and FIG. 66.

It should be noted that the second circuit board 1932 may be equivalent to the second branch circuit board in the above embodiment.

Specifically, the second circuit board 1932 may be disposed facing the accommodation body 1910. The second circuit board 1932 may be disposed in the chamber 1911 inclined to the first circuit board 1931. The second microphone element 19321 may be disposed on one side of the second circuit board 1932 facing the accommodation body 1910.

The second microphone element 19321 may be disposed facing the side wall of the accommodation body 1910, so that there is a large space near the second microphone element 19321, which may be convenient for providing functional components corresponding to the second microphone element 19321 on the accommodation body 1910. In addition, the second circuit board 1932 may be disposed inclined to the first circuit board 1931. The functional components on the two circuit boards may be disposed in a staggered manner, which may also reduce a distance between the functional components, thereby saving and compressing an internal space of the speaker.

As used herein, a second sound guiding hole 1914 may be further disposed on a side wall of the accommodation body 1910 opposite to the cover 1920 or the first sound guiding hole 19223.

The second sound guiding hole 1914 may be correspondingly disposed on the side wall of the accommodation body 1910. The second sound guiding hole 1914 and the first sound guiding hole 19223 may be away from each other. In some embodiments, the opening 1912 of the accommodation body 1910 may be an inclined opening. The cover 1920 may be inclined relative to the accommodation body 1910. The side wall of the accommodation body 1910 opposite to the first sound guiding hole 1923 may be a side surface on one side of the chamber 1911. The second sound guiding hole 1914 may be disposed on a side surface on one side wall of the accommodation body 1910. Further, the second sound guiding hole 1914 may be disposed on the side surface on one side of the accommodation body 1910, a distance between the second sound guiding hole 1914 and a top of the accommodation body 1910 may be in a range of 3 millimeters to 6 millimeters. Specifically, the distance may be 3 millimeters, 4 millimeters, 5 millimeters, 6 millimeters, etc.

In some embodiments, when a depth direction of the opening 1912 of the accommodation body 1910 is vertical relative to a bottom of the accommodation body, the cover 1920 may be horizontally disposed relative to the accommodation body 1910. The side wall of the accommodation body 1910 opposite to the first sound guiding hole 19223 may be a top of the chamber 1911. The second sound guiding hole 1914 may be disposed on the top of the accommodation body 1910. Further, the second sound guiding hole 1914 may be disposed at a middle position of the top of the accommodation body 1910.

According to the above manners, the second sound guiding hole 1914 may be disposed away from the main sound source, which may reduce the sound received by the second sound guiding hole 1914 from the main sound source, thereby increasing a ratio of environmental noise received by the second sound guiding hole 1914, and improving a noise reduction effect.

As described in the above embodiments of the speaker of the present disclosure, the cover 1920 may include the first sound guiding hole 19223 corresponding to the first microphone element 19312 and the first microphone hole 19214. As used herein, the first microphone element 19312 may be configured to receive sound input through the first sound guiding hole 19223. The second microphone element 19321 may be configured to receive sound input through the second sound guiding hole 1914

Further, a central axis of the second sound guiding hole 1914 may coincide with a main axis of a sound receiving region of the second microphone element 19321.

When the central axis of the second sound guiding hole 1914 coincides with the main axis of the sound receiving region of the second microphone element 19321, noises may be directly guided to the sound receiving region of the second microphone element 19321 through the second sound guiding hole 1914, thereby reducing noise propagation inside the chamber 1911. At the same time, the noises may be directly guided to the sound receiving region 193121 of the first microphone element 19312 through the first sound guiding hole 19223. Noises received by the first microphone element 19312 may be approximately the same as that received by the second microphone element 19321, which may be beneficial to eliminate noises in a subsequent processing and improve the quality of the main sound source.

In some embodiments, the central axis of the second sound guiding hole 1914 may coincide with or be parallel to a central axis of the first sound guiding hole 19223.

The second sound guiding hole 1914 and the first sound guiding hole 19223 may have a same central axis direction. That is, their central axes may coincide or be parallel. In addition, a sound entrance of the second sound guiding hole 1914 and a sound entrance of the first sound guiding hole 19223 may face opposite directions. Therefore, the sound from the main sound source received by the second sound guiding hole 1914 may be reduced, which may be beneficial to eliminate the noises in the subsequent processing and improve the quality of the main sound source.

In some embodiments, the main axis of the sound receiving region of the second microphone element 19321 may coincide with or be parallel to the main axis of the sound receiving region 193121 of the first microphone element 19312. The sound receiving region of the second microphone element 19321 may receive the sound signal through the second sound guiding hole 1914. The sound receiving region 193121 of the first microphone element 19312 may receive the sound signal through the first sound guiding hole 19223. Since the main sound source signal through the second sound guiding hole 1914 is small, the main sound source signal received by the sound receiving region of the second microphone element 19321 may be small, which may improve the quality of the sound signal.

In some embodiments, the first circuit board 1931 may be disposed parallel to an opening plane of the opening 1912 and close to the opening 1912. Optionally, the first circuit board 1931 may also be disposed inclined to the opening plane of the opening 1912 and close to the opening 1912. Further, the switch 19311, the light emitting element 19313, etc. as described above may be further disposed on the first circuit board 1931. The switch 19311, the light emitting element 19313, the first microphone element 19312, etc. may be disposed on the first circuit board 1931 in a certain manner. Correspondingly, the switch hole 19213, the light emitting hole 19215, the first microphone hole 19214, etc. may be separately disposed on the cover 1920, so as to transmit signals to the outside of the speaker through the corresponding holes.

Further, the first microphone hole 19214 may be disposed at a center of the cover 1920. The switch hole 19213 and the light emitting hole 19215 may be disposed on both sides of the first microphone hole 19214 in a length direction of the cover 1920, respectively. A distance between the switch hole 19213 and the first microphone hole 19214 and a distance between the light emitting hole 19215 and the first microphone hole 19214 may be in a range of 5 to 10 millimeters. Specifically, The distance may be 5 millimeters, 6 millimeters, 7 millimeters, 8 millimeters, 9 millimeters, 10 millimeters, etc. The distance between the switch hole 19213 and the first microphone hole 19214 and the distance between the light emitting hole 19215 and the first microphone hole 19214 may be the same or different.

In some embodiments, the accommodation body 1910 may extend from the opening 1912 in a direction perpendicular to the opening plane to form a chamber 1911 having a certain width. The second circuit board 1932 may be disposed parallel to the width direction of the chamber 1911 and perpendicular to the opening plane. Alternatively, the second circuit board 1932 may also be disposed inclined to the width direction of the chamber 1911 and inclined to the plane of the opening 1912. The second circuit board 1932 may be disposed in the chamber 1911 inclined to the first circuit board 1931. As used herein, the second circuit board 1932 may be further disposed with a main control chip, an antenna, etc.

In some embodiments, the second circuit board 1932 may be inclined to the width direction of the chamber 1911 and inclined to the opening plane of the opening 1912. An included angle between the second circuit board 1932 and a width direction of the chamber 1911 may be in a range of 5 to 20 degrees. Specifically, the included angle between the second circuit board 1932 and the width direction of the chamber 1911 may be any angle within the range, such as, 5 degrees, 10 degrees, 15 degrees, 20 degrees, etc., which may not be specifically limited herein.

In an application scenario, when the user uses the speaker, the main axis of the sound receiving region of the second microphone element 19321 may coincide with the main axis of the sound receiving region 193121 of the first microphone element 19312. The first microphone element 19312 and the second microphone element 19321 may be in line with the mouth of the user.

In this embodiment, the first microphone element 19312 and the second microphone element 19321 may be respectively disposed on the two circuit boards. The two microphone elements may receive sound signals through the first sound guiding hole 19223 and the second sound guiding hole 1914, respectively. One of the microphone elements may be used to receive main sounds, such as, human voices. The other microphone element may have a function of collecting background noises, which may facilitate a collection of ambient noises. The two microphone elements may cooperate to analyze and process the received sound signals, which may reduce noises in the received sound signals, thereby improving the quality of sound signal.

Figure 65:
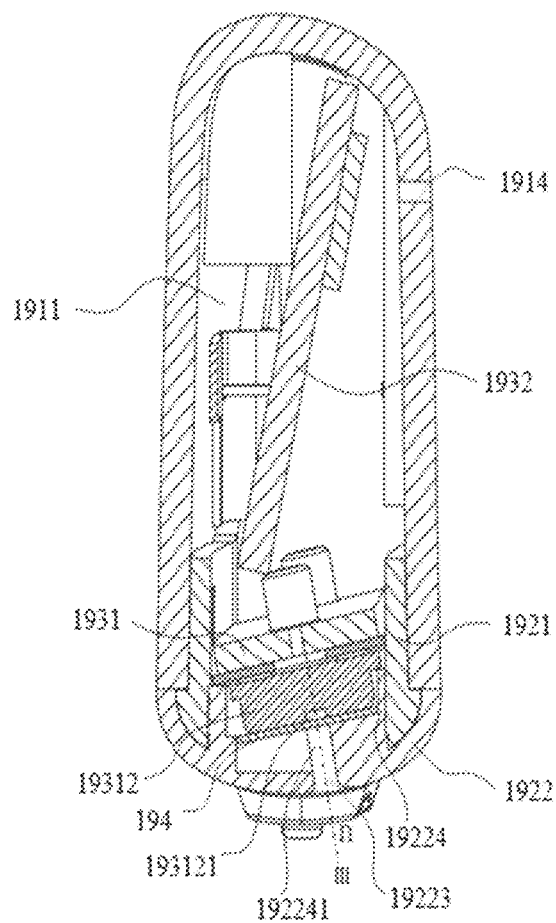
FIG. 65 is a sectional view illustrating an electronic component of a glasses along a B-B axis in FIG. 59 in a combined state according to some embodiments of the present disclosure.
Figure 66:
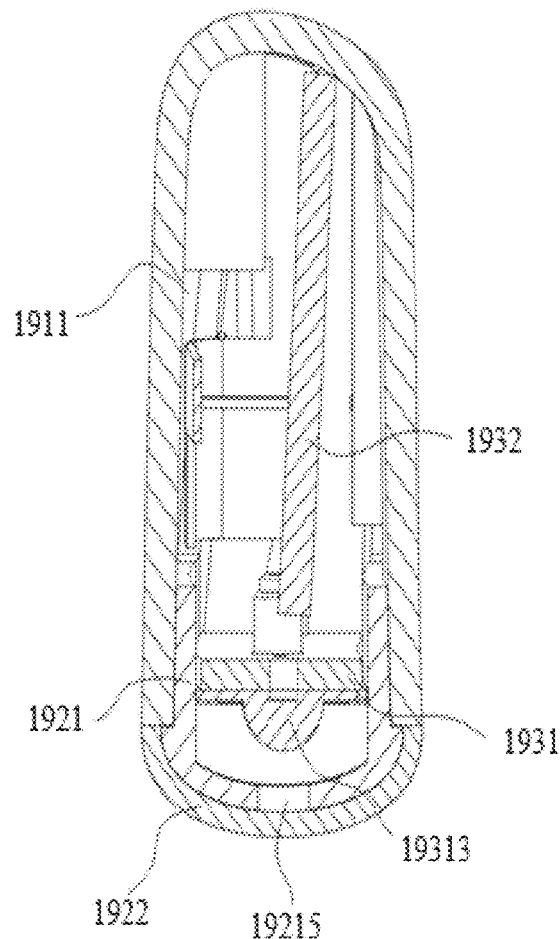
FIG. 66 is a schematic diagram illustrating a structure that the first circuit board and the second circuit board have a different included angel from that in FIG. 65 according to some embodiments in the present disclosure.

Further, as shown in FIG. 65 and FIG. 66, FIG. 66 is a schematic diagram illustrating a structure of a speaker in a combined state with a different included angle from FIG. 65 according to some embodiments of the present disclosure. The first circuit board 1931 and the second circuit board 1932 may be disposed inclined to each other in the same chamber 1911, which may make installation manners of the two circuit boards more flexible. The included angle between the two circuit boards may be adjusted according to sizes and positions of the electronic components on the two circuit boards. Therefore, a space utilization of the speaker may be improved. When the arrangement is applied in the speaker, the space in the speaker may be saved so as to achieve a thinner speaker.

Further, the included angle between the first circuit board 1931 and the second circuit board 1932 may be in a range of 50 to 150 degrees. The specific included angle between the first circuit board 1931 and the second circuit board 1932 may be any angle within the range, such as, 70 degrees, 80 degrees, 90 degrees, 100 degrees, 110 degrees, etc.

Specifically, in an application scenario, the opening 1912 and the cover 1920 may be disposed in corresponding stripe shapes. A shape of the first circuit board 1931 may match a shape of the opening 1912. A width $d_1$ of the first circuit board 1931 may be not greater than a size of the opening plane along the width direction of the opening 1912, so that the first circuit board 1931 (parallel or inclined to the opening plane) may be accommodated in a position near the opening 1912 in the chamber 1911. That is, the first circuit board 1931 may also be disposed in a stripe shape. Correspondingly, the switch 19311, the light emitting element 19313, and the first microphone element 19312 may be disposed on the first circuit board 1931 at intervals along the length direction of the first circuit board 1931 (e.g., the length direction of the cover 1920).

In some embodiments, the second microphone element 13921 may be a bone conduction microphone. The bone conduction microphone may extend out of the accommodation body 1910 through the second sound guiding hole 1914. The bone conduction microphone may be installed on a side wall on one side of the accommodation body 1910. The side wall may fit a body of the user when the user wears the speaker, so that the bone conduction microphone may better receive the vibration signal of the main sound source. When the user wears the speaker for voice input, the second microphone element 19321 may mainly collect the vibration signals of the main sound source. The vibration signals may be compared with the sound signals (including audio signals and noise) collected by the first microphone element 19312 (air conduction). In some embodiments, the sound signals collected by the first microphone element 19312 may be optimized based on the comparison result to obtain high-quality audio signals.

In some embodiments, the component body may include the second sound guiding hole 1914 through the side wall of the chamber 1911. A second sound blocking member 1915 may be disposed at a position corresponding to the second sound guiding hole 1914. The second sound blocking member 1915 may extend toward the inside of the chamber 1911 through the second sound guiding hole 1914 to limit the transmission direction of sound to the second microphone element 19321.

Specifically, in this embodiment, the second sound guiding hole 1914 corresponding to the second microphone element 19321 may be disposed on the component body and penetrate the chamber 1911 such that the second microphone element 19321 may communicate with the outside. Then the second microphone element 19321 may receive external sound signals.

As used herein, the second sound blocking member 1915 may be made of a hard material or a soft material. For example, the accommodation body 1910 may extend from an inner side of the chamber 1911 to the inside of the chamber 1911 along the periphery of the second sound guiding hole 1914 to from the second sound blocking member 1915. In this embodiment, the second sound blocking member 1914 may be formed by a soft rubber that is integrally injected with the accommodation body 1910. The soft rubber may extend from the inner side of the chamber 1911 to the inside of the chamber 1911 along the periphery of the second sound guiding hole 1914. In an application scenario, the second sound blocking member 1915 may extend into the inside of the chamber 1911 along the periphery of the second sound guiding hole 1914, extend to the second microphone element 19321, and then surround the sound receiving region of the second microphone element 19321. Then a channel connecting the second sound guiding hole 1914 and the second microphone element 19321 may be formed, so that the external sound signal input to the second sound guiding hole 1914 may be directly received by the sound receiving region of the second microphone element 19321 through the channel. In another application scenario, the second sound blocking member 1915 may not completely surround the periphery of the second sound guiding hole 1914, but only extend into the inside of the chamber 1911 along one or two sides of the second sound guiding hole 1914 and extend to the second microphone element 19321. The sound input from the second sound guiding hole 1914 may be guided and propagate to the second microphone element 19321, and be received by the sound receiving region of the second microphone element 19321.

Referring to FIGS. 59-61, in some embodiments, the electronic component (also referred to as "circuit housing" or "component body") may include the accommodation body 1910 and the cover 1920. As used herein, the accommodation body 1920 may include the chamber 1911 having at least one opening 1912. The cover 1920 may cover the opening 1912 of the chamber 1911 and seal the chamber 1911. The electronic component in this embodiment may be consistent with the component body in the above embodiments.

The electronic component in the present disclosure may be applied to an electronic device. As used herein, the electronic device may be any electronic device that requires to seal an inner structure, such as earphones, MP3 players, hearing aids, mobile phones, tablet computers, or glasses with circuit components or electronic devices, etc., and be not specifically limited herein. In some embodiments, the electronic component may be disposed on the glasses temple 15 in FIG. 7. In some embodiments, the electronic component may also be referred to as a circuit housing.

In some embodiments, the accommodation body 1910 may be at least a portion of the electronic device (e.g., the speaker).

In some embodiments, the circuit component may correspond to the control circuit in FIG. 2.

FIG. 68 is a sectional view illustrating an electronic component of electronic component along an A-A axis in FIG. 59 in a combined state according to some embodiments of the present disclosure. As shown in FIG. 68, in some embodiments, the accommodation body 1910 may include an opening edge 1913 for defining the opening 1912. The covering portion 19212 may be pressed on an inner region 19131 of the opening edge 1913 near the opening 1912. The cover layer 1922 may cover an outer surface of the covering portion 19212 away from the accommodation body 1910 and be pressed on an outer region 19132 at the outer side of the inner region 19131 of the opening edge 113 to seal with the opening edge 1913.

Figure 69:
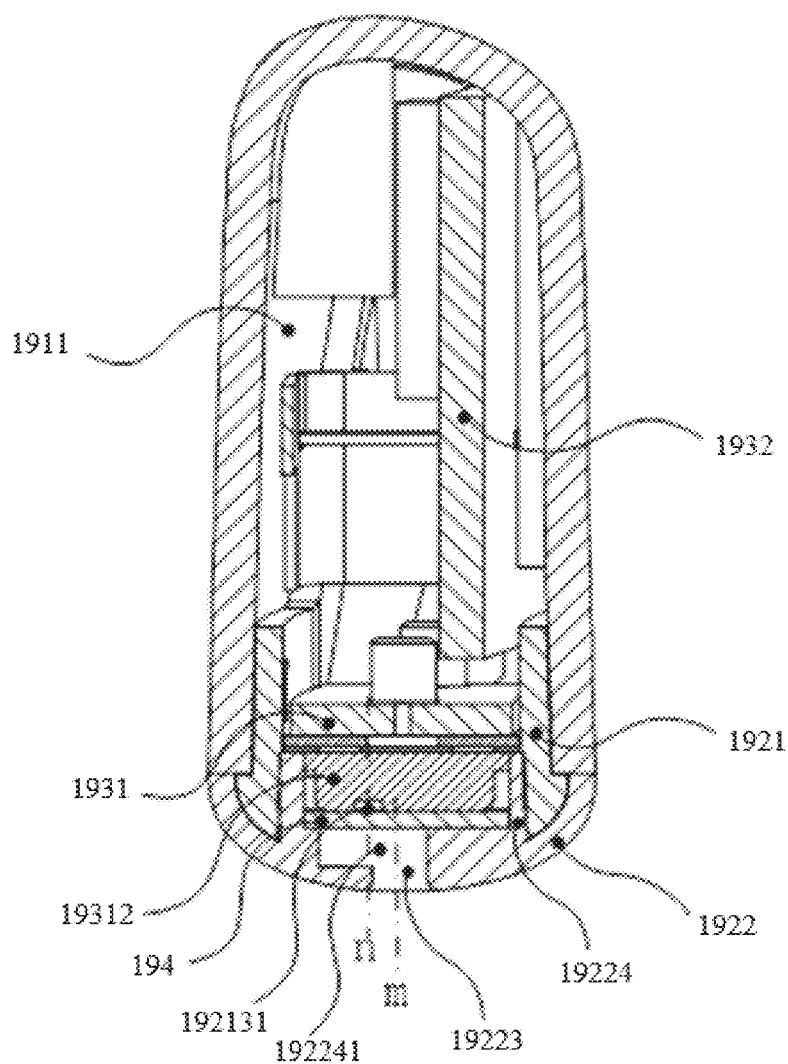
FIG. 69 is a sectional view illustrating an electronic component of a glasses along a B-B axis in FIG. 59 in a combined state according to some embodiments of the present disclosure.

FIG. 69 is a sectional view illustrating an electronic component in a combined state along a B-B axis in FIG. 59 according to the present disclosure. As shown in FIG. 69, the electronic component may include a first microphone element 19312. In some embodiments, the first microphone element 19312 may also be disposed on the first circuit board 1931 of the circuit component 1930 to be accommodated inside the chamber 1911. For example, the first microphone element 19312 may be disposed on the first circuit board 1931 spaced from the switch 19311 in the embodiment. The first microphone element 19312 may be used to receive a sound signal from the outside of the electronic component, and convert the sound signal into an electrical signal for analysis and processing.

In some embodiments, the bracket 1921 may be disposed with the microphone hole 19214 corresponding to the first microphone element 19312. The cover layer 1922 may be disposed with the first sound guiding hole 19223 corresponding to the microphone hole 19214. The first sound blocking member 19224 may be disposed at a position corresponding to the microphone hole 19214. The first sound blocking member 19224 may extend towards the inside of the chamber 1911 via the microphone hole 19214 and define the sound guiding channel 192241.

In some embodiments, the first sound guiding hole 19223 may be disposed through the cover layer 1922 and correspond to the position of the first microphone element 19312. The first sound guiding hole 19223 may correspond to the microphone hole 19214 of the bracket 1921, and further communicate the first microphone element 19312 with the outside of the electronic component. Therefore, a sound from the outside of the electronic component may be received by the first microphone element 19312 via the first sound guiding hole 19223 and the microphone hole 19214.

Figure 70:
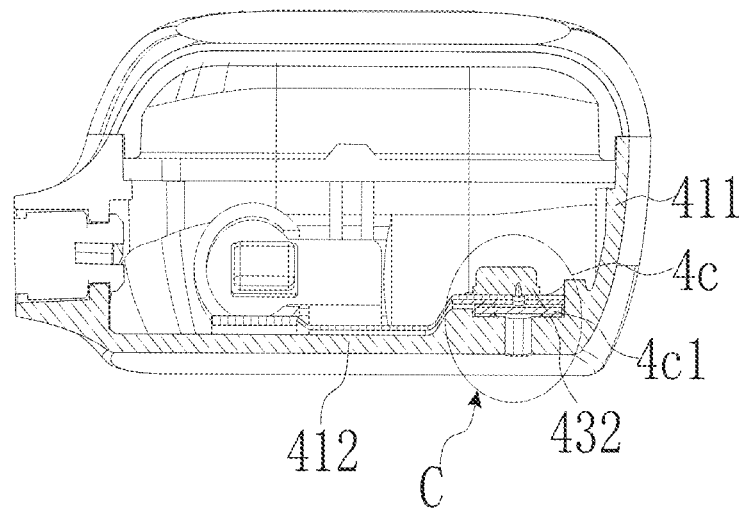
FIG. 70 is a sectional view illustrating a partial structure of a speaker of a glasses according to some embodiments of the present disclosure.

FIG. 2 is a partial structural diagram illustrating a speaker according to an embodiment of the present disclosure. FIG. 3 is an exploded diagram illustrating a partial structure of a speaker according to an embodiment of the present disclosure. FIG. 70 is a sectional view illustrating a partial structure of a speaker according to an embodiment of the present disclosure.

Referring to FIG. 2 and FIG. 3, in some embodiments, an auxiliary function module may include a microphone 432. The count of the microphones 432 may include two, i.e., a first microphone 432a and a second microphone 432b. As used herein, the first microphone 432a and the second microphone 432b may both be MEMS (micro-electromechanical system) microphone 432 which may have a small working current, relatively stable performance, and high voice quality. The two microphones 432 may be disposed at different positions of a flexible circuit board 44 according to actual requirements.

In some embodiments, the flexible circuit board 44 may be disposed in the speaker in FIG. 1. The flexible circuit board 44 may correspond to, such as, the flexible circuit board 106 in FIG. 1. The flexible circuit board 44 may include a main circuit board 441, and a branch circuit board 442 and a branch circuit board 443 connected to the main circuit board 441. The branch circuit board 442 may extend in the same direction as the main circuit board 441. The first microphone 432a may be disposed on one end of the branch circuit board 442 away from the main circuit board 441. The branch circuit board 443 may extend perpendicular to the main circuit board 441. The second microphone 432b may be disposed on one end of the branch circuit board 443 away from the main circuit board 441. A plurality of pads 45 may be disposed on the end of the main circuit board 441 away from the branch circuit board 442 and the branch circuit board 443.

In some embodiments, a core housing 41 may include a peripheral side wall 411 and a bottom end wall 412 connected to one end surface of the peripheral side wall 411 to form an accommodation space with an open end. As used herein, an earphone core 42 may be placed in the accommodation space through the open end. The first microphone 432a may be fixed on the bottom end wall 412. The second microphone 432b may be fixed on the peripheral side wall 411.

In some embodiments, the branch circuit board 442 and/or the branch circuit board 443 may be appropriately bent to suit a position of a sound inlet corresponding to the microphone 432 at the core housing 41. Specifically, the flexible circuit board 44 may be disposed in the core housing 41 in a manner that the main circuit board 441 is parallel to the bottom end wall 412. Therefore, the first microphone 432a may correspond to the bottom end wall 412 without bending the main circuit board 441. Since the second microphone 432b may be fixed to the peripheral side wall 411 of the core housing 41, it may be necessary to bend the second main circuit board 441. Specifically, the branch circuit board 443 may be bent at one end away from the main circuit board 441 so that a board surface of the branch circuit board 443 may be perpendicular to a board surface of the main circuit board 441 and the branch circuit board 442. Further, the second microphone 432b may be fixed at the peripheral side wall 411 of the core housing 41 in a direction facing away from the main circuit board 441 and the branch circuit board 442.

In some embodiments, the pad 45, a pad 46, the first microphone 432a, and the second microphone 432b may be disposed on the same side of the flexible circuit board 44. The pad 46 may be disposed adjacent to the second microphone 432b.

In some embodiments, the pad 46 may be specifically disposed at one end of the branch circuit board 443 away from the main circuit board 441, and have the same orientation as the second microphone 432b and disposed at intervals. Therefore, the pad 46 may be perpendicular to the orientation of the pad 45 as the branch circuit board 443 is bent. It should be noted that the board surface of the branch circuit board 443 may not be perpendicular to the board surface of the main circuit board 441 after the branch circuit board 443 is bent, which may be determined according to the arrangement between the peripheral side wall 411 and the bottom end wall 412.

In some embodiments, another side of the flexible circuit board 44 may be disposed with a rigid support plate 4a and a microphone rigid support plate 4b for supporting the pad 45. The microphone rigid support plate 4b may include a rigid support plate 4b1 for supporting the first microphone 432a and a rigid support plate 4b2 for supporting the pad 46 and the second microphone 432b together.

In some embodiments, the rigid support plate 4a, the rigid support plate 4b1, and the rigid support plate 4b2 may be mainly used to support the corresponding pads and the microphone 432, and thus may need to have strengths. The materials of the three may be the same or different. The specific material may be polyimide (PI), or other materials that may provide the strengths, such as polycarbonate, polyvinyl chloride, etc. In addition, the thicknesses of the three rigid support plates may be set according to the strengths of the rigid support plates and actual strengths required by the pad 45, the pad 46, the first microphone 432a, and the second microphone 432b, and be not specifically limited herein.

The first microphone 432a and the second microphone 432b may correspond to two microphone components 4c, respectively. In some embodiments, the structures of the two microphone components 4c may be the same. A sound inlet 413 may be disposed on the core housing 41. Further, the speaker may be further disposed with an annular blocking wall 414 integrally formed on the inner surface of the core housing 41 at the core housing 41, and disposed at the periphery of the sound inlet 413, thereby defining an accommodation space 415 connected to the sound inlet 413.

Referring to FIG. 2, FIG. 3, and FIG. 70, in some embodiments, the microphone component 4c may further include a waterproof membrane component 4c1.

As used herein, the waterproof membrane component 4c1 may be disposed inside the accommodation space 415 and cover the sound inlet 413. The microphone rigid support plate 4b may be disposed inside the accommodation space 415 and located at one side of the waterproof membrane component 4c1 away from the sound inlet 413. Therefore, the waterproof membrane component 4c1 may be pressed on the inner surface of the core housing 41. In some embodiments, the microphone rigid support plate 4b may be disposed with a sound inlet 4b3 corresponding to the sound inlet 413. In some embodiments, the microphone 432 may be disposed on one side of the microphone rigid support plate 4b away from the waterproof membrane component 4c1 and cover the sound inlet 4b3.

As used herein, the waterproof membrane component 4c1 may have functions of waterproofing and transmitting the sound, and closely attached to the inner surface of the core housing 41 to prevent a liquid outside the core housing 41 entering the core housing 41 via the sound inlet 413 and affect the performance of the microphone 432.

The axial directions of the sound inlet 4b3 and the sound inlet 413 may overlap, or intersect at an angle according to actual requirements of the microphone 432, etc.

The microphone rigid support plate 4b may be disposed between the waterproof membrane component 4c1 and the microphone 432. On the one hand, the waterproof membrane component 4c1 may be pressed so that the waterproof membrane component 4c1 may be closely attached to the inner surface of the core housing 41. On the other hand, the microphone rigid support plate 4b may have a strength, thereby playing the role of supporting the microphone 432.

In some embodiments, the material of the microphone rigid support plate 4b may be polyimide (PI), or other materials capable of providing the strength, such as polycarbonate, polyvinyl chloride, or the like. In addition, the thickness of the microphone rigid support plate 4b may be set according to the strength of the microphone rigid support plate 4b and the actual strength required by the microphone 432, and be not specifically limited herein.

Figure 71:
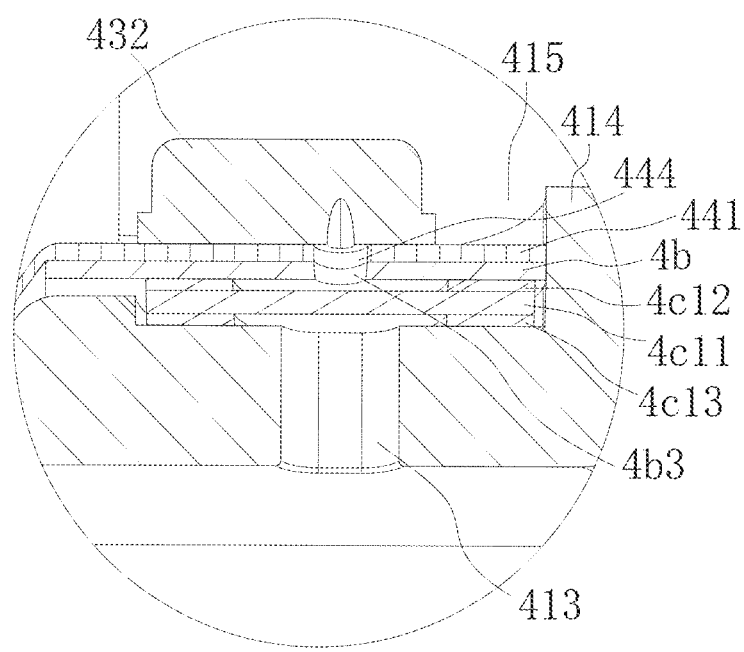
FIG. 71 is a partial enlarged view illustrating part C in FIG. 66 according to some embodiments of the present disclosure.

FIG. 71 is a partially enlarged view illustrating part C in FIG. 70 according to some embodiments of the present disclosure. As shown in FIG. 68, in some embodiments, the waterproof membrane component 4c1 may include a waterproof membrane body 4c11 and an annular rubber gasket 4c12. The annular rubber gasket 4c12 may be disposed at one side of the waterproof membrane body 4c11 towards the microphone rigid support plate 4b, and further disposed on the periphery of the sound inlet 413 and the sound inlet 4b3.

As used herein, the microphone rigid support plate 4b may be pressed against the annular rubber gasket 4c12. Therefore, the waterproof membrane component 4c1 and the microphone rigid support plate 4b may be adhered and fixed together.

In some embodiments, the annular rubber gasket 4c12 may be arranged to form a sealed chamber communicating with the microphone 432 and only through the sound inlet 4b3 between the waterproof membrane body 4c11 and the rigid support plate. That is, there may be no gap in a connection between the waterproof membrane component 4c1 and the microphone rigid support plate 4b. Therefore, a space around the annular rubber gasket 4c12 between the waterproof membrane body 4c11 and the microphone rigid support plate 4b may be isolated from the sound inlet 4b3.

In some embodiments, the waterproof membrane body 4c11 may be a waterproof and sound-transmitting membrane and be equivalent to a human eardrum. When an external sound enters via the sound inlet 413, the waterproof membrane body 4c11 may vibrate, thereby changing an air pressure in the sealed chamber and generating a sound in the microphone 432.

Further, since the waterproof membrane body 4c11 may change the air pressure in the sealed chamber during the vibration, the air pressure may need to be controlled within an appropriate range. If it is too large or too small, it may affect the sound quality. In the embodiment, a distance between the waterproof membrane body 4c11 and the rigid support plate may be 0.1-0.2 mm, specifically 0.1 mm, 0.15 mm, 0.2 mm, etc. Therefore, the change of the air pressure in the sealed chamber during the vibration of the waterproof film body 4c11 may be within the appropriate range, thereby improving the sound quality.

In some embodiments, the waterproof membrane component 4c1 may further include an annular rubber gasket 4c13 disposed on the waterproof membrane body 4c11 towards the inner surface side of the core housing 41 and overlapping the annular rubber gasket 4c12.

In this way, the waterproof membrane component 4c1 may be closely attached to the inner surface of the core housing 41 at the periphery of the sound inlet 413, thereby reducing the loss of the sound entered via the sound inlet 413, and improving a conversion rate of converting the sound into the vibration of the waterproof membrane body 4c11.

In some embodiments, the annular rubber gasket 4c12 and the annular rubber gasket 4c13 may be a double-sided tape, a sealant, etc., respectively.

In some embodiments, the sealant may be further coated on the peripheries of the annular blocking wall 414 and the microphone 432 to further improve the sealing, thereby improving the conversion rate of the sound and the sound quality.

In some embodiments, the flexible circuit board 44 may be disposed between the rigid support plate and the microphone 432. A sound inlet 444 may be disposed at a position corresponding to the sound inlet 4b3 of the microphone rigid support plate 4b. Therefore, the vibration of the waterproof membrane body 4c11 generated by the external sound may pass through the sound inlet 444, thereby further affecting the microphone 432.

Referring to FIG. 3, in some embodiments, the flexible circuit board 44 may further extend away from the microphone 432, so as to be connected to other functional components or wires to implement corresponding functions. Correspondingly, the microphone rigid support plate 4b may also extend out a distance with the flexible circuit board in a direction away from the microphone 432.

Figure 72:
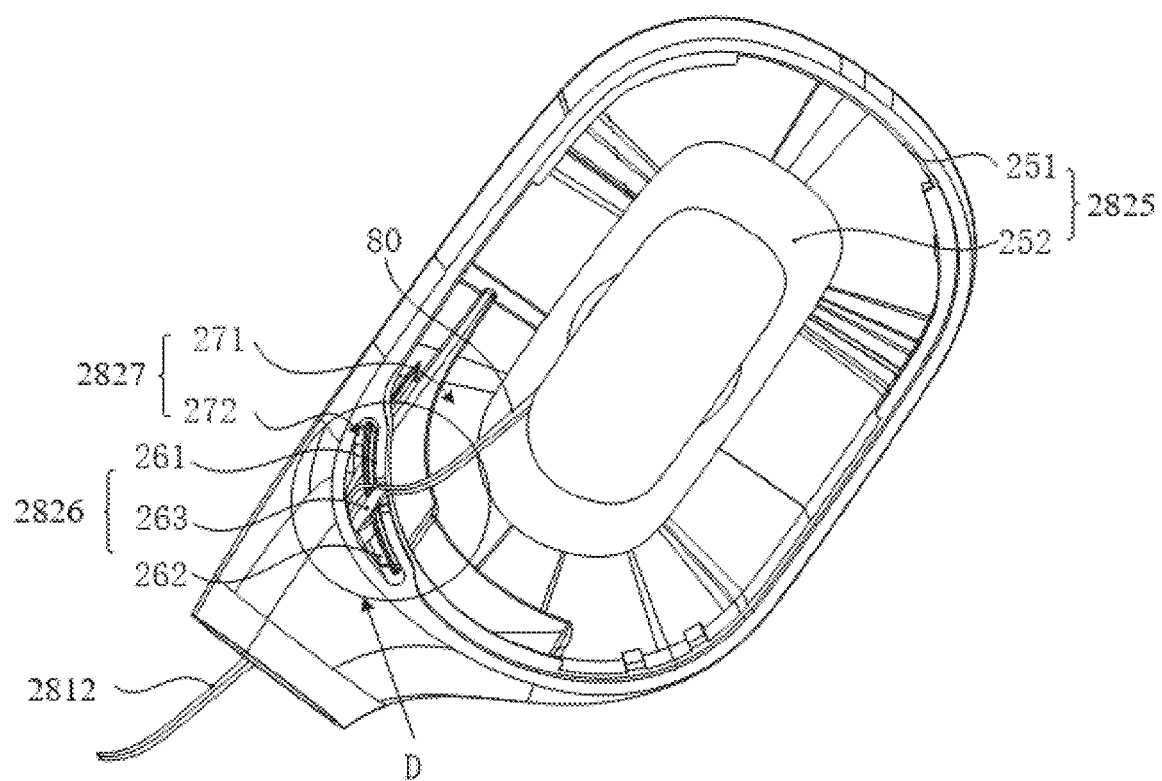
FIG. 72 is a partial structural diagram illustrating a core housing of a speaker of a glasses according to some embodiments of the present disclosure.
Figure 73:
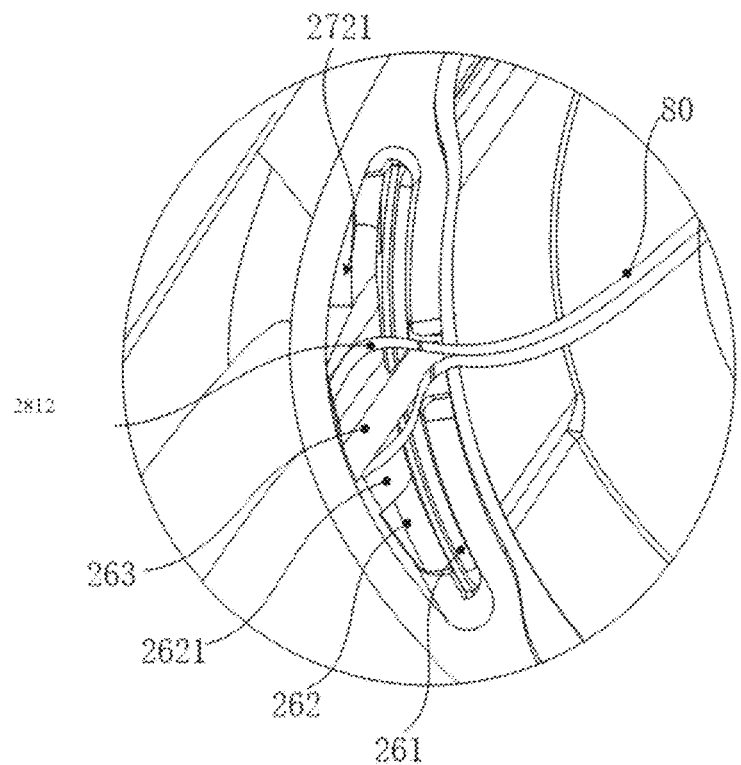
FIG. 73 is a partial enlarged view illustrating part D in FIG. 72 according to some embodiments of the present disclosure.
Figure 74:
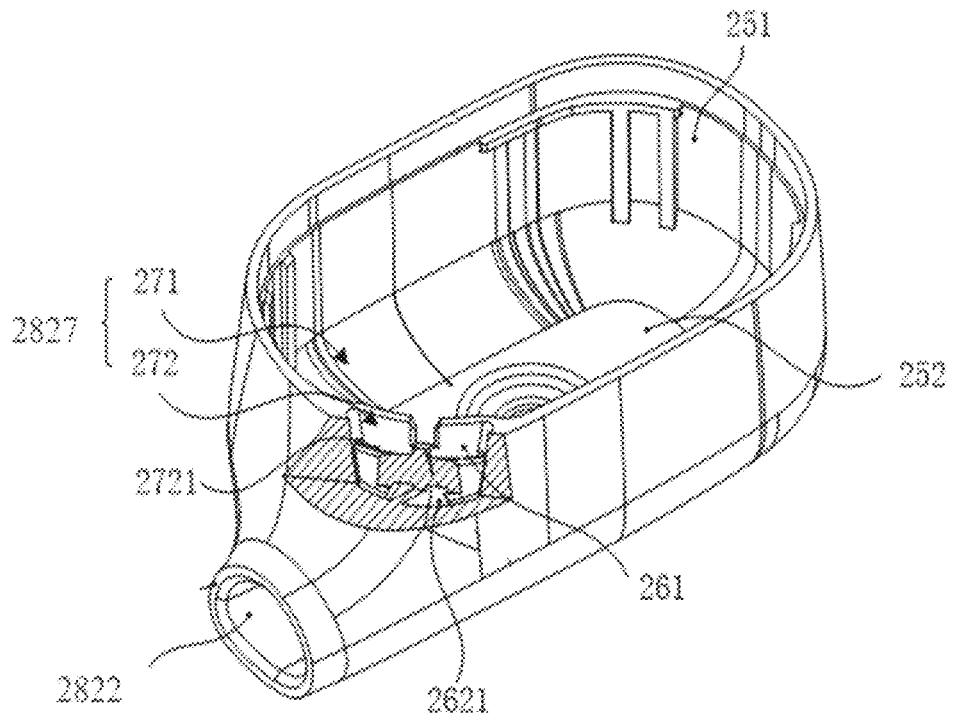
FIG. 74 is a partial sectional view illustrating a core housing of a speaker of a glasses according to some embodiments of the present disclosure.

FIG. 72 is a partial structural diagram illustrating a core housing of the speaker according to some embodiments of the present disclosure. FIG. 73 is a partial enlarged view illustrating D part in FIG. 72 according to some embodiments of the present disclosure. FIG. 74 is a partial sectional view illustrating a core housing of the speaker according to some embodiments of the present disclosure.

Referring to FIG. 72-74, the core housing may include a main housing 2825 (i.e., the core housing 108 in FIG. 1) and a baffle component 2826. As used herein, the baffle component 2826 may be located inside the main housing 2825 and connected to the main housing 2825, thereby dividing an inner space 2827 of the main housing 2825 into a first accommodation space 271 and a second accommodation space 272 near a connection hole 2822. In some embodiments, the main housing 2825 may include a peripheral side wall 251 and a bottom end wall 252 connected to one end surface of the peripheral side wall 251. The peripheral side wall 251 and the bottom end wall 252 may together form the inner space 2827 of the main housing 2825.

In some embodiments, the baffle component 2826 may be located at one side of the main housing 2825 near the connection hole 2822 and include a side baffle 261 and a bottom baffle 262. As used herein, the side baffle 261 may be disposed in a direction perpendicular to the bottom end wall 252. Both ends of the side baffle 261 may be connected to the peripheral side wall 251, so as to space the inner space 2827 of the main housing 2825. The bottom baffle 262 may be parallel to or close to the bottom end wall 252 at intervals, and further connected to the peripheral side wall 251 and the side baffle 261, respectively. Therefore, the inner space 2827 formed by the main housing 2825 may be divided into two to form the first accommodation space 271 and the second accommodation space 272. The first accommodation space 271 may be surrounded by the side baffle 261, the bottom baffle 262, the peripheral side wall 251 away from the connection hole 2822, and the bottom end wall 252. The second accommodation space 272 may be surrounded by the bottom baffle 262, the side baffle 261, and the peripheral side wall 251 near the connection hole 2822. As used herein, the second accommodation space 272 may be less than the first accommodation space 271. In some embodiments, the baffle component 2826 may also divide the inner space 2827 of the main housing 2825 by other setting manners, and be not specifically limited herein.

In some embodiments, the baffle component 2826 may further include an inner baffle 263. The inner baffle 263 may further divide the second accommodation space 272 into two sub-accommodation spaces 2721. Specifically, the inner baffle 263 may be disposed perpendicular to the bottom end wall 252 of the main housing 2825, respectively connected to the side baffle 261 and the peripheral side wall 251, and further extend to a wiring hole 2621. Thus, while the second accommodation space 272 may be divided into the two sub-accommodation spaces 2721, the wiring hole 2621 may be further divided into two, and the two wiring holes 2621 may be communicated with the corresponding sub-accommodation spaces 2721.

In some embodiments, the second accommodation space 272 may be further filled with the sealant. In this way, a lead wire 2812 and a lead wire 80 accommodated inside the second accommodation space 272 may be further fixed, so as to further reduce the adverse effect on the sound quality caused by the vibration of the lead wires and improve the sound quality of the speaker while protecting a welding point between the lead 2812 and the lead 80. In addition, the second accommodation space 272 may be sealed to implement the waterproof and dustproof purposes.

In some embodiments, the speaker described above may transmit the sound to the user through bone conduction and/or air conduction. When the air conduction is used to transmit the sound, the speaker may include one or more sound sources. The sound source may be located at a specific position of the user's head, for example, the top of the head, the forehead, a cheek, a temple, an auricle, the back of an auricle, etc., without blocking or covering an ear canal. For the purposes of description, FIG. 75 shows a schematic diagram of transmitting the sound through the air conduction according to some embodiments of the present disclosure.

Figure 75:
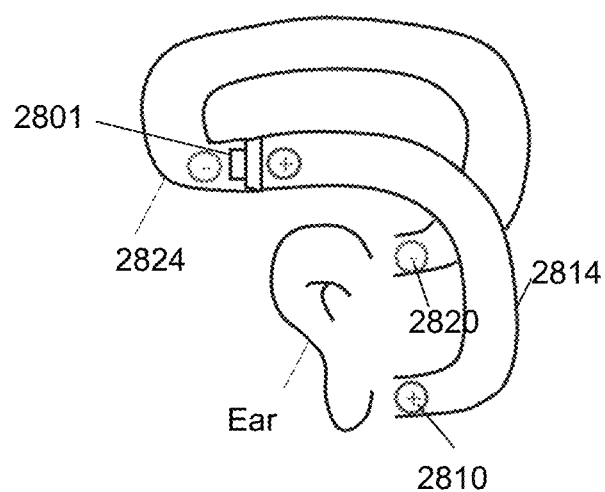
FIG. 75 is a schematic diagram of transmitting a sound through air conduction according to some embodiments of the present disclosure.

As shown in FIG. 75, a sound source 2810 and a sound source 2820 may generate sound waves with opposite phases ("+" and "−" in the figure may indicate the opposite phases). For brevity, the sound sources mentioned herein may refer to sound output holes of the speaker that may output sounds. For example, the sound source 2810 and the sound source 2820 may be two sound output holes respectively located at specific positions of the speaker (e.g., the core housing 108 or the glasses temple 15).

In some embodiments, the sound source 2810 and the sound source 2820 may be generated by a same vibration device 2801. The vibration device 2801 may include a diaphragm (not shown in the figure). When the diaphragm is driven to vibrate by an electric signal, the front side of the diaphragm may drive the air to vibrate. The sound source 2810 may form at the sound output hole through a sound guiding channel 2814. The back of the diaphragm may drive air to vibrate, and the sound source 2820 may be formed at the sound output hole through a sound guiding channel 2824. The sound guiding channel 2824 may refer to a sound transmission route from the diaphragm to the corresponding sound output hole. In some embodiments, the sound guiding channel may be a route surrounded by a specific structure (e.g., the core housing 108, or the glasses temple 12) of a speaker. It should to be known that in some alternative embodiments, the sound source 2810 and the sound source 2820 may also be generated by different vibrating diaphragms of different vibration devices, respectively.

Among the sounds generated by the sound source 2810 and the sound source 2820, one portion may be transmitted to the ear of the user to form the sound heard by the user. Another portion may be transmitted to the environment to form a leaked sound. Considering that the sound source 2810 and the sound source 2820 are relatively close to the ears of the user, for convenience of description, the sound transmitted to the ears of the user may be referred to as a near-field sound. The leaked sound transmitted to the environment may be referred to as a far-field sound. In some embodiments, the near-field/far-field sounds of different frequencies generated by the speaker may be related to a distance between the sound source 2810 and the sound source 2820. Generally speaking, the near-field sound generated by the speaker may increase as the distance between the two sound sources increases, while the generated far-field sound (the leaked sound) may increase by increasing the frequency.

For the sounds of different frequencies, the distance between the sound source 2810 and the sound source 2820 may be designed, respectively, so that a low-frequency near-field sound (e.g., a sound with a frequency of less than 800 Hz) generated by the speaker may be as large as possible and a high-frequency far-field sound (e.g., a sound with a frequency greater than 2000 Hz) may be as small as possible. In order to implement the above purposes, the speaker may include two or more sets of dual sound sources. Each set of the dual sound sources may include two sound sources similar to the sound source 2810 and the sound source 2820, and generate sounds with specific frequencies, respectively. Specifically, a first set of the dual sound sources may be used to generate low frequency sounds. A second set of the dual sound sources may be used to generate high frequency sounds. In order to obtain more low-frequency near-field sounds, the distance between the two sound sources in the first set of the dual sound sources may be set to a larger value. Since the low-frequency signal has a longer wavelength, the larger distance between the two sound sources may not cause a large phase difference in the far-field, and not form excessive leaked sound in the far-field. In order to make the high-frequency far-field sound smaller, the distance between the two sound sources in the second set of the dual sound sources may be set to a smaller value. Since the high-frequency signal has a shorter wavelength, the smaller distance between the two sound sources may avoid the generation of the large phase difference in the far-field, and thus the generation of the excessive leaked sounds may be avoided. The distance between the second set of the dual sound sources may be less than the distance between the first set of the dual sound sources.

It should be noted that the above description of a sound conduction manner for changing the air condition may be only specific examples and should not be considered as the only feasible implementation. Obviously, for those skilled in the art, after understanding the basic principles of the air conduction, it may be possible to make various modifications and changes in the form and details of the specific method and operation of implementing the different shapes and structures of the air conduction speaker without departing from these principles, but these modifications and changes may still be within the scope described above. For example, the sound guiding channel 2824 may be described as other details. As another example, the sound guiding channel 2824 may be also disposed in the glasses. All such modifications may be within the protection scope of the present disclosure.

The beneficial effects of the present disclosure may include but be not limited to the following. (1) The glasses rim and glasses temple may be connected via the rotating shaft, thereby protecting the connection wire in the glasses, and extending the life of the connection wire. (2) The flexible circuit board may simplify the wiring manner in the speaker. (3) The vibration of the housing may be reduced and the leakage of sound may be suppressed using the sound guiding hole. (4) The sound quality of the speaker may be improved using the compound vibration device. (5) The second accommodation space may be filled with the sealant to fix the wires disposed therein, which may reduce the influence of the wire vibration on the sound quality, thereby improving the sound quality of the speaker device. In addition, the sealant filled in the second accommodation space may protect the welding point between the wires. The sealing of the second accommodation space may have the waterproof and dustproof functions. (6) The waterproof membrane module with waterproof and sound transmission function may be pressed and covered on the first sound inlet through the rigid support plate. The waterproof membrane module may be closely attached to the inner surface of the core housing to prevent liquid outside the core housing entering the inside of the core housing from the first sound inlet, thereby improving the waterproof performance of the microphone. (7) The effect of the microphone element to acquire the sound of the main sound source may be improved. (8) By adding the magnetic element, the magnetic guide element, and the electrically conductive unit in the magnetic circuit assembly, the sensitivity of the speaker may be improved. It should be noted that different embodiments may have different beneficial effects. In different embodiments, possible beneficial effects may be any one or a combination of the above, and may be any other beneficial effects.

What is claimed is:

1. A glasses, wherein the glasses includes:
   a glasses frame, the glasses frame comprising a glasses rim and two glasses temples, and the two glasses temples being rotatably connected to the glasses rim, respectively; and
   two speakers, the two speakers comprising an earphone core, the two speakers being connected to the two glasses temples via hinge components of the two glasses temples, respectively, and the hinge components being rotatable to change a position of each of the two speakers relative to connected one of the two glasses temples, wherein
      the glasses temple includes a circuit component or a battery to drive the earphone core to vibrate to generate a sound;
   a first rotating shaft, two ends of the first rotating shaft being connected to the glasses rim and the glasses temple, respectively so that the glasses rim and the glasses temple are able to relatively rotate around the first rotating shaft, and the first rotating shaft being disposed with a rotating shaft wiring channel along an axial direction of the first rotating shaft, the rotating shaft wiring channel communicating with the outside through a wiring port disposed on at least one end surface of the first rotating shaft; and
   a connection wire passing through the rotating shaft wiring channel extending to the glasses rim or the glasses temple through the wiring port.

2. The glasses of claim 1, wherein the hinge component includes a hinge, a rod-shaped member, and a fixing member, and the hinge includes:
   a hinge mount;
   a hinge arm rotatably connected to the hinge mount via a rotating shaft, and being rotatable relative to the hinge mount when an external force is applied to the hinge arm to change the position of the speaker relative to the glasses temple;
   a support member flexibly disposed on the hinge mount; and
   an elastic member configured to elastically offset the support member toward the hinge arm, so that the support member elastically abuts on the hinge arm.

3. The glasses of claim 2, wherein
   the hinge arm includes a first support surface and a second support surface connected to each other;
   the support member includes a third support surface;
   when the elastic member elastically offsets the support member toward the hinge arm, the third support surface elastically abuts on the first support surface and the second support surface, respectively; and
   when the hinge arm is rotated relative to the hinge mount by the external force, a connection between the first support surface and the second support surface drives the support member against the elastic offset of the elastic member to move in an opposite direction, so that the third support surface is switched from being elastically abutting on one of the first support surface and the second support surface to being elastically abutting on the other of the first support surface and the second support surface.

4. The glasses of claim 3, wherein a ratio of a maximum distance from the rotating shaft to the connection to a shortest distance from the rotating shaft to the first support surface is between 1.1 and 1.5 in a section perpendicular to a central axis of the rotating shaft.

5. The glasses of claim 3, wherein an included angle between the hinge mount and the hinge arm becomes smaller when the third support surface is switched from elastically abutting on the first support surface to elastically abutting on the second support surface.

6. The glasses of claim 3, wherein an external force required when the third support surface is switched from elastically abutting on the first support surface to elastically abutting on the second support surface is different from another external force required when the third support surface is switched from elastically abutting on the second support surface to elastically abutting on the first support surface.

7. The glasses of claim 3, wherein the connection has an arc shape in a section perpendicular to a central axis of the rotating shaft.

8. The glasses of claim 3, wherein an included angle between the first support surface and the second support surface is an obtuse angle in a section perpendicular to a central axis of the rotating shaft.

9. The glasses of claim 3, wherein
the hinge mount includes a mount body, and a first lug and a second lug protruding from the mount body and spaced apart from each other; and
the hinge arm includes an arm body and a third lug protruding from the arm body, the third lug being inserted into an interval region between the first lug and the second lug, and rotatably connected to the first lug and the second lug via the rotating shaft.

10. The glasses of claim 9, wherein
the support member is at least partially disposed inside the interval region and located at a side of the third lug towards the mount body; and
the mount body is disposed with an accommodation chamber communicating with the interval region, the elastic member is disposed inside the accommodation chamber, and the support member elastically offsets toward the third lug.

11. The glasses of claim 1, wherein
the rotating shaft wiring channel communicates with the outside through a first wiring port and a second wiring port, the first wiring port and the second wiring port being disposed on two end surfaces of the first rotating shaft, respectively; and
the connection wire extends to the glasses rim and the glasses temple through the first wiring port and the second wiring port, respectively.

12. The glasses of claim 1, wherein
the rotating shaft wiring channel communicates with the outside through a first wiring port disposed on an end surface of the first rotating shaft and a second wiring port disposed on a side wall of the first rotating shaft; and
the connection wire extends to the glasses rim and the glasses temple through the first wiring port and the second wiring port, respectively.

13. The glasses of claim 12, wherein the first rotating shaft is fixedly connected to one of the glasses rim and the glasses temple disposed near the second wiring port, and rotatably connected to another of the glasses rim and the glasses temple disposed near the first wiring port.

14. The glasses of claim 1, wherein the speaker further comprises:
an auxiliary function module configured to receive an auxiliary signal and execute an auxiliary function;
a flexible circuit board configured to electrically connect to an audio signal wire and an auxiliary signal wire of the control circuit, and electrically connect the audio signal wire and the auxiliary signal wire with the earphone core and the auxiliary function module via the flexible circuit board, respectively; and
a core housing configured to accommodate the earphone core, the auxiliary function module, and the flexible circuit board.

15. The glasses of claim 14, wherein
the flexible circuit board at least comprises a plurality of first pads and a plurality of second pads;
at least one of the first pads is electrically connected to the audio signal wire, the at least one first pad is electrically connected to at least one of the second pads via a first flexible lead on the flexible circuit board, and the at least one second pad is electrically connected to the earphone core via an external wire; and
at least another one of the first pads is electrically connected to the auxiliary signal wire, and the at least another one of the first pads is electrically connected to the auxiliary function module via a second flexible lead on the flexible circuit board.

16. The glasses of claim 15, wherein
the flexible circuit board at least includes a main circuit board and a first branch circuit board;
the first branch circuit board is connected to the main circuit board, away from the main circuit board, and extends along one end of the main circuit board;
the auxiliary function module includes at least a first auxiliary function module and a second auxiliary function module;
the first auxiliary function module is disposed on the main circuit board; and
the second auxiliary function module is disposed on the first branch circuit board.

17. The glasses of claim 16, wherein
the flexible circuit board further includes a second branch circuit board,
the second branch circuit board is connected to the main circuit board, away from the main circuit board, extends along the other end of the main circuit board, and is spaced apart from the first branch circuit board; and
the auxiliary function module further includes a third auxiliary function module, and the third auxiliary function module is disposed on the second branch circuit board.

18. The glasses of claim 14, wherein the earphone core includes:
a magnetic circuit component configured to provide a magnetic field;
a vibration component, the vibration component comprising a coil and an inner lead, wherein
the coil is located in the magnetic field,
the inner lead is electrically connected to the coil,
the coil receives an audio current via the inner lead and converts the audio current into a mechanical vibration signal under an action of the magnetic field,
one end of the external wire transmitting the audio current to the coil is electrically connected to a second pad, and
the other end of the external wire is electrically connected to the inner lead.

* * * * *